US009368869B2

(12) United States Patent
Chen et al.

(10) Patent No.: US 9,368,869 B2
(45) Date of Patent: Jun. 14, 2016

(54) ANTENNA STRUCTURES AND METHODS
(71) Applicant: Skycross, Inc., San Jose, CA (US)
(72) Inventors: Li Chen, Melbourne, FL (US); Frank M. Caimi, Vero Beach, FL (US); Mark T. Montgomery, Melbourne Beach, FL (US); Mark W. Kishler, Rockledge, FL (US)
(73) Assignee: SKYCROSS, INC., San Jose, CA (US)
( * ) Notice: Subject to any disclaimer, the term of this patent is extended or adjusted under 35 U.S.C. 154(b) by 0 days.
(21) Appl. No.: 14/449,498
(22) Filed: Aug. 1, 2014
(65) Prior Publication Data
US 2015/0117502 A1 Apr. 30, 2015

Related U.S. Application Data

(60) Provisional application No. 61/896,233, filed on Oct. 28, 2013, provisional application No. 61/932,831, filed on Jan. 29, 2014, provisional application No. 61/941,888, filed on Feb. 19, 2014.

(51) Int. Cl.
*H04B 1/38* (2015.01)
*H01Q 3/24* (2006.01)
(Continued)

(52) U.S. Cl.
CPC .................. *H01Q 3/24* (2013.01); *G01C 21/20* (2013.01); *G01R 23/02* (2013.01); *G01R 25/00* (2013.01);
(Continued)

(58) Field of Classification Search
CPC ......... H01Q 1/243; H01Q 13/10; H01Q 3/24; H01Q 5/48; H01Q 21/12; H01Q 1/38; H01Q 5/371; H01Q 9/42; H01Q 9/16; H01Q 21/29; H01Q 1/2291; H01Q 21/0006; H01Q 9/30; H01Q 9/40; H01Q 9/28; H01Q 5/40; H01Q 9/04; H01Q 5/0024; H01Q 9/0442; H01Q 13/103; H01Q 9/145; H01Q 1/50; H01Q 21/00; H01Q 21/28; H01Q 5/00; H01Q 3/34; H04B 7/0404; H04B 1/38; H04B 7/024; H04B 7/0632; H04B 1/401; H04B 7/0413; H04B 7/0417; H04B 1/0053; H04B 7/0628; H03J 5/244; H03J 5/0245; H03J 5/242; H03J 2200/15; H04W 36/18; H04W 72/085; H04W 40/12; H04W 72/0486; H04W 28/12; H04W 24/08; H04W 64/003; H04W 36/08; H04W 4/026; H04W 36/32; H04W 24/10; H04W 72/0453; H04W 88/06; G01R 25/00; G01R 29/10; G01R 23/02; G01R 29/0807; G01C 21/20
USPC .......... 375/219, 304, 315; 343/702, 893, 843, 343/745, 703, 770
See application file for complete search history.

(56) References Cited

U.S. PATENT DOCUMENTS 2,947,987 A  8/1960 Dodington
3,646,559 A  2/1972 Wiley
(Continued)

OTHER PUBLICATIONS

"PCT International Search Report and Written Opinion for International Application No. PCT/US07/76667", Date of Mailing: Aug. 20, 2008.
(Continued)

*Primary Examiner* — Dhaval Patel
(74) *Attorney, Agent, or Firm* — Guntin & Gust, PLLC; Robert Gingher

(57) ABSTRACT

A communication device that incorporates the subject disclosure may include, for example, a conductive cover, an antenna structure, and a circuit. The antenna structure can comprise a first portion of the conductive cover having a first slot formed therein. The first portion can form a first antenna element for converting between first electromagnetic signals and first electrical signals. The first slot can define a shape of a trade dress design in the conductive cover. The circuit can be communicatively coupled to first edges of the first slot to define a first port. The circuit can perform operations comprising transmitting the first electronic signals into the first antenna element. Other embodiments are disclosed.

20 Claims, 100 Drawing Sheets

(51) Int. Cl.

| | | |
|---|---|---|
| *H01Q 3/34* | (2006.01) | |
| *H01Q 1/24* | (2006.01) | |
| *H01Q 13/10* | (2006.01) | |
| *G01R 29/10* | (2006.01) | |
| *H01Q 1/50* | (2006.01) | |
| *H01Q 5/00* | (2015.01) | |
| *H01Q 9/14* | (2006.01) | |
| *G01R 25/00* | (2006.01) | |
| *H01Q 9/04* | (2006.01) | |
| *H01Q 21/00* | (2006.01) | |
| *H03J 5/02* | (2006.01) | |
| *G01R 23/02* | (2006.01) | |
| *H04W 24/08* | (2009.01) | |
| *H04W 28/12* | (2009.01) | |
| *H04W 40/12* | (2009.01) | |
| *H04B 7/04* | (2006.01) | |
| *H04B 7/06* | (2006.01) | |
| *H04W 72/04* | (2009.01) | |
| *H04W 24/10* | (2009.01) | |
| *H04W 72/08* | (2009.01) | |
| *H04W 36/18* | (2009.01) | |
| *H01Q 21/28* | (2006.01) | |
| *G01R 29/08* | (2006.01) | |
| *H01Q 1/52* | (2006.01) | |
| *H04B 1/401* | (2015.01) | |
| *H03J 5/24* | (2006.01) | |
| *H04B 1/00* | (2006.01) | |
| *H04W 4/02* | (2009.01) | |
| *H04W 36/08* | (2009.01) | |
| *H04W 36/32* | (2009.01) | |
| *H04W 64/00* | (2009.01) | |
| *H04B 7/02* | (2006.01) | |
| *G01C 21/20* | (2006.01) | |
| *G01S 5/00* | (2006.01) | |
| *H01Q 1/22* | (2006.01) | |
| *H01Q 1/38* | (2006.01) | |
| *H01Q 9/16* | (2006.01) | |
| *H01Q 9/28* | (2006.01) | |
| *H01Q 9/30* | (2006.01) | |
| *H01Q 9/40* | (2006.01) | |
| *H01Q 9/42* | (2006.01) | |
| *H01Q 21/12* | (2006.01) | |
| *H01Q 21/29* | (2006.01) | |
| *H01Q 5/371* | (2015.01) | |
| *H01Q 5/40* | (2015.01) | |
| *H01Q 5/48* | (2015.01) | |
| *H04W 88/08* | (2009.01) | |
| *H04W 88/06* | (2009.01) | |

(52) U.S. Cl.
CPC ............ *G01R 29/0807* (2013.01); *G01R 29/10* (2013.01); *G01S 5/0009* (2013.01); *H01Q 1/2291* (2013.01); *H01Q 1/243* (2013.01); *H01Q 1/38* (2013.01); *H01Q 1/50* (2013.01); *H01Q 1/521* (2013.01); *H01Q 3/34* (2013.01); *H01Q 5/00* (2013.01); *H01Q 5/0024* (2013.01); *H01Q 5/371* (2015.01); *H01Q 5/40* (2015.01); *H01Q 5/48* (2015.01); *H01Q 9/04* (2013.01); *H01Q 9/0442* (2013.01); *H01Q 9/145* (2013.01); *H01Q 9/16* (2013.01); *H01Q 9/28* (2013.01); *H01Q 9/30* (2013.01); *H01Q 9/40* (2013.01); *H01Q 9/42* (2013.01); *H01Q 13/10* (2013.01); *H01Q 13/103* (2013.01); *H01Q 21/00* (2013.01); *H01Q 21/0006* (2013.01); *H01Q 21/12* (2013.01); *H01Q 21/28* (2013.01); *H01Q 21/29* (2013.01); *H03J 5/0245* (2013.01); *H03J 5/242* (2013.01); *H03J 5/244* (2013.01); *H04B 1/0053* (2013.01); *H04B 1/38* (2013.01); *H04B 1/401* (2013.01); *H04B 7/024* (2013.01); *H04B 7/0404* (2013.01); *H04B 7/0413* (2013.01); *H04B 7/0417* (2013.01); *H04B 7/0628* (2013.01); *H04B 7/0632* (2013.01); *H04W 4/026* (2013.01); *H04W 24/08* (2013.01); *H04W 24/10* (2013.01); *H04W 28/12* (2013.01); *H04W 36/08* (2013.01); *H04W 36/18* (2013.01); *H04W 36/32* (2013.01); *H04W 40/12* (2013.01); *H04W 64/003* (2013.01); *H04W 72/0453* (2013.01); *H04W 72/0486* (2013.01); *H04W 72/085* (2013.01); *H03J 2200/15* (2013.01); *H04W 88/06* (2013.01); *H04W 88/08* (2013.01)

(56) References Cited

U.S. PATENT DOCUMENTS

| | | |
|---|---|---|
| 5,047,787 A | 9/1991 | Hogberg |
| 5,189,434 A | 2/1993 | Bell |
| 5,463,406 A | 10/1995 | Vannatta |
| 5,617,102 A | 4/1997 | Prater |
| 6,069,590 A | 5/2000 | Thompson |
| 6,141,539 A | 10/2000 | Marino |
| 6,509,883 B1 | 1/2003 | Foti |
| 6,573,869 B2 | 6/2003 | Moore |
| 6,876,337 B2 | 4/2005 | Larry |
| 6,897,808 B1 | 5/2005 | Murch |
| 6,930,642 B2 | 8/2005 | Kossiavas |
| 7,187,945 B2 | 3/2007 | Ranta |
| 7,251,499 B2 | 7/2007 | Ella |
| 7,340,277 B2 | 3/2008 | Nakamura |
| 8,269,683 B2 | 9/2012 | McKinzie et al. |
| 8,988,290 B2 * | 3/2015 | Ozden et al. .................. 343/702 |
| 9,130,274 B1 | 9/2015 | Vincent |
| 2001/0038332 A1 | 11/2001 | Rodgers et al. |
| 2004/0166881 A1 | 8/2004 | Farchmin et al. |
| 2005/0128137 A1 | 6/2005 | Lee et al. |
| 2005/0200535 A1 | 9/2005 | Elkobi |
| 2006/0050009 A1 | 3/2006 | Ho |
| 2006/0082503 A1 | 4/2006 | Gaucher et al. |
| 2006/0132360 A1 | 6/2006 | Caimi et al. |
| 2006/0281423 A1 | 12/2006 | Caimi et al. |
| 2007/0060089 A1 | 3/2007 | Owen |
| 2007/0222697 A1 | 9/2007 | Caimi et al. |
| 2008/0048917 A1 | 2/2008 | Achour et al. |
| 2008/0075146 A1 | 3/2008 | Rofougaran et al. |
| 2008/0123771 A1 | 5/2008 | Cranford et al. |
| 2008/0192849 A1 | 8/2008 | Kim et al. |
| 2009/0237313 A1 | 9/2009 | Martinez et al. |
| 2009/0315792 A1 | 12/2009 | Miyashita et al. |
| 2010/0289701 A1 | 11/2010 | DeJean et al. |
| 2012/0068893 A1 * | 3/2012 | Guterman et al. ............ 343/702 |
| 2013/0065543 A1 | 3/2013 | Ayatollahi et al. |
| 2013/0077551 A1 | 3/2013 | Lo et al. |
| 2013/0077554 A1 | 3/2013 | Gauvreau et al. |
| 2013/0093568 A1 | 4/2013 | Gay et al. |
| 2013/0234901 A1 | 9/2013 | Chang et al. |
| 2013/0281036 A1 | 10/2013 | Kolokotronis et al. |
| 2013/0307742 A1 | 11/2013 | Hu et al. |
| 2013/0335280 A1 | 12/2013 | Chen, III et al. |
| 2013/0336242 A1 | 12/2013 | Rajagopal et al. |
| 2014/0010125 A1 | 1/2014 | Tillman et al. |
| 2014/0024321 A1 | 1/2014 | Zhu et al. |
| 2014/0241190 A1 | 8/2014 | Park et al. |
| 2014/0256273 A1 | 9/2014 | Pelosi et al. |
| 2014/0306857 A1 * | 10/2014 | Bevelacqua et al. .......... 343/750 |
| 2014/0347248 A1 * | 11/2014 | Stjernman ..................... 343/893 |
| 2015/0041541 A1 | 2/2015 | Qu et al. |
| 2015/0042537 A1 | 2/2015 | du Toit et al. |
| 2015/0055454 A1 | 2/2015 | Yang |
| 2015/0078286 A1 | 3/2015 | Kim |

(56) References Cited

U.S. PATENT DOCUMENTS

| | | |
|---|---|---|
| 2015/0092636 A1 | 4/2015 | Rofougaran et al. |
| 2015/0111602 A1 | 4/2015 | Beattie |
| 2015/0116161 A1 | 4/2015 | Caimi |
| 2015/0116162 A1 | 4/2015 | Caimi |
| 2015/0116163 A1 | 4/2015 | Caimi |
| 2015/0119045 A1 | 4/2015 | Montgomery et al. |
| 2015/0245251 A1 | 8/2015 | Somayazulu |
| 2015/0249531 A1 | 9/2015 | Lindoff et al. |
| 2015/0271788 A1 | 9/2015 | Kim |

OTHER PUBLICATIONS

"PCT International Search Report and Written Opinion for International Application No. PCT/US08/60723", Date of Mailing: Aug. 6, 2008.

Anderson, et al., "Decoupling and Descattering Networks for Antennas", IEEE Transactions on Antennas and Propagation, Nov. 1976.

Caimi, Frank M. et al., "Antenna Structures and Methods Thereof", U.S. Appl. No. 14/285,262, filed May 22, 2014.

Caimi, Frank M. et al., "U.S. Appl. No. 14/257,592", Antenna Structures and Methods Thereof, filed Apr. 21, 2014.

Caimi, Frank M. et al., "U.S. Appl. No. 14/257,624", Antenna Structures and Methods Thereof, filed Apr. 21, 2014.

Diallo, A. et al., "Efficient Two-Port Antenna System for GSM/DCS/UMTS Multimode Mobile Phones", Electronics Letters, Mar. 29, 2007 vol. 43 No.

Diallo, A. et al., "Enhanced Diversity Antennas for Umts Handsets", Antennas and Propagation, 2006. EuCAP 2006. First European Conference.

Diallo, A. et al., "Estimation of the Diversity Performance of Several Two-Antenna Systems in Different Propagation Environments", Antennas and Propagation Society International Symposium, 2007 IEEE.

Diallo, A. et al., "Evaluation of the Performances of Several Four-Antenna Systems in a Reverberation Chamber", Antenna Technology: Small and Smart Antennas Metamaterials and Applications, 2007. IWAT '07.

Diallo, A. et al., "Mimo Performance of Enhanced Umts Four-Antenna Structures For Mobile Phones in the Presence of the User's Head", Antennas and Propagation Society International Symposium, 2007 IEEE.

Diallo, A. et al., "Reverberation Chamber Evaluation of Multi-Antenna Handsets Having Low Mutual Coupling and High Efficiencies", In proceeding of: Proceedings of the European Conference on Antennas and Propagation EuCAP 2006, Nov. 6-10, 2006.

Diallo, A. et al., "Study and Reduction of the Mutual Coupling Between Two Mobile Phone PIFAs Operating in the DCS1800 and UMTS Bands", IEEE Transactions on Antennas and Propagation, vol. 54, No. 11, Nov. 2006.

Dossche, et al., "Three Different Ways to Decorrelate Two Closely Spaced Monopoles for MIMO Applications", IEEE 2005.

Foltz, et al., "Multielement Top-loaded Vertical Antennas with Mutually Isolated Input Ports", University of Texas, Pan American, Electrical Engineering, pp. 1-24, GloMo 1998.

Ko, et al., "Compact Integrated Diversity Antenna for Wireless Communications", IEEE Transactions on Antennas and Propagation, vol. 49, No. 6, Jun. 2001.

Lau, et al., "Impact of Matching Network on Bandwidth of Compact Antenna Arrays", IEEE Transactions on Antennas and Propagation, vol. 54, No. 11, Nov. 2006.

Ranvier, et al., "Mutual Coupling Reduction for Patch Antenna Array", Proceedings of the European Conference on Antennas and Propagation: EuCAP 2006 (ESA SP-626). Nov. 6-10, 2006.

Ranvier, S. et al., "Capacity Enhancement by Increasing Both Mutual Coupling and Efficiency: a Novel Approach", Antennas and Propagation Society International Symposium, 2007 IEEE.

Stjernman, et al., "Antenna Mutual Coupling Effects on Correlation, Efficiency and Shannon Capacity in MIMO Wireless Systems", EuCAP 2006—European Conference on Antennas & Propagation, Nov. 6, 2006.

Wallace, et al., "Mutual Coupling in MIMO Wireless Systems: A Rigorous Network Theory Analysis", Wireless Communications, IEEE Transactions, Jul. 2004.

Wallace, et al., "Termination-Dependent Diversity Performance of Coupled Antennas: Network Theory Analysis", IEEE Transactions on Antennas and Propagation, vol. D 52, No. 1, Jan. 2004.

Wallace, et al., "The Capacity of MIMO Wireless Systems with Mutual Coupling", Vehicular Technology Conference, 2002. Proceedings. VTC 2002-Fall. 2002 IEEE 56th (vol. 2).

* cited by examiner

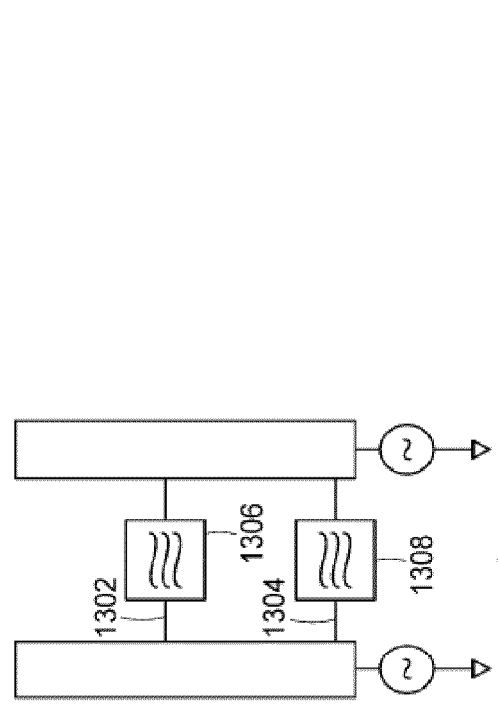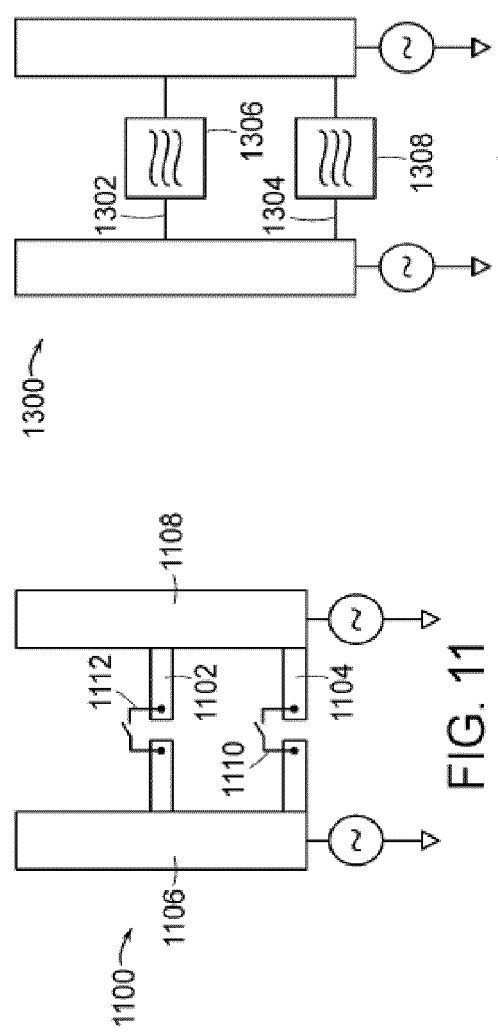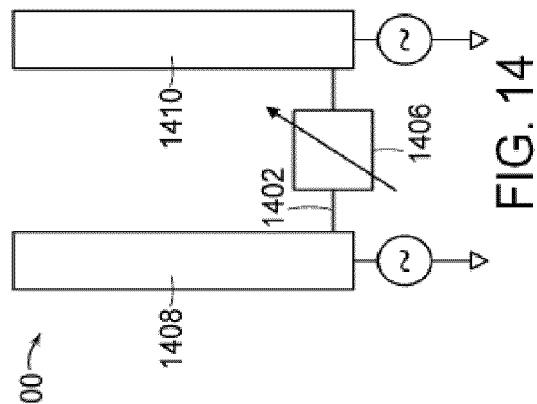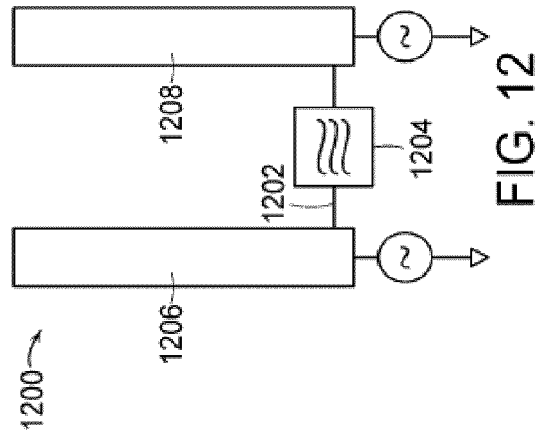

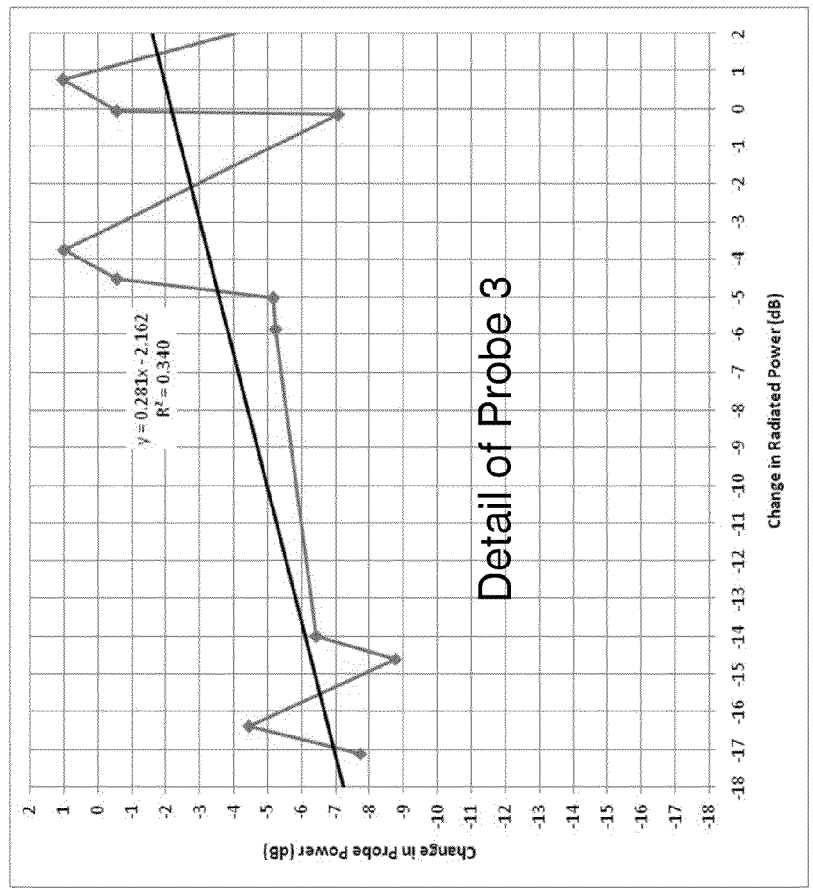
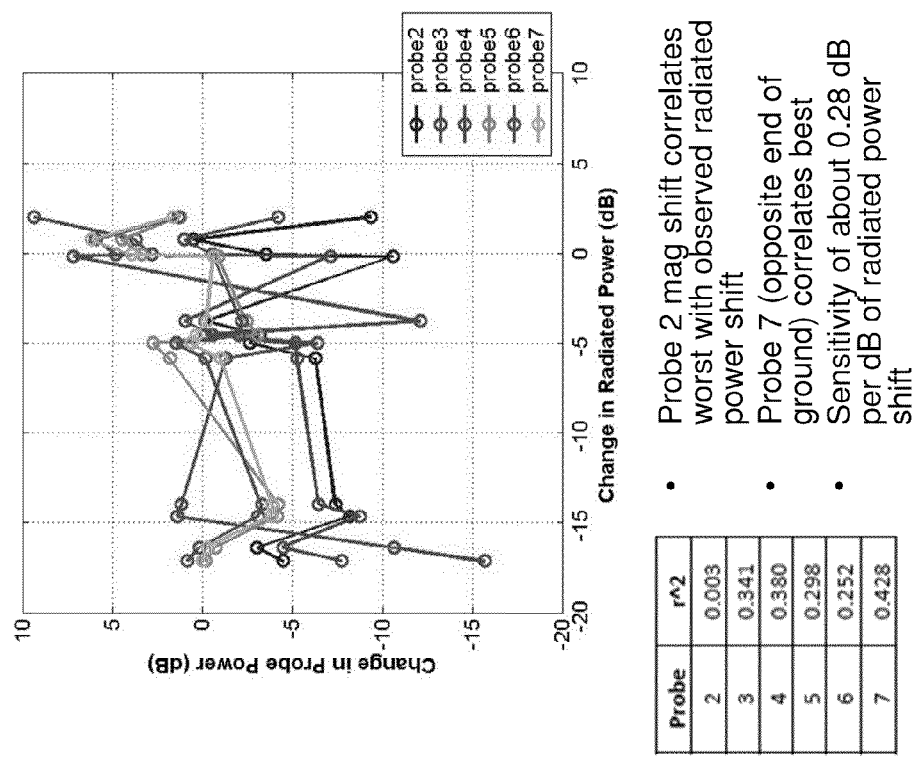
FIG. 44

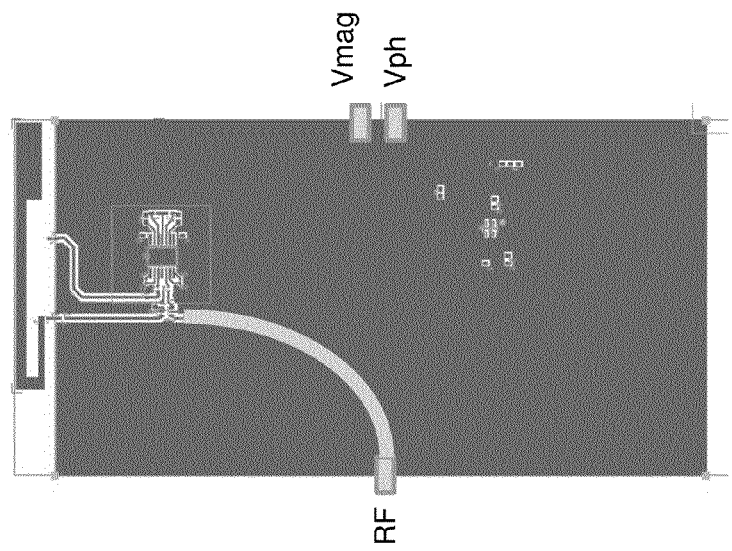
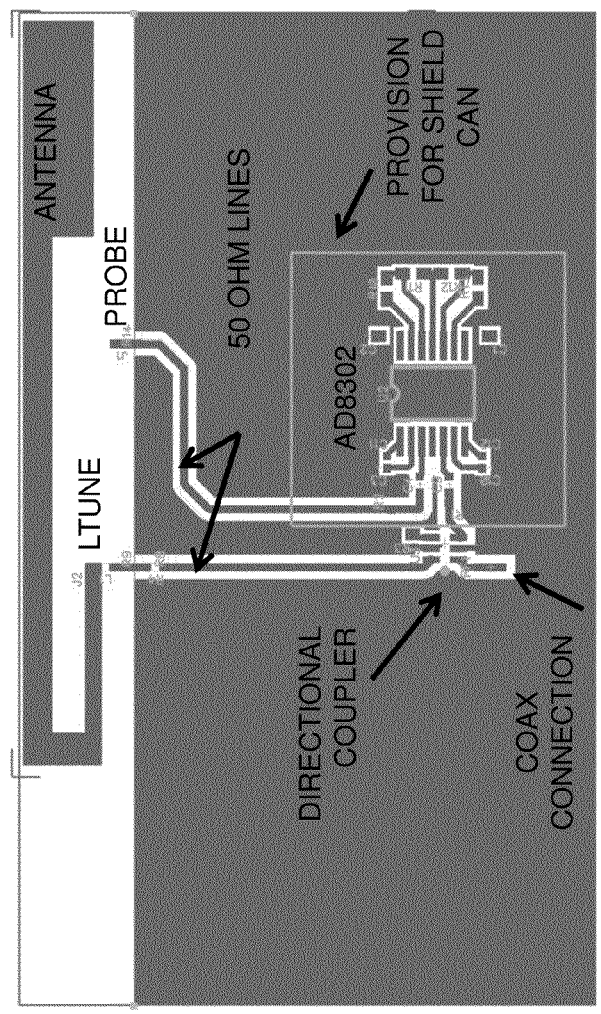
FIG. 50

5300

5400

ANTENNA STRUCTURES AND METHODS

CROSS REFERENCE TO RELATED APPLICATIONS

The present application claims the benefit of priority to U.S. Provisional Application No. 61/896,233 filed on Oct. 28, 2013, which is hereby incorporated herein by reference in its entirety.

The present application claims the benefit of priority to U.S. Provisional Application No. 61/932,831 filed on Jan. 29, 2014, which is hereby incorporated herein by reference in its entirety.

The present application claims the benefit of priority to U.S. Provisional Application No. 61/941,888 filed on Feb. 19, 2014, which is hereby incorporated herein by reference in its entirety.

FIELD OF THE DISCLOSURE

The present disclosure relates generally to antenna structures and methods thereof.

BACKGROUND

It is common for communications devices to have multiple antennas that are packaged close together (e.g., less than a quarter of a wavelength apart) and that can operate simultaneously within the same frequency band. Common examples of such communications devices include portable communications products such as cellular handsets, personal digital assistants (PDAs), and wireless networking devices or data cards for personal computers (PCs).

Many system architectures (such as Multiple Input Multiple Output (MIMO)) and standard protocols for mobile wireless communications devices (such as 802.11n for wireless LAN, and 3G and 4G data communications such as 802.16e (WiMAX), HSDPA, 1×EVDO, and LTE) may require multiple antennas operating simultaneously.

BRIEF DESCRIPTION OF THE DRAWINGS

Reference will now be made to the accompanying drawings, which are not necessarily drawn to scale, and wherein:

FIG. 11 illustrates an antenna structure including connecting elements having switches in accordance with one or more embodiments of the disclosure;

FIG. 12 illustrates an antenna structure having a connecting element with a filter coupled thereto in accordance with one or more embodiments of the disclosure;

FIG. 13 illustrates an antenna structure having two connecting elements with filters coupled thereto in accordance with one or more embodiments of the disclosure;

FIG. 14 illustrates an antenna structure having a tunable connecting element in accordance with one or more embodiments of the disclosure;

FIGS. 25A, 25B, 25C, 25D, 24E, 25F, and 25G illustrate a comparison of antenna pattern test measurement results.

FIG. 44 depicts illustrative embodiments of probe power shift vs. antenna radiated power shift plots of the probes;

FIG. 50 depicts an illustrative embodiment of the near field sensor of FIG. 49 on a printed circuit board;

DETAILED DESCRIPTION

Figure 1A:
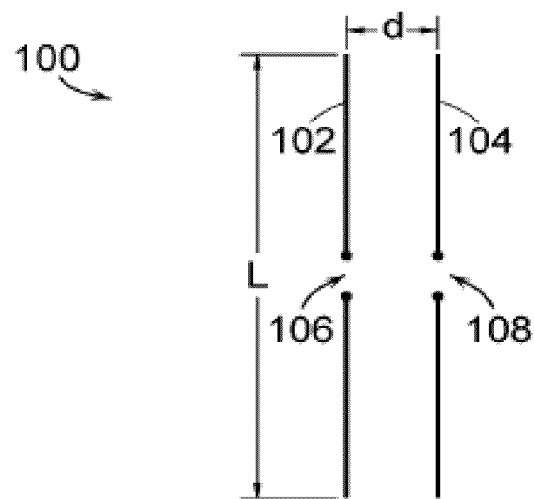
FIG. 1A illustrates an antenna structure with two parallel dipoles.
Figure 1B:
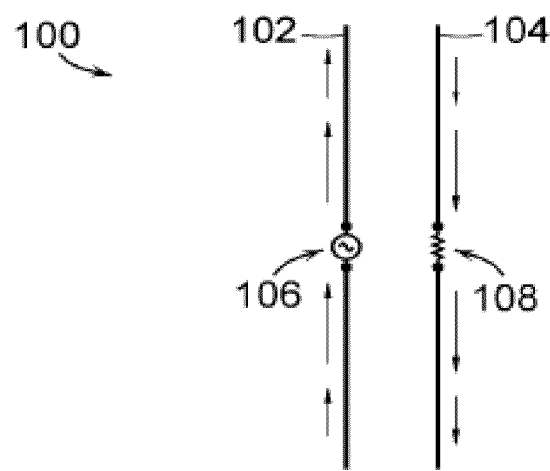
FIG. 1B illustrates current flow resulting from excitation of one dipole in the antenna structure of FIG. 1A.

The subject disclosure describes, among other things, illustrative embodiments for slot antenna structures in a conductive cover of an electronic device, where the antenna structures define a trade dress design in the conductive cover. Other embodiments are described in the subject disclosure.

One embodiment of the subject disclosure includes an antenna structure comprising a conductive cover of an electronic device, a first antenna element, a second antenna element, and a trade dress design in the conductive cover. The first antenna element can convert between first electromagnetic signals and first electrical signals. The first antenna element can comprise a first portion of the conductive cover having a first opening formed therein. The first antenna element can be communicatively coupled to first antenna ports. The second antenna element can convert between second electromagnetic signals and second electrical signals. The second antenna element can comprise a second portion of the conductive cover having a second opening formed therein. The second antenna element can be communicatively coupled to second antenna ports. A shape of the trade dress design can be defined by the first opening and the second opening.

One embodiment of the subject disclosure includes a communication device comprising a conductive cover, an antenna structure, and a circuit. The antenna structure can comprise a first portion of the conductive cover having a first slot formed therein. The first portion can form a first antenna element for converting between first electromagnetic signals and first electrical signals. The first slot can define a shape of a trade dress design in the conductive cover. The circuit can communicatively couple to first antenna ports. The circuit can perform operations comprising transmitting the first electronic signals into the first antenna element.

One embodiment of the subject disclosure includes a method for transmitting, by a device comprising a processor, first electronic signals to a first slot antenna element. The first electronic signals can generate first electromagnetic signals via the first slot antenna element. The first slot antenna can comprise a first portion of a conductive cover of the device having a first opening formed therein. The method can include receiving, by the device, second electrical signals from a second slot antenna element. The second electrical signals can be generated via second electromagnetic signals received by the second slot antenna element. The second slot antenna can comprise a second portion of the conductive cover having a second opening formed therein. A shape of a trade dress design in the conductive cover can be defined by one of the first opening, the second opening, or a combination thereof.

Antenna structures in accordance with various embodiments of the disclosure are particularly useful in communications devices that require multiple antennas to be packaged close together (e.g., less than a quarter of a wavelength apart), including in devices where more than one antenna is used simultaneously and within the same frequency band or multiple frequency bands in cases where carrier aggregation is required. Common examples of such devices in which the antenna structures can be used include portable communications products such as cellular handsets, PDAs, smart phones, tablets, and wireless networking devices or data cards for PCs or other equipment integrated communication devices such as automobiles, trucks, or other vehicle categories. The antenna structures are also useful with system architectures such as MIMO and standard protocols for mobile wireless communications devices (such as 802.11n for wireless LAN, and 3G and 4G data communications such as 802.16e (WiMAX), HSDPA, 1×EVDO, LTE) that require multiple antennas operating simultaneously. The embodiments of the subject disclosure can be applied to future generations of wireless communication protocols such as 5G.

FIGS. 1A-1G illustrate the operation of an antenna structure 100. FIG. 1A schematically illustrates the antenna structure 100 having two parallel antennas, in particular parallel dipoles 102, 104, of length L. The dipoles 102, 104 are separated by a distance d, and are not connected by any connecting element. The dipoles 102, 104 have a fundamental resonant frequency that corresponds approximately to $L=\lambda/2$. Each dipole is connected to an independent transmit/receive system, which can operate at the same frequency. This system connection can have the same characteristic impedance $z_0$ for both antennas, which in this example is 50 ohms.

When one dipole is transmitting a signal, some of the signal being transmitted by the dipole will be coupled directly into the neighboring dipole. The maximum amount of coupling generally occurs near the half-wave resonant frequency of the individual dipole and generally increases as the separation distance d is made smaller. For example, for $d<\lambda/3$, the magnitude of coupling is greater than 0.1 or −10 dB, and for $d<\lambda/8$, the magnitude of the coupling is greater than −5 dB.

It is desirable to have no coupling (i.e., complete isolation) or to reduce the coupling (i.e., at least reduced isolation) between the antennas. If the coupling is, e.g., −10 dB, 10 percent of the transmit power is lost due to that amount of power being directly coupled into the neighboring antenna. There may also be detrimental system effects such as saturation or desensitization of a receiver connected to the neighboring antenna or degradation of the performance of a transmitter connected to the neighboring antenna. Currents induced on the neighboring antenna distort the gain pattern compared to that generated by an individual dipole. This effect is known to reduce the correlation between the gain patterns produced by the dipoles. Thus, while coupling may provide some pattern diversity, it has detrimental system impacts as described above.

Because of the close coupling, the antennas do not act independently and can be considered an antenna system having two pairs of terminals or ports that correspond to two different gain patterns. Use of either port involves substantially the entire structure including both dipoles. The parasitic excitation of the neighboring dipole enables diversity to be achieved at close dipole spacing, but currents excited on the dipole pass through the source impedance, and therefore manifest mutual coupling between ports.

Figure 1C:
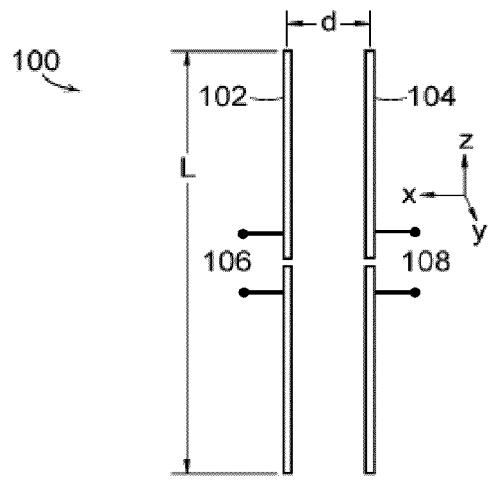
FIG. 1C illustrates a model corresponding to the antenna structure of FIG. 1A.
Figure 1D:
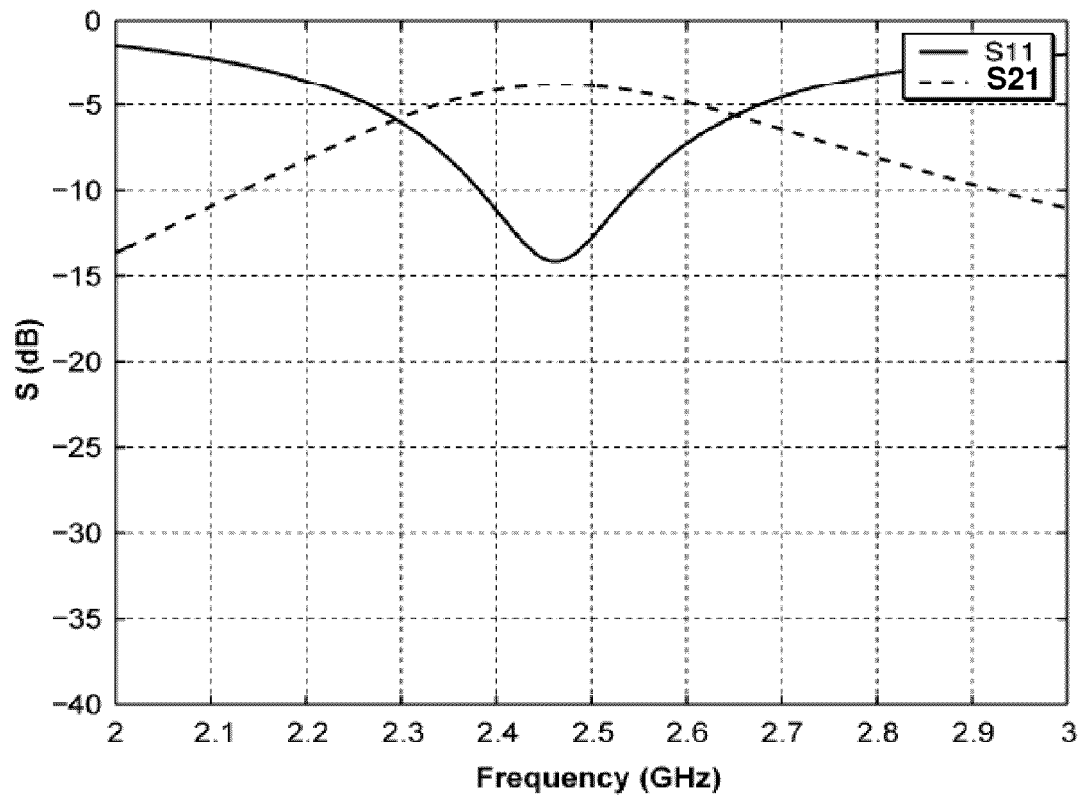
FIG. 1D is a graph illustrating scattering parameters for the FIG. 1C antenna structure.

FIG. 1C illustrates a model dipole pair corresponding to the antenna structure 100 shown in FIG. 1 used for simulations. In this example, the dipoles 102, 104 have a square cross section of 1 mm×1 mm and length (L) of 56 mm. These dimensions yield a center resonant frequency of 2.45 GHz when attached to a 50-ohm source. The free-space wavelength at this frequency is 122 mm. A plot of the scattering parameters S11 and S21 for a separation distance (d) of 10 mm, or approximately $\lambda/12$, is shown in FIG. 1D. Due to symmetry and reciprocity, S22=S11 and S12=S21. For simplicity, only S11 and S21 are shown and discussed. In this configuration, the coupling between dipoles as represented by S21 reaches a maximum of −3.7 dB.

Figure 1E:
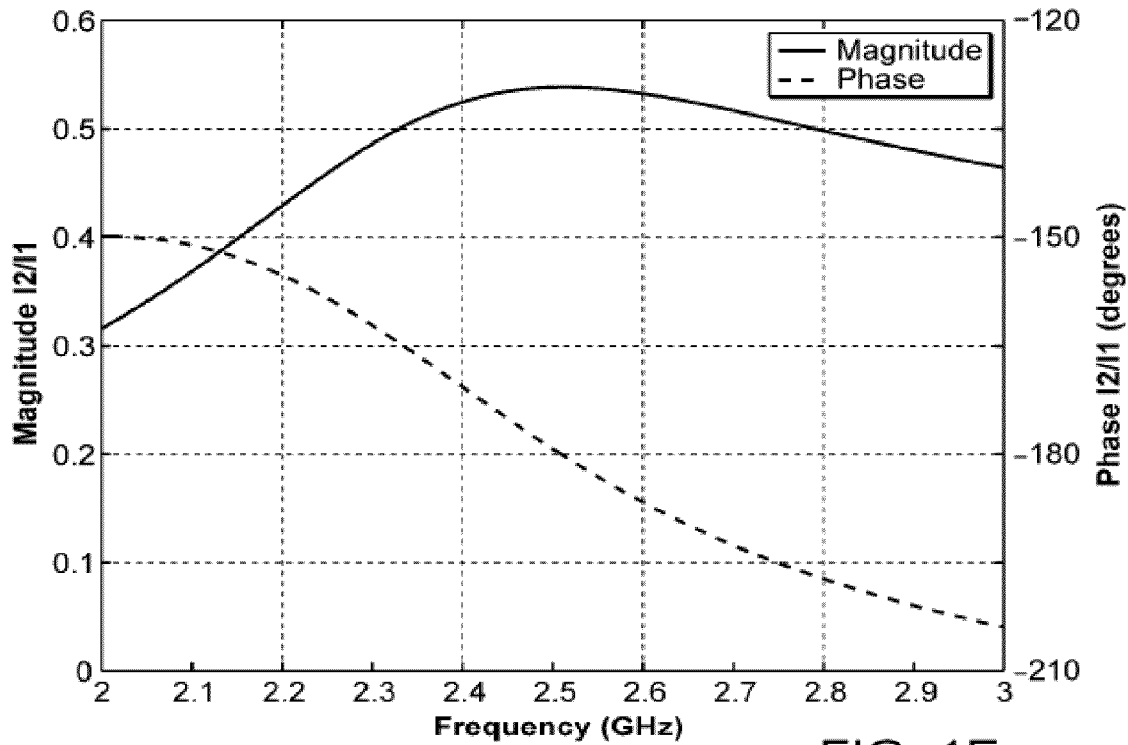
FIG. 1E is a graph illustrating the current ratios for the FIG. 1C antenna structure.

FIG. 1E shows the ratio (identified as "Magnitude I2/I1" in the figure) of the vertical current on dipole 104 of the antenna structure to that on dipole 102 under the condition in which port 106 is excited and port 108 is passively terminated. The frequency at which the ratio of currents (dipole 104/dipole 102) is a maximum corresponds to the frequency of 180 degree phase differential between the dipole currents and is just slightly higher in frequency than the point of maximum coupling shown in FIG. 1D.

Figure 1F:
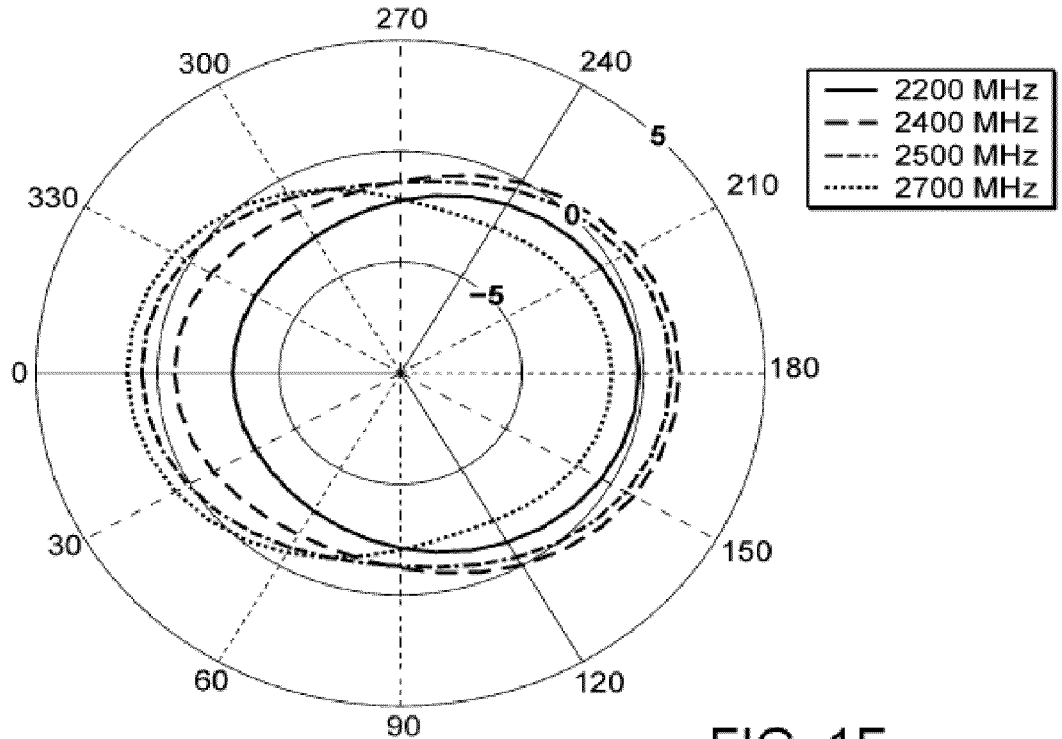
FIG. 1F is a graph illustrating gain patterns for the FIG. 1C antenna structure.

FIG. 1F shows azimuthal gain patterns for several frequencies with excitation of port 106. The patterns are not uniformly omni-directional and change with frequency due to the changing magnitude and phase of the coupling. Due to symmetry, the patterns resulting from excitation of port 108 would be the mirror image of those for port 106. Therefore, the more asymmetrical the pattern is from left to right, the more diverse the patterns are in terms of gain magnitude.

Figure 1G:
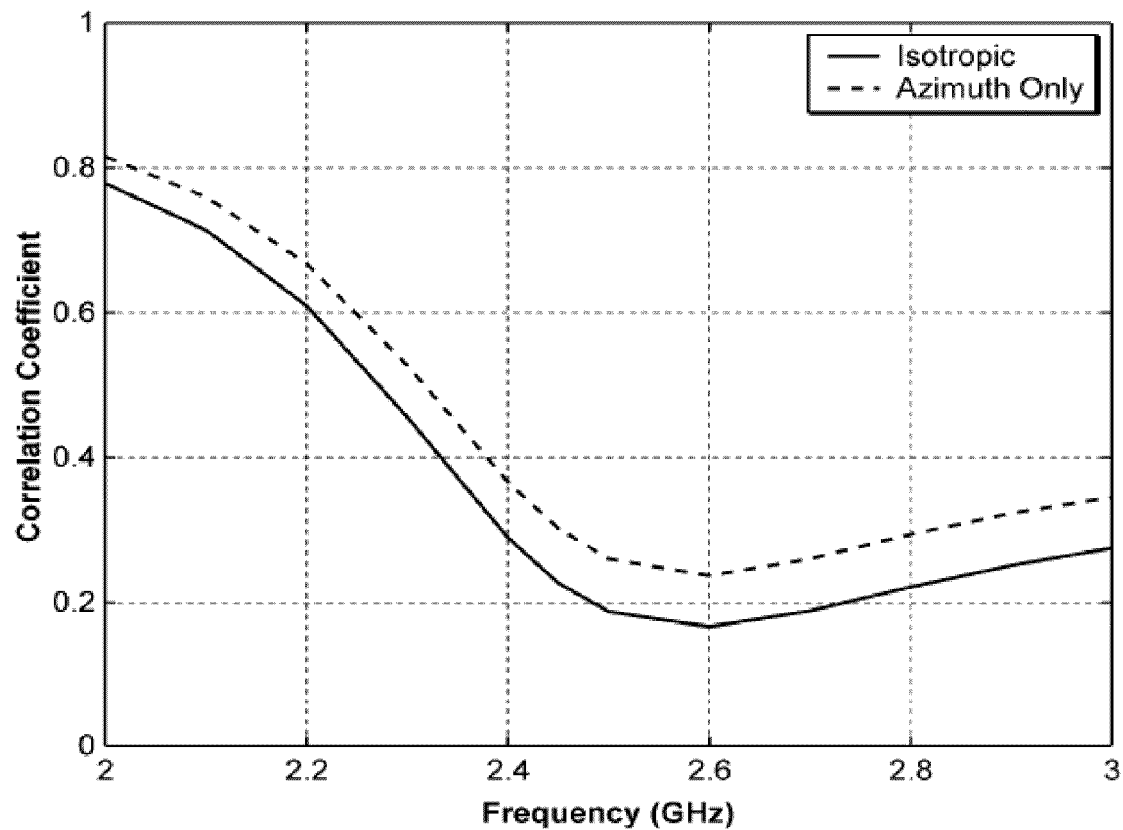
FIG. 1G is a graph illustrating envelope correlation for the FIG. 1C antenna structure.

Calculation of the correlation coefficient between patterns provides a quantitative characterization of the pattern diversity. FIG. 1G shows the calculated correlation between port 106 and port 108 antenna patterns. The correlation is much lower than is predicted by Clark's model for ideal dipoles. This is due to the differences in the patterns introduced by the mutual coupling.

Figure 2A:
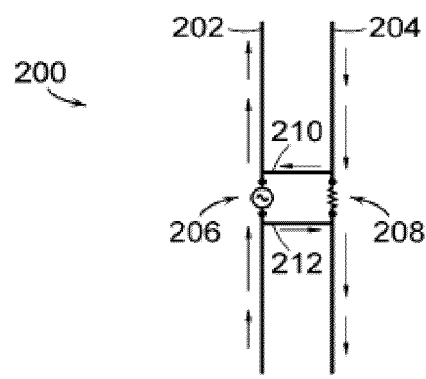
FIG. 2A illustrates an antenna structure with two parallel dipoles connected by connecting elements in accordance with one or more embodiments of the disclosure.

FIGS. 2A-2F illustrate the operation of an exemplary two port antenna structure 200 in accordance with one or more embodiments of the disclosure. The two port antenna structure 200 includes two closely-spaced resonant antenna elements 202, 204 and provides both low pattern correlation and low coupling between ports 206, 208. FIG. 2A schematically illustrates the two port antenna structure 200. This structure is similar to the antenna structure 100 comprising the pair of dipoles shown in FIG. 1B, but additionally includes horizontal conductive connecting elements 210, 212 between the dipoles on either side of the ports 206, 208. The two ports 206, 208 are located in the same locations as with the FIG. 1 antenna structure. When one port is excited, the combined structure exhibits a resonance similar to that of the unattached pair of dipoles, but with a significant reduction in coupling and an increase in pattern diversity.

Figure 2B:
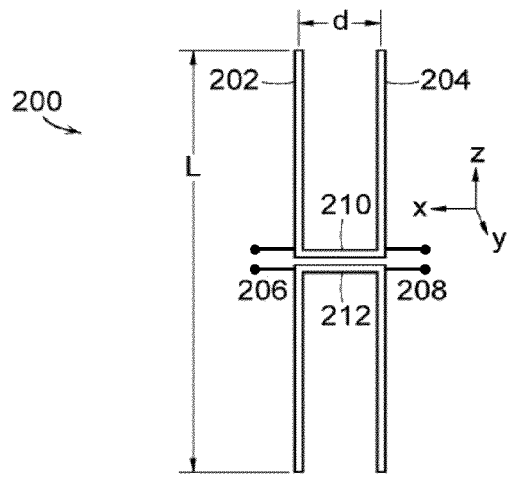
FIG. 2B illustrates a model corresponding to the antenna structure of FIG. 2A.
Figure 2C:
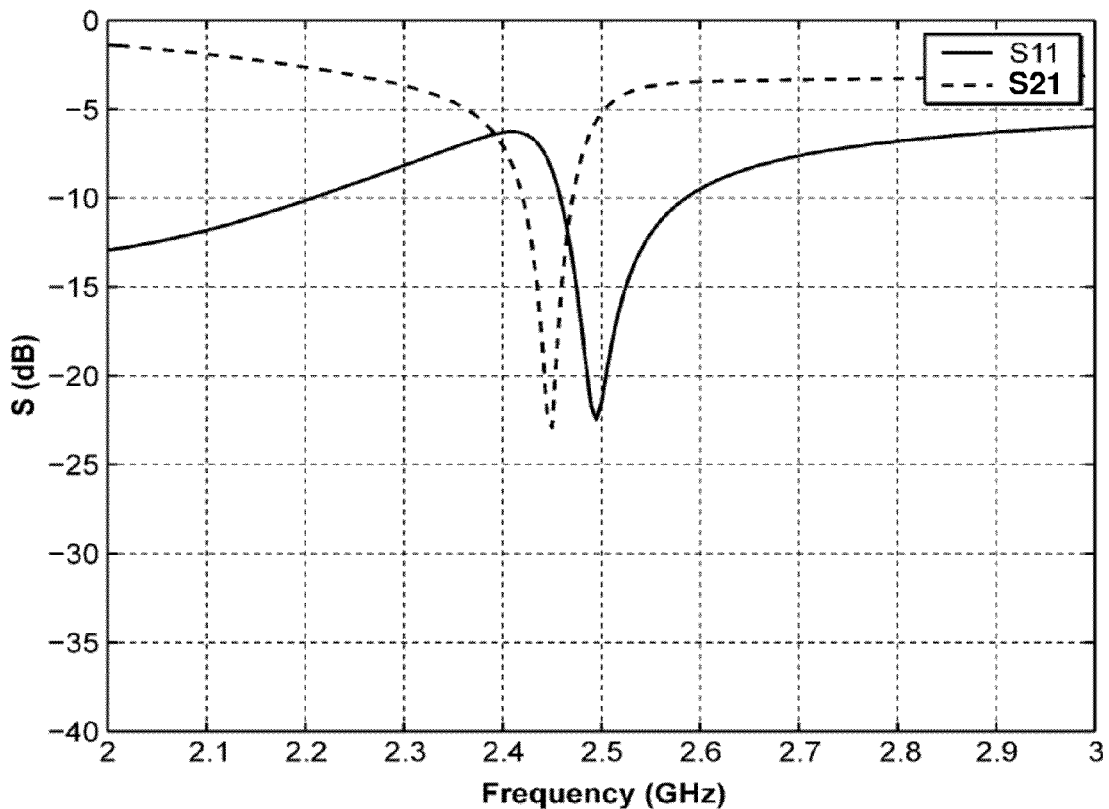
FIG. 2C is a graph illustrating scattering parameters for the FIG. 2B antenna structure.
Figure 2D:
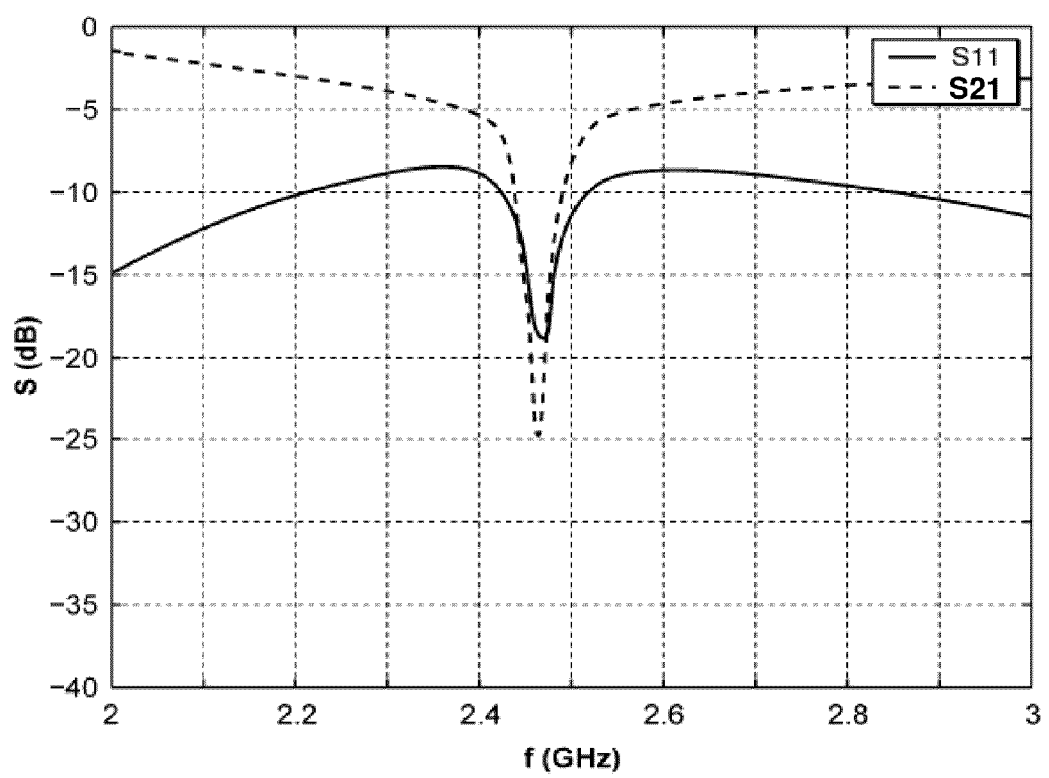
FIG. 2D is a graph illustrating scattering parameters for the FIG. 2B antenna structure with lumped element impedance matching at both ports.

An exemplary model of the antenna structure 200 with a 10 mm dipole separation is shown in FIG. 2B. This structure has generally the same geometry as the antenna structure 100 shown in FIG. 1C, but with the addition of the two horizontal connecting elements 210, 212 electrically connecting the antenna elements slightly above and below the ports. This structure shows a strong resonance at the same frequency as unattached dipoles, but with very different scattering parameters as shown in FIG. 2C. There is a deep drop-out in coupling, below −20 dB, and a shift in the input impedance as indicated by S11. In this example, the best impedance match (S11 minimum) does not coincide with the lowest coupling (S21 minimum). A matching network can be used to improve the input impedance match and still achieve very low coupling as shown in FIG. 2D. In this example, a lumped element matching network comprising a series inductor followed by a shunt capacitor was added between each port and the structure.

Figure 2E:
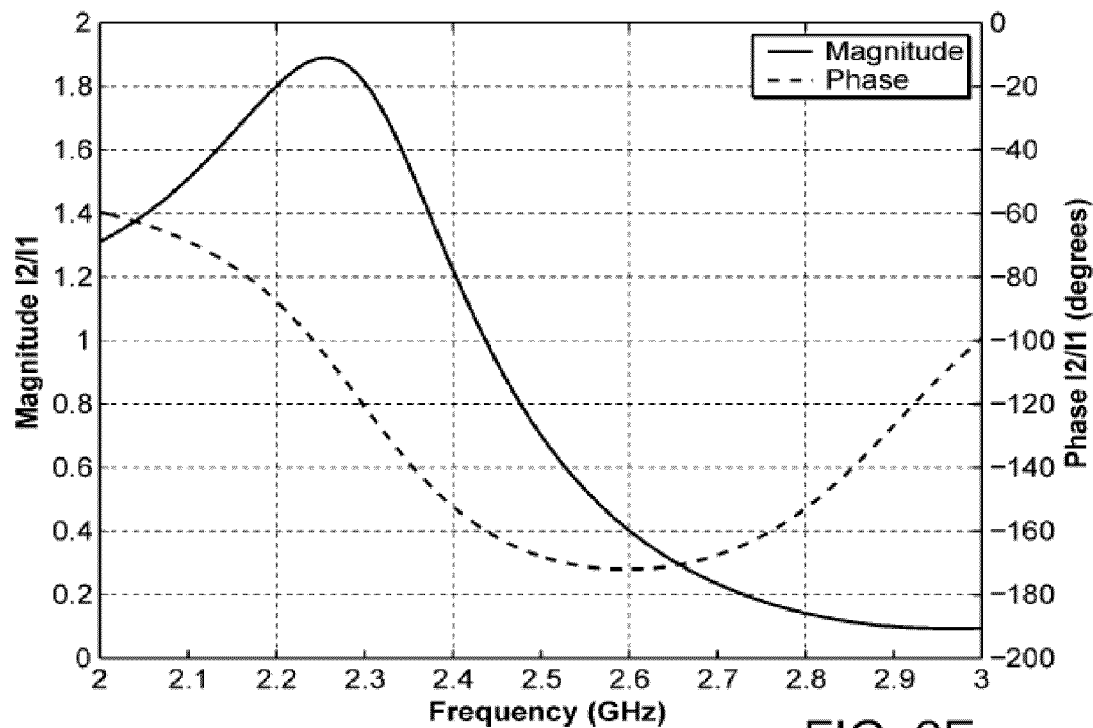
FIG. 2E is a graph illustrating the current ratios for the FIG. 2B antenna structure.
Figure 2F:
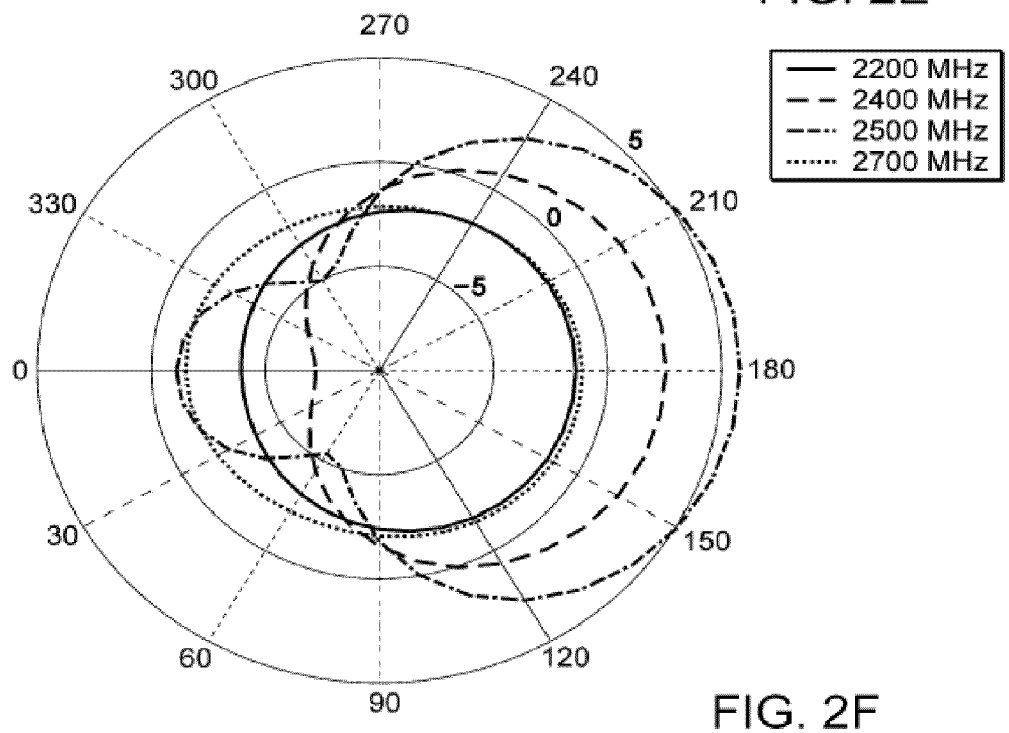
FIG. 2F is a graph illustrating gain patterns for the FIG. 2B antenna structure.

FIG. 2E shows the ratio (indicated as "Magnitude I2/I1" in the figure) of the current on dipole element 204 to that on dipole element 202 resulting from excitation of port 206. This plot shows that below the resonant frequency, the currents are actually greater on dipole element 204. Near resonance, the currents on dipole element 204 begin to decrease relative to those on dipole element 202 with increasing frequency. A point of low coupling (2.44 GHz in this case) occurs near the frequency where currents on both dipole elements are generally equal in magnitude. At this frequency, the phase of the currents on dipole element 204 lag those of dipole element 202 by approximately 160 degrees.

Unlike the FIG. 1C dipoles without connecting elements, the currents on antenna element 204 of the FIG. 2B combined antenna structure 200 are not forced to pass through the terminal impedance of port 208. Instead a resonant mode is produced where the current flows down antenna element 204, across the connecting element 210, 212, and up antenna element 202 as indicated by the arrows shown on FIG. 2A. (Note that this current flow is representative of one half of the resonant cycle; during the other half, the current directions are reversed). The resonant mode of the combined structure features the following: (1) the currents on antenna element 204 largely bypass port 208, thereby allowing for high isolation between the ports 206, 208, and (2) the magnitude of the currents on both antenna elements 202, 204 are approximately equal, which allows for dissimilar and uncorrelated gain patterns as described in further detail below.

Because the magnitude of currents is nearly equal on the antenna elements, a much more directional pattern is produced (as shown on FIG. 2F) than in the case of the FIG. 1C antenna structure 100 with unattached dipoles. When the currents are equal, the condition for nulling the pattern in the x (or phi=0) direction is for the phase of currents on dipole 204 to lag those of dipole 202 by the quantity $\pi - kd$ (where $k=2\pi/\lambda$, and $\lambda$ is the effective wavelength). Under this condition, fields propagating in the phi=0 direction from dipole 204 will be 180 degrees out of phase with those of dipole 202, and the combination of the two will therefore have a null in the phi=0 direction.

Figure 2G:
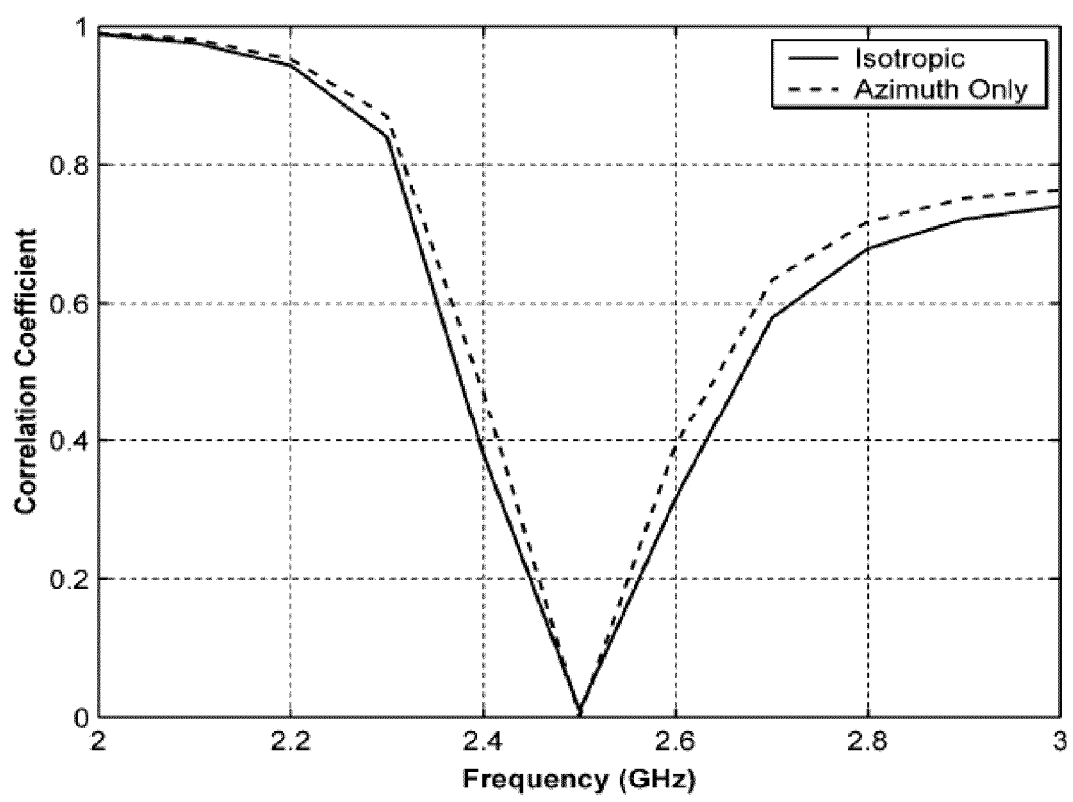
FIG. 2G is a graph illustrating envelope correlation for the FIG. 2B antenna structure.

In the model example of FIG. 2B, d is 10 mm or an effective electrical length of $\lambda/12$. In this case, kd equates $\pi/6$ or 30 degrees, and so the condition for a directional azimuthal radiation pattern with a null towards phi=0 and maximum gain towards phi=180 is for the current on dipole 204 to lag those on dipole 202 by 150 degrees. At resonance, the currents pass close to this condition (as shown in FIG. 2E), which explains the directionality of the patterns. In the case of the excitation of port 204, the radiation patterns are the mirror opposite of those of FIG. 2F, and maximum gain is in the phi=0 direction. The difference in antenna patterns produced from the two ports has an associated low predicted envelope correlation as shown on FIG. 2G. Thus the combined antenna structure has two ports that are isolated from each other and produce gain patterns of low correlation.

Figure 3A:
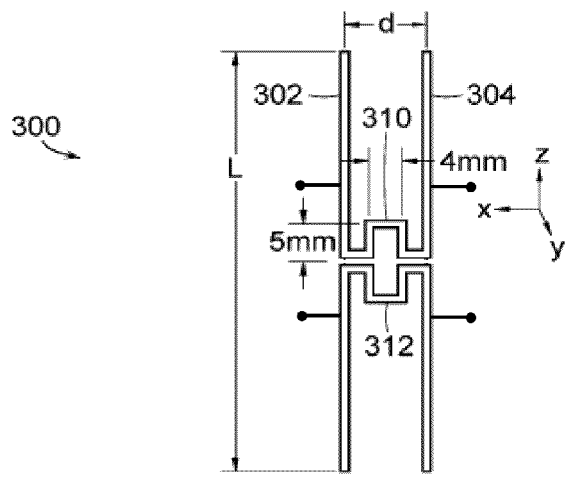
FIG. 3A illustrates an antenna structure with two parallel dipoles connected by meandered connecting elements in accordance with one or more embodiments of the disclosure.
Figure 3B:
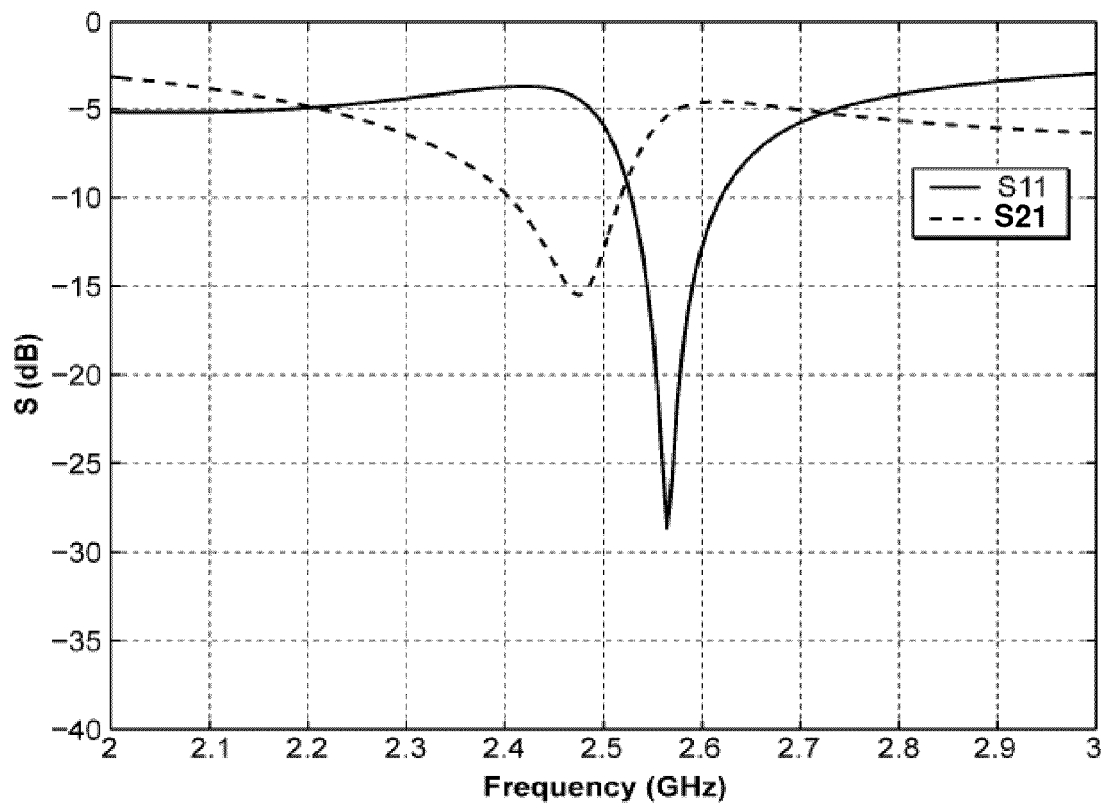
FIG. 3B is a graph showing scattering parameters for the FIG. 3A antenna structure.
Figure 3C:
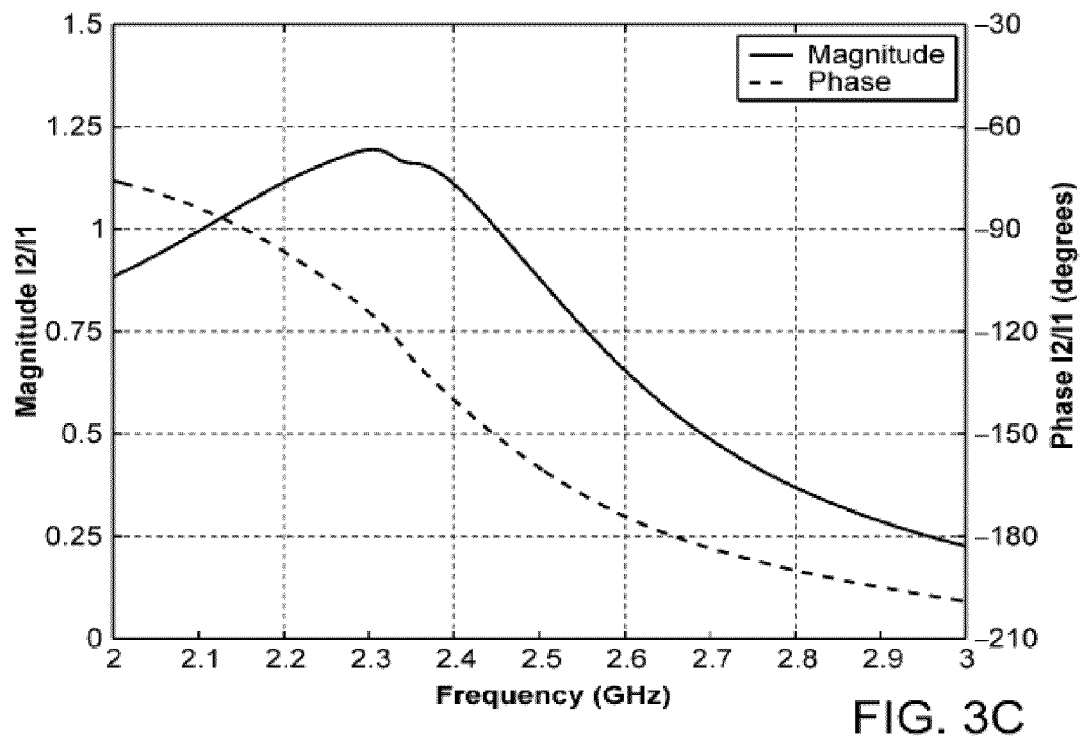
FIG. 3C is a graph illustrating current ratios for the FIG. 3A antenna structure.
Figure 3D:
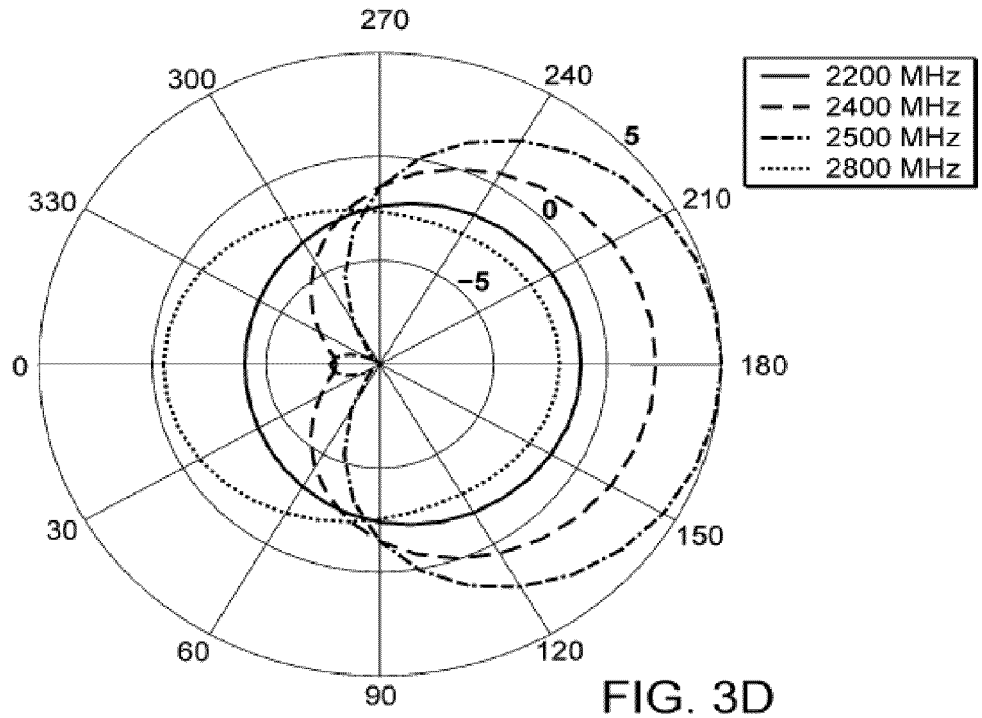
FIG. 3D is a graph illustrating gain patterns for the FIG. 3A antenna structure.
Figure 3E:
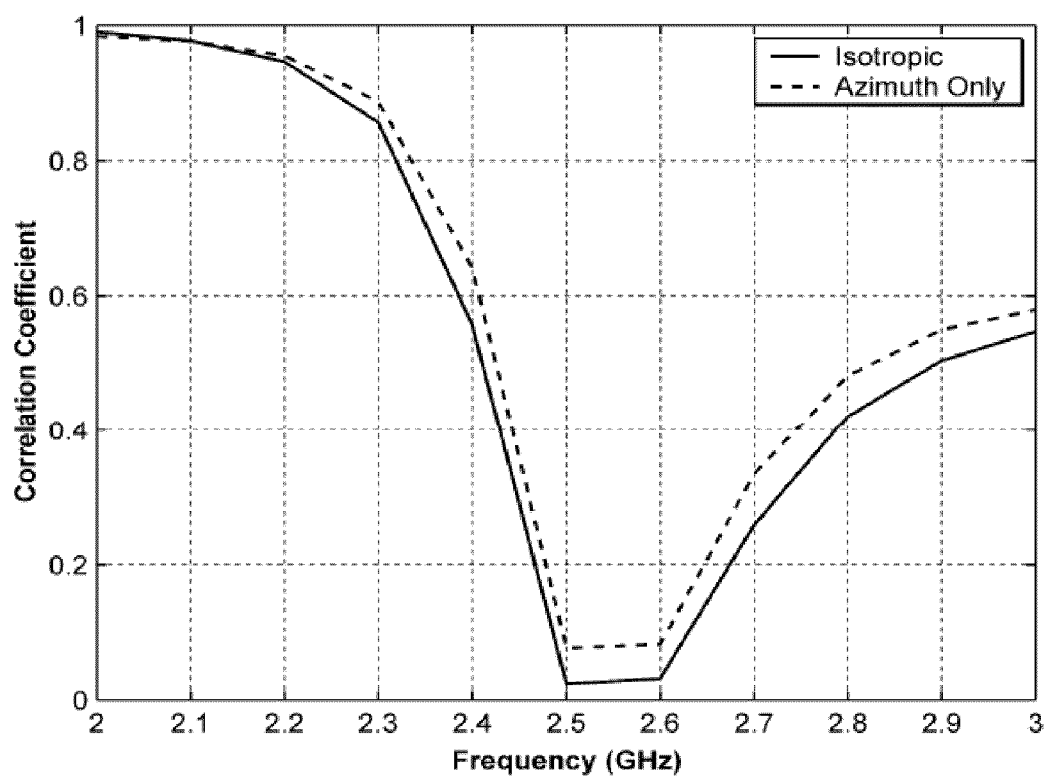
FIG. 3E is a graph illustrating envelope correlation for the FIG. 3A antenna structure.

Accordingly, the frequency response of the coupling is dependent on the characteristics of the connecting elements 210, 212, including their impedance and electrical length. In accordance with one or more embodiments of the disclosure, the frequency or bandwidth over which a desired amount of isolation can be maintained is controlled by appropriately configuring the connecting elements. One way to configure the cross connection is to change the physical length of the connecting element. An example of this is shown by the multimode antenna structure 300 of FIG. 3A where a meander has been added to the cross connection path of the connecting elements 310, 312. This has the general effect of increasing both the electrical length and the impedance of the connection between the two antenna elements 302, 304. Performance characteristics of this structure including scattering parameters, current ratios, gain patterns, and pattern correlation are shown on FIGS. 3B, 3C, 3D, and 3E, respectively. In this embodiment, the change in physical length has not significantly altered the resonant frequency of the structure, but there is a significant change in S21, with larger bandwidth and a greater minimum value than in structures without the meander. Thus, it is possible to optimize or improve the isolation performance by altering the electrical characteristic of the connecting elements.

Figure 4:
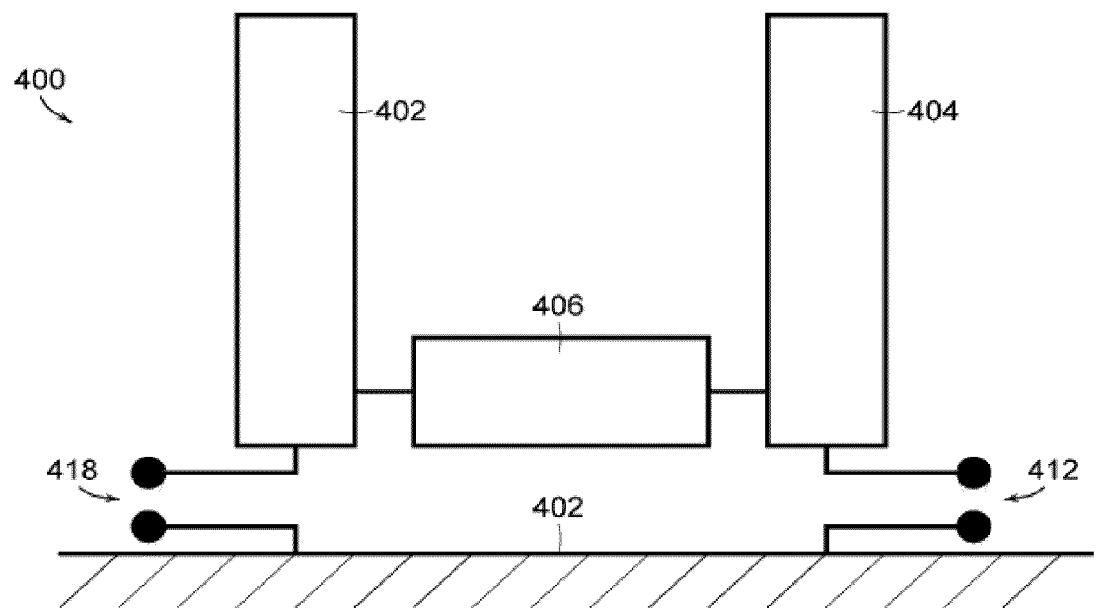
FIG. 4 illustrates an antenna structure with a ground or counterpoise in accordance with one or more embodiments of the disclosure.
Figure 5:
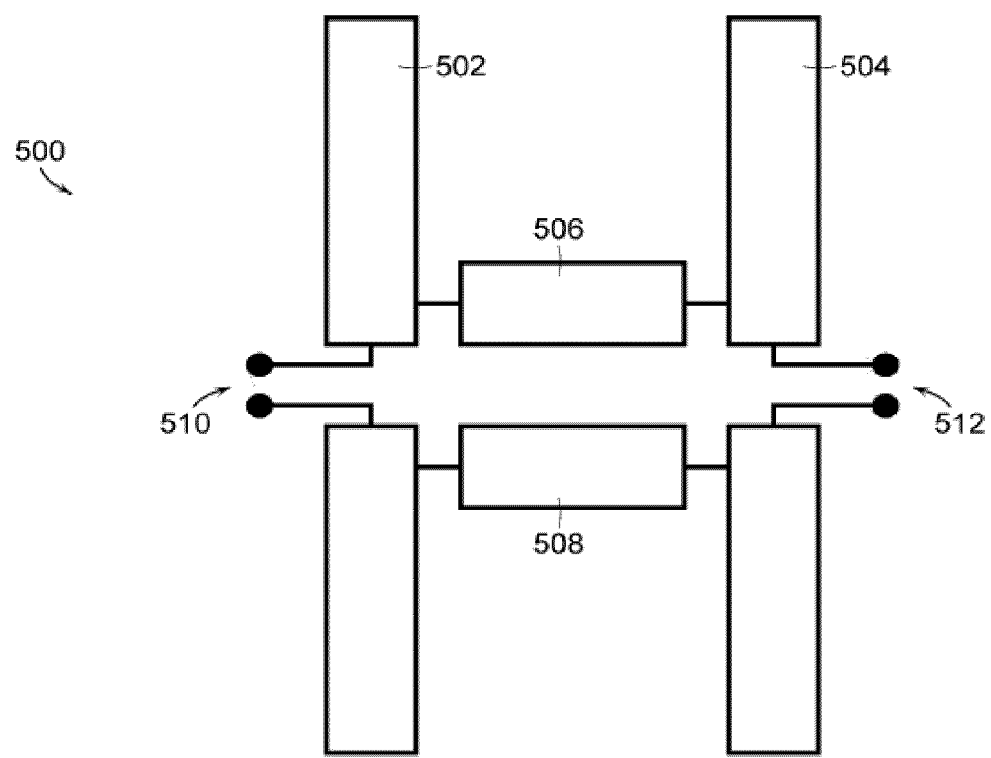
FIG. 5 illustrates a balanced antenna structure in accordance with one or more embodiments of the disclosure.

Exemplary multimode antenna structures in accordance with various embodiments of the disclosure can be designed to be excited from a ground or counterpoise 402 (as shown by antenna structure 400 in FIG. 4), or as a balanced structure (as shown by antenna structure 500 in FIG. 5). In either case, each antenna structure includes two or more antenna elements (402, 404 in FIG. 4, and 502, 504 in FIG. 5) and one or more electrically conductive connecting elements (406 in FIG. 4, and 506, 508 in FIG. 5). For ease of illustration, only a two-port structure is illustrated in the example diagrams. However, it is possible to extend the structure to include more than two ports in accordance with various embodiments of the disclosure. A signal connection to the antenna structure, or port (418, 412 in FIGS. 4 and 510, 512 in FIG. 5), is provided at each antenna element. The connecting element provides electrical connection between the two antenna elements at the frequency or frequency range of interest. Although the antenna is physically and electrically one structure, its operation can be explained by considering it as two independent antennas. For antenna structures not including a connecting element such as antenna structure 100, port 106 of that structure can be said to be connected to antenna 102, and port 108 can be said to be connected to antenna 104. However, in the case of this combined structure such as antenna structure 400, port 418 can be referred to as being associated with one antenna mode, and port 412 can be referred to as being associated with another antenna mode.

The antenna elements are designed to be resonant at the desired frequency or frequency range of operation. The lowest order resonance occurs when an antenna element has an electrical length of one quarter of a wavelength. Thus, a simple element design is a quarter-wave monopole in the case of an unbalanced configuration. It is also possible to use higher order modes. For example, a structure formed from quarter-wave monopoles also exhibits dual mode antenna performance with high isolation at a frequency of three times the fundamental frequency. Thus, higher order modes may be exploited to create a multiband antenna. Similarly, in a balanced configuration, the antenna elements can be complementary quarter-wave elements as in a half-wave center-fed dipole. However, the antenna structure can also be formed from other types of antenna elements that are resonant at the desired frequency or frequency range. Other possible antenna element configurations include, but are not limited to, helical coils, wideband planar shapes, chip antennas, meandered shapes, loops, and inductively shunted forms such as Planar Inverted-F Antennas (PIFAs).

The antenna elements of an antenna structure in accordance with one or more embodiments of the disclosure need not have the same geometry or be the same type of antenna element. The antenna elements should each have resonance at the desired frequency or frequency range of operation.

In accordance with one or more embodiments of the disclosure, the antenna elements of an antenna structure have the same geometry. This is generally desirable for design simplicity, especially when the antenna performance requirements are the same for connection to either port.

Figure 6A:
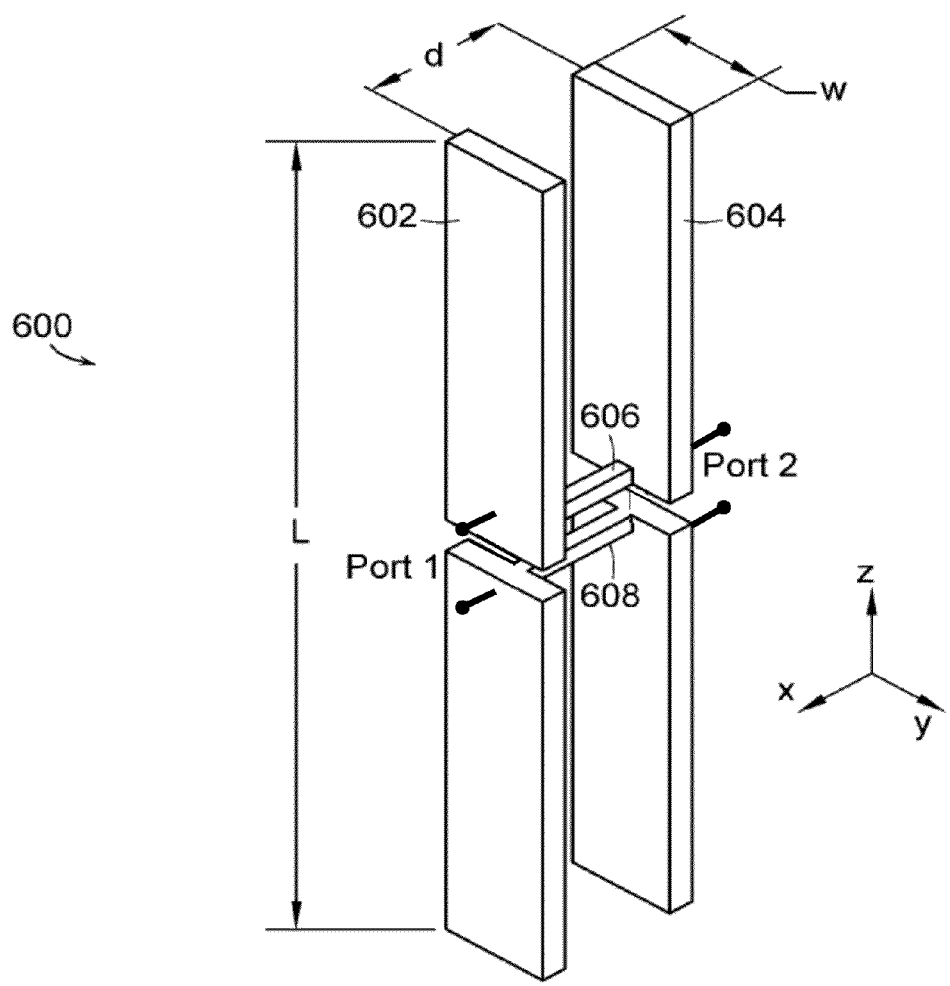
FIG. 6A illustrates an antenna structure in accordance with one or more embodiments of the disclosure.
Figure 6B:
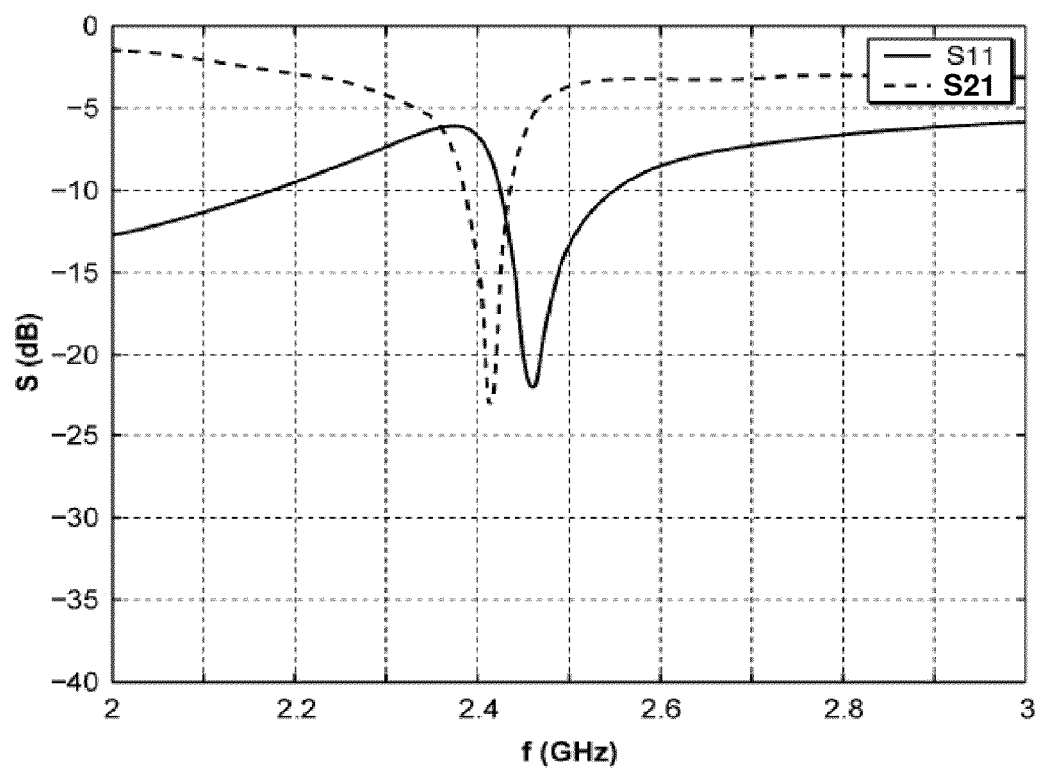
FIG. 6B is a graph showing scattering parameters for the FIG. 6A antenna structure for a particular dipole width dimension.
Figure 6C:
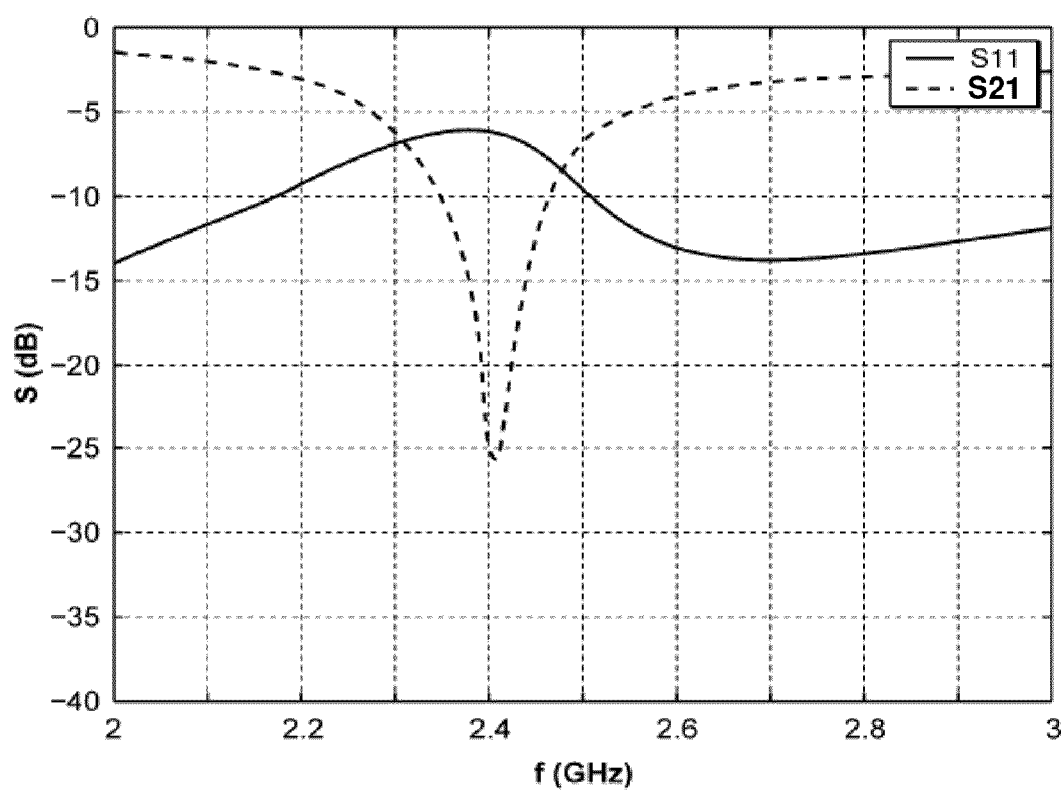
FIG. 6C is a graph showing scattering parameters for the FIG. 6A antenna structure for another dipole width dimension.

The bandwidth and resonant frequencies of the combined antenna structure can be controlled by the bandwidth and resonance frequencies of the antenna elements. Thus, broader bandwidth elements can be used to produce a broader bandwidth for the modes of the combined structure as illustrated, e.g., in FIGS. 6A, 6B, and 6C. FIG. 6A illustrates a multimode antenna structure 600 including two dipoles 602, 604 connected by connecting elements 606, 608. The dipoles 602, 604 each have a width (W) and a length (L) and are spaced apart by a distance (d). FIG. 6B illustrates the scattering parameters for the structure having exemplary dimensions: W=1 mm, L=57.2 mm, and d=10 mm. FIG. 6C illustrates the scattering parameters for the structure having exemplary dimensions: W=10 mm, L=50.4 mm, and d=10 mm. As shown, increasing W from 1 mm to 10 mm, while keeping the other dimensions generally the same, results in a broader isolation bandwidth and impedance bandwidth for the antenna structure.

It has also been found that increasing the separation between the antenna elements increases the isolation bandwidth and the impedance bandwidth for an antenna structure.

In general, the connecting element is in the high-current region of the combined resonant structure. It may therefore be desirable for the connecting element to have a high conductivity.

The ports are located at the feed points of the antenna elements as they would be if they were operated as separate antennas. Matching elements or structures may be used to match the port impedance to the desired system impedance.

Figure 7:
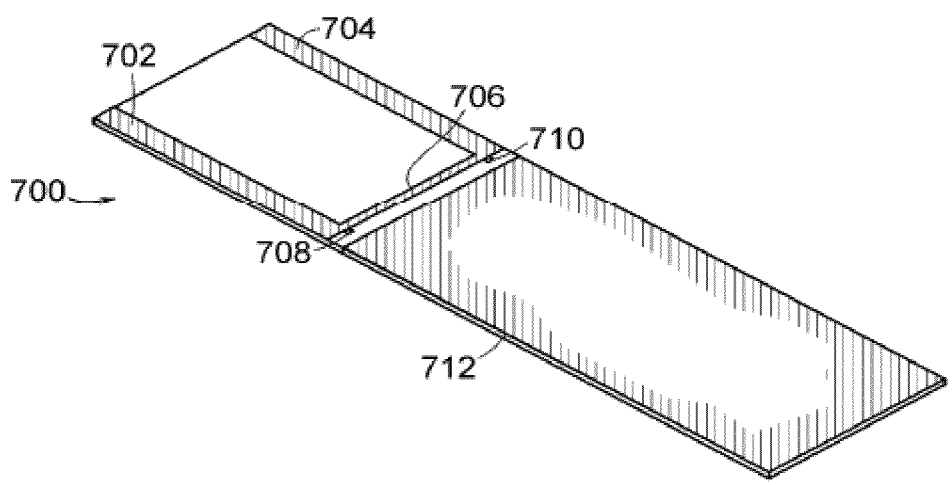
FIG. 7 illustrates an antenna structure fabricated on a printed circuit board in accordance with one or more embodiments of the disclosure.

In accordance with one or more embodiments of the disclosure, the multimode antenna structure can be a planar structure incorporated, e.g., into a printed circuit board, as shown as FIG. 7. In this example, the antenna structure 700 includes antenna elements 702, 704 connected by a connecting element 706 at ports 708, 710. The antenna structure is fabricated on a printed circuit board substrate 712. The antenna elements shown in the figure are simple quarter-wave monopoles. However, the antenna elements can be any geometry that yields an equivalent effective electrical length.

Figure 8A:
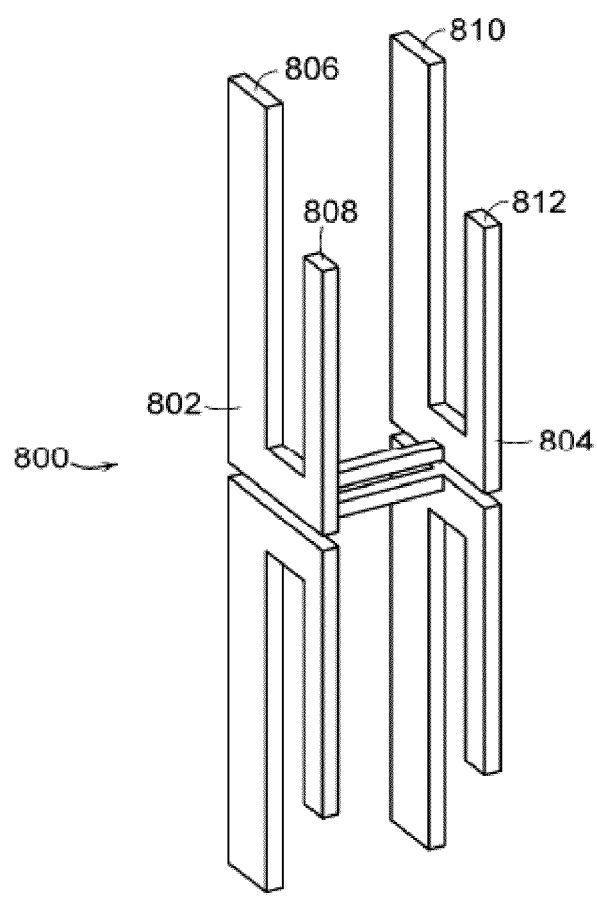
FIG. 8A illustrates an antenna structure having dual resonance in accordance with one or more embodiments of the disclosure.
Figure 8B:
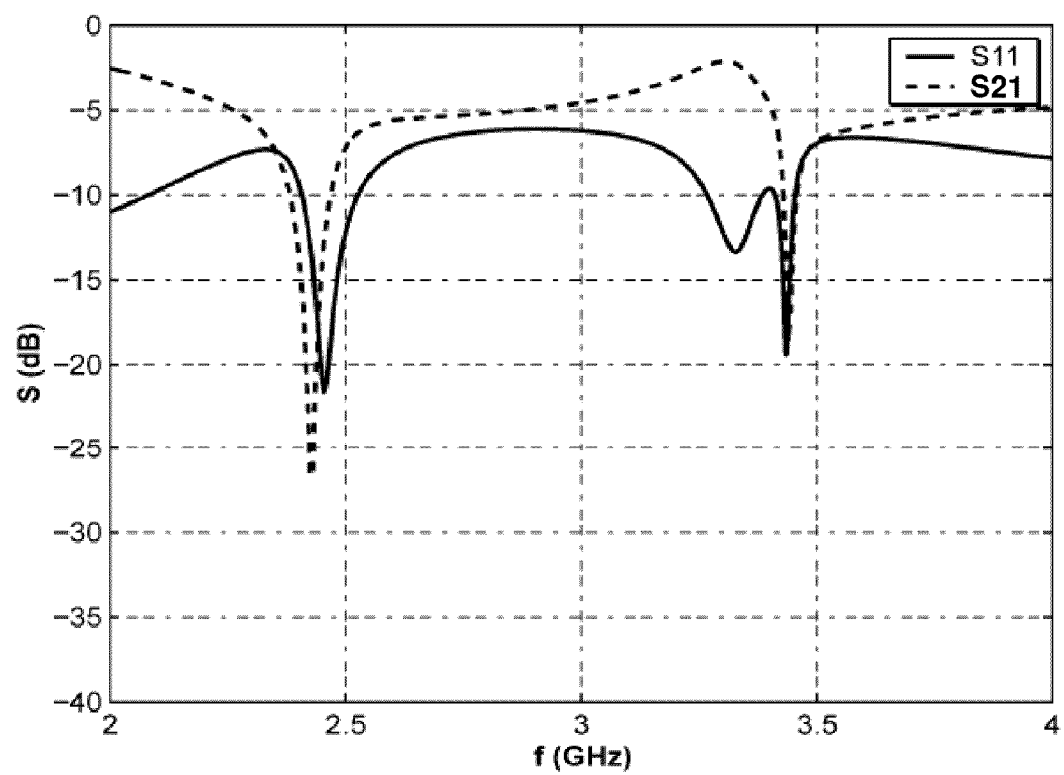
FIG. 8B is a graph illustrating scattering parameters for the FIG. 8A antenna structure.

In accordance with one or more embodiments of the disclosure, antenna elements with dual resonant frequencies can be used to produce a combined antenna structure with dual resonant frequencies and hence dual operating frequencies. FIG. 8A shows an exemplary model of a multimode dipole structure 800 where the dipole antenna elements 802, 804 are split into two fingers 806, 808 and 810, 812, respectively, of unequal length. The dipole antenna elements have resonant frequencies associated with each the two different finger lengths and accordingly exhibit a dual resonance. Similarly, the multimode antenna structure using dual-resonant dipole arms exhibits two frequency bands where high isolation (or small S21) is obtained as shown in FIG. 8B.

Figure 9:
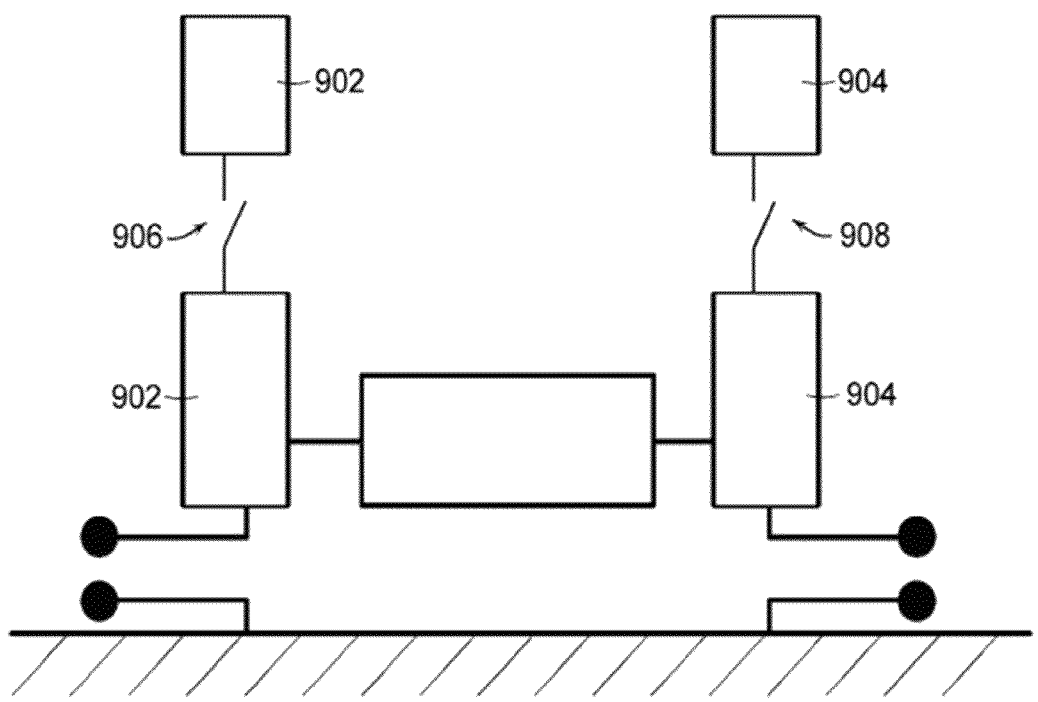
FIG. 9 illustrates a tunable antenna structure in accordance with one or more embodiments of the disclosure.

In accordance with one or more embodiments of the disclosure, a multimode antenna structure 900 shown in FIG. 9 is provided having variable length antenna elements 902, 904 forming a tunable antenna. This may be done by changing the effective electrical length of the antenna elements by a controllable device such as an RF switch 906, 908 at each antenna element 902, 904. In this example, the switch may be opened (by operating the controllable device) to create a shorter electrical length (for higher frequency operation) or closed to create a longer electrical length (for lower frequency of operation). The operating frequency band for the antenna structure 900, including the feature of high isolation, can be tuned by tuning both antenna elements in concert. This approach may be used with a variety of methods of changing the effective electrical length of the antenna elements including, e.g., using a controllable dielectric material, loading the antenna elements with a variable capacitor such as a microelectromechanical systems (MEMs) device, varactor, or tunable dielectric capacitor, and switching on or off parasitic elements.

In accordance with one or more embodiments of the disclosure, the connecting element or elements provide an electrical connection between the antenna elements with an electrical length approximately equal to the electrical distance between the elements. Under this condition, and when the connecting elements are attached at the port ends of the antenna elements, the ports are isolated at a frequency near the resonance frequency of the antenna elements. This arrangement can produce nearly perfect isolation at particular frequency.

Alternately, as previously discussed, the electrical length of the connecting element may be increased to expand the bandwidth over which isolation exceeds a particular value. For example, a straight connection between antenna elements may produce a minimum S21 of −25 dB at a particular frequency and the bandwidth for which S21<−10 dB may be 100 MHz. By increasing the electrical length, a new response can be obtained where the minimum S21 is increased to −15 dB but the bandwidth for which S21<−10 dB may be increased to 150 MHz.

Various other multimode antenna structures in accordance with one or more embodiments of the disclosure are possible. For example, the connecting element can have a varied geometry or can be constructed to include components to vary the properties of the antenna structure. These components can include, e.g., passive inductor and capacitor elements, resonator or filter structures, or active components such as phase shifters.

Figure 10A:
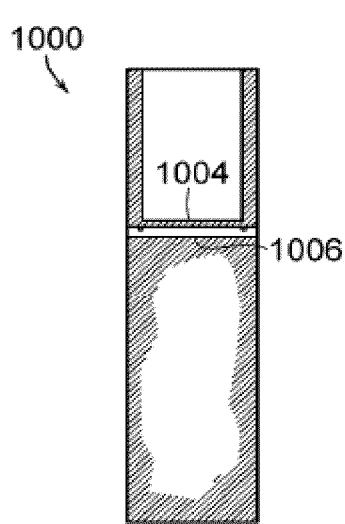
FIGS. 10A and 10B illustrate antenna structures having connecting elements positioned at different locations along the length of the antenna elements in accordance with one or more embodiments of the disclosure.
Figure 10B:
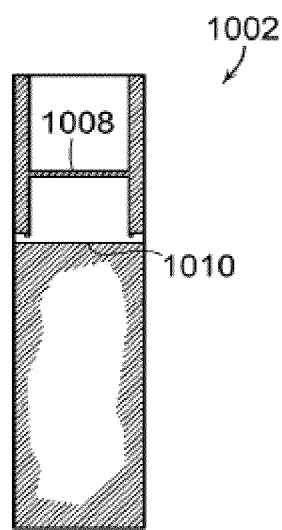
Figure 10C:
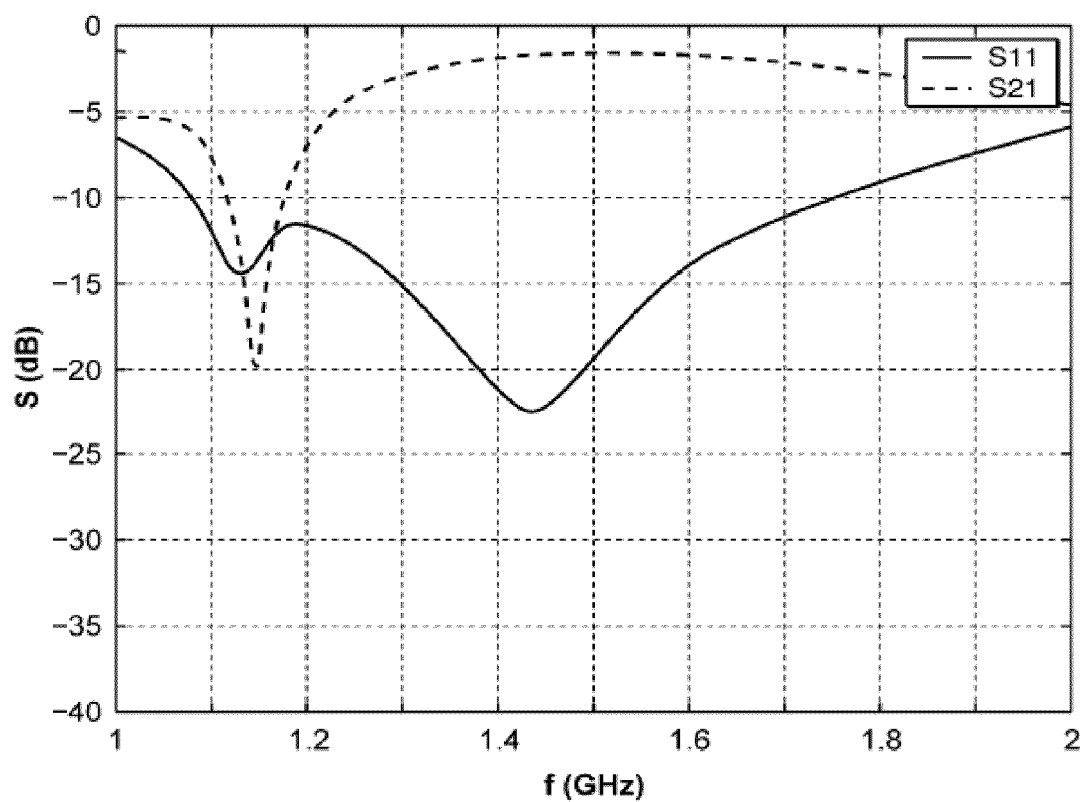
FIGS. 10C and 10D are graphs illustrating scattering parameters for the FIGS. 10A and 10B antenna structures, respectively.
Figure 10D:
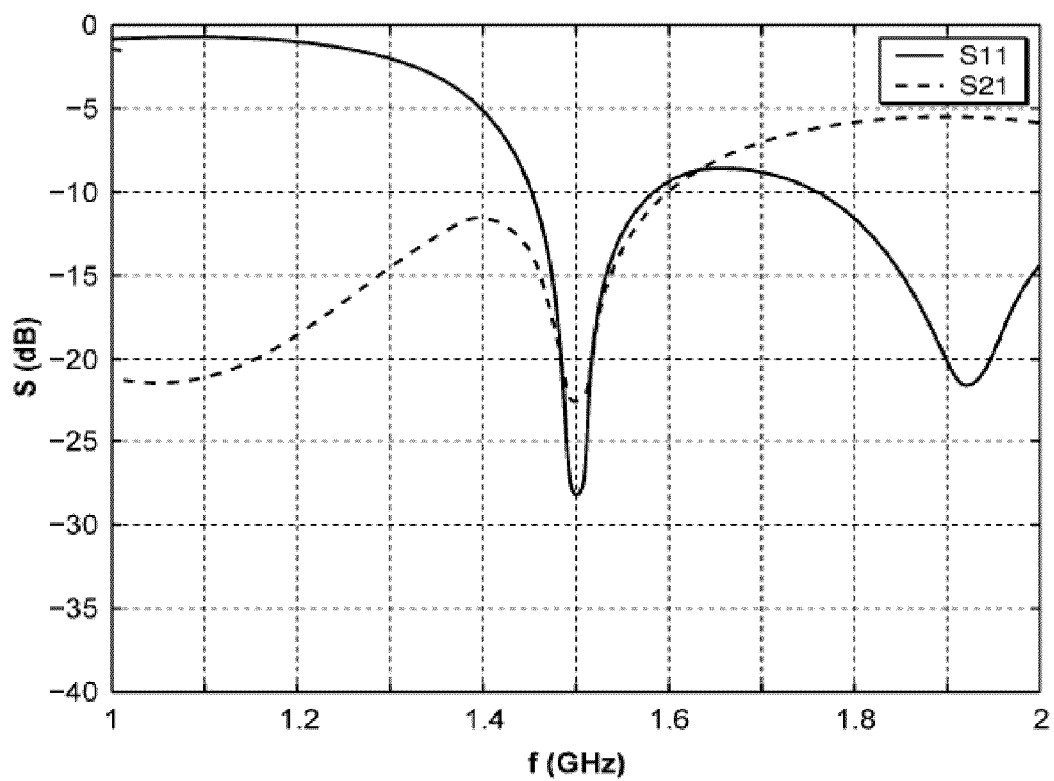

In accordance with one or more embodiments of the disclosure, the position of the connecting element along the length of the antenna elements can be varied to adjust the properties of the antenna structure. The frequency band over which the ports are isolated can be shifted upward in frequency by moving the point of attachment of the connecting element on the antenna elements away from the ports and towards the distal end of the antenna elements. FIGS. 10A and 10B illustrate multimode antenna structures 1000, 1002, respectively, each having a connecting element electrically connected to the antenna elements. In the FIG. 10A antenna structure 1000, the connecting element 1004 is located in the structure such that the gap between the connecting element 1004 and the top edge of the ground plane 1006 is 3 mm. FIG. 10C shows the scattering parameters for the structure showing that high isolation is obtained at a frequency of 1.15 GHz in this configuration. A shunt capacitor/series inductor matching network is used to provide the impedance match at 1.15 GHz. FIG. 10D shows the scattering parameters for the structure 1002 of FIG. 10B, where the gap between the connecting element 1008 and the top edge 1010 of the ground plane is 19 mm. The antenna structure 1002 of FIG. 10B exhibits an operating band with high isolation at approximately 1.50 GHz.

FIG. 11 schematically illustrates a multimode antenna structure 1100 in accordance with one or more further embodiments of the disclosure. The antenna structure 1100 includes two or more connecting elements 1102, 1104, each of which electrically connects the antenna elements 1106, 1108. (For ease of illustration, only two connecting elements are shown in the figure. It should be understood that use of more than two connecting elements is also contemplated.) The connecting elements 1102, 1104 are spaced apart from each other along the antenna elements 1106, 1108. Each of the connecting elements 1102, 1104 includes a switch 1112, 1110. Peak isolation frequencies can be selected by controlling the switches 1110, 1112. For example, a frequency f1 can be selected by closing switch 1110 and opening switch 1112. A different frequency f2 can be selected by closing switch 1112 and opening switch 1110.

FIG. 12 illustrates a multimode antenna structure 1200 in accordance with one or more alternate embodiments of the disclosure. The antenna structure 1200 includes a connecting element 1202 having a filter 1204 operatively coupled thereto. The filter 1204 can be a low pass or band pass filter selected such that the connecting element connection between the antenna elements 1206, 1208 is only effective within the desired frequency band, such as the high isolation resonance frequency. At higher frequencies, the structure will function as two separate antenna elements that are not coupled by the electrically conductive connecting element, which is open circuited.

FIG. 13 illustrates a multimode antenna structure 1300 in accordance with one or more alternate embodiments of the disclosure. The antenna structure 1300 includes two or more connecting elements 1302, 1304, which include filters 1306, 1308, respectively. (For ease of illustration, only two connecting elements are shown in the figure. It should be understood that use of more than two connecting elements is also contemplated.) In one possible embodiment, the antenna structure 1300 has a low pass filter 1308 on the connecting element 1304 (which is closer to the antenna ports) and a high pass filter 1306 on the connecting element 1302 in order to create an antenna structure with two frequency bands of high isolation, i.e., a dual band structure.

FIG. 14 illustrates a multimode antenna structure 1400 in accordance with one or more alternate embodiments of the disclosure. The antenna structure 1400 includes one or more connecting elements 1402 having a tunable element 1406 operatively connected thereto. The antenna structure 1400 also includes antenna elements 1408, 1410. The tunable element 1406 alters the delay or phase of the electrical connection or changes the reactive impedance of the electrical connection. The magnitude of the scattering parameters S21/S12 and a frequency response are affected by the change in electrical delay or impedance and so an antenna structure can be adapted or generally optimized for isolation at specific frequencies using the tunable element 1406.

Figure 15:
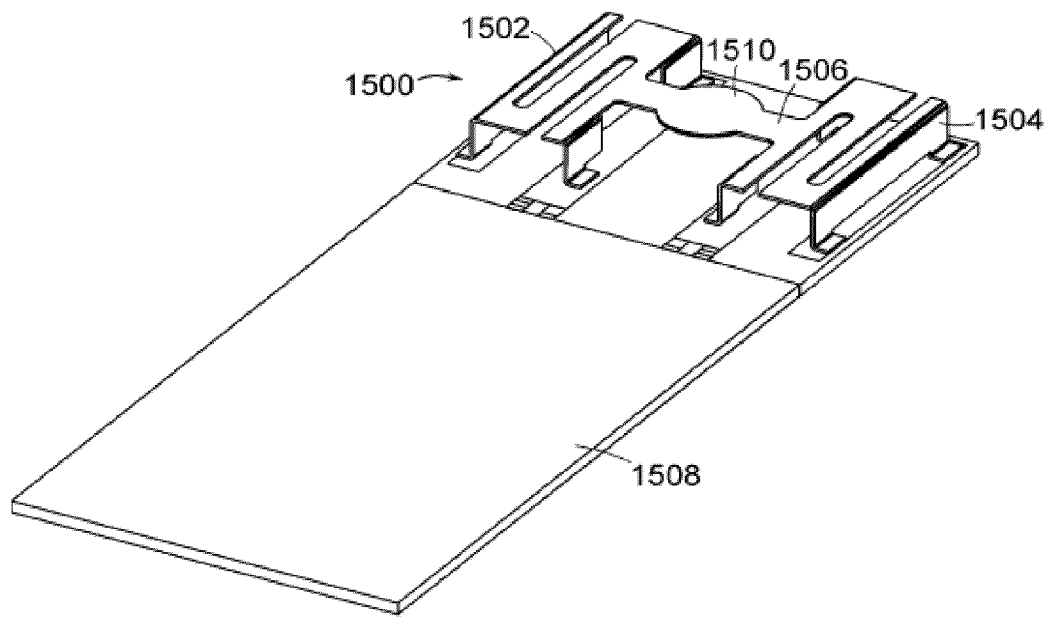
FIG. 15 illustrates an antenna structure mounted on a PCB assembly in accordance with one or more embodiments of the disclosure.

FIG. 15 illustrates a multimode antenna structure 1500 in accordance with one or more alternate embodiments of the disclosure. The multimode antenna structure 1500 can be used, e.g., in a WIMAX USB dongle. The antenna structure 1500 can be configured for operation, e.g., in WiMAX bands from 2300 to 2700 MHz.

The antenna structure 1500 includes two antenna elements 1502, 1504 connected by a conductive connecting element 1506. The antenna elements include slots to increase the electrical length of the elements to obtain the desired operating frequency range. In this example, the antenna structure is optimized for a center frequency of 2350 MHz. The length of the slots can be reduced to obtain higher center frequencies. The antenna structure is mounted on a printed circuit board assembly 1508. A two-component lumped element match is provided at each antenna feed.

The antenna structure 1500 can be manufactured, e.g., by metal stamping. It can be made, e.g., from 0.2 mm thick copper alloy sheet. The antenna structure 1500 includes a pickup feature 1510 on the connecting element at the center of mass of the structure, which can be used in an automated pick-and-place assembly process. The antenna structure is also compatible with surface-mount reflow assembly.

Figure 16:
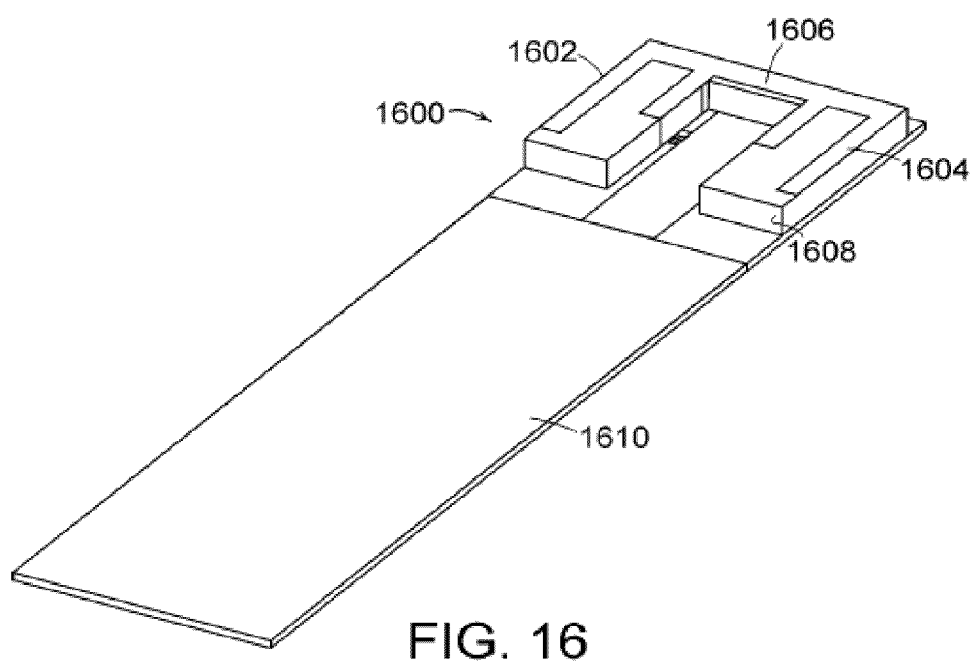
FIG. 16 illustrates another antenna structure mounted on a PCB assembly in accordance with one or more embodiments of the disclosure.

FIG. 16 illustrates a multimode antenna structure 1600 in accordance with one or more alternate embodiments of the disclosure. As with antenna structure 1500 of FIG. 15, the antenna structure 1600 can also be used, e.g., in a WIMAX USB dongle. The antenna structure can be configured for operation, e.g., in WiMAX bands from 2300 to 2700 MHz.

The antenna structure 1600 includes two antenna elements 1602, 1604, each comprising a meandered monopole. The length of the meander determines the center frequency. The exemplary design shown in the figure is optimized for a center frequency of 2350 MHz. To obtain higher center frequencies, the length of the meander can be reduced.

A connecting element 1606 electrically connects the antenna elements. A two-component lumped element match is provided at each antenna feed.

The antenna structure can be fabricated, e.g., from copper as a flexible printed circuit (FPC) mounted on a plastic carrier 1608. The antenna structure can be created by the metalized portions of the FPC. The plastic carrier provides mechanical support and facilitates mounting to a PCB assembly 1610. Alternatively, the antenna structure can be formed from sheet-metal.

Figure 17:
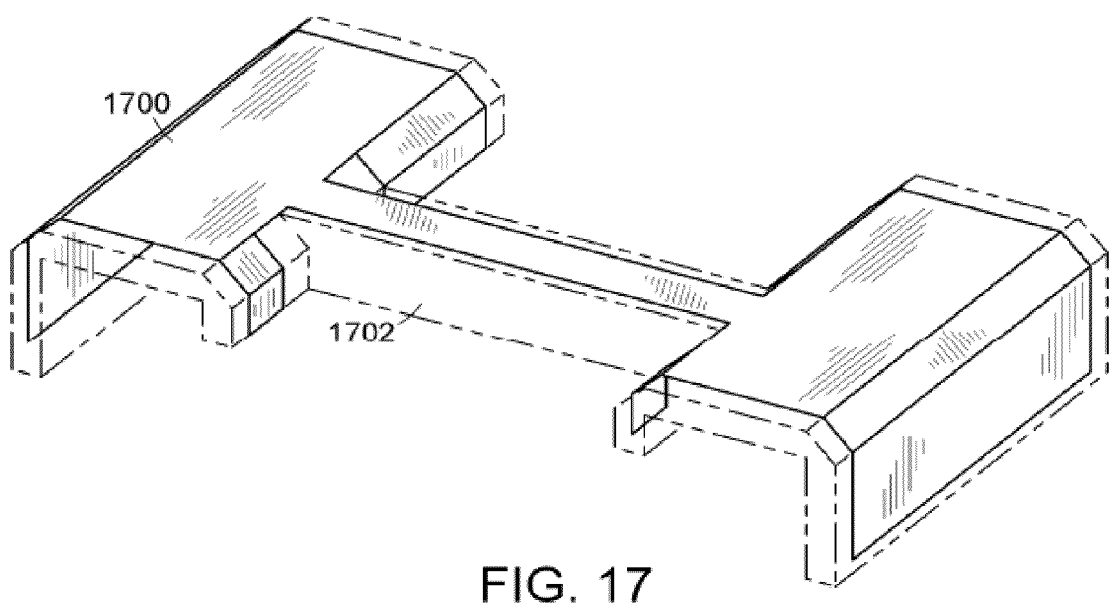
FIG. 17 illustrates an alternate antenna structure that can be mounted on a PCB assembly in accordance with one or more embodiments of the disclosure.

FIG. 17 illustrates a multimode antenna structure 1700 in accordance with another embodiment of the disclosure. This antenna design can be used, e.g., for USB, Express 34, and Express 54 data card formats. The exemplary antenna structure shown in the figure is designed to operate at frequencies from 2.3 to 6 GHz. The antenna structure can be fabricated, e.g., from sheet-metal or by FPC over a plastic carrier 1702.

Figure 18A:
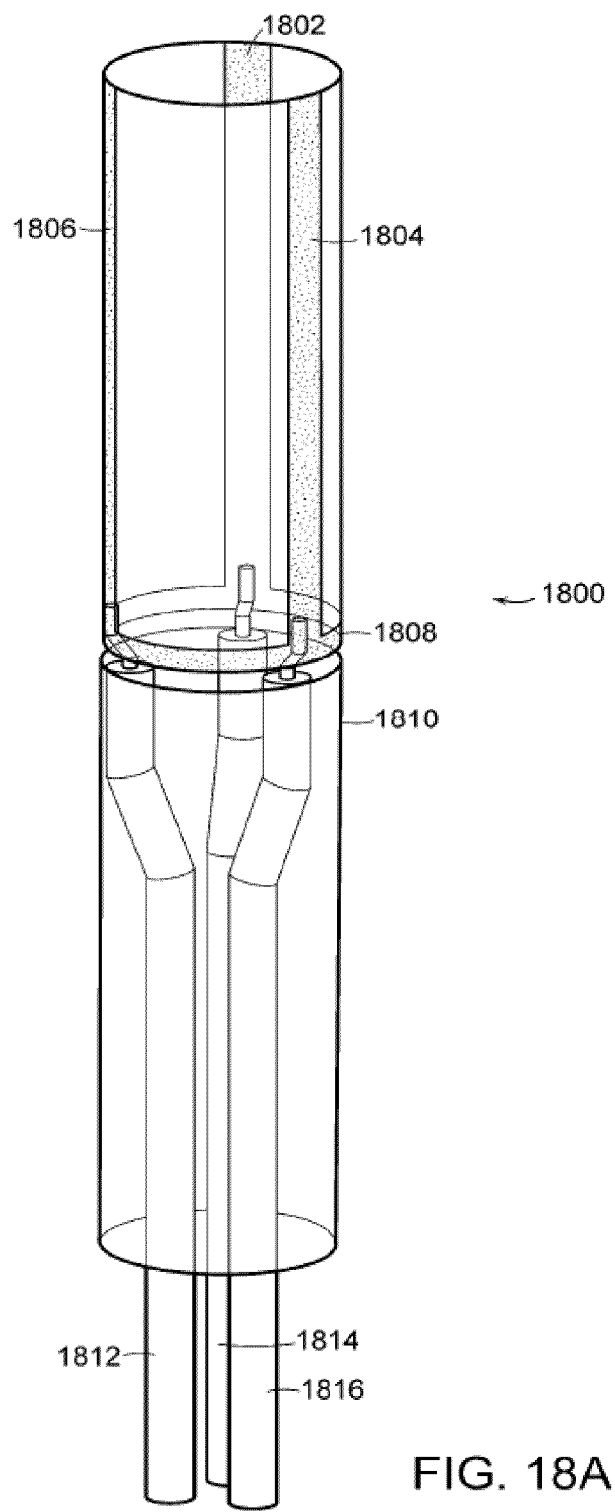
FIG. 18A illustrates a three mode antenna structure in accordance with one or more embodiments of the disclosure.
Figure 18B:
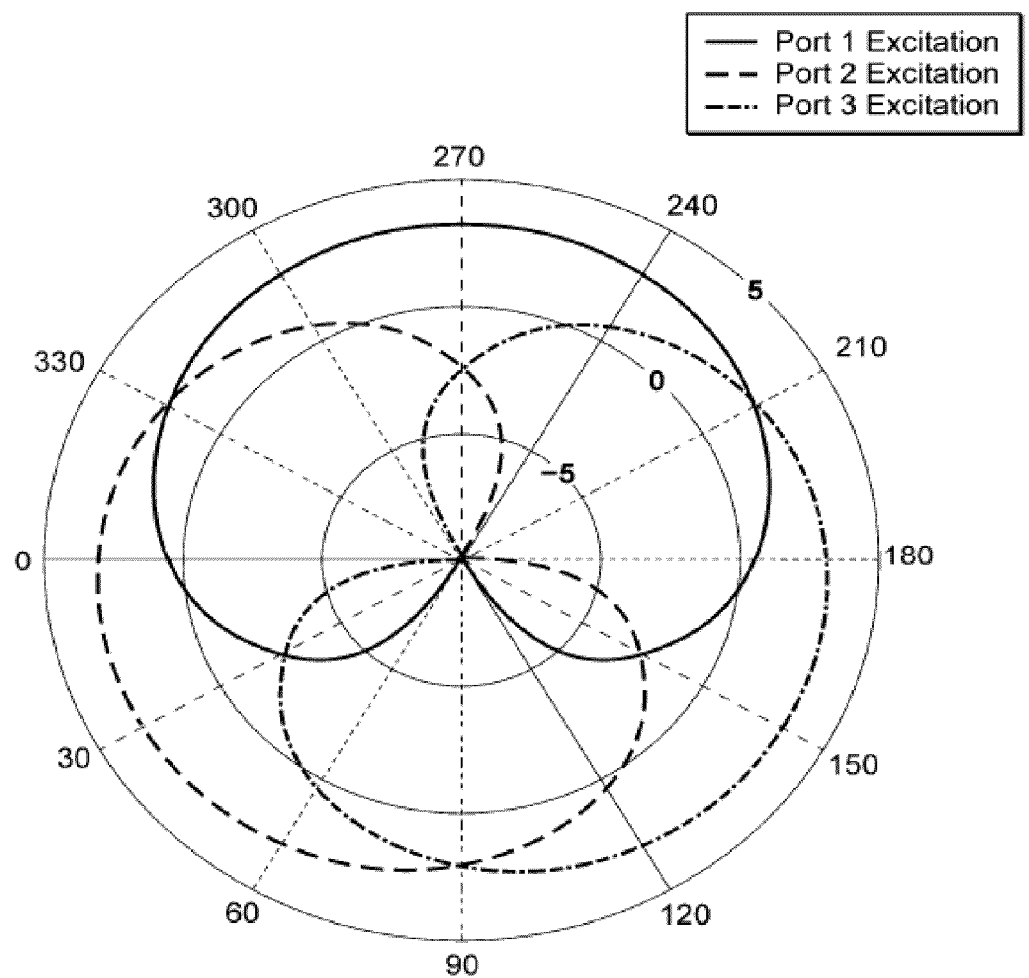
FIG. 18B is a graph illustrating the gain patterns for the FIG. 18A antenna structure.

FIG. 18A illustrates a multimode antenna structure 1800 in accordance with another embodiment of the disclosure. The antenna structure 1800 comprises a three mode antenna with three ports. In this structure, three monopole antenna elements 1802, 1804, 1806 are connected using a connecting element 1808 comprising a conductive ring that connects neighboring antenna elements. The antenna elements are balanced by a common counterpoise, or sleeve 1810, which is a single hollow conductive cylinder. The antenna has three coaxial cables 1812, 1814, 1816 for connection of the antenna structure to a communications device. The coaxial cables 1812, 1814, 1816 pass through the hollow interior of the sleeve 1810. The antenna assembly may be constructed from a single flexible printed circuit wrapped into a cylinder and may be packaged in a cylindrical plastic enclosure to provide a single antenna assembly that takes the place of three separate antennas. In one exemplary arrangement, the diameter of the cylinder is 10 mm and the overall length of the antenna is 56 mm so as to operate with high isolation between ports at 2.45 GHz. This antenna structure can be used, e.g., with multiple antenna radio systems such as MIMO or 802.11N systems operating in the 2.4 to 2.5 GHz bands. In addition to port to port isolation, each port advantageously produces a different gain pattern as shown on FIG. 18B. While this is one specific example, it is understood that this structure can be scaled to operate at any desired frequency. It is also understood that methods for tuning, manipulating bandwidth, and creating multiband structures described previously in the context of two-port antennas can also apply to this multiport structure.

While the above embodiment is shown as a true cylinder, it is possible to use other arrangements of three antenna elements and connecting elements that produce the same advantages. This includes, but is not limited to, arrangements with straight connections such that the connecting elements form a triangle, or another polygonal geometry. It is also possible to construct a similar structure by similarly connecting three separate dipole elements instead of three monopole elements with a common counterpoise. Also, while symmetric arrangement of antenna elements advantageously produces equivalent performance from each port, e.g., same bandwidth, isolation, impedance matching, it is also possible to arrange the antenna elements asymmetrically or with unequal spacing depending on the application.

Figure 19:
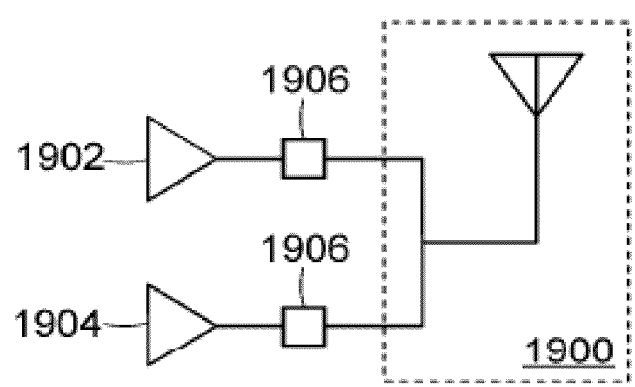
FIG. 19 illustrates an antenna and power amplifier combiner application for an antenna structure in accordance with one or more embodiments of the disclosure.

FIG. 19 illustrates use of a multimode antenna structure 1900 in a combiner application in accordance with one or more embodiments of the disclosure. As shown in the figure, transmit signals may be applied to both antenna ports of the antenna structure 1900 simultaneously. In this configuration, the multimode antenna can serve as both antenna and power amplifier combiner. The high isolation between antenna ports restricts interaction between the two amplifiers 1902, 1904, which is known to have undesirable effects such as signal distortion and loss of efficiency. Optional impedance matching at 1906 can be provided at the antenna ports.

Figure 20A:
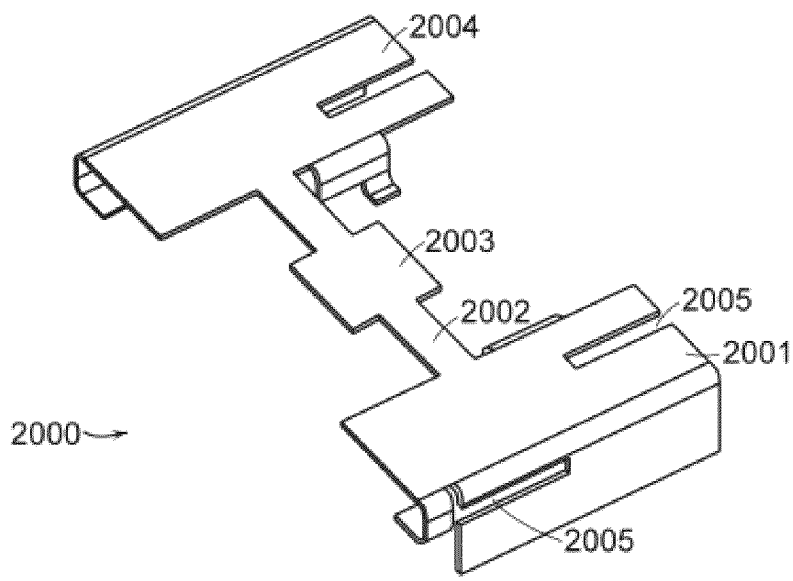
FIGS. 20A and 20B illustrate a multimode antenna structure useable, e.g., in a WiMAX USB or ExpressCard/34 device in accordance with one or more further embodiments of the subject disclosure.
Figure 20B:
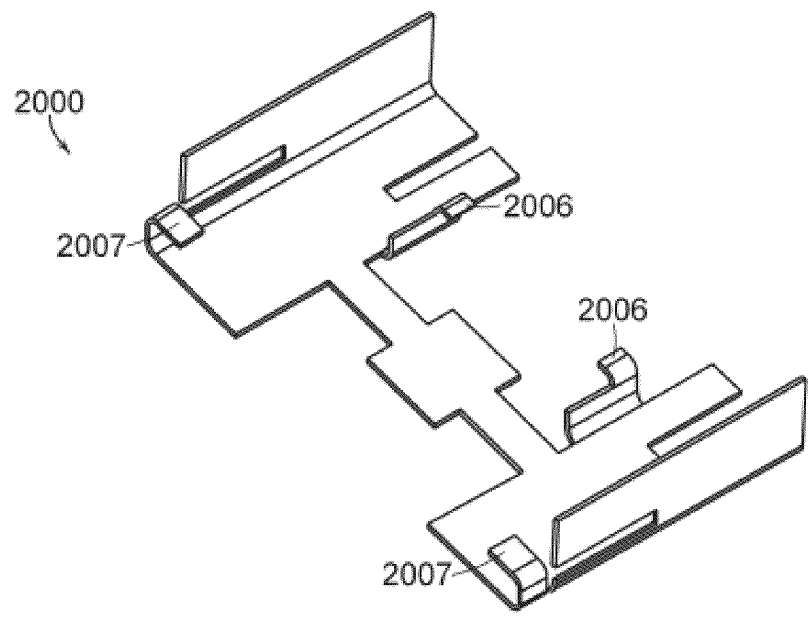

FIGS. 20A and 20B illustrate a multimode antenna structure 2000 in accordance with one or more alternate embodiments of the subject disclosure. The antenna structure 2000 can also be used, e.g., in a WiMAX USB or ExpressCard/34 device. The antenna structure can be configured for operation, e.g., in WiMAX bands from 2300 to 6000 MHz.

The antenna structure 2000 includes two antenna elements 2001, 2004, each comprising a broad monopole. A connecting element 2002 electrically connects the antenna elements. Slots (or other cut-outs) 2005 are used to improve the input impedance match above 5000 MHz. The exemplary design shown in the figure is optimized to cover frequencies from 2300 to 6000 MHz.

The antenna structure 2000 can be manufactured, e.g., by metal stamping. It can be made, e.g., from 0.2 mm thick copper alloy sheet. The antenna structure 2000 includes a pickup feature 2003 on the connecting element 2002 generally at the center of mass of the structure, which can be used in an automated pick-and-place assembly process. The antenna structure is also compatible with surface-mount reflow assembly. Feed points 2006 of the antenna provide the points of connection to the radio circuitry on a PCB, and also serve as a support for structural mounting of the antenna to the PCB. Additional contact points 2007 provide structural support.

Figure 20C:
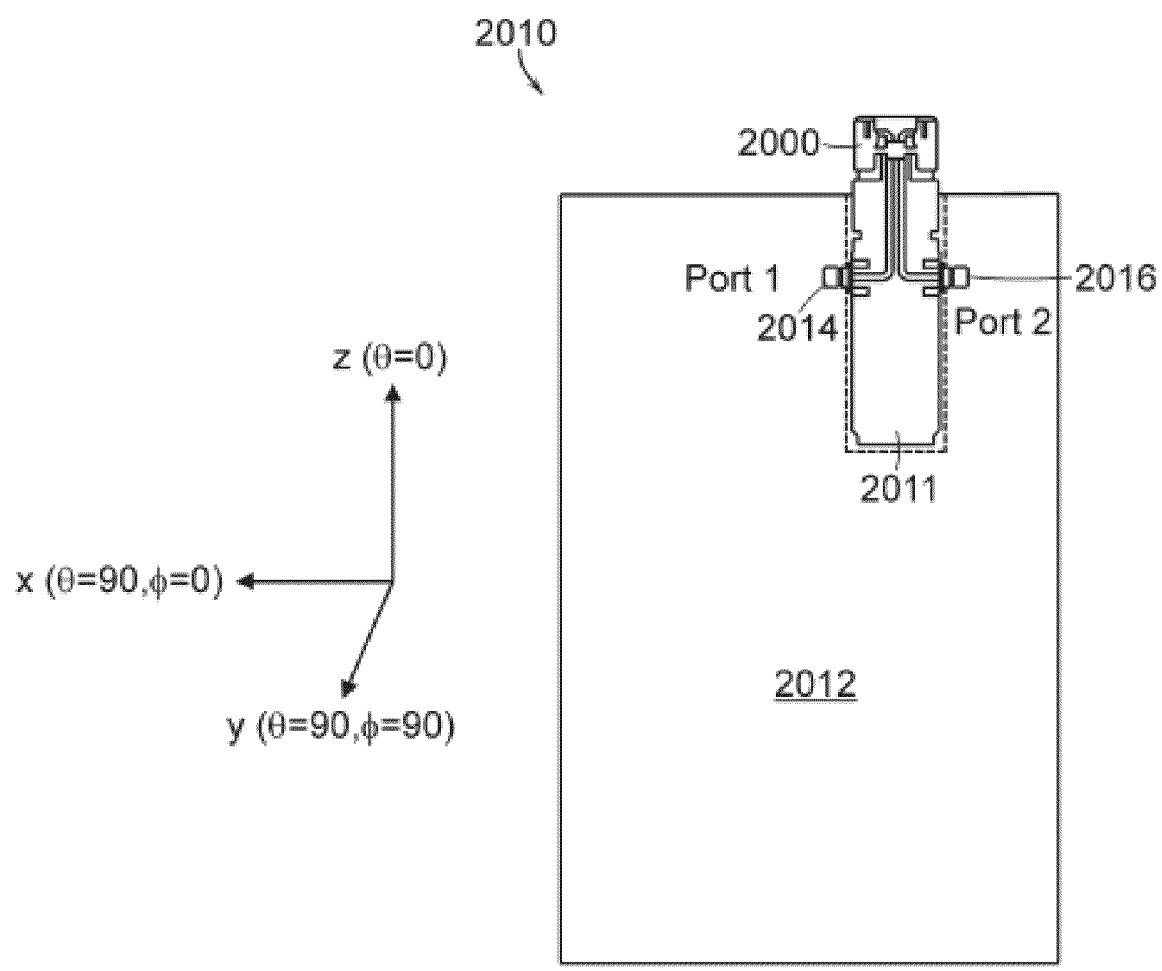
FIG. 20C illustrates a test assembly used to measure the performance of the antenna of FIGS. 20A and 20B.

FIG. 20C illustrates a test assembly 2010 used to measure the performance of antenna 2000. The figure also shows the coordinate reference for far-field patterns. Antenna 2000 is mounted on a 30×88 mm PCB 2011 representing an ExpressCard/34 device. The grounded portion of the PCB 2011 is attached to a larger metal sheet 2012 (having dimensions of 165×254 mm in this example) to represent a counterpoise size typical of a notebook computer. Test ports 2014, 2016 on the PCB 2011 are connected to the antenna through 50-ohm striplines.

Figure 20D:
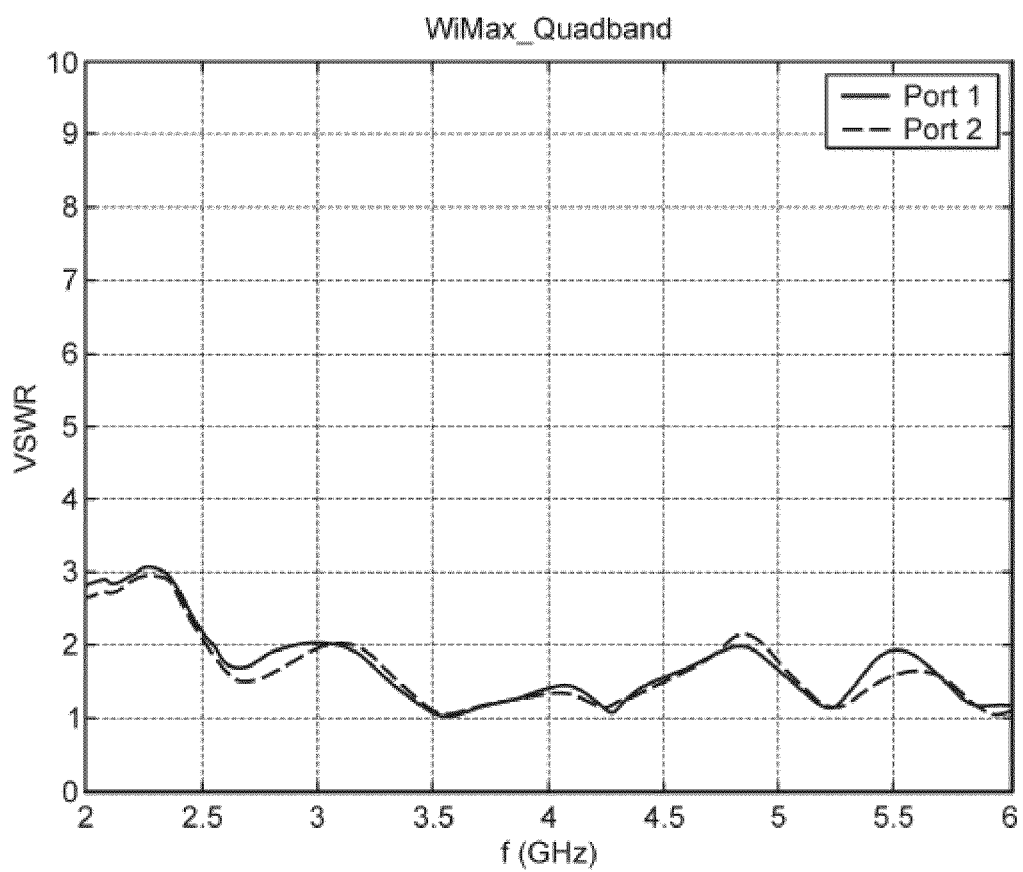
FIGS. 20D to 20J illustrate test measurement results for the antenna of FIGS. 20A and 20B.
Figure 20E:
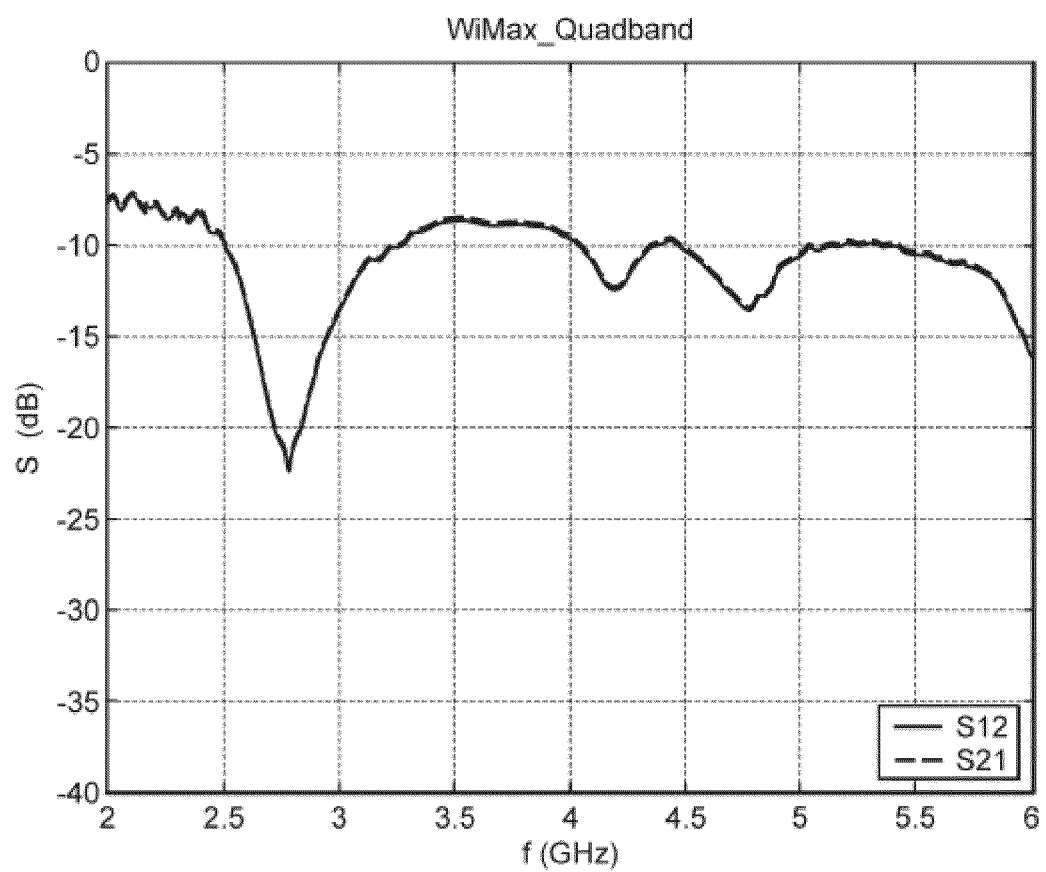
Figure 20F:
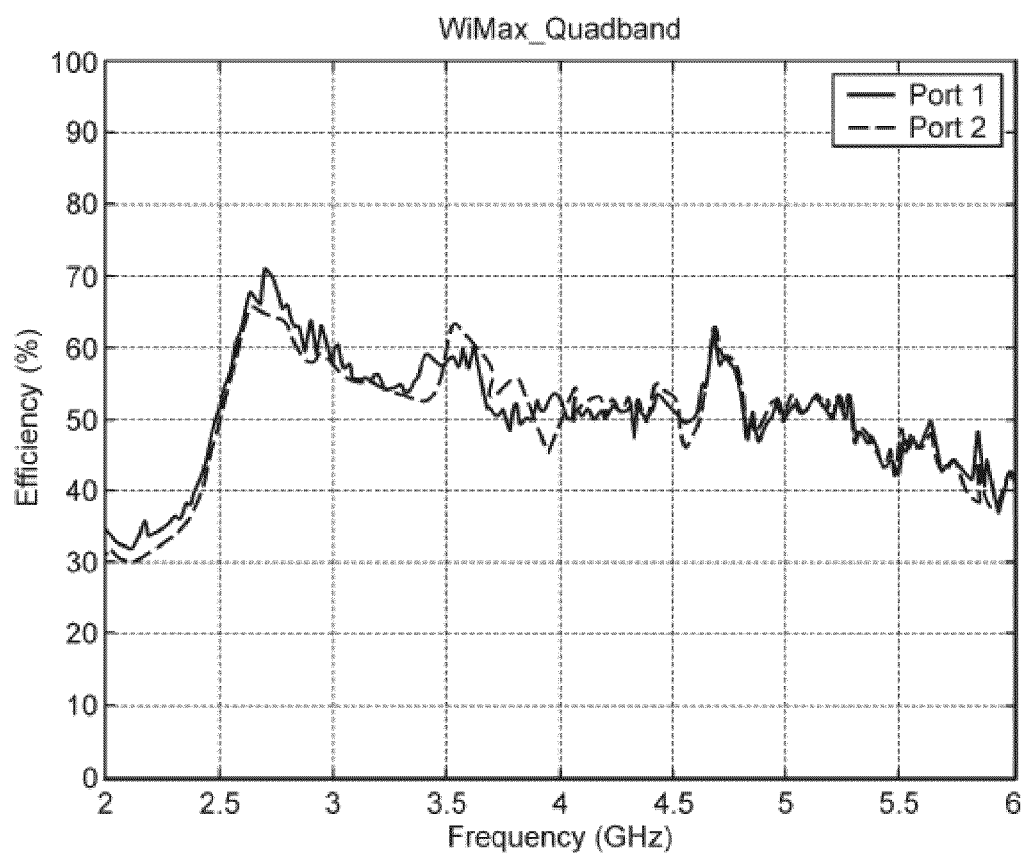
Figure 20G:
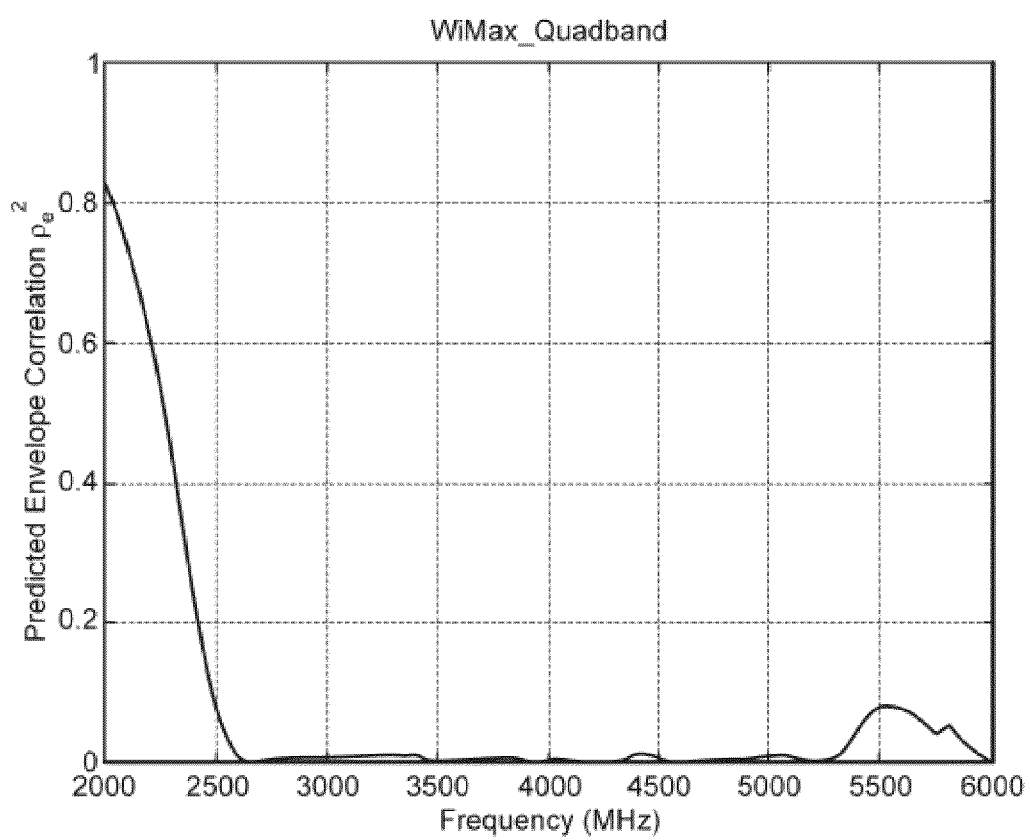
Figure 20H:
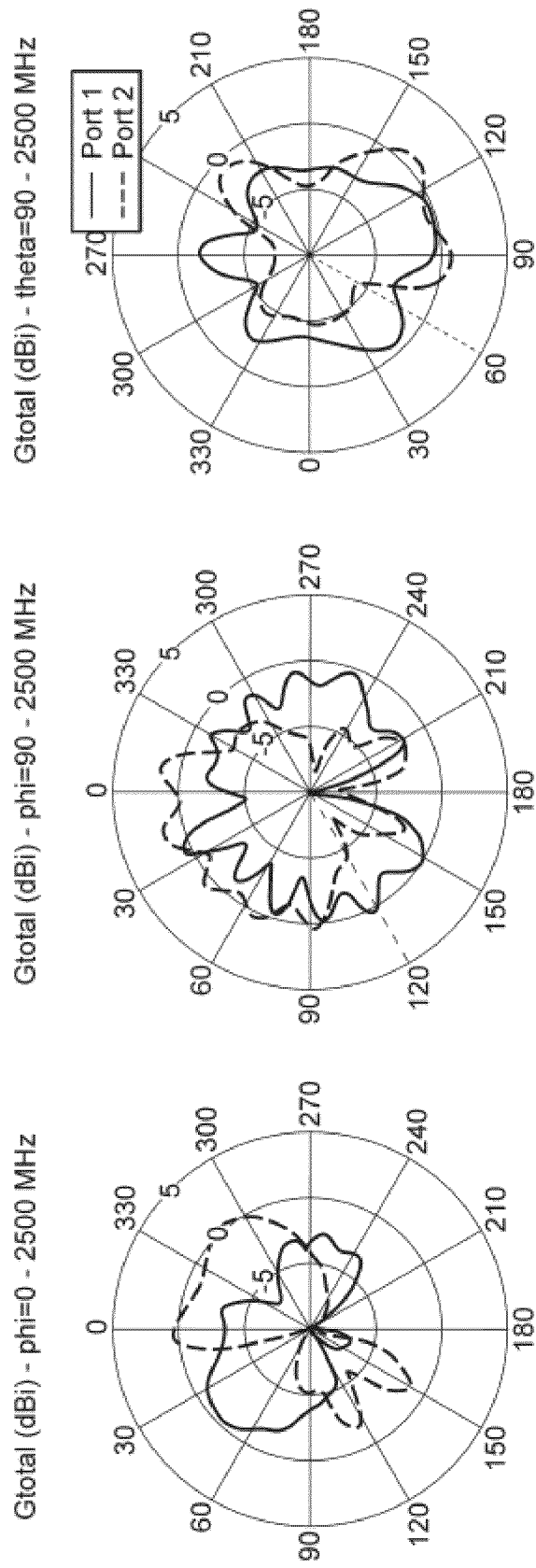
Figure 20I:
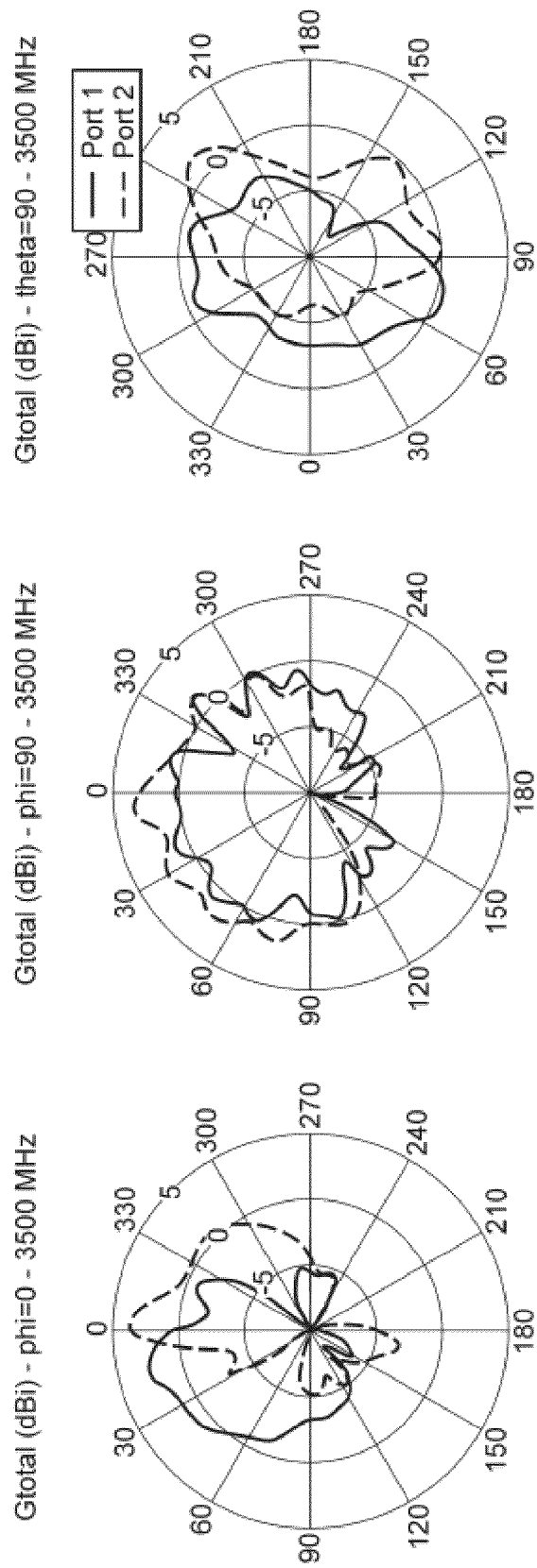
Figure 20J:
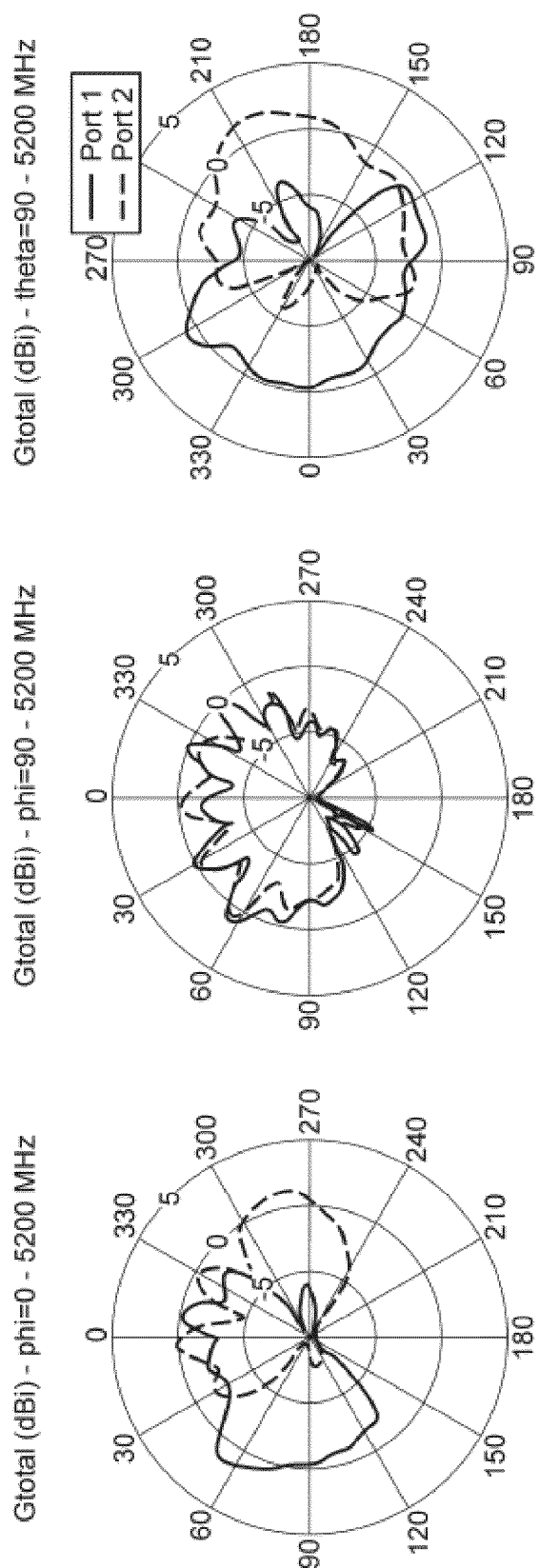

FIG. 20D shows the VSWR measured at test ports 2014, 2016. FIG. 20E shows the coupling (S21 or S12) measured between the test ports. The VSWR and coupling are advantageously low across the broad range of frequencies, e.g., 2300 to 6000 MHz. FIG. 20F shows the measured radiation efficiency referenced from the test ports 2014 (Port 1), 2016 (Port 2). FIG. 20G shows the calculated correlation between the radiation patterns produced by excitation of test port 2014 (Port 1) versus those produced by excitation of test port 2016 (Port 2). The radiation efficiency is advantageously high while the correlation between patterns is advantageously low at the frequencies of interest. FIG. 20H shows far field gain patterns by excitation of test port 2014 (Port 1) or test port 2016 (Port 2) at a frequency of 2500 MHz. FIGS. 20I and 20J show the same pattern measurements at frequencies of 3500 and 5200 MHz, respectively. The patterns resulting from test port 2014 (Port 1) are different and complementary to those of test port 2016 (Port 2) in the $\phi=0$ or XZ plane and in the $\theta=90$ or XY plane.

Figure 21A:
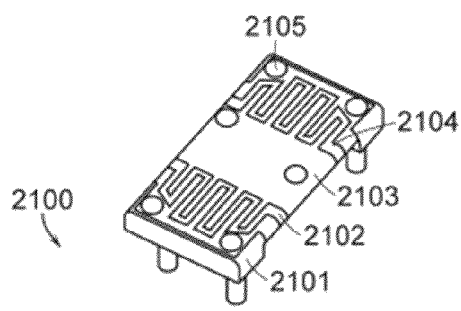
FIGS. 21A and 21B illustrate a multimode antenna structure useable, e.g., in a WiMAX USB dongle in accordance with one or more alternate embodiments of the subject disclosure.
Figure 21B:
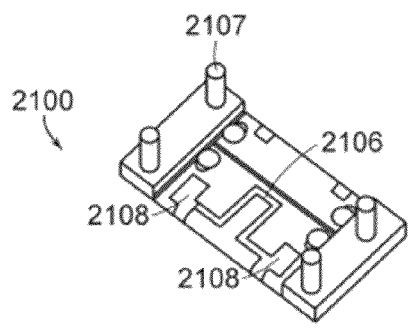

FIGS. 21A and 21B illustrate a multimode antenna structure 2100 in accordance with one or more alternate embodiments of the subject disclosure. The antenna structure 2100 can also be used, e.g., in a WiMAX USB dongle. The antenna structure can be configured for operation, e.g., in WiMAX bands from 2300 to 2400 MHz.

The antenna structure 2100 includes two antenna elements 2102, 2104, each comprising a meandered monopole. The length of the meander determines the center frequency. Other tortuous configurations such as, e.g., helical coils and loops, can also be used to provide a desired electrical length. The exemplary design shown in the figure is optimized for a center frequency of 2350 MHz. A connecting element 2106 (shown in FIG. 21B) electrically connects the antenna elements 2102, 2104. A two-component lumped element match is provided at each antenna feed.

The antenna structure can be fabricated, e.g., from copper as a flexible printed circuit (FPC) 2103 mounted on a plastic carrier 2101. The antenna structure can be created by the metalized portions of the FPC 2103. The plastic carrier 2101 provides mounting pins or pips 2107 for attaching the antenna to a PCB assembly (not shown) and pips 2105 for securing the FPC 2103 to the carrier 2101. The metalized portion of 2103 includes exposed portions or pads 2108 for electrically contacting the antenna to the circuitry on the PCB.

Figure 22A:
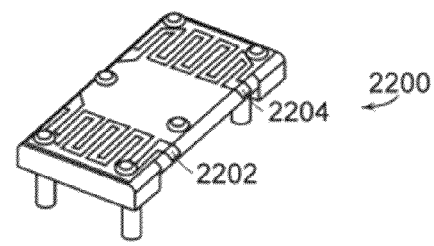
FIGS. 22A and 22B illustrate a multimode antenna structure useable, e.g., in a WiMAX USB dongle in accordance with one or more alternate embodiments of the subject disclosure.
Figure 22B:
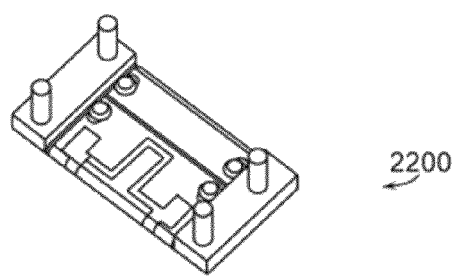

To obtain higher center frequencies, the electrical length of the elements 2102, 2104 can be reduced. FIGS. 22A and 22B illustrate a multimode antenna structure 2200, the design of which is optimized for a center frequency of 2600 MHz. The electrical length of the elements 2202, 2204 is shorter than that of elements 2102, 2104 of FIGS. 21A and 21B because metallization at the end of the elements 2202, 2204 has been removed, and the width of the of the elements at feed end has been increased.

Figure 23A:
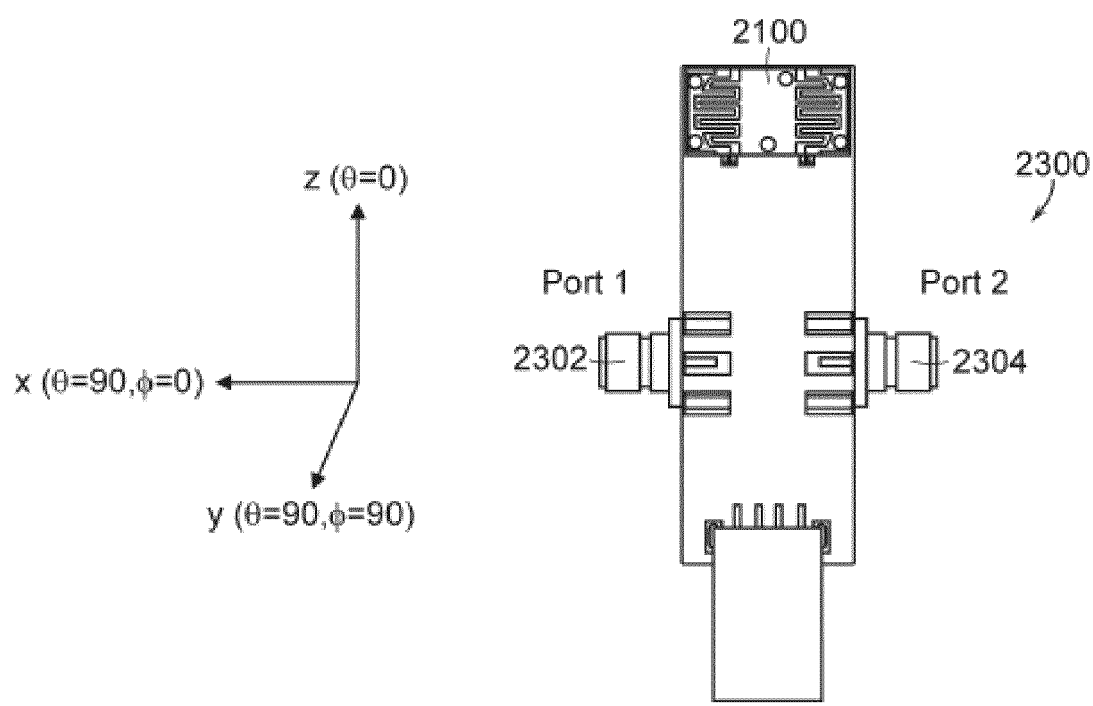
FIG. 23A illustrates a test assembly used to measure the performance of the antenna of FIGS. 21A and 21B.
Figure 23B:
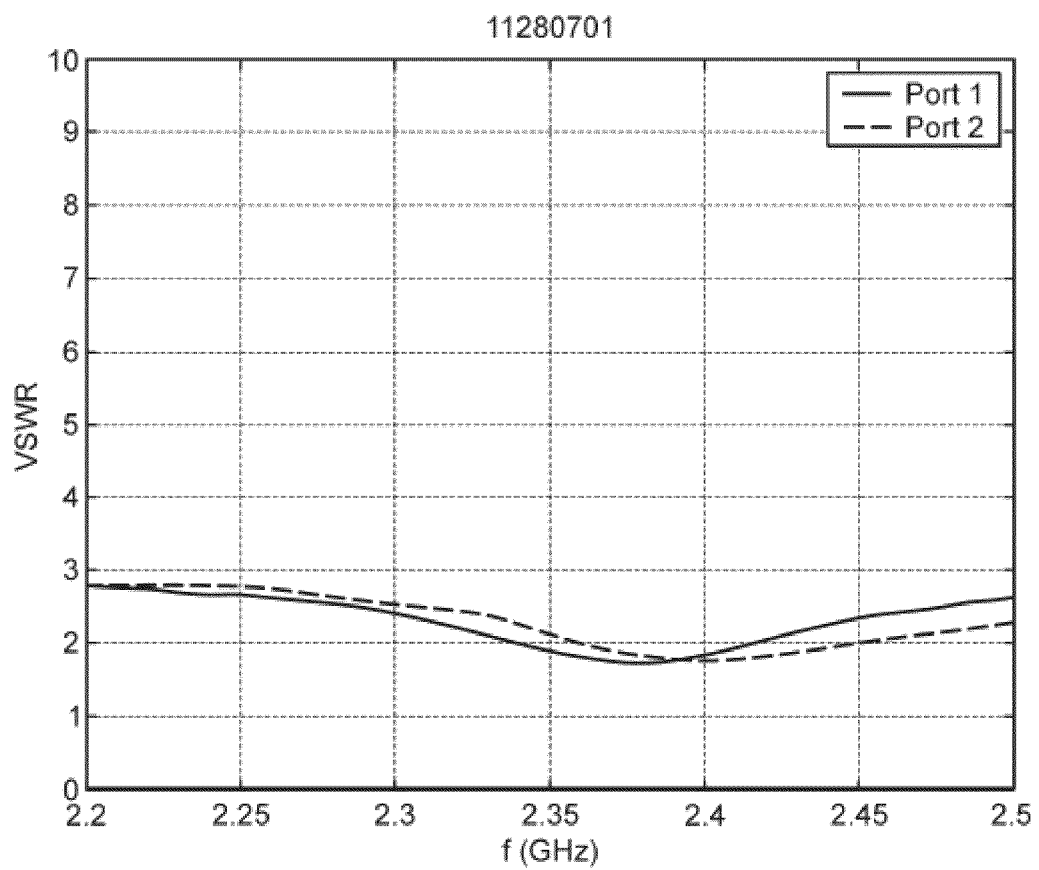
FIGS. 23B to 23K illustrate test measurement results for the antenna of FIGS. 21A and 21B.
Figure 23C:
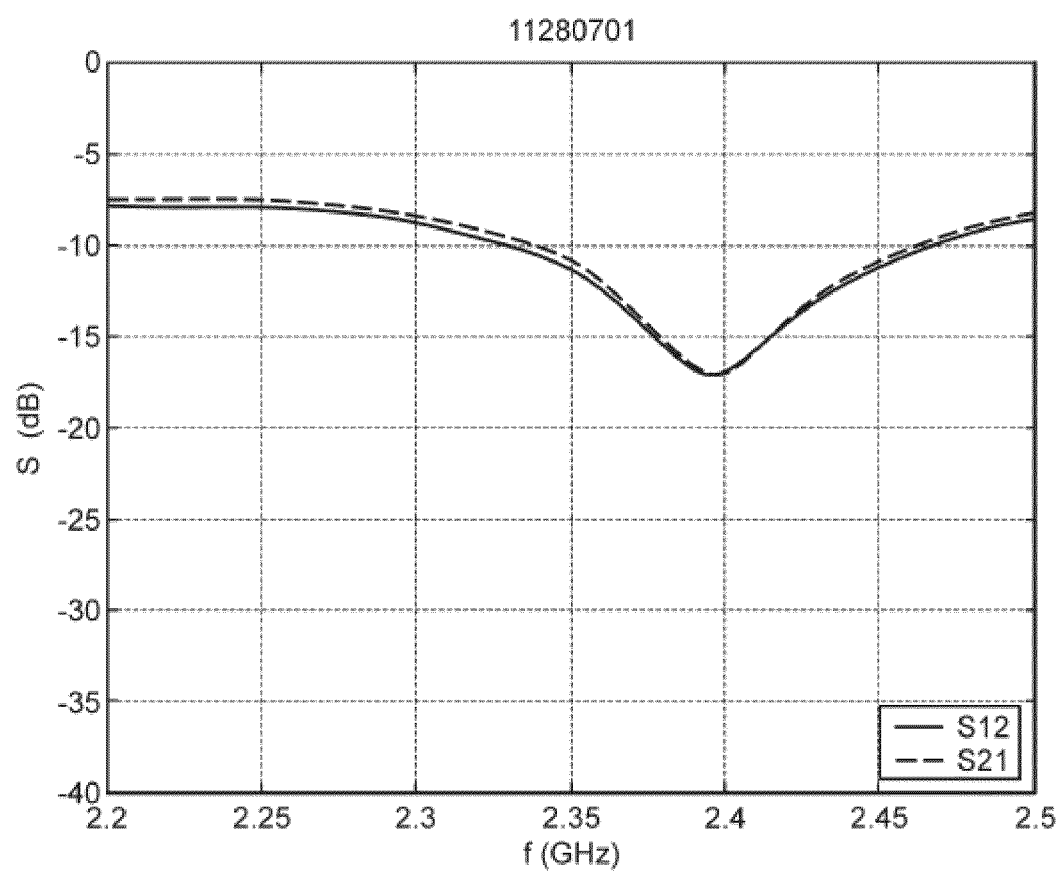
Figure 23D:
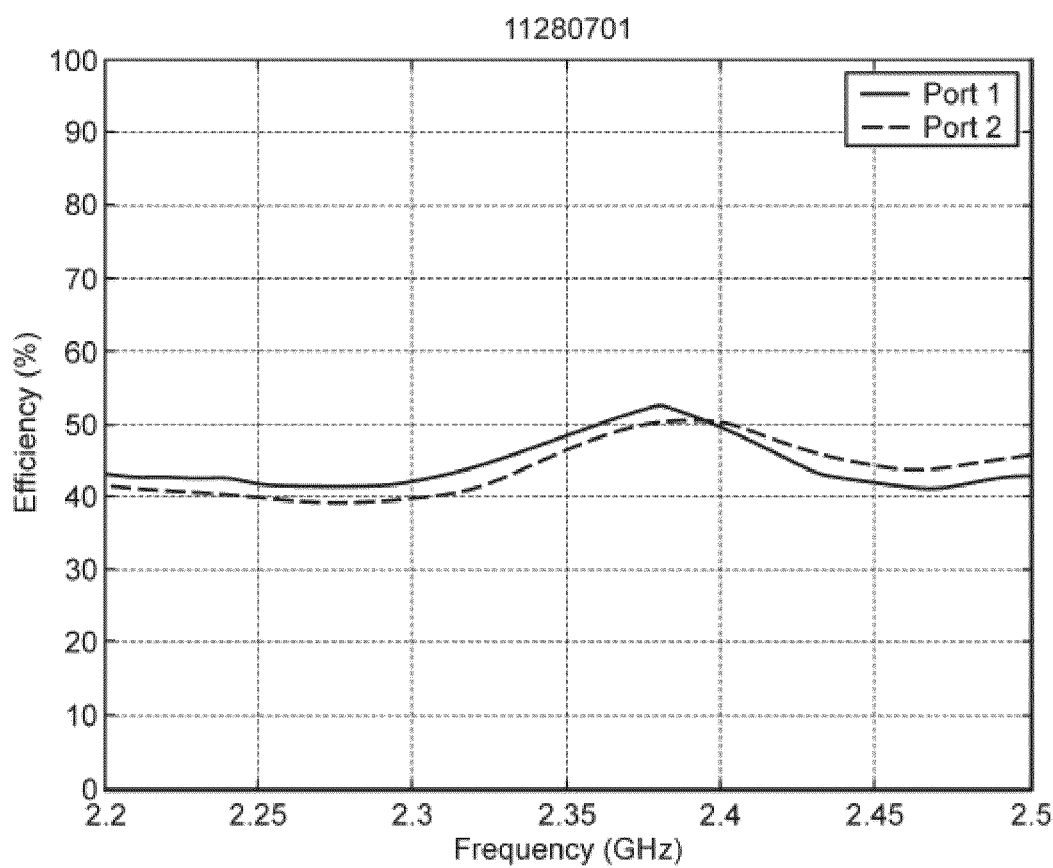
Figure 23E:
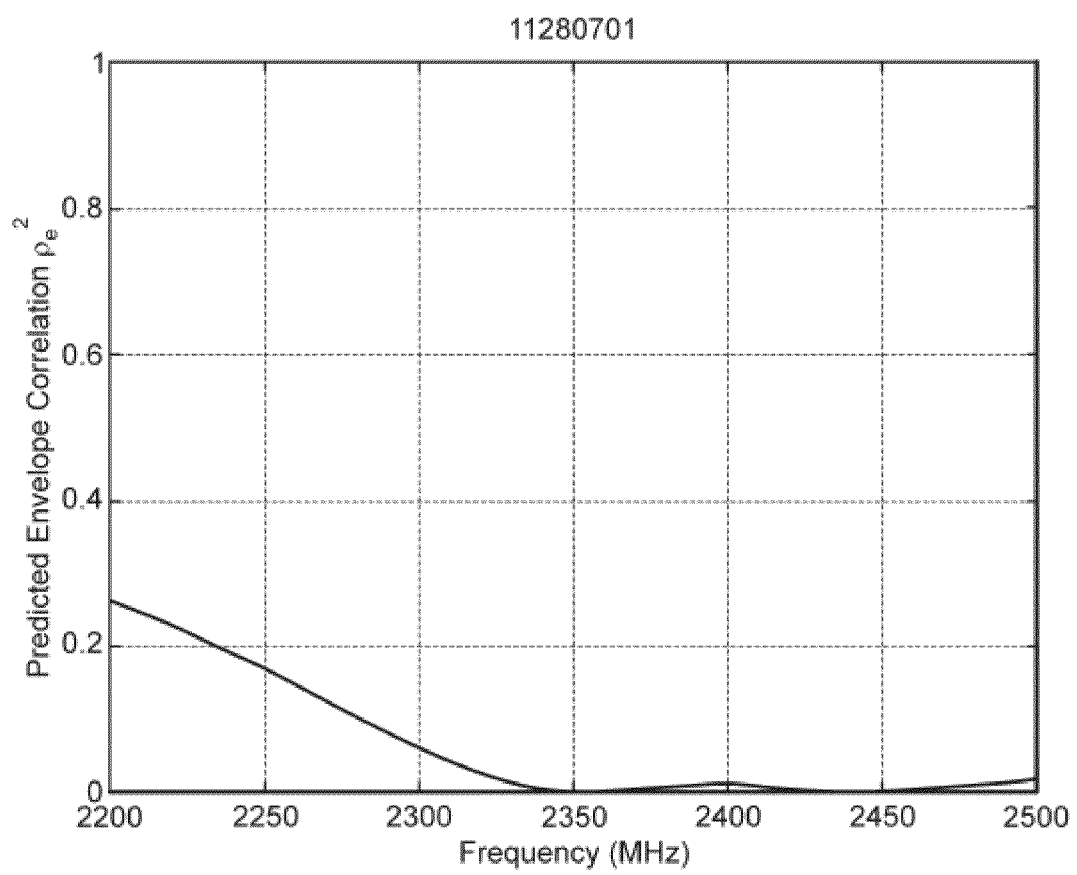
Figure 23F:
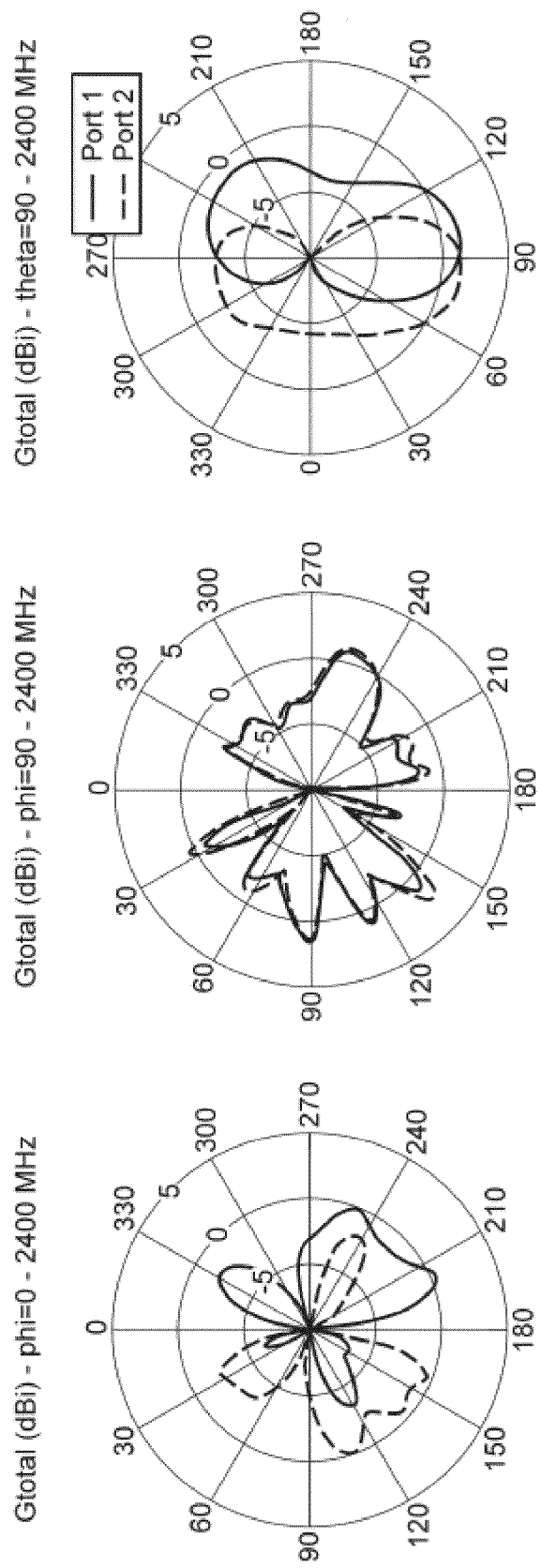

FIG. 23A illustrates a test assembly 2300 using antenna 2100 of FIGS. 21A and 21B along with the coordinate reference for far-field patterns. FIG. 23B shows the VSWR measured at test ports 2302 (Port 1), 2304 (Port 2). FIG. 23C shows the coupling (S21 or S12) measured between the test ports 2302 (Port 1), 2304 (Port 2). The VSWR and coupling are advantageously low at the frequencies of interest, e.g., 2300 to 2400 MHz. FIG. 23D shows the measured radiation efficiency referenced from the test ports. FIG. 23E shows the calculated correlation between the radiation patterns produced by excitation of test port 2302 (Port 1) versus those produced by excitation of test port 2304 (Port 2). The radiation efficiency is advantageously high while the correlation between patterns is advantageously low at the frequencies of interest. FIG. 23F shows far field gain patterns by excitation of test port 2302 (Port 1) or test port 2304 (Port 2) at a frequency of 2400 MHz. The patterns resulting from test port 2302 (Port 1) are different and complementary to those of test port 2304 (Port 2) in the φ=0 or XZ plane and in the θ=90 or XY plane.

Figure 23G:
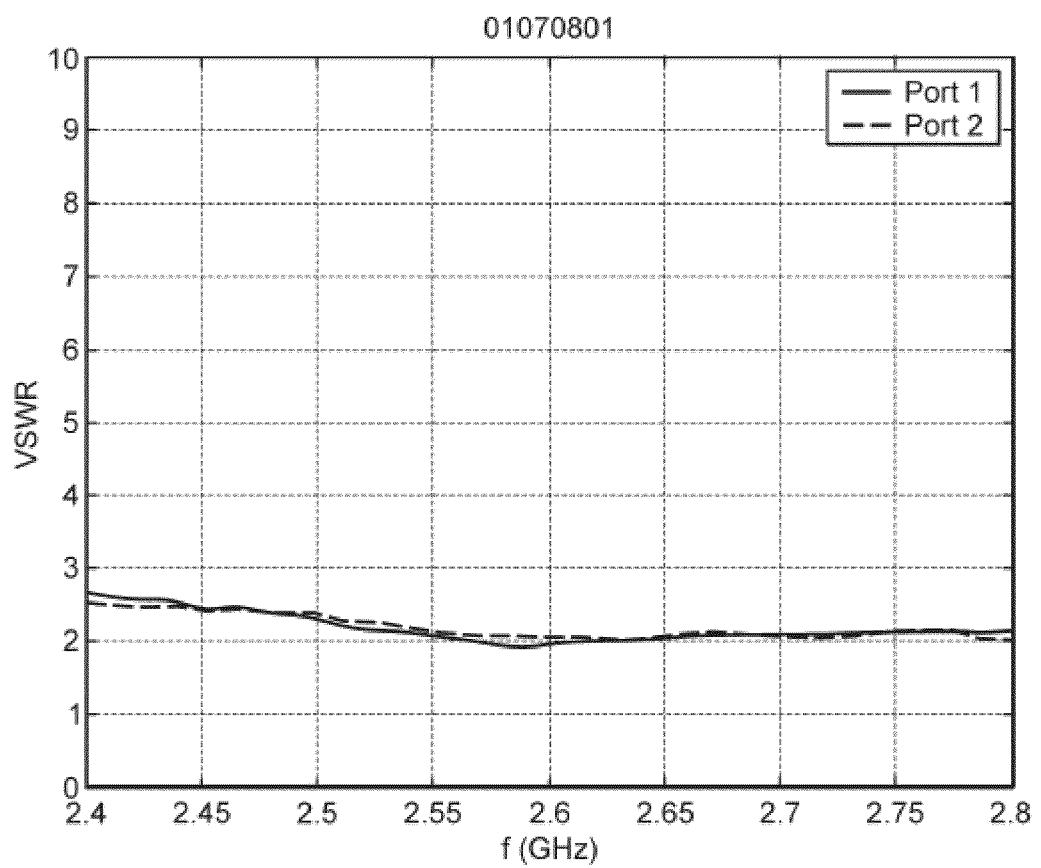
Figure 23H:
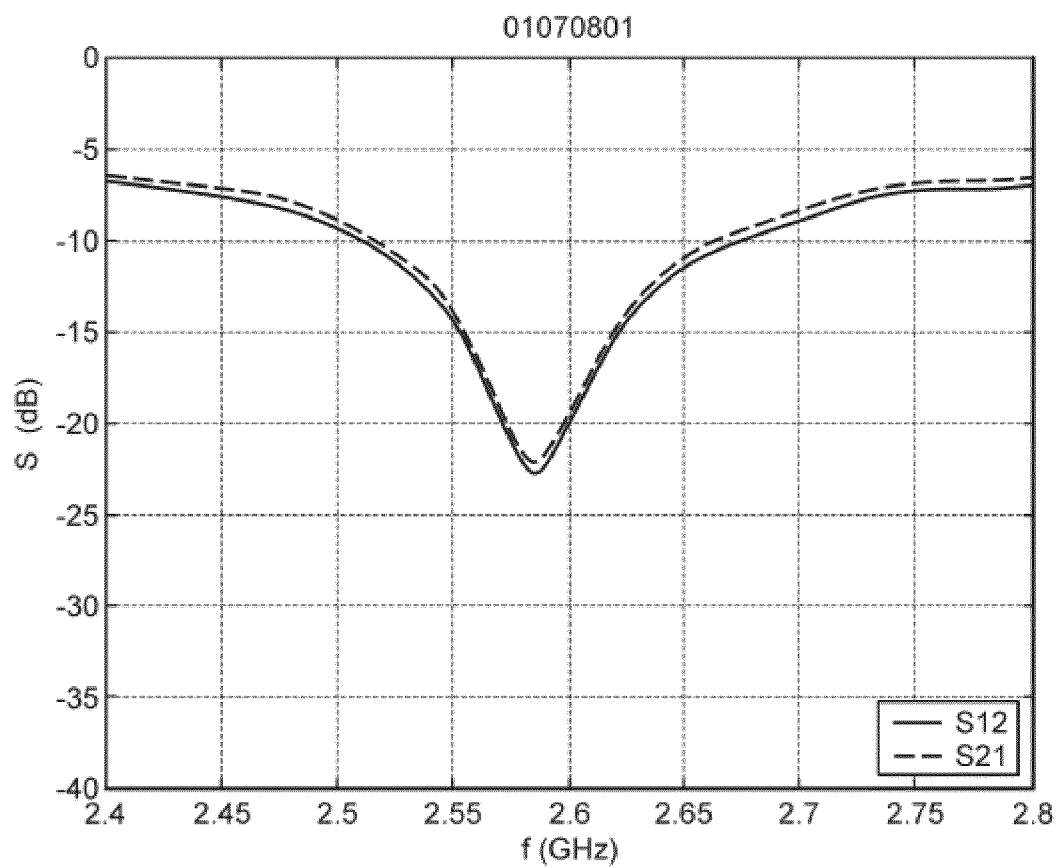
Figure 23I:
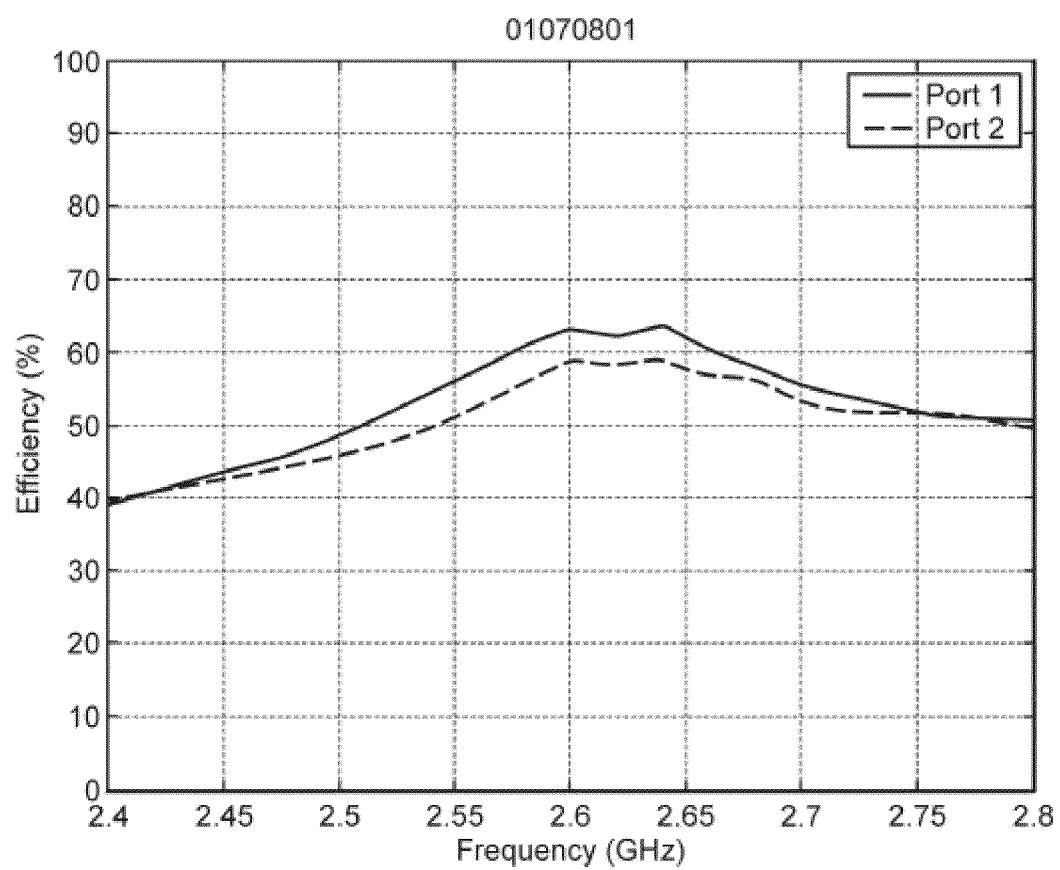
Figure 23J:
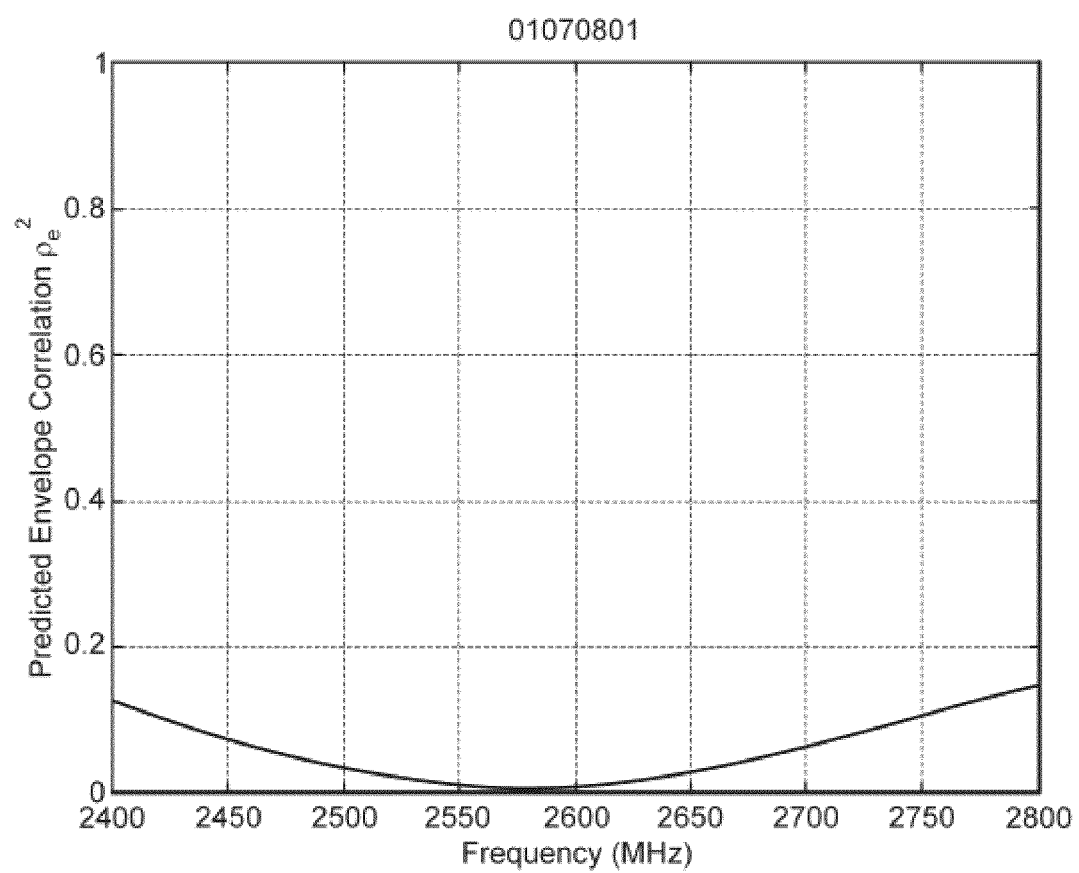
Figure 23K:
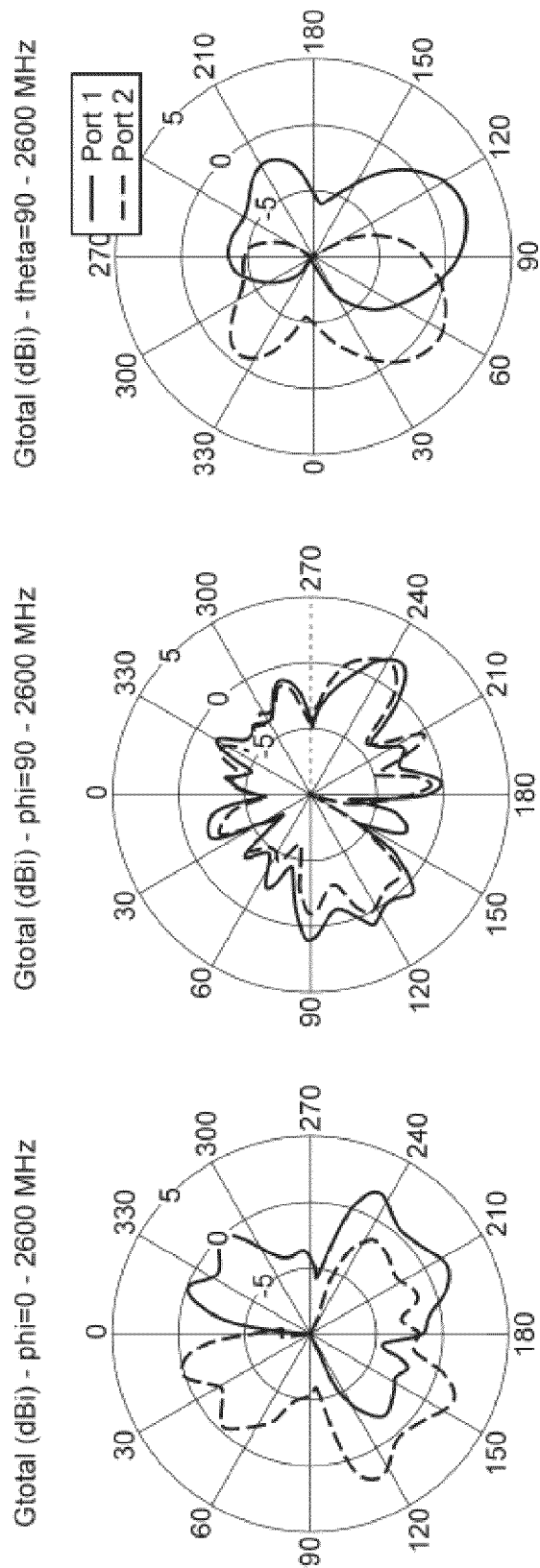

FIG. 23G shows the VSWR measured at the test ports of assembly 2300 with antenna 2200 in place of antenna 2100. FIG. 23H shows the coupling (S21 or S12) measured between the test ports. The VSWR and coupling are advantageously low at the frequencies of interest, e.g. 2500 to 2700 MHz. FIG. 23I shows the measured radiation efficiency referenced from the test ports. FIG. 23J shows the calculated correlation between the radiation patterns produced by excitation of test port 2302 (Port 1) versus those produced by excitation of test port 2304 (Port 2). The radiation efficiency is advantageously high while the correlation between patterns is advantageously low at the frequencies of interest. FIG. 23K shows far field gain patterns by excitation of test port 2302 (Port 1) or test port 2304 (Port 2) at a frequency of 2600 MHz. The patterns resulting from test port 2302 (Port 1) are different and complementary to those of test port 2304 (Port 2) in the φ=0 or XZ plane and in the θ=90 or XY plane.

One or more further embodiments of the subject disclosure are directed to techniques for beam pattern control for the purpose of null steering or beam pointing. When such techniques are applied to a conventional array antenna (comprising separate antenna elements that are spaced at some fraction of a wavelength), each element of the array antenna is fed with a signal that is a phase shifted version of a reference signal or waveform. For a uniform linear array with equal excitation, the beam pattern produced can be described by the array factor F, which depends on the phase of each individual element and the inter-element element spacing d.

$$F = A_0 \sum_{n=0}^{N-1} \exp[jn(\beta d \cos\theta + \alpha)]$$

where $\beta = 2\pi/\lambda$, $N$ = Total # of elements, $\alpha$ = phase shift between successive elements, and $\theta$ = angle from array axis By controlling the phase $\alpha$ to a value $\alpha_i$, the maximum value of F can be adjusted to a different direction $\theta_i$, thereby controlling the direction in which a maximum signal is broadcast or received.

The inter-element spacing in conventional array antennas is often on the order of ¼ wavelength, and the antennas can be closely coupled, having nearly identical polarization. It is advantageous to reduce the coupling between elements, as coupling can lead to several problems in the design and performance of array antennas. For example, problems such as pattern distortion and scan blindness (see Stutzman, Antenna Theory and Design, Wiley 1998, pgs 122-128 and 135-136, and 466-472) can arise from excessive inter-element coupling, as well as a reduction of the maximum gain attainable for a given number of elements.

Beam pattern control techniques can be advantageously applied to all multimode antenna structures described herein having antenna elements connected by one or more connecting elements, which exhibit high isolation between multiple feedpoints. The phase between ports at the high isolation antenna structure can be used for controlling the antenna pattern. It has been found that a higher peak gain is achievable in given directions when the antenna is used as a simple beam-forming array as a result of the reduced coupling between feedpoints. Accordingly, greater gain can be achieved in selected directions from a high isolation antenna structure in accordance with various embodiments that utilizes phase control of the carrier signals presented to its feed terminals.

In handset applications where the antennas are spaced at much less than ¼ wavelength, mutual coupling effects in conventional antennas reduce the radiation efficiency of the array, and therefore reduce the maximum gain achievable.

Figure 24:
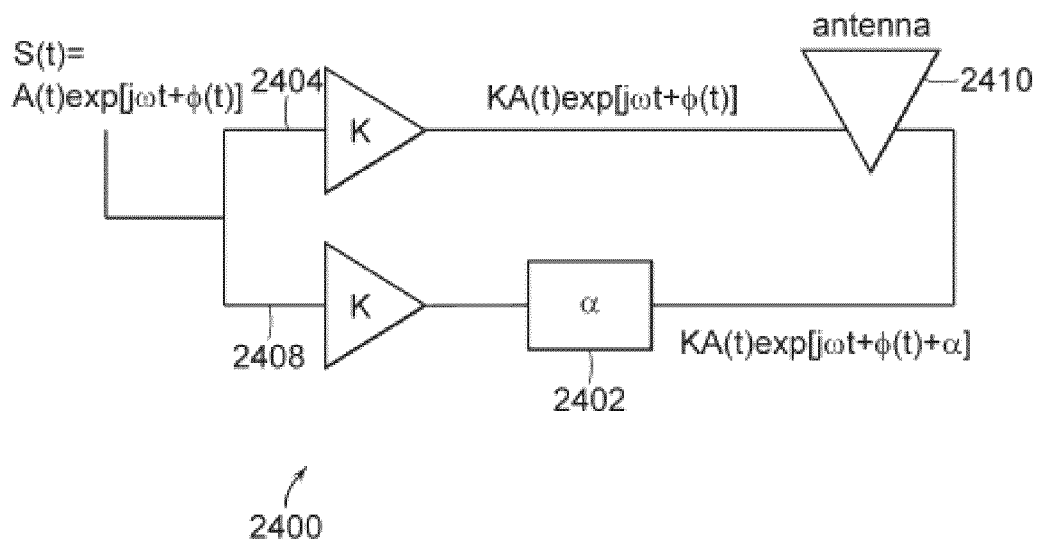
FIG. 24 is a schematic block diagram of an antenna structure with a beam steering mechanism in accordance with one or more embodiments of the subject disclosure.

By controlling the phase of the carrier signal provided to each feedpoint of a high isolation antenna in accordance with various embodiments, the direction of maximum gain produced by the antenna pattern can be controlled. A gain advantage of, e.g., 3 dB obtained by beam steering is advantageous particularly in portable device applications where the beam pattern is fixed and the device orientation is randomly controlled by the user. As shown, e.g., in the schematic block diagram of FIG. 24, which illustrates a pattern control apparatus 2400 in accordance with various embodiments, a relative phase shift cc is applied by a phase shifter 2402 to the RF signals applied to each antenna feed 2404, 2408. The signals are fed to respective antenna ports of antenna structure 2410.

The phase shifter 2402 can comprise standard phase shift components such as, e.g., electrically controlled phase shift devices or standard phase shift networks.

FIGS. 25A-25G provide a comparison of antenna patterns produced by a closely spaced 2-D conventional array of dipole antennas and a 2-D array of high isolation antennas in accordance with various embodiments of the subject disclosure for different phase differences α between two feeds to the antennas. In FIGS. 25A-25G, curves are shown for the antenna patterns at θ=90 degrees. The solid lines in the figures represents the antenna pattern produced by the isolated feed single element antenna in accordance with various embodiments, while the dashed lines represent the antenna pattern produced by two separate monopole conventional antennas separated by a distance equal to the width of the single element isolated feed structure. Therefore, the conventional antenna and the high isolation antenna are of generally equivalent size.

In all cases shown in the figures, the peak gain produced by the high isolation antenna in accordance with various embodiments produces a greater gain margin when compared to the two separate conventional dipoles, while providing azimuthal control of the beam pattern. This behavior makes it possible to use the high isolation antenna in transmit or receive applications where additional gain is needed or desired in a particular direction. The direction can be controlled by adjusting the relative phase between the drivepoint signals. This may be particularly advantageous for portable devices needing to direct energy toward a receive point such as, e.g., a base station. The combined high isolation antenna offers greater advantage when compared to two single conventional antenna elements when phased in a similar fashion.

Figure 25A:
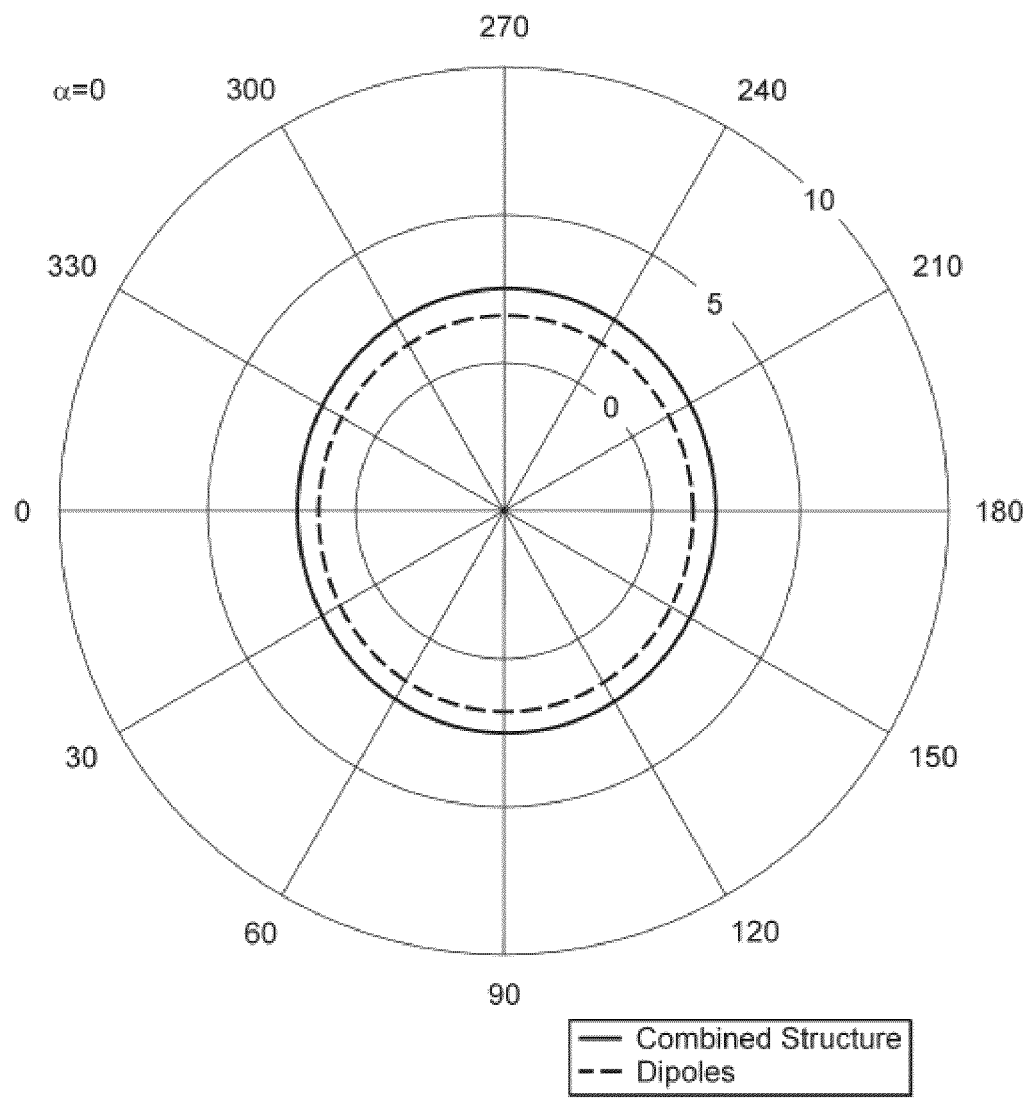

As shown in FIG. 25A, the combined dipole in accordance with various embodiments shows greater gain in a uniform azimuth pattern (θ=90) for α=0 (zero degrees phase difference).

Figure 25B:
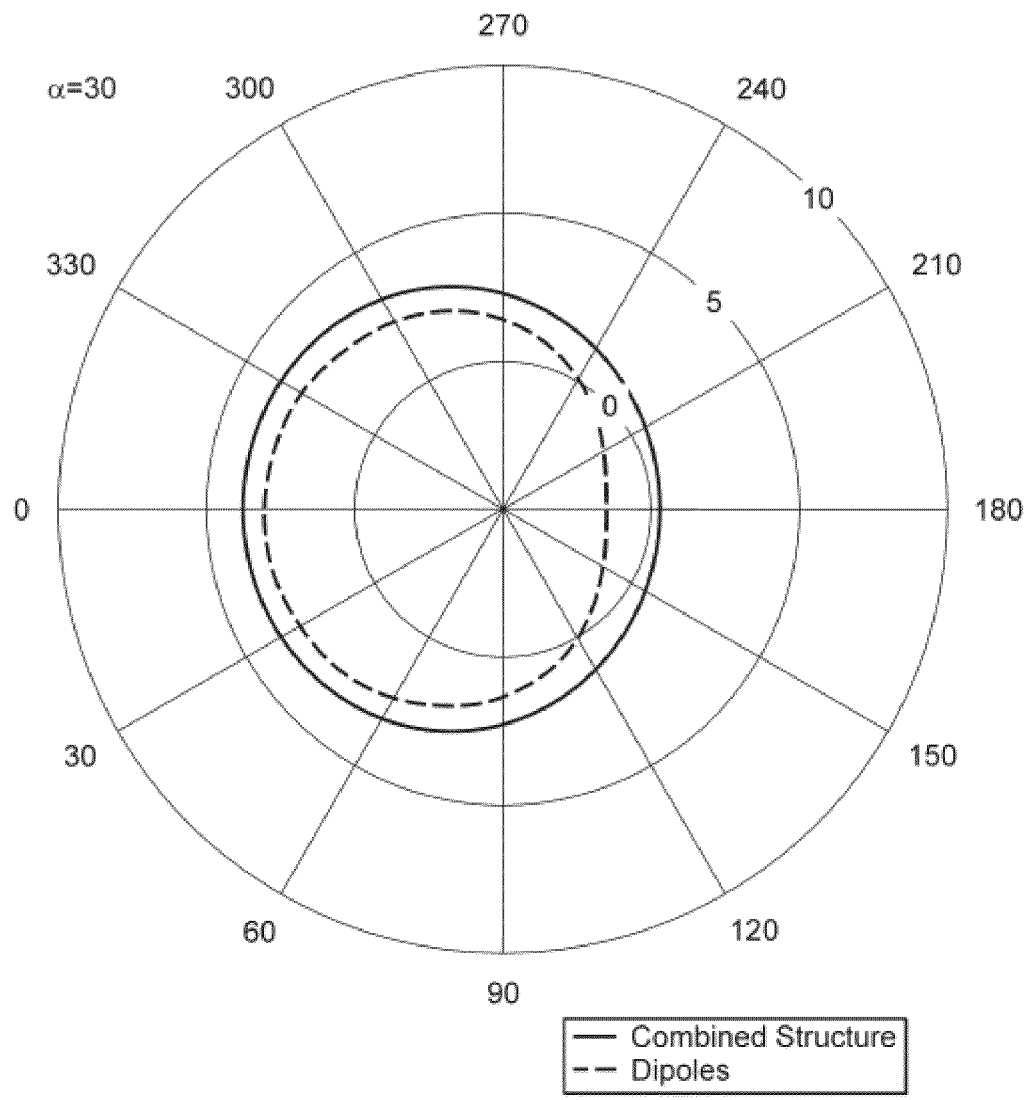

As shown in FIG. 25B, the combined dipole in accordance with various embodiments shows greater peak gain (at φ=0) with a non-symmetric azimuthal pattern (θ=90 plot for α=30 (30 degrees phase difference between feedpoints).

Figure 25C:
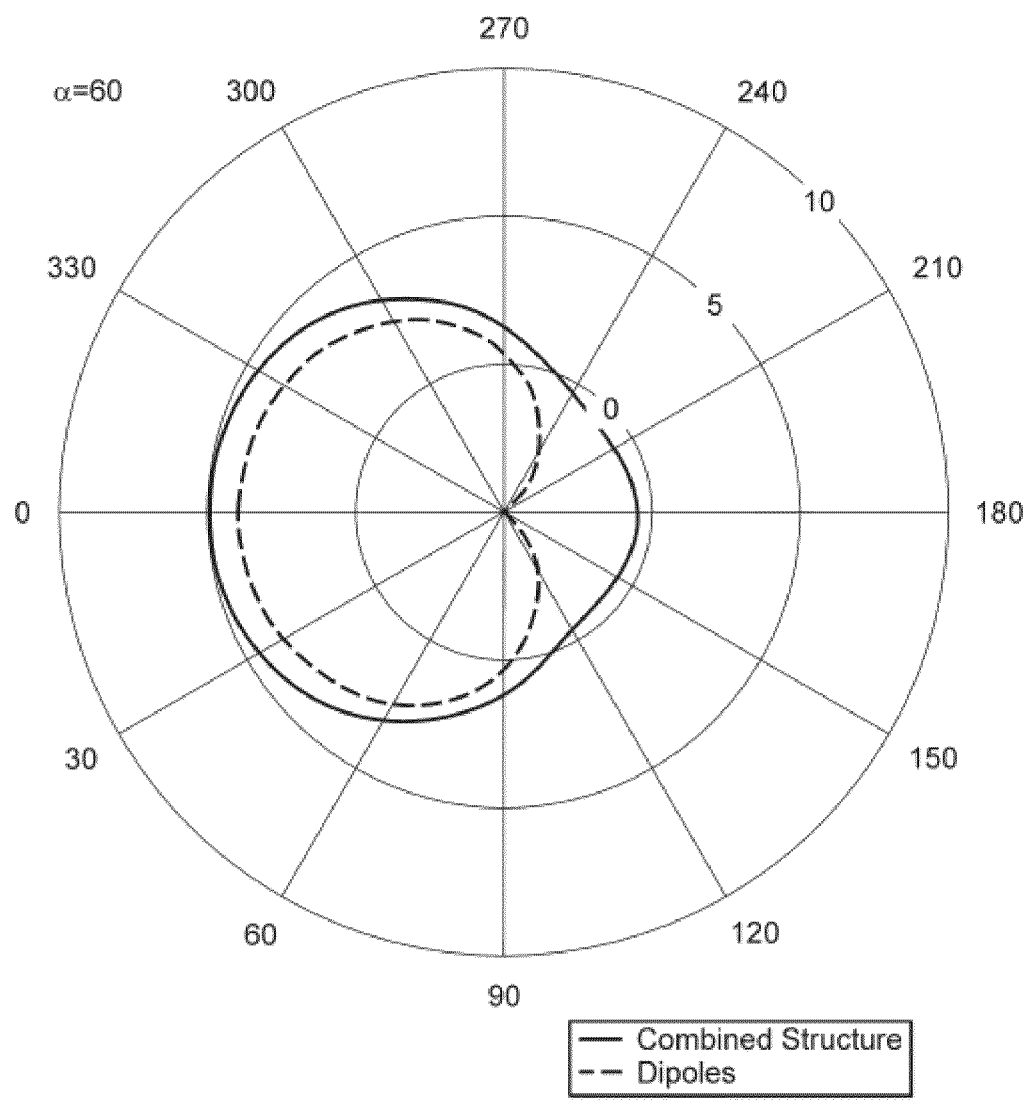

As shown in FIG. 25C, the combined dipole in accordance with various embodiments shows greater peak gain (at φ=0) with a shifted azimuthal pattern (θ=90 plot for α=60 (60 degrees phase difference between feedpoints).

Figure 25D:
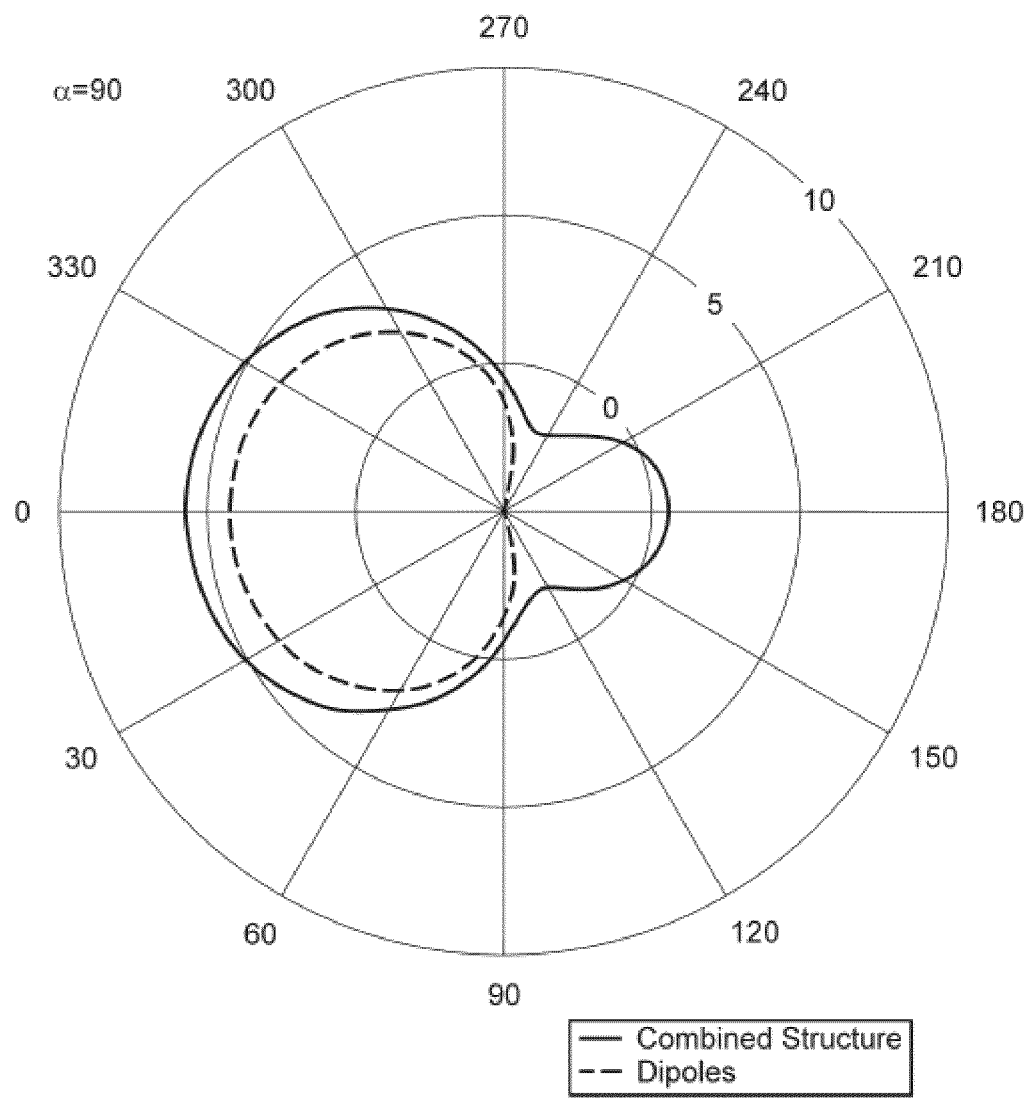

As shown in FIG. 25D, the combined dipole in accordance with various embodiments shows even greater peak gain (at φ=0) with a shifted azimuthal pattern (θ=90 plot for α=90 (90 degrees phase difference between feedpoints).

Figure 25E:
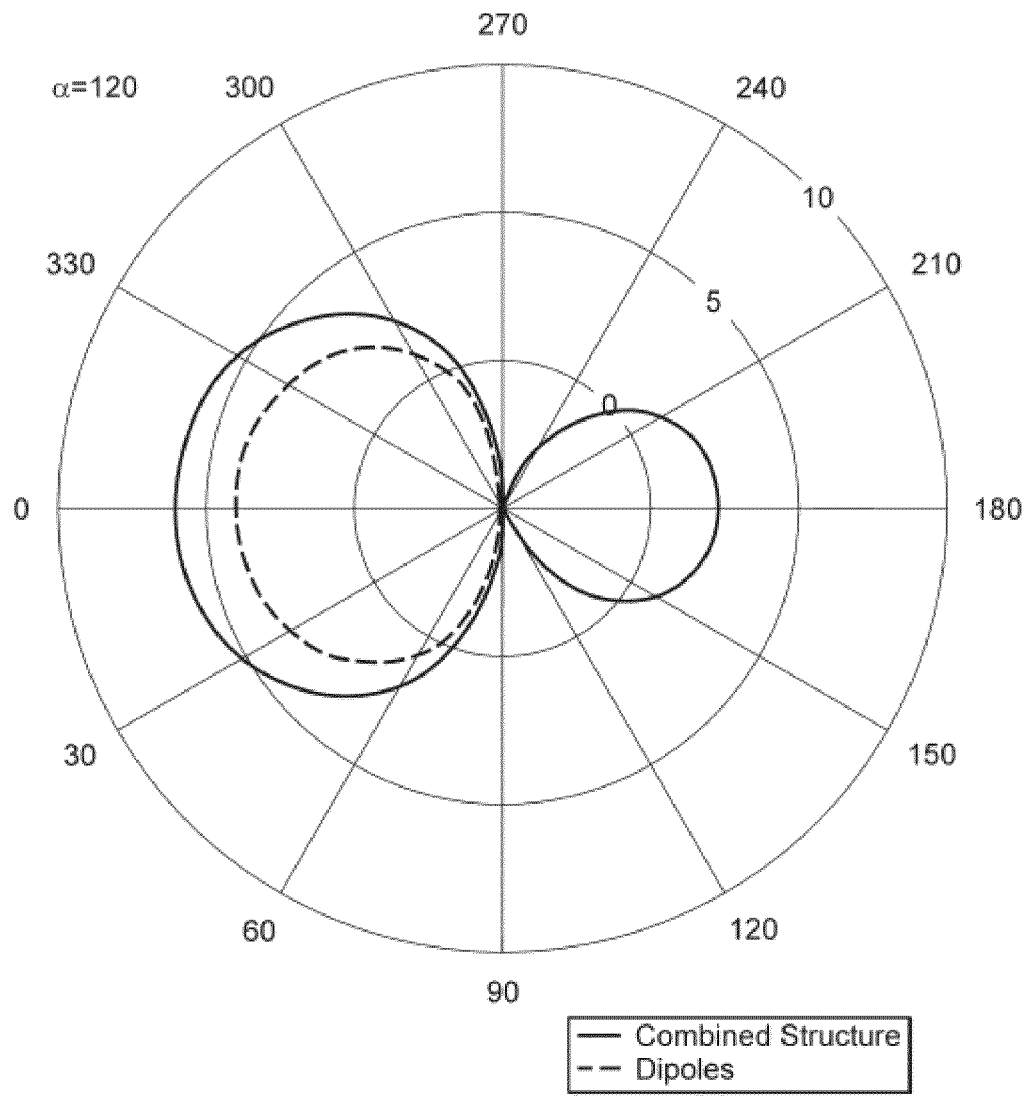

As shown in FIG. 25E, the combined dipole in accordance with various embodiments shows greater peak gain (at φ=0) with a shifted azimuthal pattern (θ=90 plot greater backlobe (at φ=180) for α=120 (120 degrees phase difference between feedpoints).

Figure 25F:
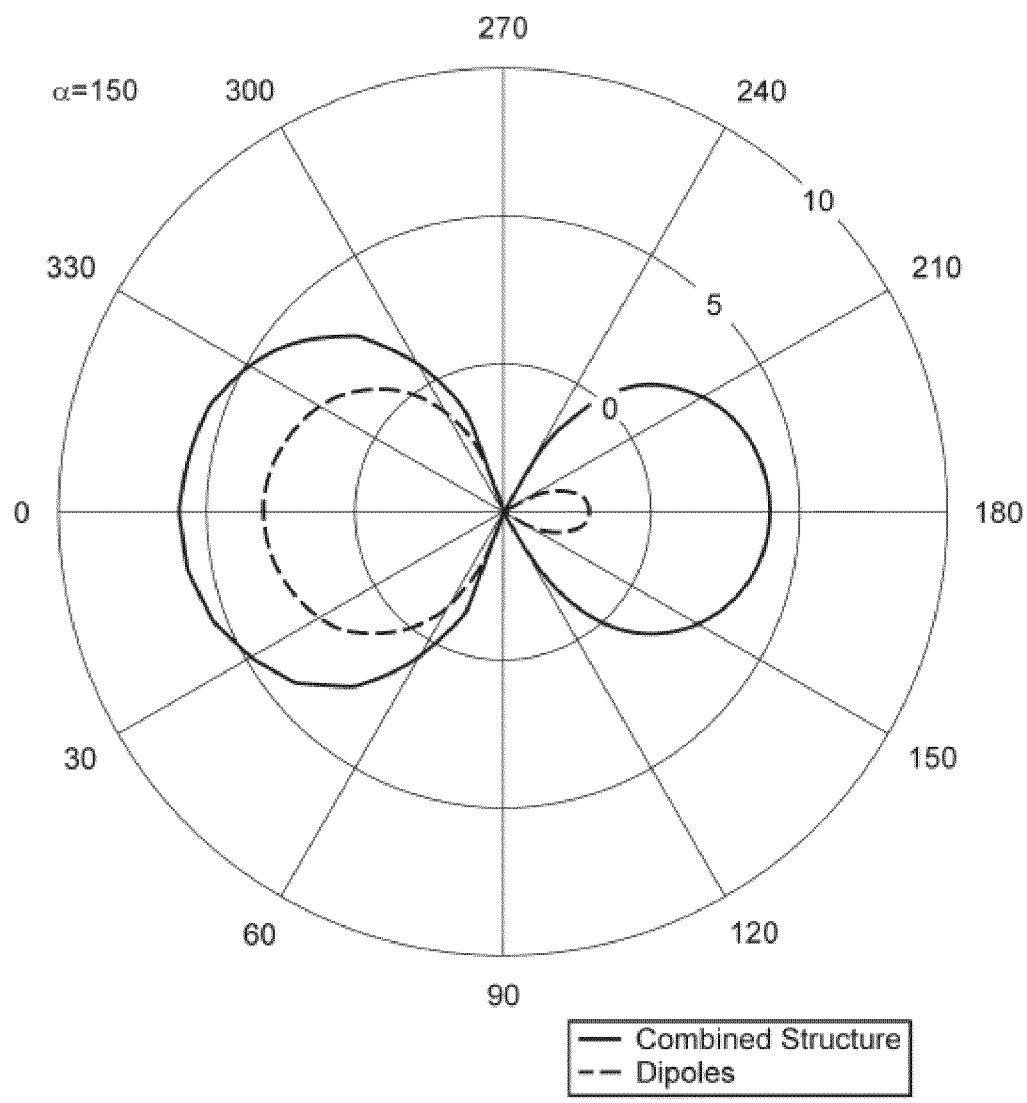

As shown in FIG. 25F, the combined dipole in accordance with various embodiments shows greater peak gain (at φ=0) with a shifted azimuthal pattern (θ=90 plot), even greater backlobe (at φ=180) for α=150 (150 degrees phase difference between feedpoints).

Figure 25G:
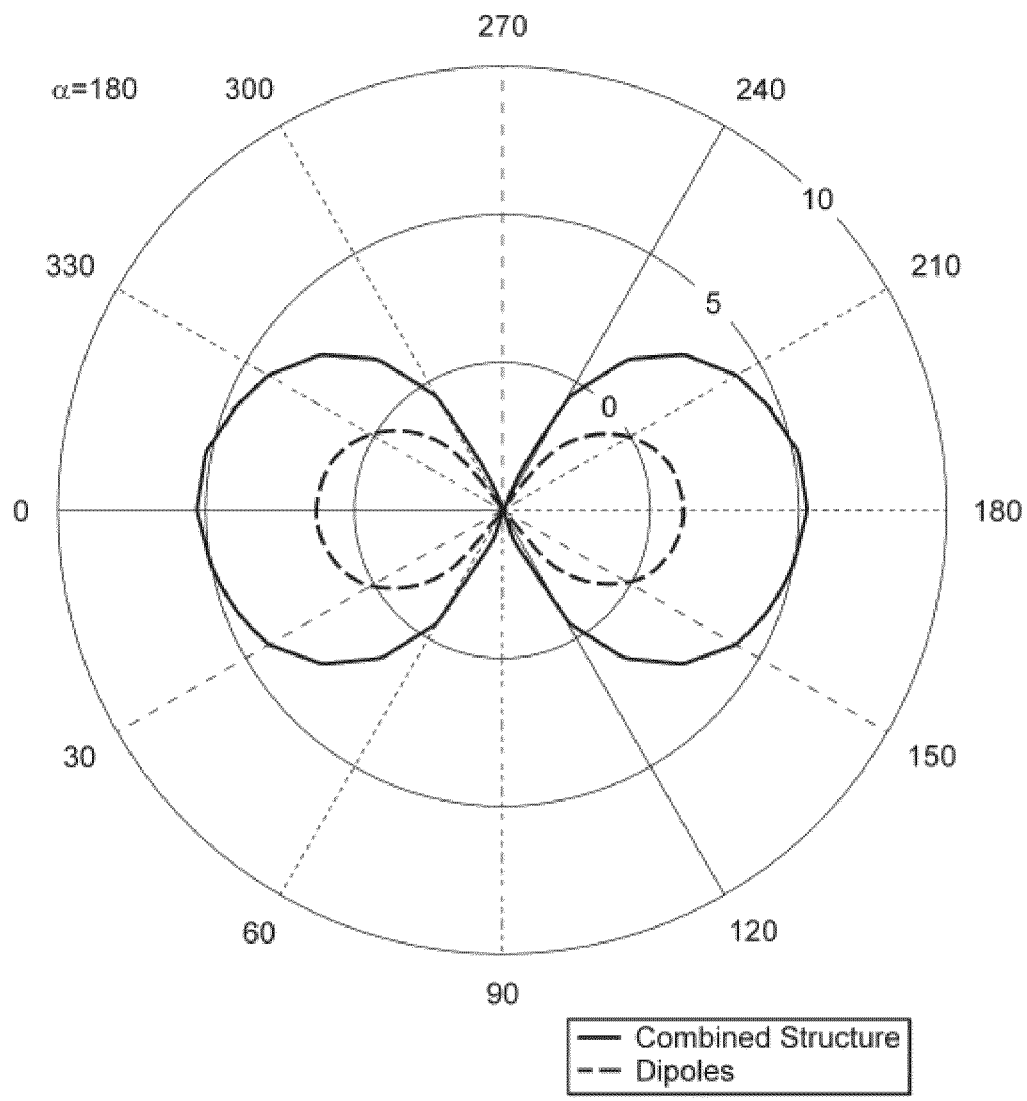

As shown in FIG. 25G, the combined dipole in accordance with various embodiments shows greater peak gain (at φ=0 & 180) with a double lobed azimuthal pattern (θ=90 plot) for α=180 (180 degrees phase difference between feedpoints).

Figure 26:
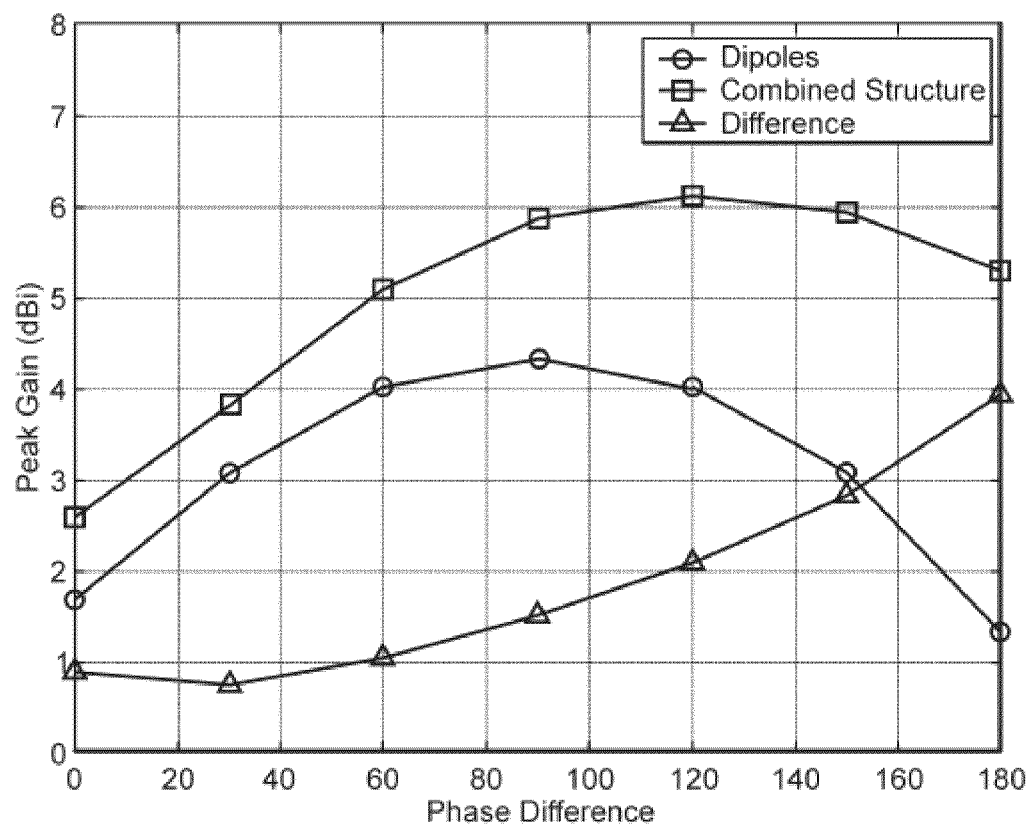
FIG. 26 illustrates the gain advantage of an antenna structure in accordance with one or more embodiments of the subject disclosure as a function of the phase angle difference between feed points.

FIG. 26 illustrates the ideal gain advantage if the combined high isolation antenna in accordance with one or more embodiments over two separate dipoles as a function of the phase angle difference between the feedpoints for a two feedpoint antenna array.

Further embodiments of the subject disclosure are directed to multimode antenna structures that provide increased high isolation between multi-band antenna ports operating in close proximity to each other at a given frequency range. In these embodiments, a band-rejection slot is incorporated in one of the antenna elements of the antenna structure to provide reduced coupling at the frequency to which the slot is tuned.

Figure 27A:
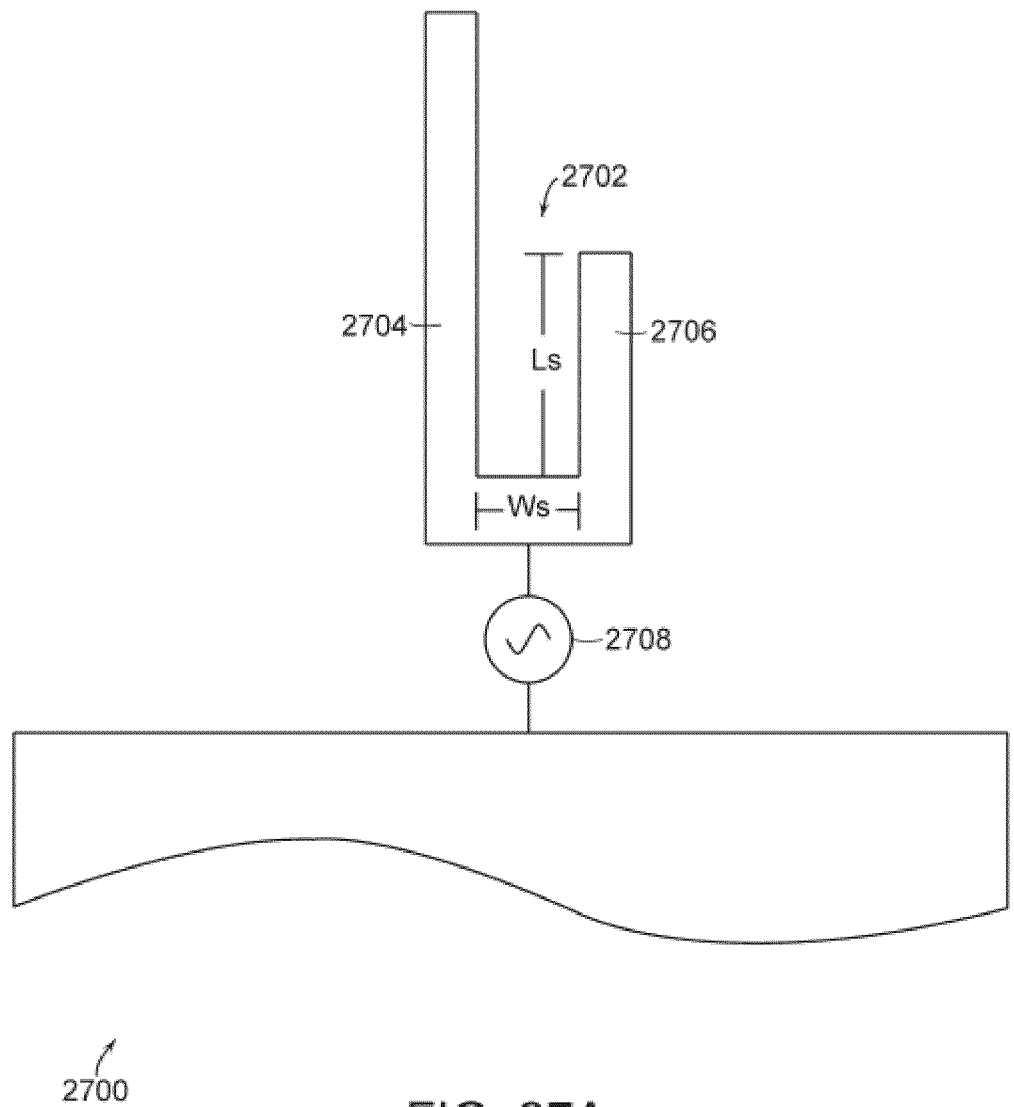
FIG. 27A is a schematic diagram illustrating a simple dual-band branch line monopole antenna structure.

FIG. 27A schematically illustrates a simple dual-band branch line monopole antenna 2700. The antenna 2700 includes a band-rejection slot 2702, which defines two branch resonators 2704, 2706. The antenna is driven by signal generator 2708. Depending on the frequency at which the antenna 2700 is driven, various current distributions are realized on the two branch resonators 2704, 2706.

Figure 27B:
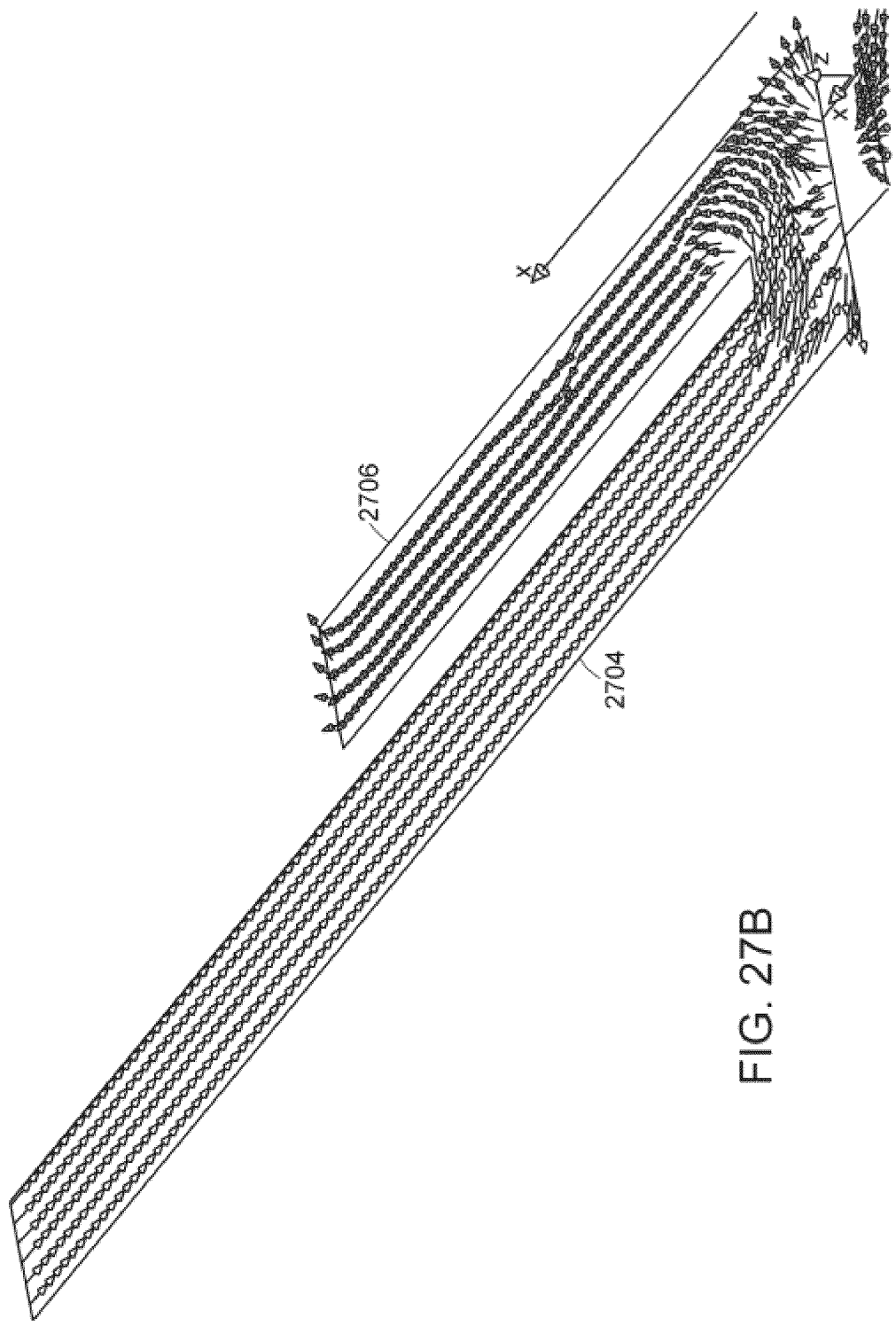
FIG. 27B illustrates current distribution in the FIG. 27A antenna structure.

The physical dimensions of the slot 2702 are defined by the width Ws and the length Ls as shown in FIG. 27A. When the excitation frequency satisfies the condition of Ls=lo/4, the slot feature becomes resonant. At this point the current distribution is concentrated around the shorted section of the slot, as shown in FIG. 27B.

Figure 27C:
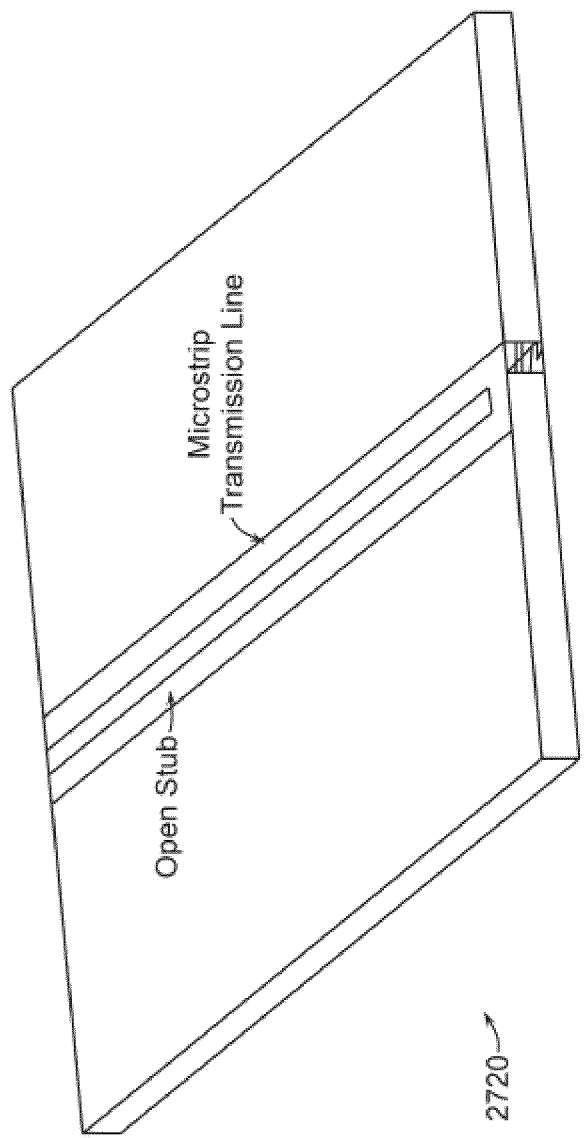
FIG. 27C is a schematic diagram illustrating a spurline band stop filter.
Figure 27D:
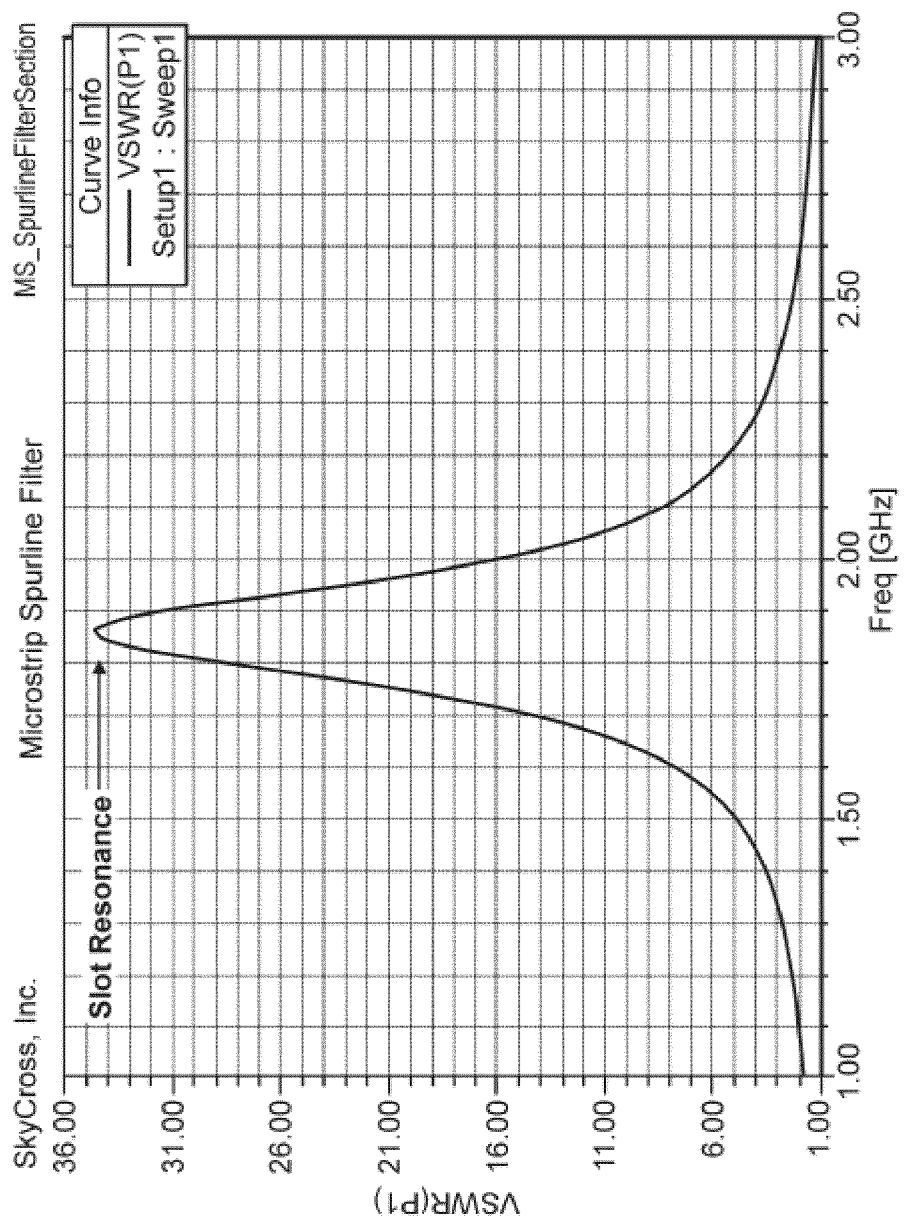
FIGS. 27D and 27E are test results illustrating frequency rejection in the FIG. 27A antenna structure.
Figure 27E:
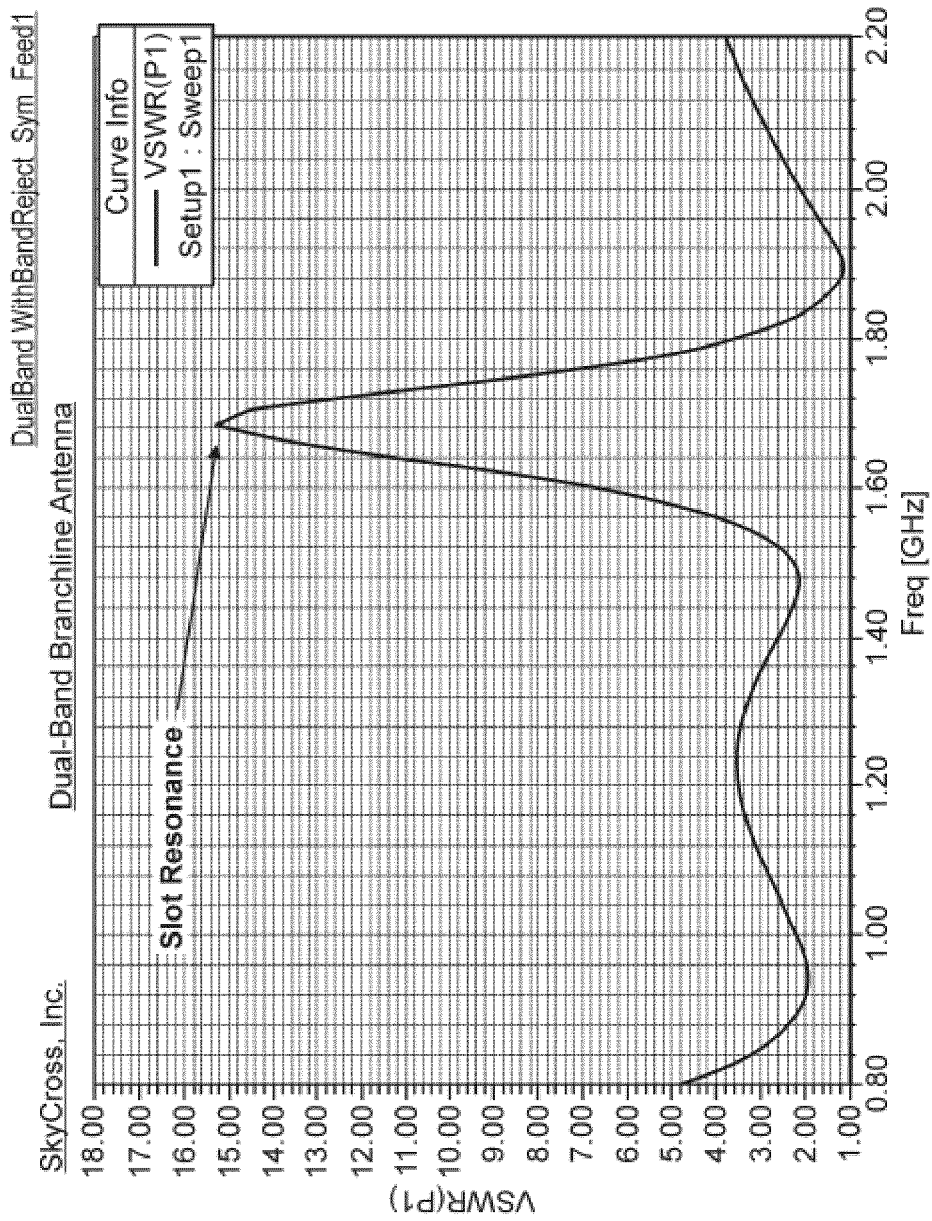

The currents flowing through the branch resonators 2704, 2706 are approximately equal and oppositely directed along the sides of the slot 2702. This causes the antenna structure 2700 to behave in a similar manner to a spurline band stop filter 2720 (shown schematically in FIG. 27C), which transforms the antenna input impedance down significantly lower than the nominal source impedance. This large impedance mismatch results in a very high VSWR, shown in FIGS. 27D and 27E, and as a result leads to the desired frequency rejection.

Figure 28:
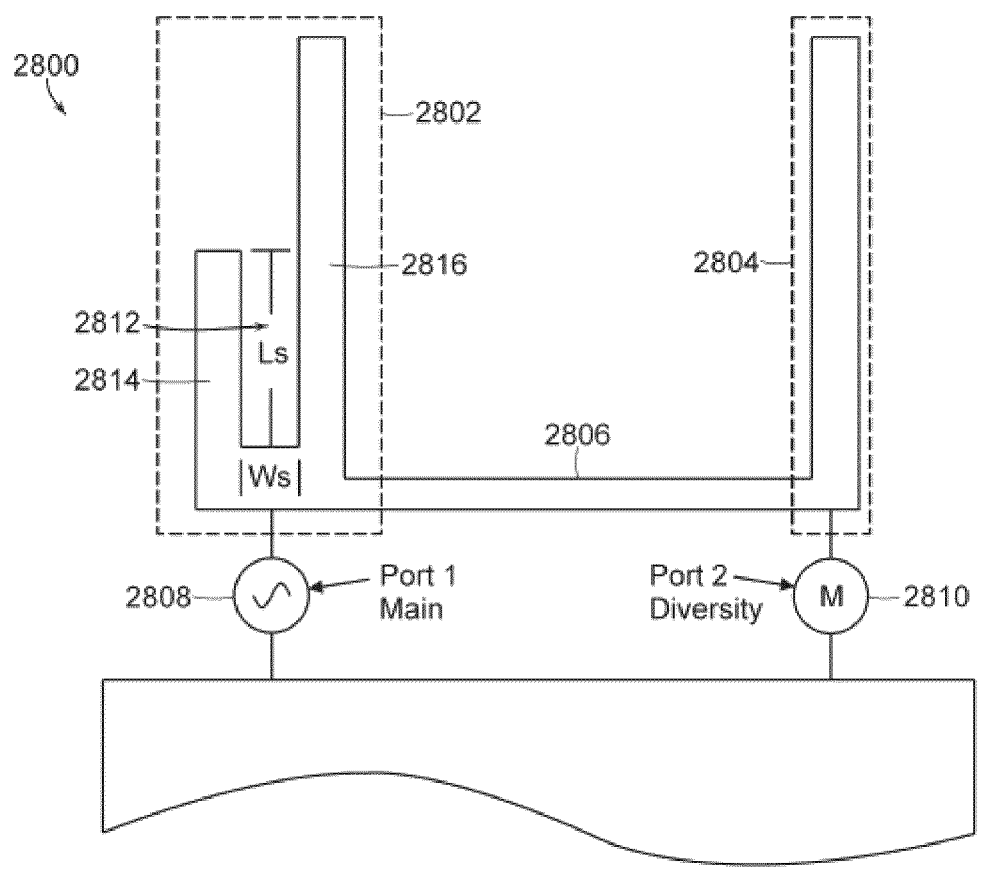
FIG. 28 is a schematic diagram illustrating an antenna structure with a band-rejection slot in accordance with one or more embodiments of the subject disclosure.

This band-rejection slot technique can be applied to an antenna system with two (or more) antennas elements operating in close proximity to each other where one antenna element needs to pass signals of a desired frequency and the other does not. In one or more embodiments, one of the two antenna elements includes a band-rejection slot, and the other does not. FIG. 28 schematically illustrates an antenna structure 2800, which includes a first antenna element 2802, a second antenna element 2804, and a connecting element 2806. The antenna structure 2800 includes ports 2808 and 2810 at antenna elements 2802 and 2804, respectively. In this example, a signal generator drives the antenna structure 2802 at port 2808, while a meter is coupled to the port 2810 to measure current at port 2810. It should be understood, however, that either or both ports can be driven by signal generators. The antenna element 2802 includes a band-rejection slot 2812, which defines two branch resonators 2814, 2816. In this embodiment, the branch resonators comprise the main transmit section of the antenna structure, while the antenna element 2804 comprises a diversity receive portion of the antenna structure.

Due to the large mismatch at the port of the antenna element 2802 with the band-reject slot 2812, the mutual coupling between it and the diversity receive antenna element 2804, which is actually matched at the slot resonant frequency will be quite small and will result in relatively high isolation.

Figure 29A:
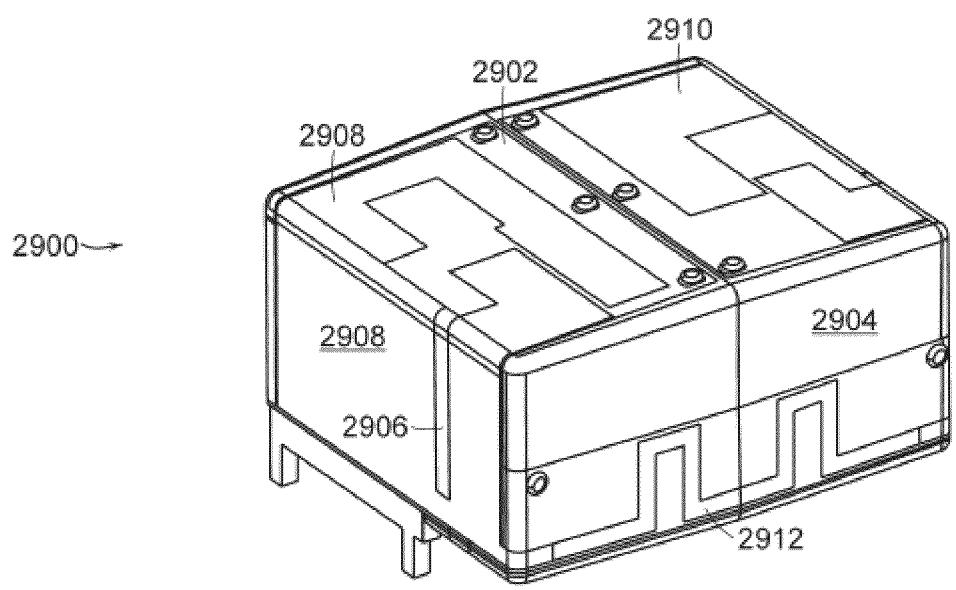
FIG. 29A illustrates an alternate antenna structure with a band-rejection slot in accordance with one or more embodiments of the subject disclosure.
Figure 29B:
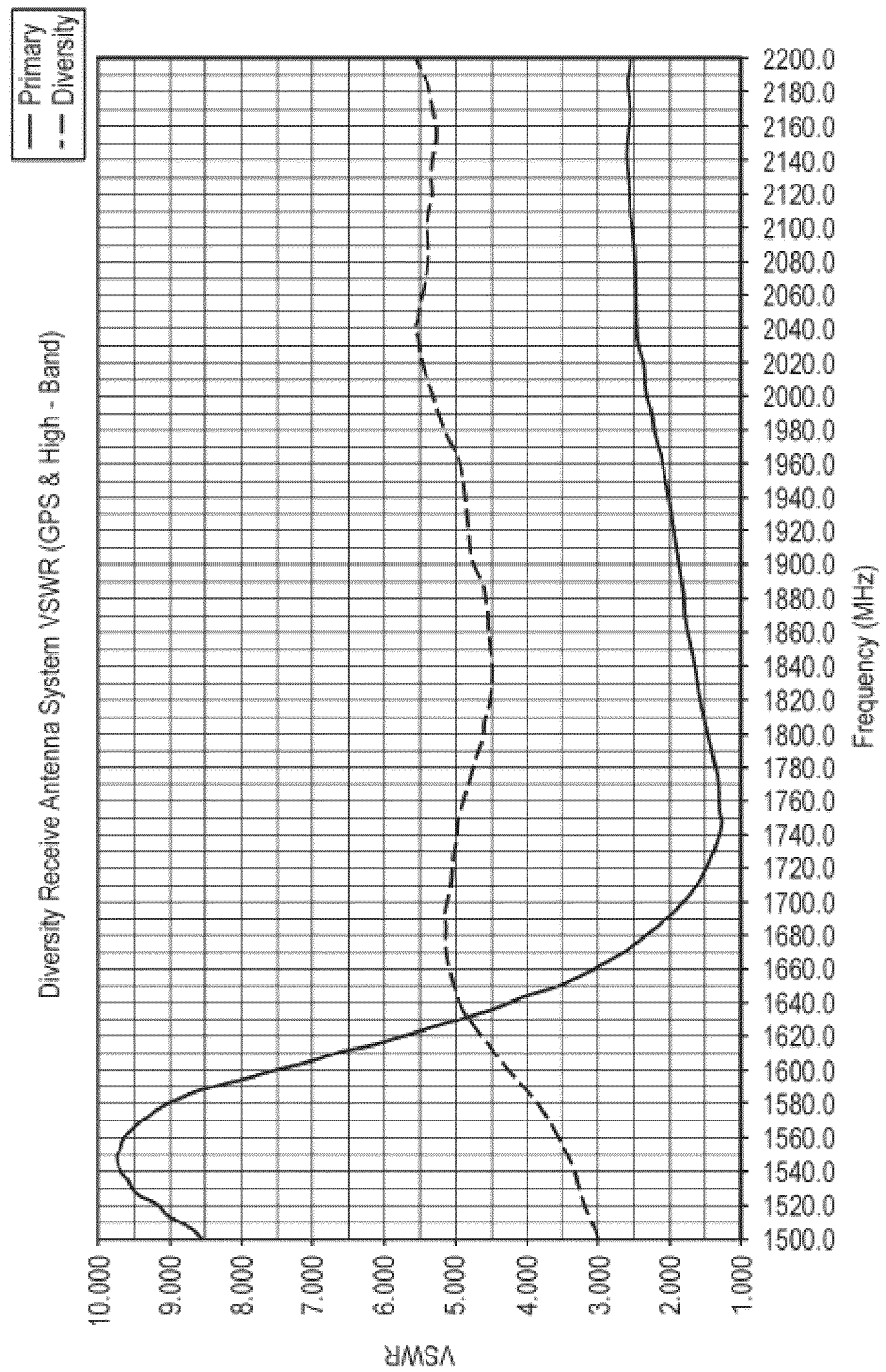
FIGS. 29B and 29C illustrate test measurement results for the FIG. 29A antenna structure.
Figure 29C:
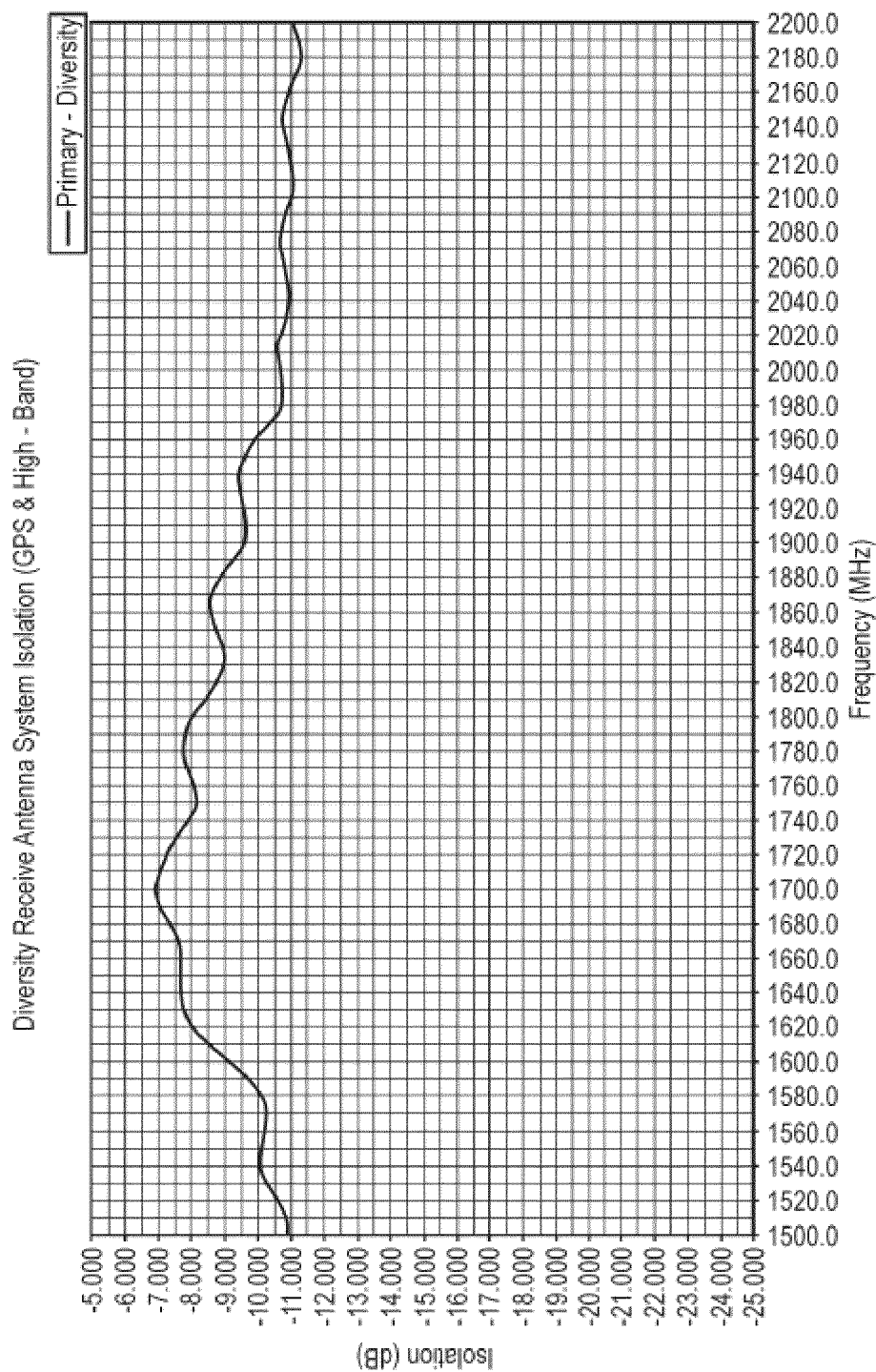

FIG. 29A is a perspective view of a multimode antenna structure 2900 comprising a multi-band diversity receive antenna system that utilizes the band-rejection slot technique in the GPS band in accordance with one or more further embodiments of the subject disclosure. (The GPS band is 1575.42 MHz with 20 MHz bandwidth.) The antenna structure 2900 is formed on a flex film dielectric substrate 2902, which is formed as a layer on a dielectric carrier 2904. The antenna structure 2900 includes a GPS band rejection slot 2906 on the primary transmit antenna element 2908 of the antenna structure 2900. The antenna structure 2900 also includes a diversity receive antenna element 2910, and a connecting element 2912 connecting the diversity receive antenna element 2910 and the primary transmit antenna element 2908. A GPS receiver (not shown) is connected to the diversity receive antenna element 2910. In order to generally minimize the antenna coupling from the primary transmit antenna element 2908 and to generally maximize the diversity antenna radiation efficiency at these frequencies, the primary antenna element 2908 includes the band-rejection slot 2906 and is tuned to an electrical quarter wave length near the center of the GPS band. The diversity receive antenna element 2910 does not contain such a band rejection slot, but comprises a GPS antenna element that is properly matched to the main antenna source impedance so that there will be generally maximum power transfer between it and the GPS receiver. Although both antenna elements 2908, 2910 co-exist in close proximity, the high VSWR due to the slot 2906 at the primary transmit antenna element 2908 reduces the coupling to the primary antenna element source resistance at the frequency to which the slot 2906 is tuned, and therefore provides isolation at the GPS frequency between both antenna elements 2908, 2910. The resultant mismatch between the two antenna elements 2908, 2910 within the GPS band is large enough to decouple the antenna elements in order to meet the isolation requirements for the system design as shown in FIGS. 29B and 29C.

In the antenna structures described herein in accordance with various embodiments of the subject disclosure, the antenna elements and the connecting elements can form a single integrated radiating structure such that a signal fed to either port excites the entire antenna structure to radiate as a whole, rather than separate radiating structures. As such, the techniques described herein provide isolation of the antenna ports without the use of decoupling networks at the antenna feed points.

Other embodiments disclosed herein are directed to an antenna that separates the fundamental (low band) resonance from the high band resonance by using two separate structures, which are connected at the feedpoint—thus accomplishing the goal of achieving a MIMO or Diversity antenna with each feed exhibiting a multiband capability, and whereby each feed is optimally isolated from the opposite feed. By way of a non-limiting illustration, in some implementations, high band frequencies can range from 1710 to 2170 MHz, and low band frequencies can range from 698 to 960 MHz.

Figure 30:
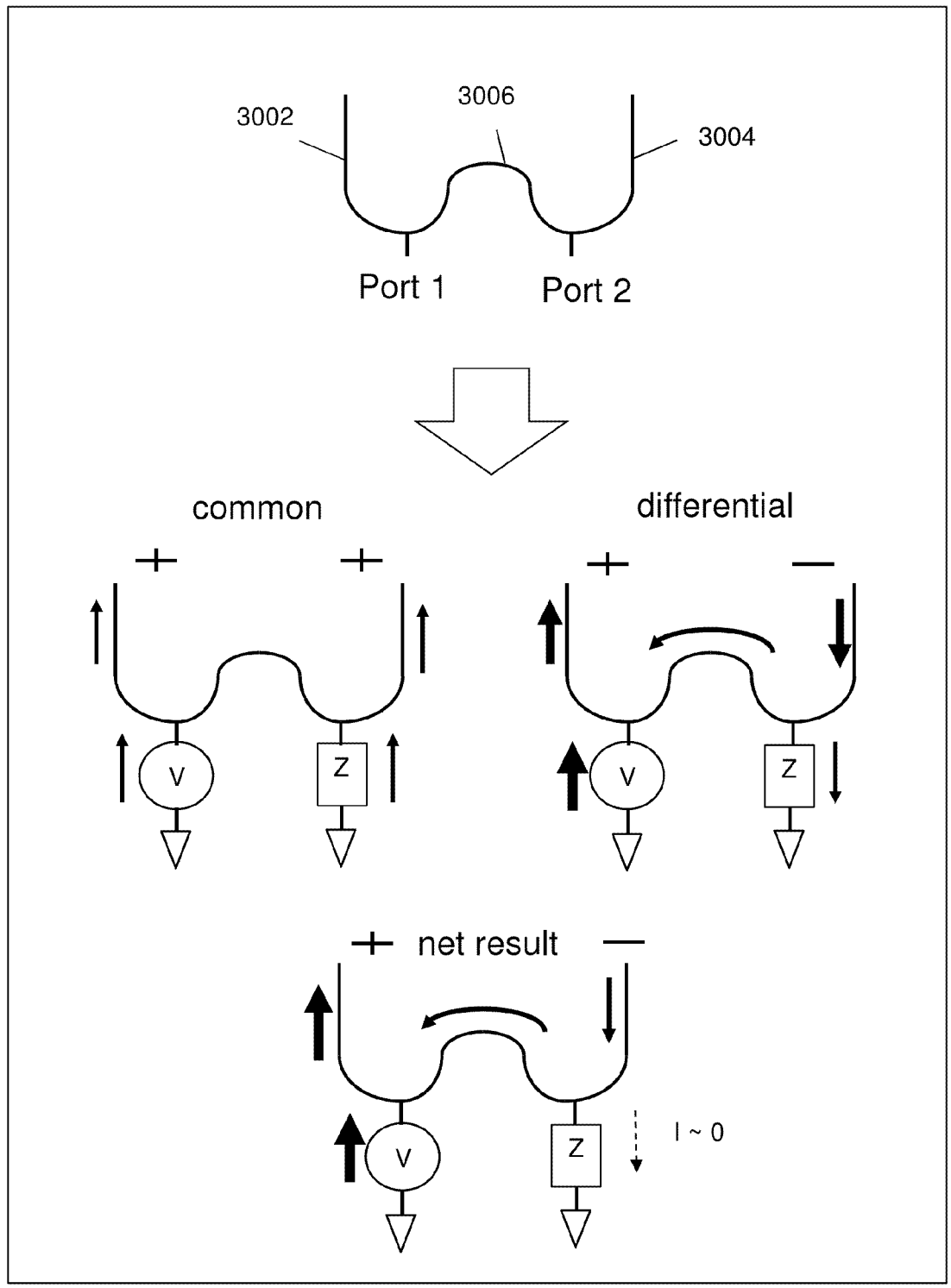
FIG. 30 depicts an illustrative embodiment of an antenna structure in accordance with one or more embodiments.

In one or more embodiments of the antenna structures described in the subject disclosure, electrical currents flowing through neighboring antenna elements 3002 and 3004 (see FIG. 30) can be configured to be similar in magnitude, such that an antenna mode excited by one antenna port (e.g., Port 1) is approximately electrically isolated from an antenna mode excited by another antenna port (e.g., Port 2) at a given desired signal frequency range. In one embodiment, this can be accomplished by configuring antennas 3002 and 3004 with a connecting element 3006 to enable common and difference mode currents, which when summed together result in some or a substantial amount of isolation between ports 1 and 2. Configuring an antenna structure to control differential and common mode current to cause isolation between any number of antenna ports can be applied to any of the antenna embodiments described herein.

Figure 31:
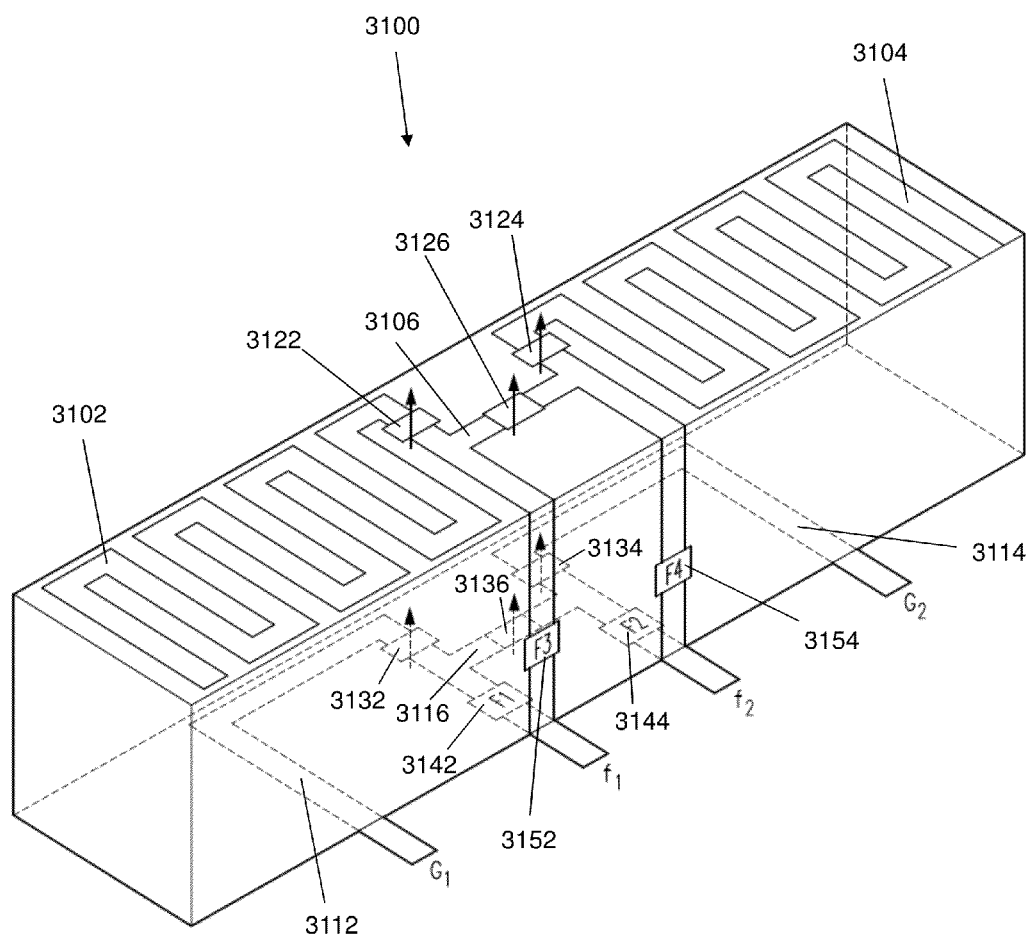
FIG. 31 depicts an illustrative embodiment of a multiband antenna structure in accordance with one or more embodiments.

FIG. 31 illustrates an exemplary multiband antenna 3100 in accordance with one or more embodiments. The antenna 3100 can include a low band structure comprising two low band antenna elements 3102, 3104 connected by a connecting element 3106. A fixed or variable reactive element 3126 such as a fixed or variable inductor L is provided in the connecting element 3106 to provide control (reduction) of the mutual coupling between feedpoints for the low band element by varying the electrical length of the connecting element 3106 in accordance with the disclosures of U.S. Pat. No. 7,688,273, the disclosure of which is incorporated by reference herein in its entirety. Similarly, a connecting element 3116 can be provided between the high band antenna elements 3112, 3114. A fixed or variable reactive element 3136 such as a fixed or variable inductor L can be provided in the connecting element 3116 to provide control (reduction) of the mutual coupling between feedpoints for the low band element by varying the electrical length of the connecting element 3116 in accordance with the disclosures of U.S. Pat. No. 7,688,273.

The high band structure comprising two high band antenna elements 3112, 3114 can be connected to the low band structure at feed points f1, f2. Two filters 3142 and 3144 are provided in the high band antenna elements 3112, 3114 for blocking low band frequencies, thereby isolating the high band antenna elements 3112, 3114 from the low band antenna elements 3102, 3104. The filters 3142 and 3144 can be passive or programmable pass band filters. In the present illustration the filters 3142 and 3144 can represent high pass filters implemented with a capacitor and/or other components to achieve desired high pass filtering characteristics. To achieve similar isolation with the low band structure, the low band antenna elements 3102, 3104 can be configured with filters 3152, 3154 to block high band frequencies, thereby isolating the high band antenna elements 3112, 3114 from the low band antenna elements 3102, 3104. The filters 3152, 3154 can be passive or programmable pass band filters. In the present illustration the filters 3152, 3154 can represent low pass filters implemented with reactive and passive components that achieve desired low pass filtering characteristics.

By having a structure associated with low band resonance and a separate structure associated with high band resonance, the low band structure can be advantageously designed or optimized independently of the high band structure and vice-versa. A further advantage is that the low band or high band structures may separately take on different antenna design realizations, e.g., monopole, loop, Planar Inverted "F" antenna (PIFA), etc. allowing the designer to select the best option for the electrical and mechanical design requirements. In one exemplary embodiment, the low band structure may be a monopole, while the high band structure may be a PIFA.

A separate network is provided for each structure. The low band structure can use a fixed or variable inductive bridge 3126 as an interconnecting element 3106. The high band element is fed from the common feedpoint, but with a high pass network 3142, 3144—the simplest being a series capacitor with low reactance at the high band frequencies and higher reactance at the low band frequencies. In addition, the low band antenna elements 3102, 3104 can be configured with variable reactive components 3122, 3124 to perform aperture tuning which enables shifting of the low band resonance frequency of the low band structure. The reactive components 3122, 3124 can be independently controlled so that the resonance frequency of low band antenna element 3102 can be independently controlled from the low band resonance frequency of low band antenna element 3104. The reactive components 3122, 3124 can be represented by switched inductors which can be aggregated or reduced to vary the electrical length of the low band antenna elements 3102, 3104, respectively.

Similarly, the high band antenna elements 3112, 3114 can be configured with variable reactive components 3132, 3134 to perform aperture tuning which enables shifting of the high band resonance frequency of the high band structure. The reactive components 3132, 3134 can be independently controlled so that the resonance frequency of high band antenna element 3112 can be independently controlled from the high band resonance frequency of high band antenna element 3114. The reactive components 3132, 3134 can also be represented by switched inductors which can be aggregated or reduced to vary the electrical length of the high band antenna elements 3112, 3114, respectively.

The aforementioned structures, enable high band tuning to be performed relatively independent of low band tuning, providing a simpler design process and better performance than antennas not having such separate structures. Other more complex networks may also be used advantageously to separate the interdependence of the high and low band structures still using a common feedpoint for a MIMO branch such as shown in FIG. 31. The method illustrated in FIG. 31 is not limited to 2×2, 2×1 MIMO or 2 feed antennas used for diversity applications, and may be extended to higher branch order MIMO antennas, e.g., 3×3, etc.

A number of factors affect antenna performance in a hand held mobile communication device. While these factors are related, they generally fall into one of three categories; antenna size, mutual coupling between multiple antennas, and device usage models. The size of an antenna is dependent on three criteria; bandwidth of operation, frequency of operation, and required radiation efficiency. Bandwidth requirements have obviously increased as they are driven by FCC frequency allocations in the US and carrier roaming agreements around the world. Different regions use different frequency bands, now with over 40 E-UTRA band designations-many overlapping but requiring world capable wireless devices to typically cover a frequency range from 698 to 2700 MHz.

A simple relationship exists between the bandwidth, size, and radiation efficiency for the fundamental or lowest frequency resonance of a physically small antenna.

$$\frac{\Delta f}{f} \propto \left(\frac{a}{\lambda}\right)^3 \eta^{-1} \quad (1)$$

Here a is the radius of a sphere containing the antenna and its associated current distribution. Since a is normalized to the operating wavelength, the formula may be interpreted as "fractional bandwidth is proportional to the wavelength normalized modal volume". The radiation efficiency η is included as a factor on the right side of (1), indicating that greater bandwidth, is achievable by reducing the efficiency. Radio frequency currents exist not only on the antenna element but also on the attached conductive structure or "counterpoise". For instance, mobile phone antennas in the 698-960 MHz bands use the entire PCB as a radiating structure so that the physical size of the antenna according to (1) is actually much larger than what appears to be the "antenna". The "antenna" may be considered a resonator that is electromagnetically coupled to the PCB so that it excites currents over the entire conductive structure or chassis. Most smartphones exhibit conductive chassis dimensions of approximately 70×130 mm, which from an electromagnetic modal analysis predicts a fundamental mode near 1 GHz suggesting that performance bandwidth degrades progressively at lower excitation frequencies. The efficiency-bandwidth trade-off is complex requiring E-M simulation tools for accurate prediction. Results indicate that covering 698-960 MHz (Bands 12, 13, 17, 18, 19, 20, 5 and 8) with a completely passive antenna with desirable antenna size and geometry becomes difficult without making sacrifices in radiation efficiency.

Factors determining the achievable radiation efficiency are not entirely obvious, as the coupling coefficient between the "antenna" and the chassis; radiative coupling to lossy components on the PCB; dielectric absorption in plastic housing, coupling to co-existing antennas; as well as losses from finite resistance within the "antenna" resonator structure, all play a part. In most cases, the requirements imposed by operators suggest minimum radiation efficiencies of 40-50%, so that meeting a minimum TRP requirement essentially requires tradeoffs between the power amplifier (PA) output and the achievable antenna efficiency. In turn, poor efficiency at the antenna translates to less battery life, as the PA must compensate for the loss.

Prior to concerns over band aggregation, wireless devices operated on one band at a time with need to change when roaming. Consequently, the required instantaneous bandwidth would be considerably less than that required to address worldwide compatibility. Take a 3G example for instance, where operation in band 5 from (824-894 MHz) compared to operation in bands 5 plus 8 (824-960 MHz). Then, add the requirements for band 13 and band 17 and the comparison becomes more dramatic—824-960 vs. 698-960 MHz. This becomes a problematic as legacy phone antennas support pentaband operation but only bands 5 and band 8. Given equation (1) several choices exist. The most obvious would be to increase the antenna system size, (i.e. the antenna and phone chassis footprint) and/or to reduce the radiation efficiency. Since 4G smartphones require 2 antennas, neither approach is necessarily desirable from an industrial design standpoint, although it is possible to cover the 700-2200 MHz bands with a completely passive antenna in a space allocation of 6.5×10×60 mm.

Various alternative antenna configurations are the following: limit the antenna(s) instantaneous bandwidth within current antenna space allocations to allow use of 1 or more antennas without compromising the industrial design (Antenna Supplier motivation); make the antenna(s) smaller to achieve a compact and sleek device with greater functionality by limiting the instantaneous bandwidth with same or improved antenna efficiency (OEM motivation); improve the antenna efficiency, and therefore the network performance by controlling the antenna instantaneous frequency/tuning (Operator motivation); make the antenna agile to adapt to different usage models (OEM/User/Operator motivation); or combinations of the above.

The simplest approach can be to limit the instantaneous operation to a single band to satisfy the protocol requirements for a single region. To satisfy the roaming requirements, the antenna could be made frequency agile on a band-by-band basis. This approach represents the most basic type of "state-tuned" antenna.

Various embodiments disclosed herein are directed to an antenna that separates the fundamental (low band) resonance from the high band resonance by using two separate structures, which are connected at the feedpoint—thus accomplishing the goal of achieving a MIMO or Diversity antenna with each feed exhibiting a multiband capability, and whereby each feed is optimally isolated from the opposite feed. By way of non-limiting example, in some implementations, high band frequencies can range from 1710 to 2700 MHz, and low band frequencies can range from 500 to 960 MHz.

The exemplary embodiments allow for tuning of the first resonance of the antenna to accommodate multiple operational bands depending on a tuning state, and broadband operation on the high bands (e.g., 1710-2170 MHz, or 1710-2700 MHz) independent of the low band tuning state.

Figure 32A:
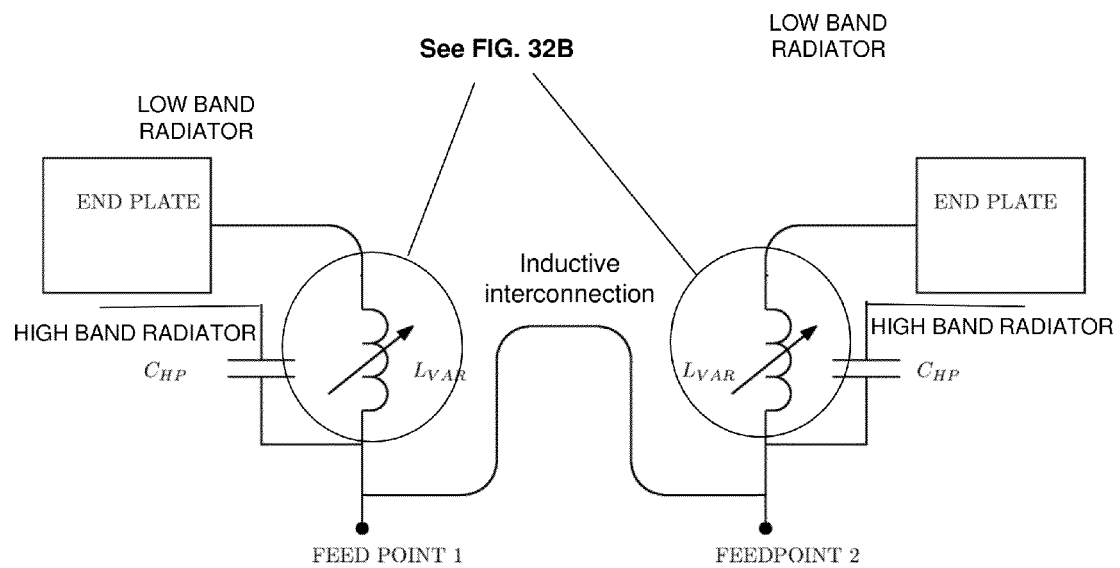
FIGS. 32A and 32B illustrate tuning using discrete selection of inductance to select antenna fundamental resonance frequency in accordance with one or more embodiments.
Figure 32B:
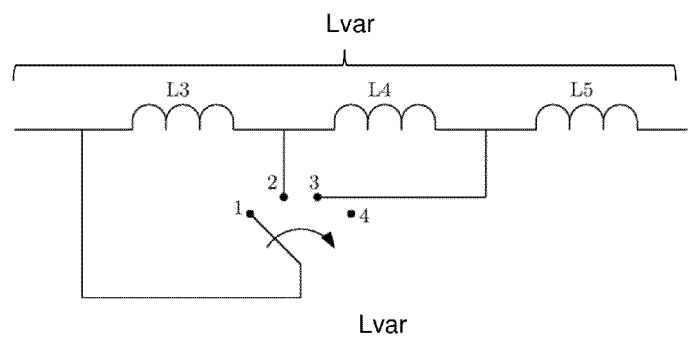

Referring to FIG. 32A, an example is shown that is illustrative of single low band-multiple high band aggregation compatibility. The high band radiation efficiency in this case can remain essentially the same independent of the low band tuning state, but the low band resonance frequency is able to be tuned in discrete frequency increments according to the equivalent electrical length, as selected by the series inductance Lvar which is shown in FIG. 32B. The variable inductance can be created using discrete reactive elements such as inductors and a switching mechanism such as an SP4T switch. The configuration as shown yields 3 different inductances depending on which state the switch is in: (state 1) LVAR=L3+L4+L5 (switch connects to pole 1 or 4); (state 2) LVAR=Lpath2||L3+L4+L5 or approximately L4+L5 (switch connects to pole 2); or (state 3) LVAR=Lpath3||(L3+L4)+L5 OR approximately L5 (switch connects to pole 3). In this embodiment, Lpath2 and Lpath3 refer to the equivalent inductances of the circuit paths through the switch. Keeping the inductors close to the switch can minimize or otherwise reduce the path inductances such that the discrete inductors are essentially shorted out by the switch.

The antenna incorporates a main structure that has a fundamental resonance at the lowest frequency band. The solution employs a multiband antenna having 3 low band tuning states as shown in FIG. 32B. State 1 includes a low band (fundamental) resonance suited for LTE 700 (698-742 MHz) operation: State 2 includes a low band resonance suited to GSM 850 (824-894 MHz) operation, and state 3 a low band resonance suited to GSM 900 (880-960 MHz).

The high band resonance (1710-2170 MHz) can be reasonably independent of the tuning state for the low band by nature of the separation of the low and high band radiating elements from the feedpoints. The low band tuning can be accomplished by switching different reactive components in between the feedpoint and the radiating structure. The high band operation of the antenna can be governed primarily by the auxiliary radiating section at the terminus of the capacitor opposite the feedpoint. The capacitor functions primarily as a high pass filter to decouple the feedpoint from the high and low bands portions of the antenna. In this way, signals at different operating bands can be directed to the appropriate radiating section of the combined antenna. The high band resonance can be determined in part by the electrical length of the high band portion of the antenna (indicated in the illustration by horizontal conductive segments). In other embodiments, the capacitor may be a highpass, bandpass, or tunable filter. In a similar manner, the path from the feedpoint to the low band radiating portion of the antenna may include a low pass, bandpass or tunable filter.

Tuning can be accomplished using a switching device such one capable of SP4T operation. In one embodiment, a solid state silicon-based FET switch can be used in each leg of the antenna to alter the series inductance presented to the antenna feedpoint, thereby lowering the resonant frequency as a function of the amount of inductance added. Although inductors are used in this embodiment, other reactive components may also be used for the purpose of altering the electrical length of the low band portion of the antenna radiating structure including capacitive elements. The switch may be of various types such as a mechanical MEMS type device, a voltage/current controlled variable device, and so forth. The switch may also be configured with multiple poles and with any throw capability needed to select the number of tuning states required for antenna operation. The number of throws can establish the number of tuning states possible, which in turn is dictated by the number of frequency bands to be supported. While three states are shown in the illustrated embodiment, any number of states can be utilized corresponding to any number of frequency bands or ranges. In one embodiment, a pair of adjustable reactive elements (e.g., fixed inductors coupled with switching mechanisms) can be coupled with corresponding pairs of feedpoints, and the tuning can be performed by settings each of the adjustable reactive elements to the same tuning state among the group of tuning states.

Figure 33A:
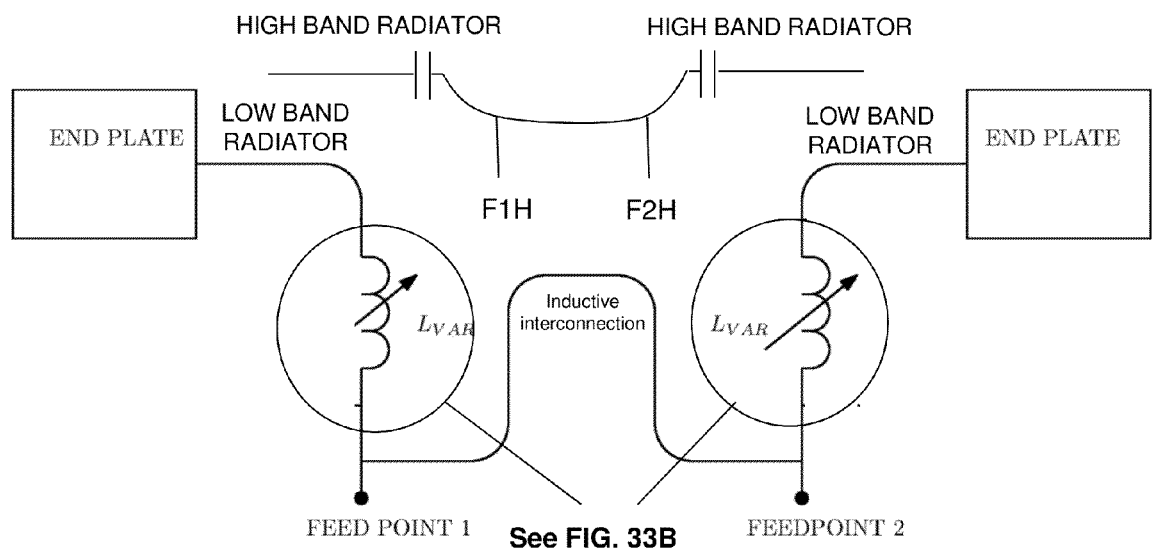
FIGS. 33A and 33B illustrate tuning using discrete selection of inductance to select fundamental resonance frequency where a separate but co-located high band element is shown with feed points F1H and F2H that allows for compatibility with RF transceiver front end designs requiring separate low- and mid- or low- and high-band connections to the antenna in accordance with one or more embodiments.
Figure 33B:
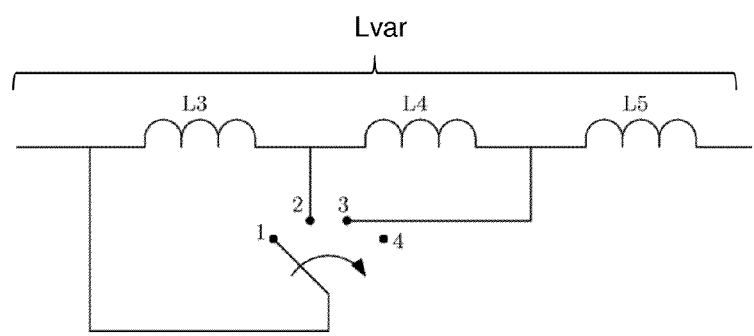
Figure 34A:
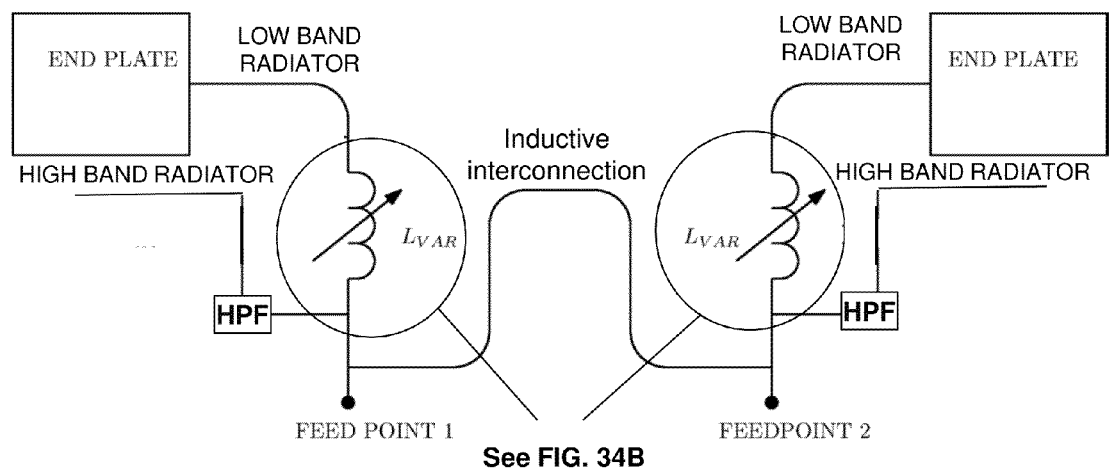
FIGS. 34A and 34B illustrate tuning and filtering using discrete selection of inductance to select antenna fundamental resonance frequency in accordance with one or more embodiments.
Figure 34B:
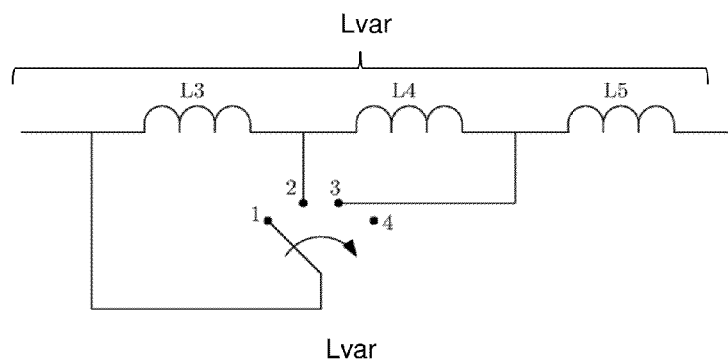
Figure 35A:
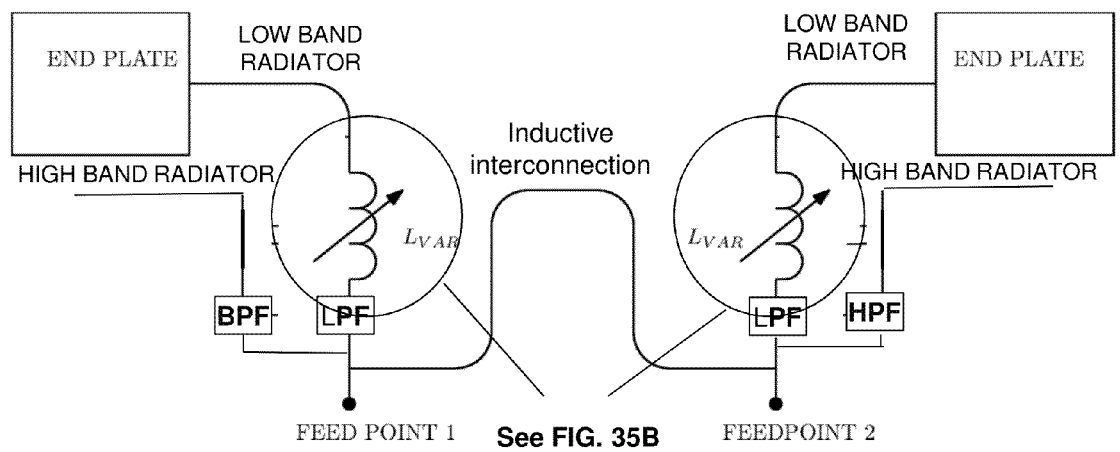
FIGS. 35A and 35B illustrate tuning and filtering using discrete selection of inductance to select fundamental resonance frequency in accordance with one or more embodiments.
Figure 35B:
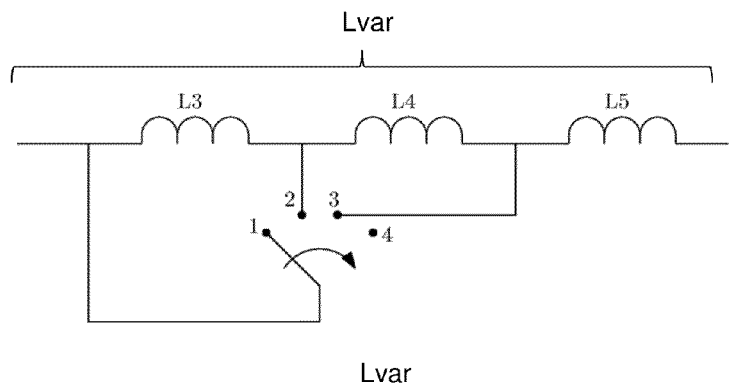

Referring to FIG. 33A, a separate but co-located high band element is shown with feed points F1H and F2H that allows for compatibility with RF transceiver front end designs requiring separate low- and mid- or low- and high-band connections to the antenna. The variable inductance can be created using discrete inductors and a SP4T switch as shown. The configuration as shown yields 3 different inductances depending on which state the switch is in: (state 1) LVAR=L3+L4+L5 (switch connects to pole 1 or 4); (state 2) LVAR=Lpath2||L3+L4+L5 or approximately L4+L5 (switch connects to pole 2); or (state 3) LVAR=Lpath3||(L3+L4)+L5 OR approx. L5 (switch connects to pole 3). Lpath2 and Lpath3 refer to the equivalent inductances of the circuit paths through the switch. Keeping the inductors close to the switch minimizes the path inductances such that the discrete inductors are essentially shorted out by the switch.

The exemplary antennas can provide better radiation efficiency and/or smaller size compared to an untuned antenna by nature of the tuning to each band of operation separately. The reactive elements (e.g., inductors and their associated inductance) can establish the electrical length of the low band elements, and therefore can provide for adjusting the low band resonance (tuning). Referring additionally to FIGS. 34A-35B, antenna structures that enable tuning to each band of operation separately while also providing for desired filtering through use of low-pass-filters and high-pass-filters as illustrated.

Further, the fundamental mode associated of the antenna low band resonance can be tuned by adjustment of the electrical length of the low band portion of the antenna via reactive elements which may exhibit either inductive or capacitive characteristics. As illustrated in FIG. 32A, discrete inductors are shown in a series connection between the antenna feed points and the radiating element end plates on the each side of the antenna, thereby increasing the equivalent electrical length. The use of separate or discrete components is intended to be illustrative of the principle, but by no means limiting to scope of the subject disclosure. In one or more embodiments, the techniques and/or components of the exemplary embodiments described herein that provide for antenna tuning can be utilized in conjunction with techniques and/or components described with respect to U.S. Pat. No. 7,688,273.

Figure 36A:
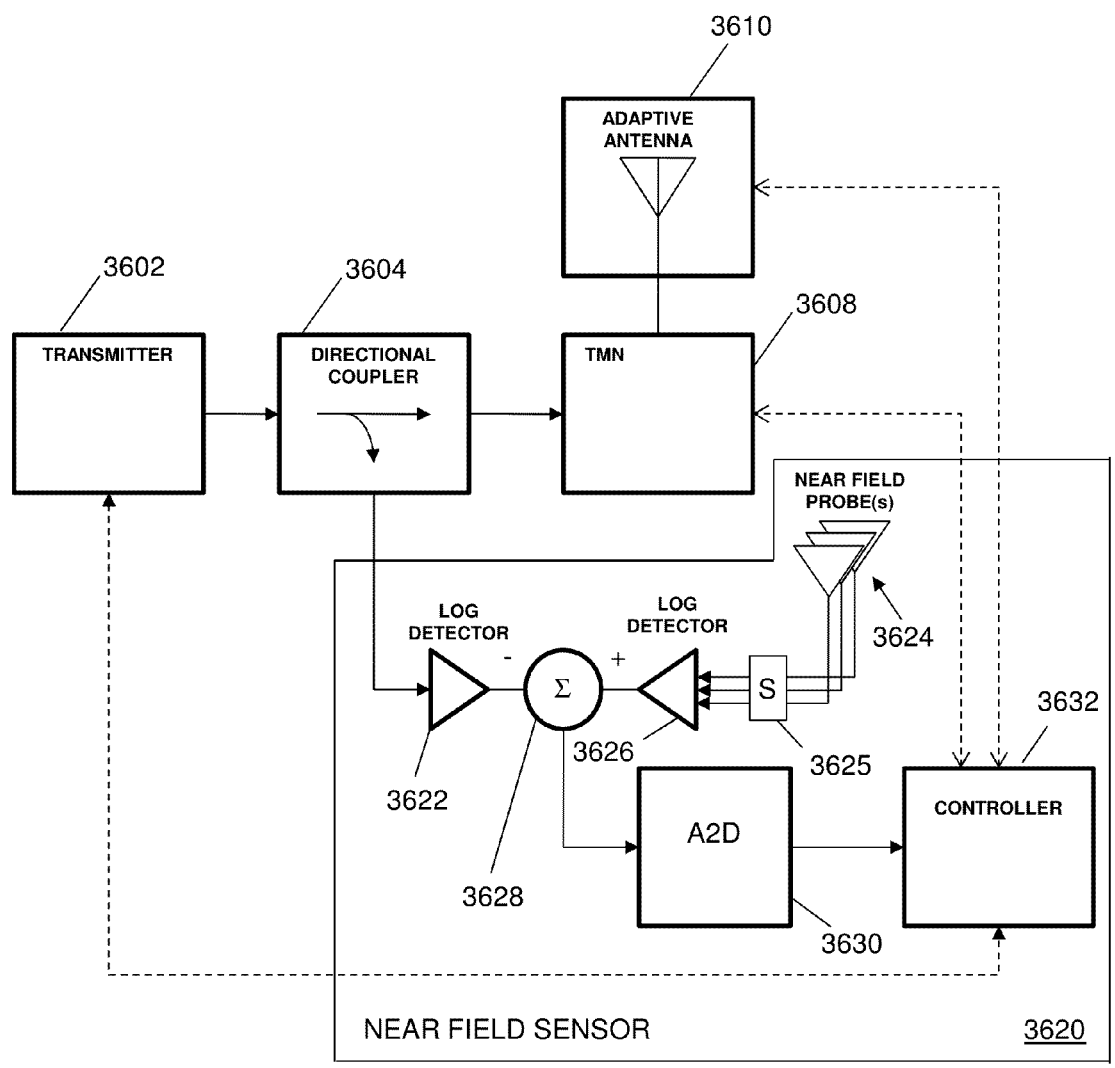
FIGS. 36A-36B depict illustrative embodiments of a near field sensor.
Figure 36B:
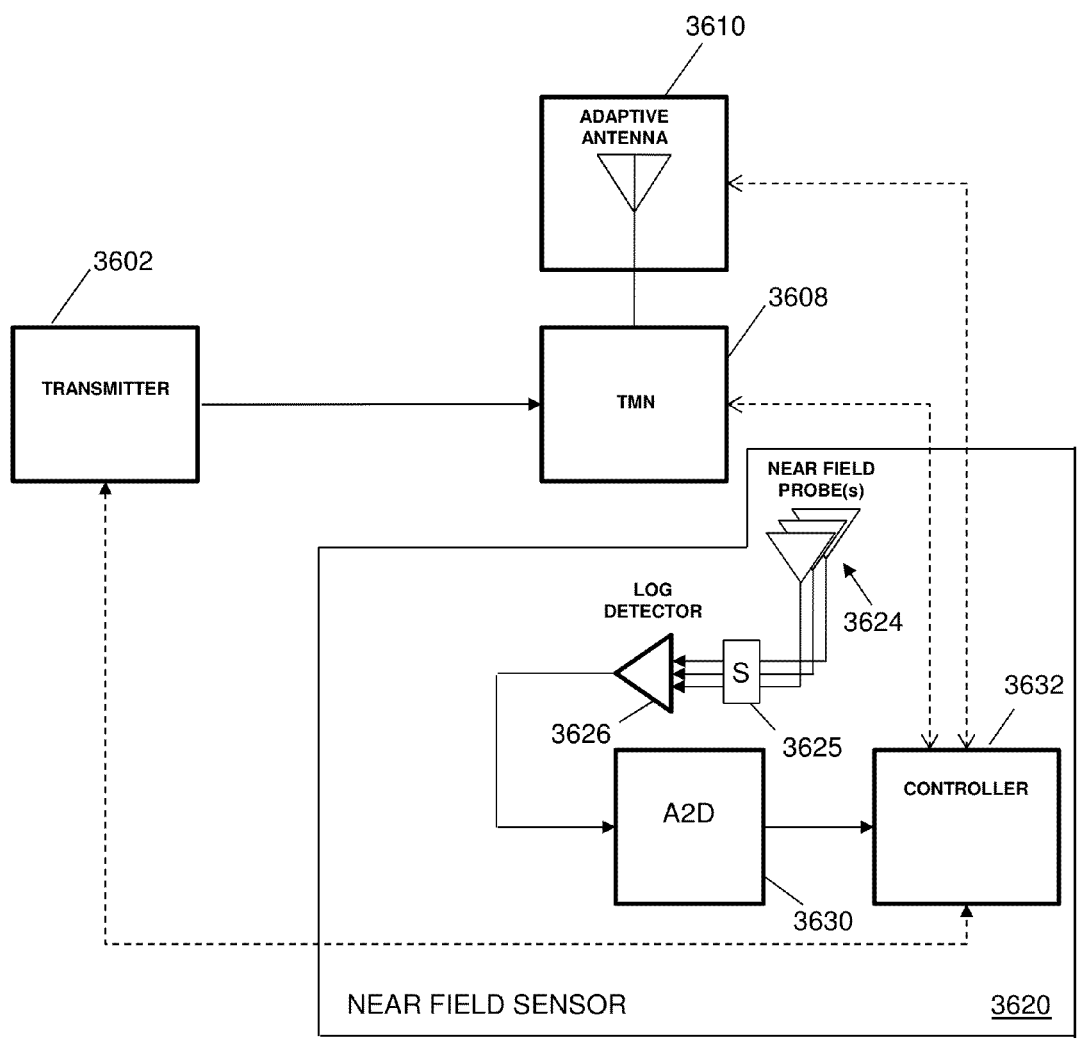

FIG. 36A depicts an illustrative embodiment of a near field sensor 3620 utilized with other RF components of a communication device 3600. In one embodiment near field sensor 3620 can comprise a first log detector 3622 that receives signals from a directional coupler 3604, a second log detector 3626 that receives signals from a near field probe 3624. In another embodiment, such as shown in FIG. 36B, the near field sensor 3620 can comprise a single log detector 3626 that receives signals from one or more near field probes 3624 selectable by a switch 3625. Instead of relying on a directional coupler 3604 such as shown in FIG. 36A, the controller 3632 of FIG. 36B can be configured to determine a magnitude of a forward feed signal supplied by the transmitter 3602 based on a known state of the transmitter 3602, which can be determined from a look-up table. That is, the controller 3632 may be aware that the transmitter 3602 has been configured to transmit at a desired magnitude as a result of configuring components of the transmitter 3602 such as an amplifier or otherwise. The controller 3632 can utilize a look-up table comprising magnitudes indexed according to known states of the transmitter 3602, or can determine the magnitude of a transmit signal based on an algorithm implemented by the controller 3632. The look-up table can be created by characterizing the transmitter 3602 in a lab or manufacturing setting. Accordingly, the embodiments that follow can be based on either the embodiments of FIG. 36A or 36B.

The near field probe 3624 can be a small trace of metal serving as a miniature antenna that can receive radiated energy from an adaptive antenna 3610 and which can have a very small parasitic effect (if any) on the adaptive antenna 3610, thereby unaffecting the original operating characteristics of the adaptive antenna 3610. The near field probe 3624 can be located on a printed circuit board (PCB), a housing assembly component or some other suitable location of the communication device 3600 that enables placement of the near field probe 3624 at a particular perspective of the adaptive antenna 3610. As depicted in FIGS. 36A and 36B, more than on near field probe 3624 can be used at various location of the communication device 3600 as will be described below.

The output signals of the first and second log detectors 3622 and 3626 can be supplied to a difference circuit 3628 that produces a difference signal supplied to an analog to digital converter (A2D) 3630, which in turn supplies a digital value to a controller 3632 for processing. The difference signal represents a difference in magnitude between the signals supplied by the first and second log detectors 3622 and 3626. The signal supplied by the first log detector 3622 can represent a measure of a forward feed signal supplied by an RF transmitter 3602. The difference in magnitude between the forward feed signal and the signal measured by the near field probe 3624 can be used to detect a change in a resonance frequency of the adaptive antenna 3610. In the embodiment of FIG. 36B, the controller 3632 would be supplied a digital value from the A2D 3630 that corresponds only to the magnitude of the near field signal generated by the log detector 3626. The controller 3632 in turn can obtain a digital representation of the magnitude of the forward feed (or transmit) signal supplied by the transmitter 3602 by retrieving a magnitude value from a look-up table based on a known state of the transmitter 3602 or it can obtain it by way of a computational approach that determines the magnitude from the known state of the transmitter 3602. Once the forward feed magnitude is determined, the controller 3632 can determine a difference between the forward feed and near field signal magnitudes using digital signal processing techniques, and thereby detect a change in a resonance frequency of the adaptive antenna 3610.

The adaptive antenna 3610 can be an antenna structure such as any of the embodiments described above. For instance, the adaptive antenna 3610 can be represented by one of the embodiments of FIGS. 31-35, which enable programming of the resonant frequency of the antenna. If the detected change of the resonance frequency of the adaptive antenna 3610 is determined to be undesirable based on the difference signals supplied by the A2D 3630, the adaptive antenna 3610 can be tuned by the controller 3632 by changing the electrical length of the antenna by reconfiguring the structure of the antenna (e.g., adding or removing antenna components), by adding or removing reactive components such as the embodiments of FIGS. 32B, 33B, 34B and 35B, or changing the reactance of a component of the antenna (e.g., a variable capacitor or variable inductor). As the adaptive antenna 3610 is tuned by the controller 3632, the controller 3632 can also be configured to program a matching network 3608 or supply the tuning data of the adaptive antenna 3610 to a separate controller of the matching network to enable programming of the match network to adapt to changes applied to the adaptive antenna 3610 while tuning its resonant frequency. It is noted that the near field sensor 3620 as described herein can be used with other antenna structures not described in the subject disclosure.

What follows is an illustrative algorithm for tuning the adaptive antenna 3610 based on near field rf power measurements. We begin by assuming the adaptive antenna 3610 is tunable with a total of N states. The adaptive antenna 3610 can be set to a particular state, k, based on operating conditions such as a band of operation. The A2D 3630 provides the controller 3632 a relative power measurement, Y, at a specific transmit frequency in use. In one embodiment, an objective is to improve Y. To do this, the k is stepped at time interval, τ, and the response of Y is used to determine if the state should be incremented, decremented, or kept the same. The time τ may be chosen to be longer than a response time of other power control loops used by the communication device 3600 and/or other network operations that may be dependent on the transmit power level from the communication device 3600. With this in mind, a tuning algorithm can be described as follows:

Let k0 be the nominal setting for the state value
Let the value of k alternate between k0, k0+1 and k0−1:
$k(n\tau)=k0+\cos(n\pi/2)$, where n is the number of time increments
For each state, measure the probe response $Y(n\tau)$
Calculate the slope, $m=dY/dk$
Calculate the running average mbar, over M time intervals, $$\bar{m}=\Sigma_{i=n-M}^{n}m(n\tau)$$

Compare mbar to a threshold δ to determine whether to change the state
If mbar≥δ k=k−1
If mbar Ωδ k=k+1
If |mbar|<δ k is unchanged In an embodiment where multiple near field probes 3624 are used, the above algorithm can be changed so that delta measurements of Y are averaged over time. Averaging delta Y readings can increase the reliability of the measurement. In one embodiment, the controller 3632 can select an individual near field probe 3624 using a programmable multiplexer (S) 3625. The controller 3632 can then apply the above algorithm using only those near field probes 3624 that provide a delta Y with desirable results. This approach can be applied to each near field probe 3624 until one or more near field probes 3624 are identified as providing desirable tuning results of the adaptive antenna 3610. The controller 3632 can then average the delta Y magnitudes measured for each near field probe 3624, or select only one of the identified near field probes 3624 for tuning the adaptive antenna 3610. In a multi-antenna system where the transmitter 3602 can transmit from any one of a plurality of adaptive antennas 3610, the near field sensor 3620 can be configured to choose a near field probe 3624 closest to the antenna used during transmission for performing the above algorithm. In another embodiment, if for a selected near field probe 3624 the near field sensor 3620 is not performing due to unrepresentative information supplied by the selected near field probe 3624 (e.g., a user's finger is changing the performance of the selected near field probe 3624) then the controller 3632 can be adapted to avoid the identified near field probe 3624 and perform averaging from other probes unaffected by the environment effect.

In other embodiments averaging can be performed for more than one near field probe 3624 associated with a single adaptive antenna. In yet another embodiment, multiple near field probes 3624 can be placed on each radiating element of an antenna (high band, mid band, and low band near field probes). In another embodiment, one near field probe can be used per radiating element of an antenna. In yet another embodiment, a pad of an integrated circuit (IC) can be used as a near field probe 3624 of an antenna.

Figure 37:
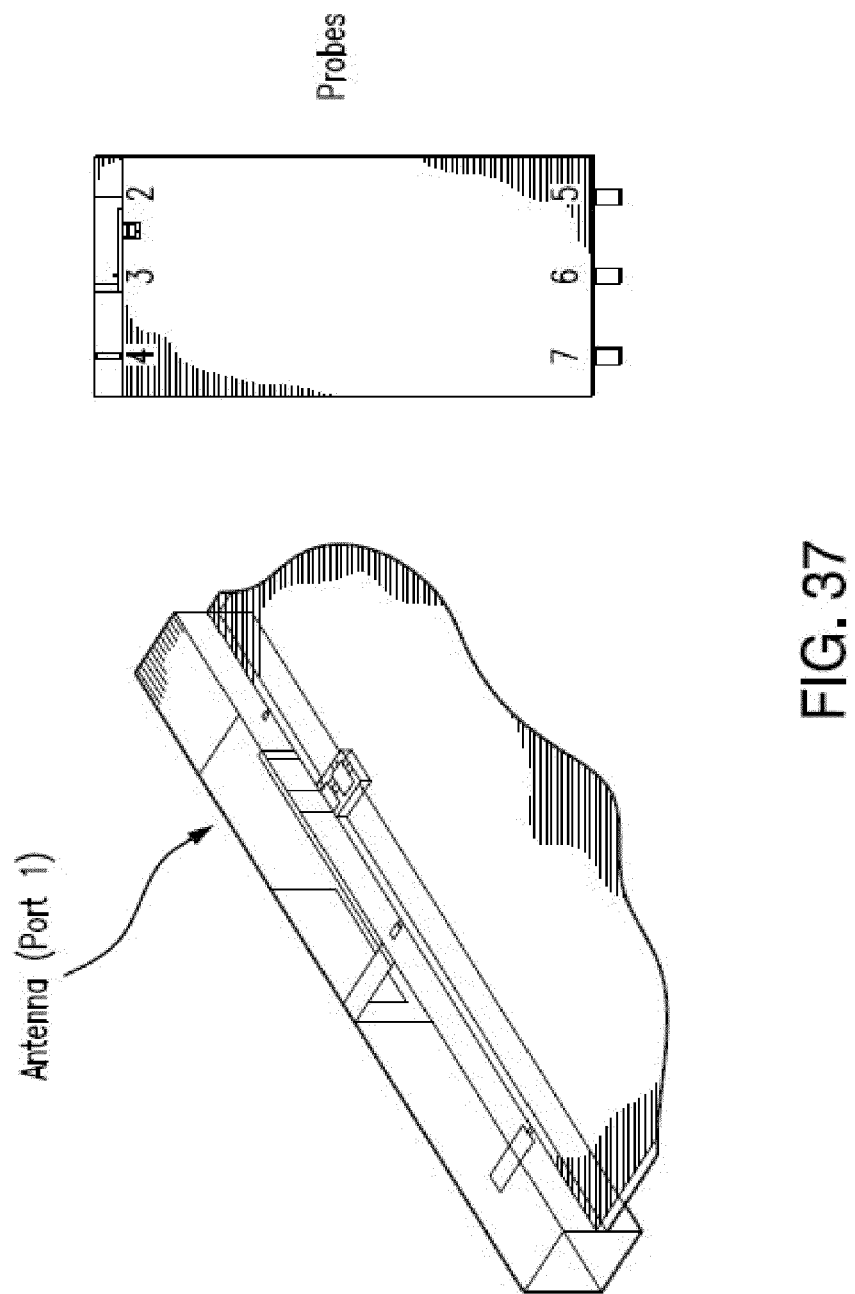
FIG. 37 depicts illustrative embodiments for placement of the near field sensor as a probe.
Figure 38:
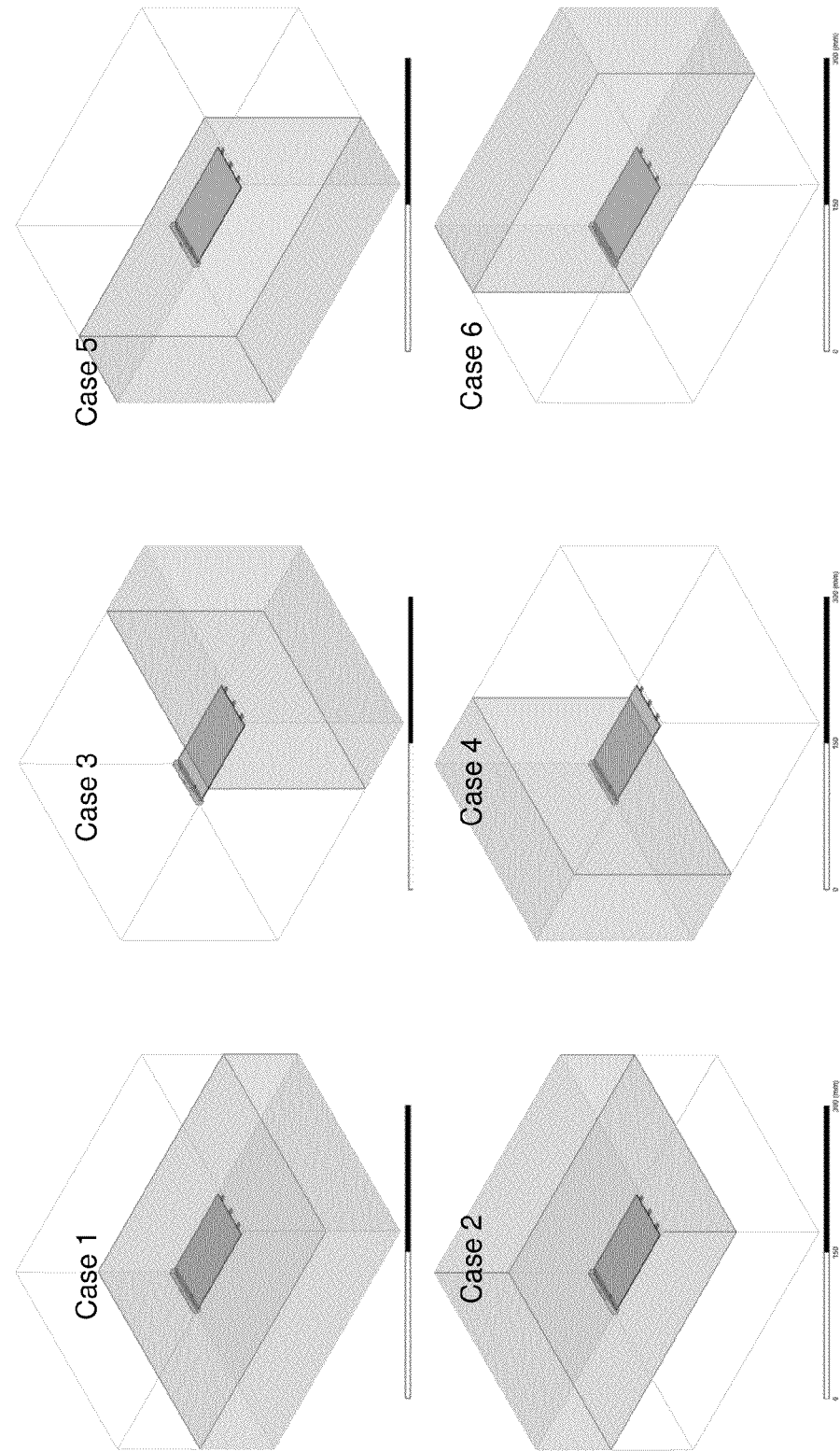
FIG. 38 depicts illustrative embodiments of environmental use cases applied to the antenna structure of FIG. 27.

Multiple near field probes 3624 can be used at different locations of the communication device 3600 using a multiplexer 3625 to select between near field probes 3624 to get a measurement of radiated energy of the adaptive antenna 3610 from different perspectives (e.g., bottom, top, sides). FIG. 37 provides a placement illustration of six near field probes 3624 on a printed circuit board. The near field probes 3624 of FIG. 37 are sized to yield −30 dB of coupling with the antenna structure shown. Low band simulations were performed on an antenna structure with a PCB ground of 110 mm×60 mm. FIG. 38 depicts six use cases applied to the circuit board of FIG. 37. The gray sections of each use case represent body tissue or steel. The simulation further assumed a 2 mm air gap between a furthest model element and a log material.

Figure 39:
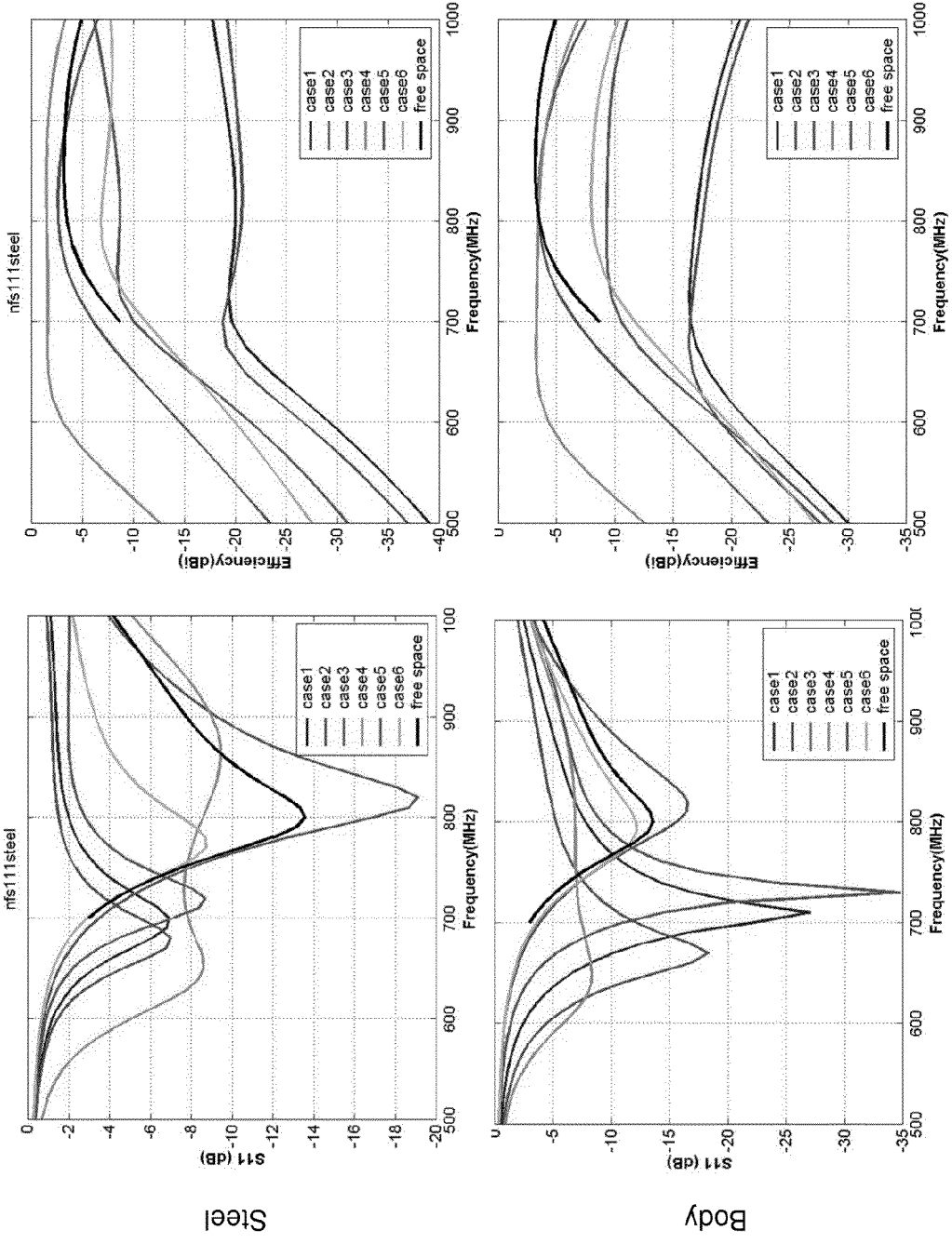
FIG. 39 depicts illustrative embodiments of return loss and efficiency plots according to the environmental use cases of FIG. 38.
Figure 40:
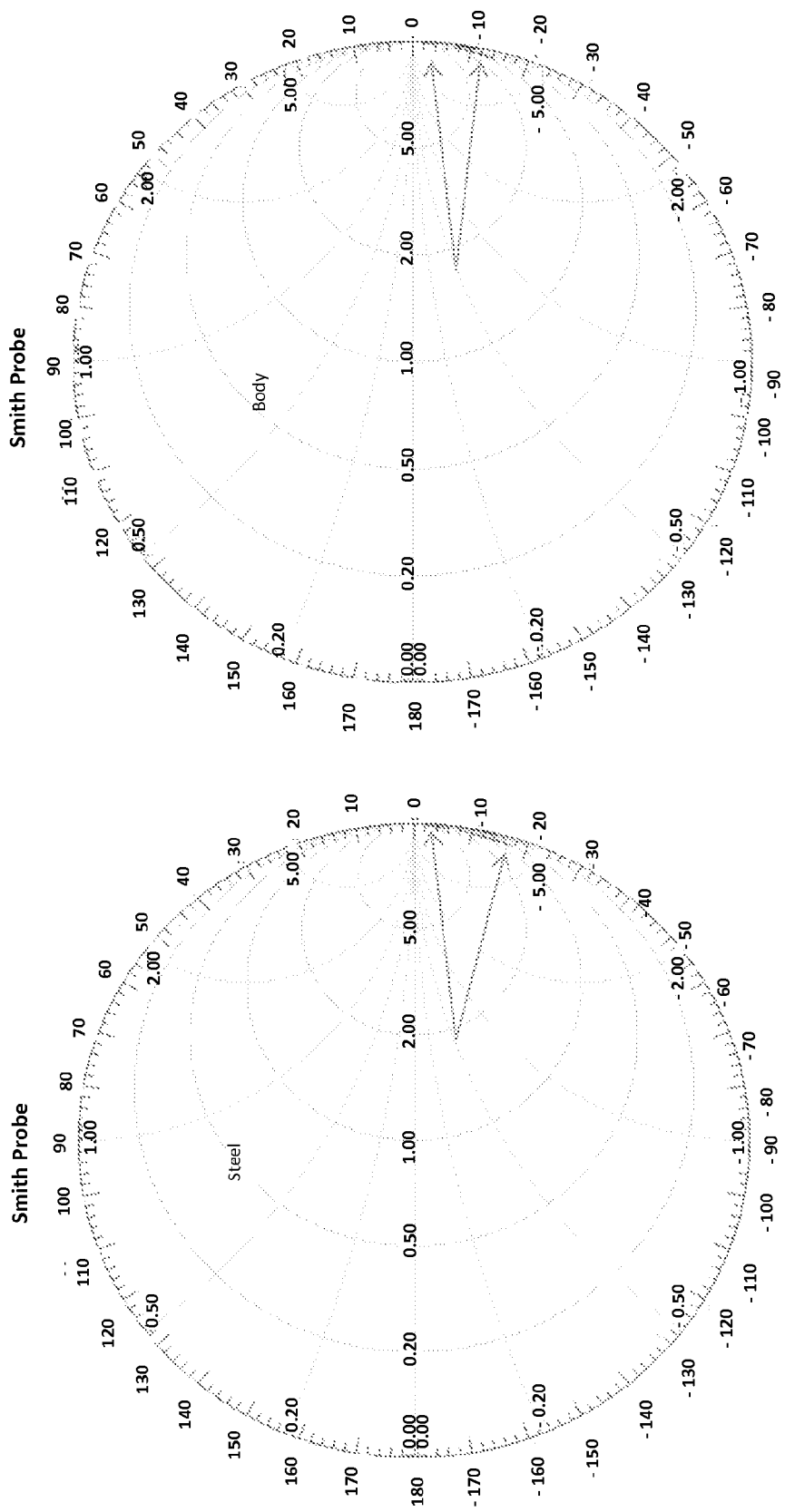
FIG. 40 depicts illustrative embodiments of Smith charts according to the environmental use cases of FIG. 38.
Figure 41:
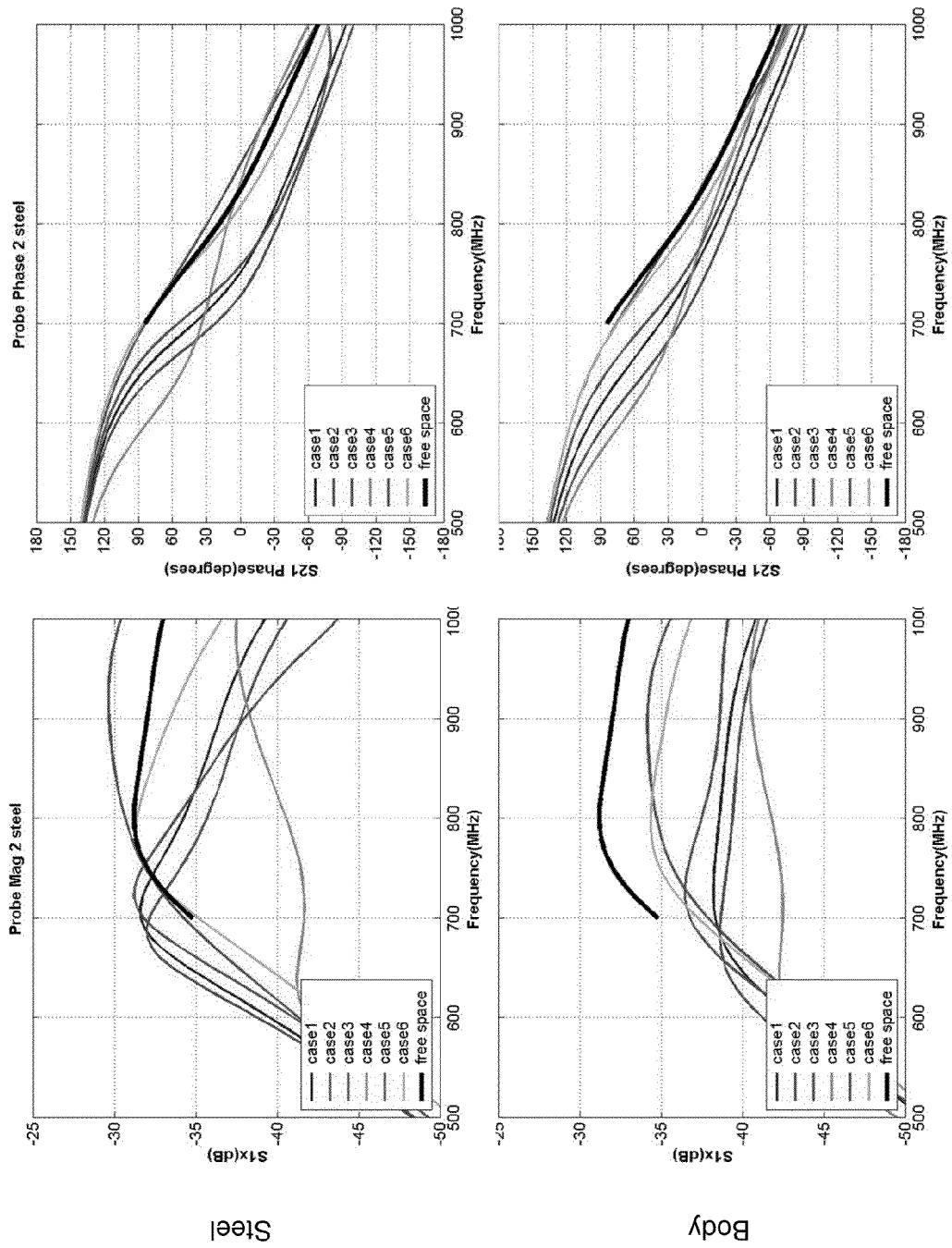
FIG. 41 depicts illustrative embodiments of magnitude and phase plots associated with one of the probes.
Figure 42:
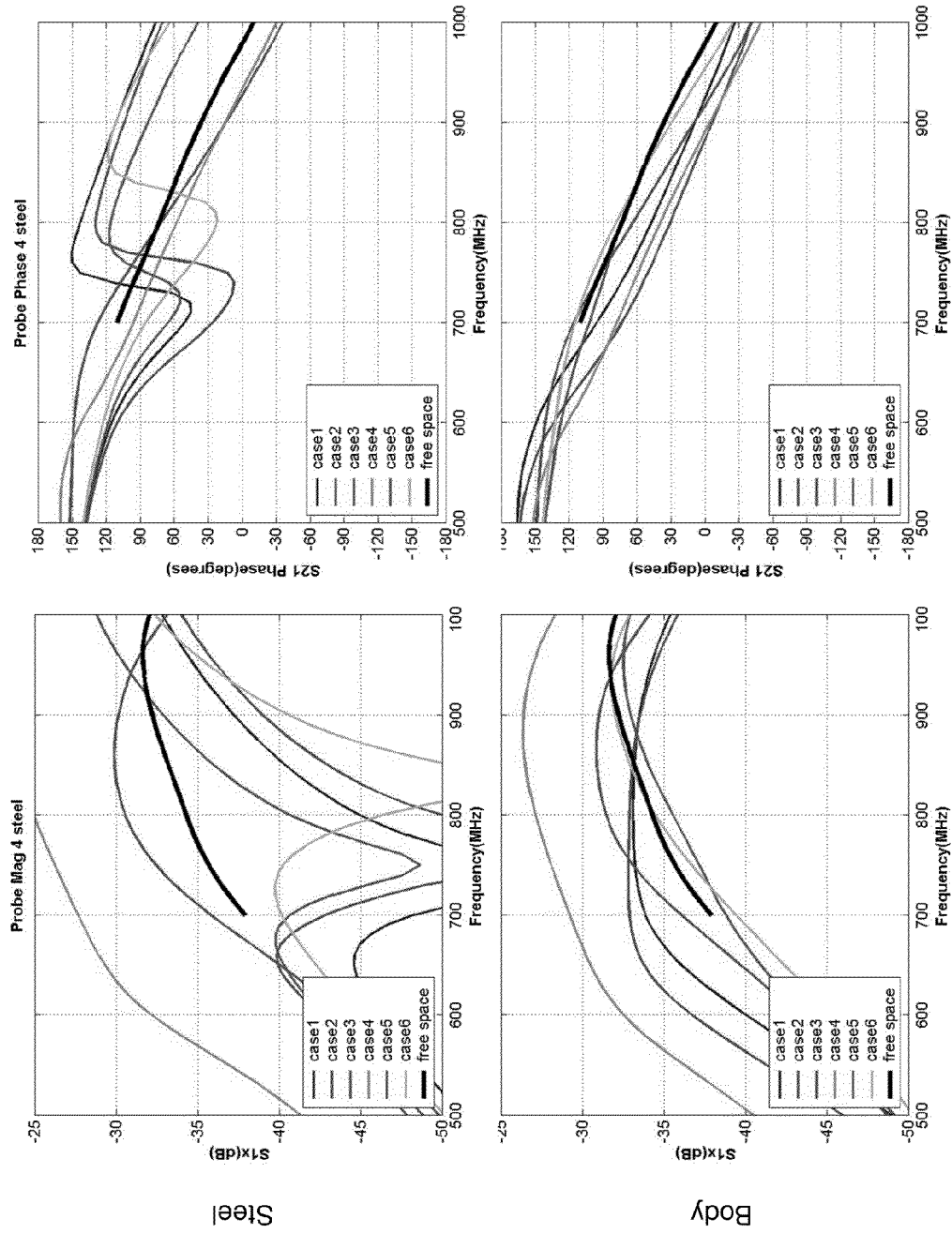
FIG. 42 depicts illustrative embodiments of magnitude and phase plots associated with one of the probes.
Figure 43:
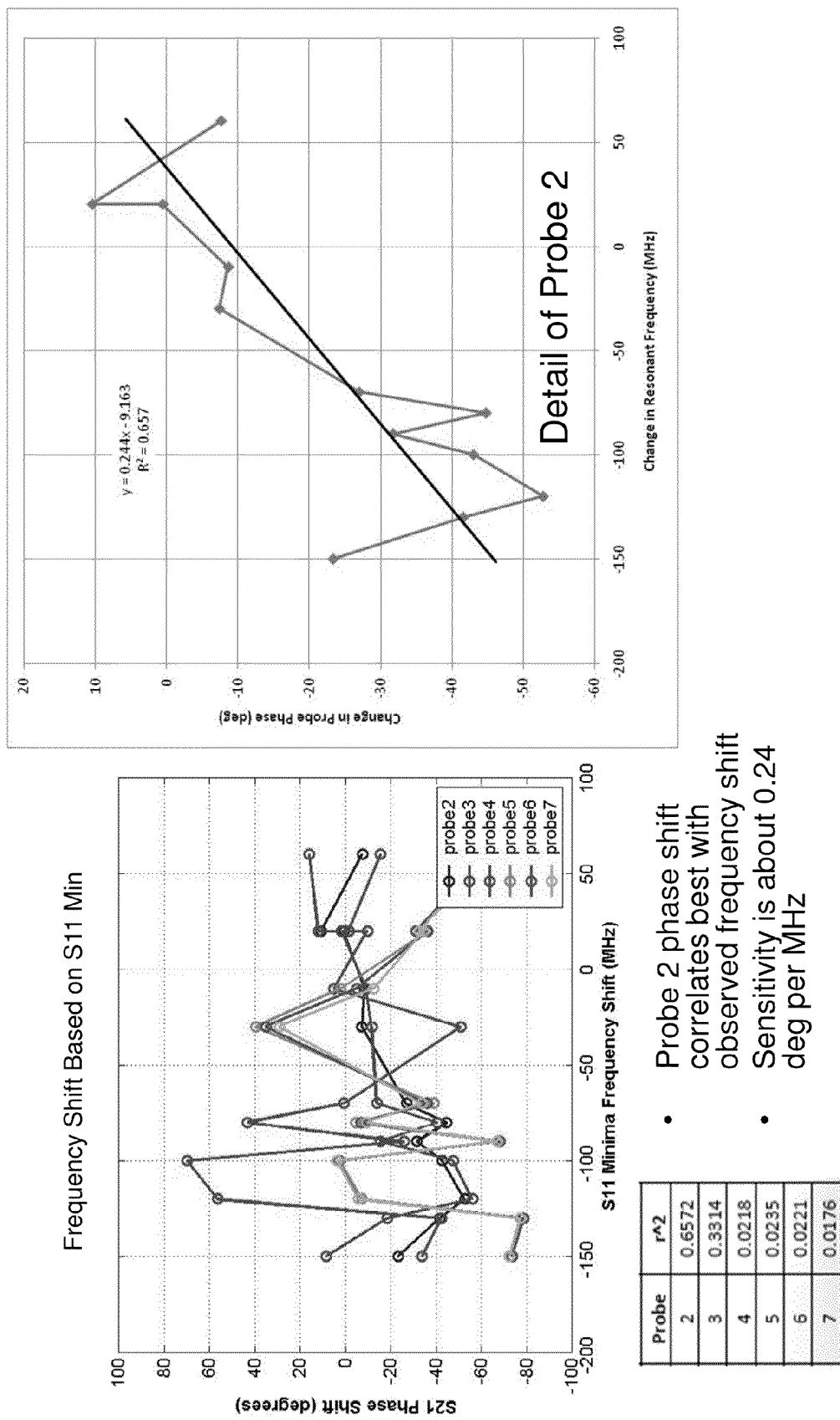
FIG. 43 depicts illustrative embodiments of phase vs. antenna frequency shift plots of the probes.

FIG. 39 depicts return loss plots (S11) for steel and body tissue and their respective efficiencies for each use case. Compared with free space, the resonant frequency of the antenna shifts from free space from −150 to +60 MHz. The efficiency changes from −18 to +2 dB. The Smith charts of FIG. 40 depict steel and body tissue plots of all probes for all use cases. FIG. 41 depicts magnitude and phase response of probe 2 which is closest to an end of the antenna. FIG. 42 depicts the magnitude and phase response of probe 4 which is to the left of the antenna. In this latter embodiment, the response is not well behaved, which illustrates that not all probe locations may provide optimal results. FIG. 43 depicts phase shift versus antenna frequency shift plots for probe 2. These plots show that the phase shift experienced at probe 2 correlates with an observed frequency shift. The sensitivity is about 0.24 degrees per MHz. FIG. 44 depicts power shift versus antenna radiated power shift plots for probe 2. These plots show that the magnitude shift experienced at probe 2 correlates worst with an observed power shift. Probe 7 (opposite end of ground) correlates best with the radiated power shift. The sensitivity is about 0.28 degrees per radiated power shift.

Figure 45:
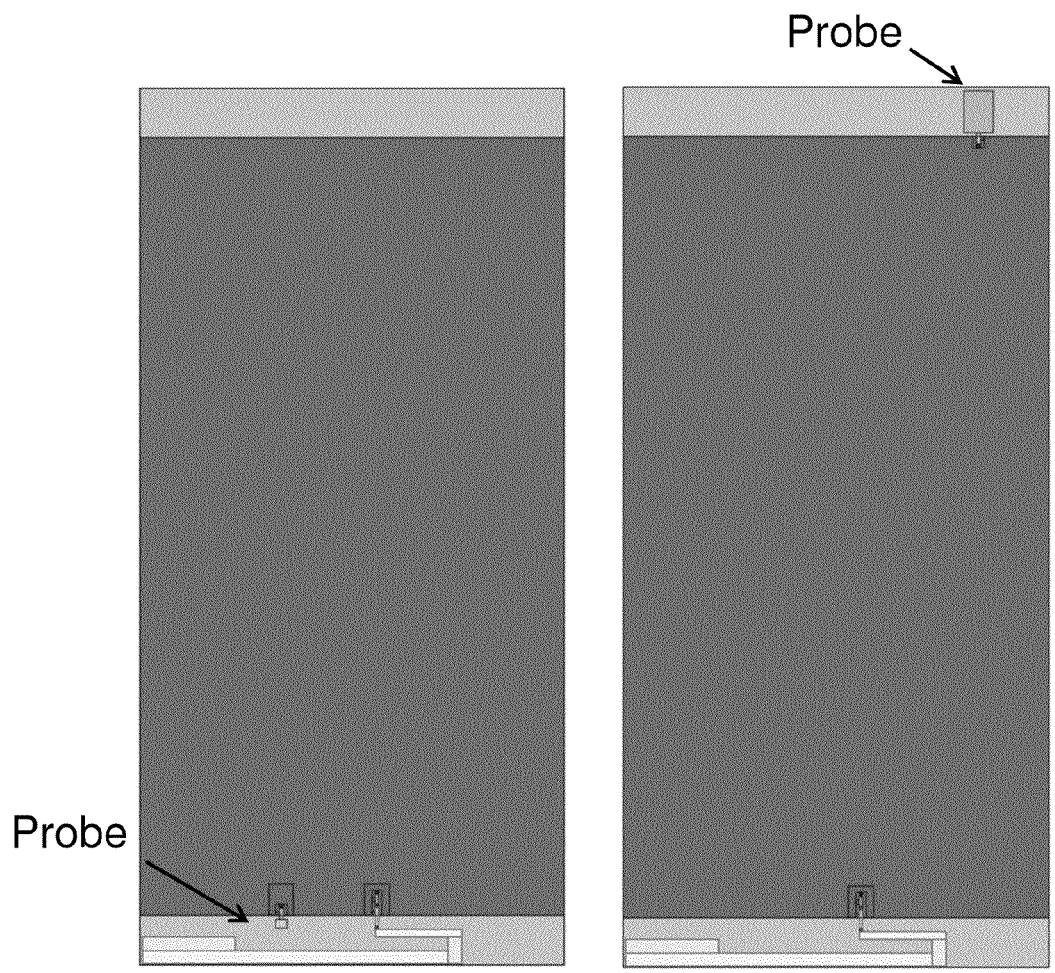
FIG. 45 depicts illustrative embodiments of an antenna structure and probe placements.

FIGS. 45-48 depict simulations for an aperture tuned antenna model. FIG. 45 depicts two embodiments having near field probes placed near and far from an antenna located at one end of a PCB having dimensions of 60 mm×126 mm. The antenna is designed for a low band nominal frequency of 860 MHz. A variable inductor (Ltune) can be changed to shift the resonant frequency of the antenna. The models shown in FIG. 45 can be used to determine how much improvement can be made by changing Ltune in several loading scenarios.

Figure 46:
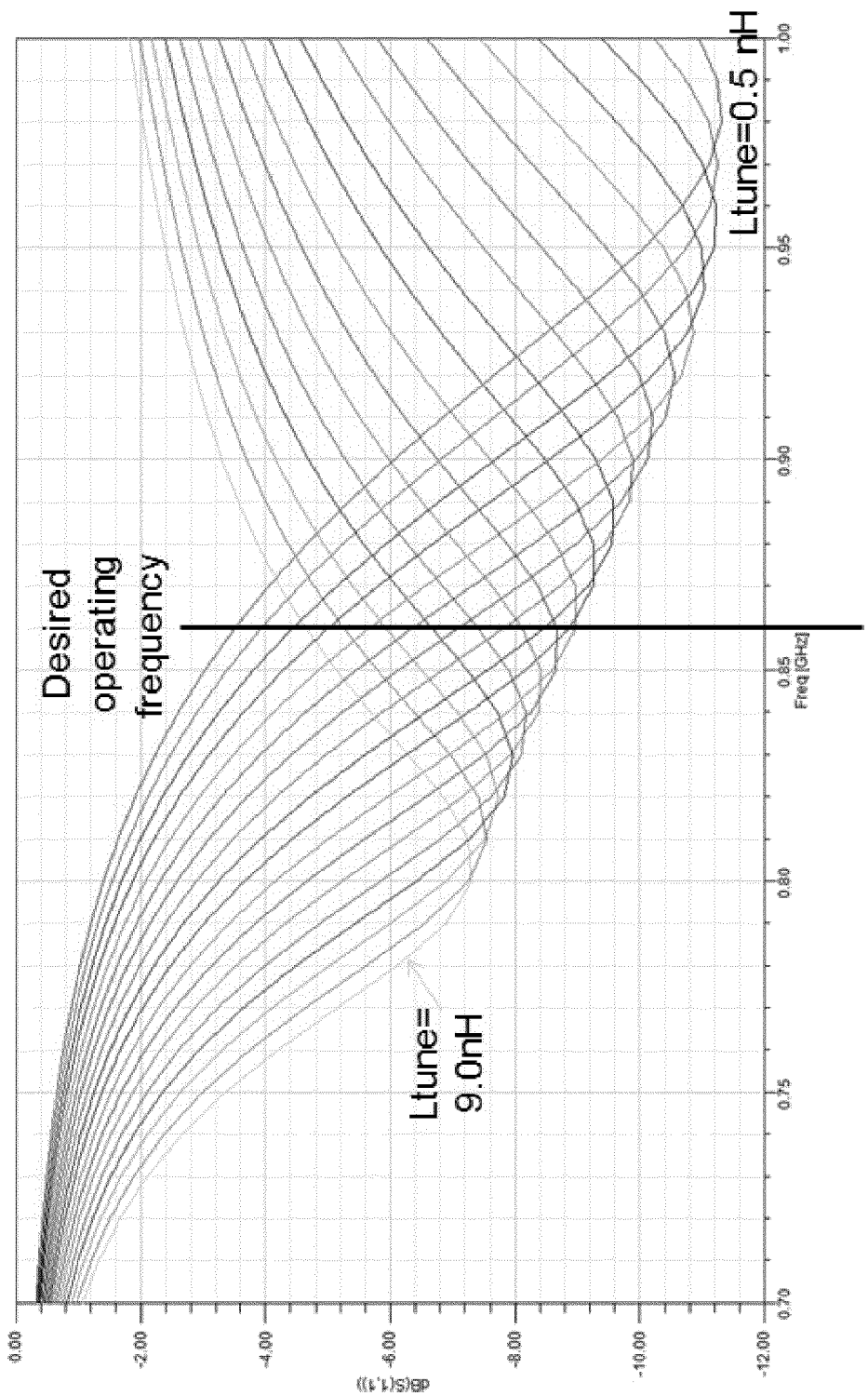
FIG. 46 depicts illustrative embodiments of a free space resonance tuning use a Ltune (a tuning variable)

FIG. 46 depicts free space resonance tuning using Ltune. Return loss (S11) is presented in the pots of FIG. 46 as a function of the value of Ltune. The simulations assume in free space a nominal setting of L=5.6 nH at a resonant frequency of 860 MHz. The simulation methodology included running each of the models of FIG. 45 with all of the loading cases shown in FIG. 38. The value of Ltune is then swept for each loading case. A determination is then made of the maximum radiated power at the desired operating frequency (fc) over the sweep of Ltune. The maximum radiated power is then compared based on metrics such as maximizing a magnitude of S21 (power coupled to the near field probe), minimizing a magnitude of S11, and normalizing S21 phase to 0 degrees (the normalized phase is the measured S21 phase minus the reference phase delay at resonance center determined from the free space model or by the actual phase when the antenna is tuned to the desired frequency).

Figure 47:
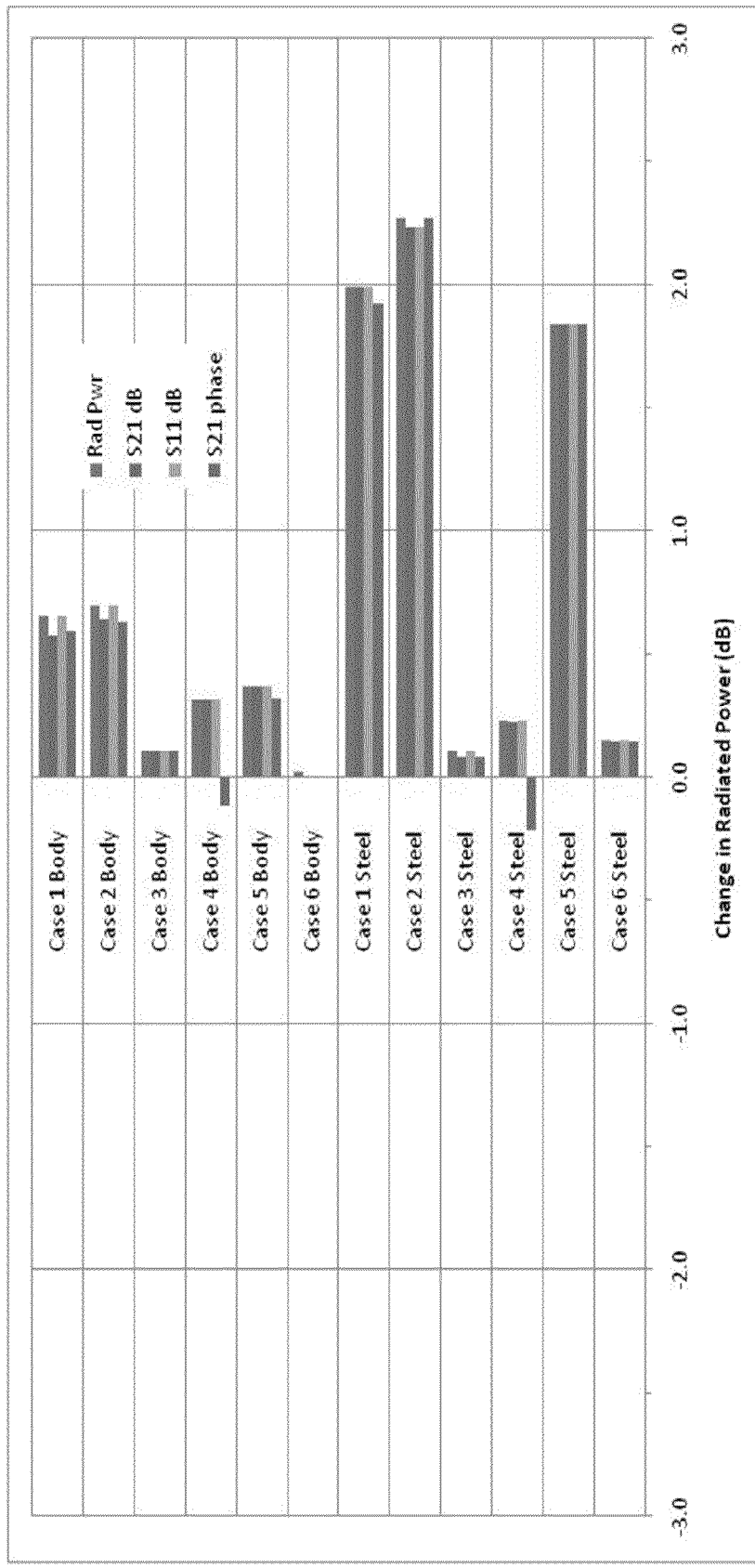
FIG. 47 depicts illustrative embodiments of efficiency gain by tuning of the antenna structure based on measurements of one of the probes of the antenna structure of FIG. 45.
Figure 48:
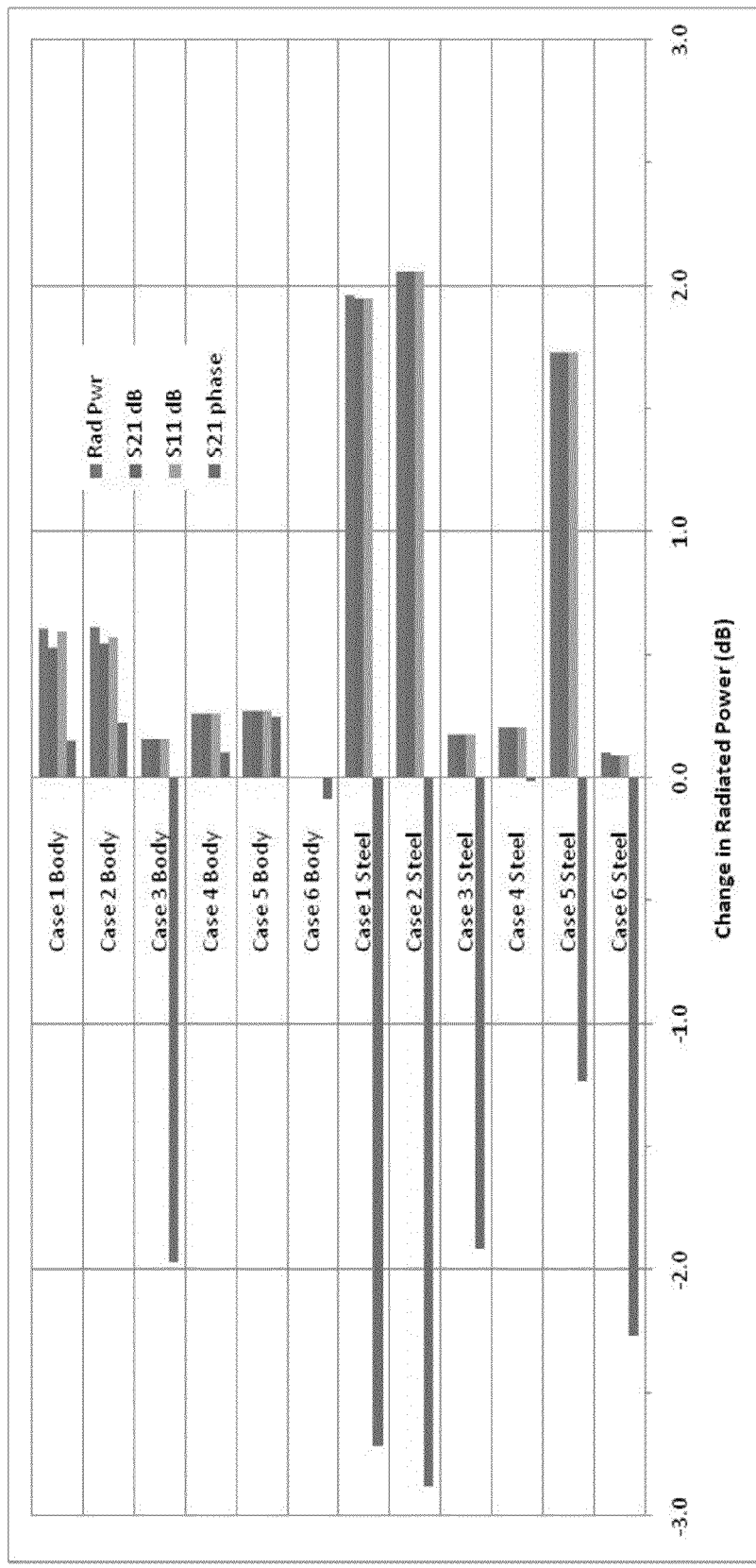
FIG. 48 depicts illustrative embodiments of efficiency gain by tuning of the antenna structure based on measurements of a different one of the probes of the antenna structure of FIG. 45.

FIG. 47 depicts an efficiency gain by optimization of tuning for the case of the near field probe nearest the antenna in FIG. 45. FIG. 47 shows an improvement in radiated power from 0 to 2.2 dB depending on loading case. It is further observed that an ideal optimization of S21 or S11 results in nearly the same gain as optimizing on radiated power itself. It is also observed that optimizing on S21 phase also works well except in five of the six loading cases. FIG. 48 depicts an efficiency gain by optimization of tuning for the case of the probe opposite the antenna in FIG. 45. FIG. 48 shows again that optimization of S21 or S11 are reliable. However, in this case, optimizing on S21 phase works poorly in the situation where near field probe is far from the antenna.

Figure 49:
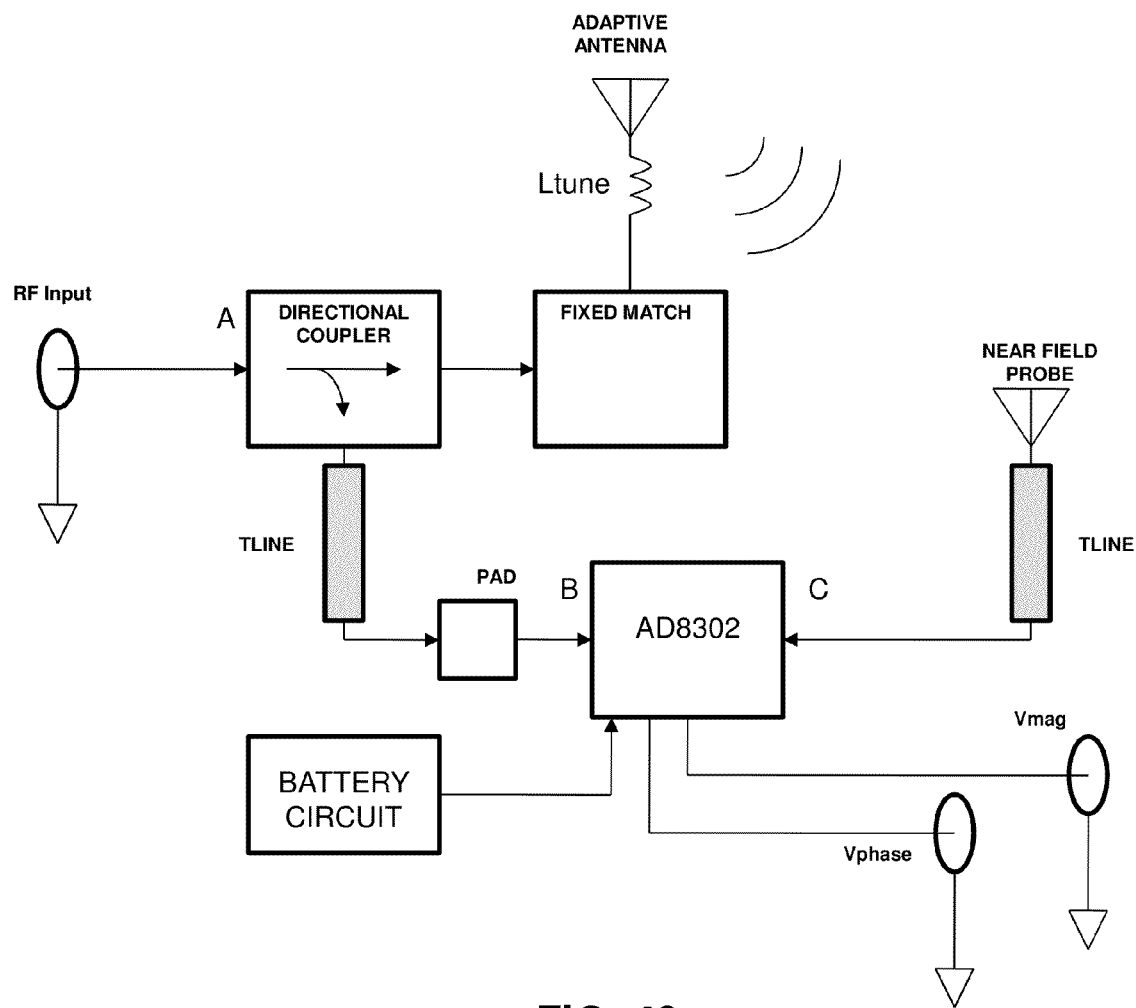
FIG. 49 depicts an illustrative embodiment of a near field sensor.

FIG. 49 depicts an illustrative implementation of a near field sensor. In one embodiment, the near field sensor can comprise a transmission line coupled to a directional coupler, an RF IC (e.g., an Analog Devices AD8302) powered by a battery for measuring amplitude and phase between a forward feed signal supplied by the directional coupler, and a signal supplied by the near field probe. The magnitude and phase measured by the RF IC can be supplied to a controller that performs algorithmic steps as described earlier for detecting a change in a desire frequency of the antenna. RF paths AB and AC can be configured to 90 degrees of path difference for nominal free space, which is the center of the measurement range for phase of the RF IC. RF paths AB and AC can be set to ~−30 dB path loss, the center of the input range being −30 dBm. FIG. 50 depicts a PCB layout of the near field sensor.

It is noted that any of the adaptive antenna embodiments described in the subject disclosure can be applied to multiple MIMO configuration (2×2, 4×4, etc.) or diversity configurations. It is further noted that adaptive antenna embodiments described in the subject disclosure can be applied to multi-band antenna structures. In such configurations, the subject disclosure enables support for carrier aggregation of multiple bands for simultaneous transmission or reception in MIMO or diversity configurations, while maintaining at least some isolation between antenna ports.

Figure 51:
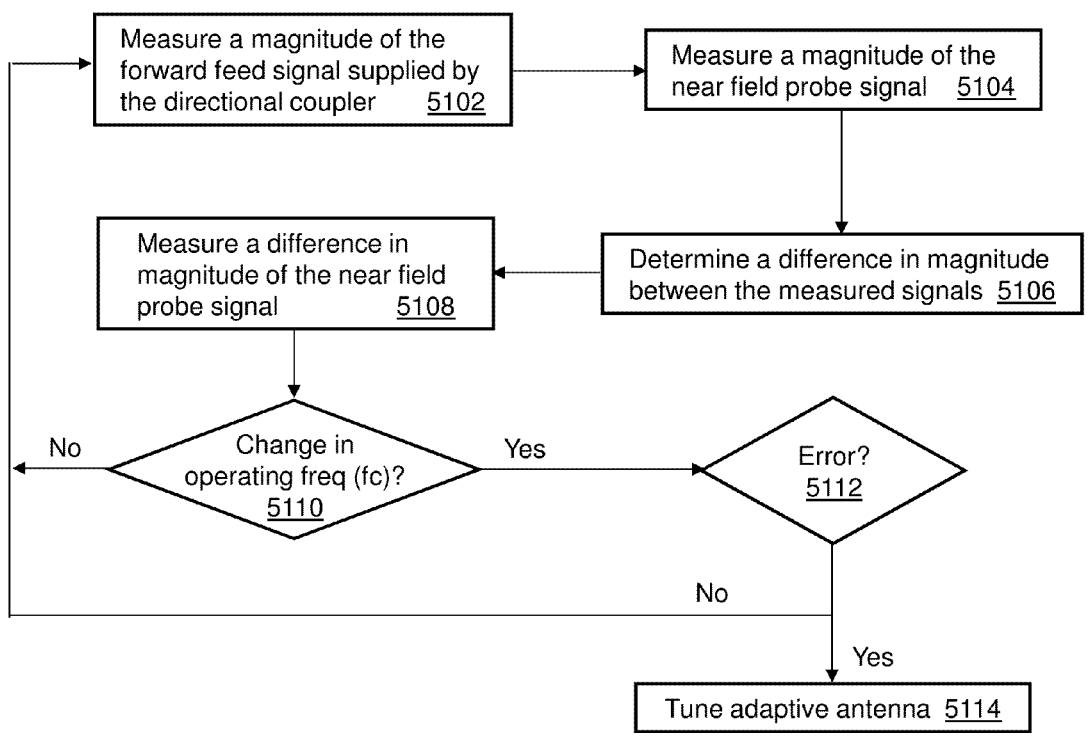
FIG. 51 depicts an illustrative embodiment of a method that can be applied to the subject disclosure.

FIG. 51 depicts an illustrative embodiment of a method 5100 that can be applied to the embodiments of the subject disclosure. The method 5100 can begin at step 5102 where circuitry (such as a log detector) can be used to measure a magnitude of a forward feed signal supplied by a directional coupler coupled to an adaptive antenna by way of a matching network. At step 5104 a near field probe can be used to measure a magnitude of radiated energy from the adaptive antenna. At step 5106 a difference between the magnitude of the forward feed signal and the radiated energy of the antenna can be determined. At step 5110 a determination can be made whether the difference in magnitude results in a change in the operating frequency (fc) of the adaptive antenna. If there is no change (or an insignificant change) in the operating frequency (fc) is detected, method 5100 can be adapted for repeating subsequent iterations of method 5100 beginning from step 5102. If the change in the operating frequency (fc) is considered significant, at step 5112 a frequency offset error can be determined according to the difference in magnitude determined at step 5106.

If the frequency offset error is considered insignificant, method 5100 can be repeated in subsequent iterations beginning from step 5102. If, however, the frequency offset error is considered undesirable (or unacceptable), at step 5114 the adaptive antenna can be tuned by, for example, varying the electrical length of the antenna based on an Ltune value calculated from the difference in magnitude between the forward feed signal and the radiated energy of the antenna. The Ltune value can be used to configure a switched array of inductors such as shown in FIGS. 32B, 33B, 34B and 35B. Alternatively, a tuning value can be calculated from the difference in magnitude between the forward feed signal and the radiated energy of the antenna, which can be used to tune one or more programmable variable reactive elements (such as one or more variable capacitors, one or more variable inductors, or combinations thereof) coupled to the antenna that reconfigure the electrical length of the antenna, and thereby change the operating frequency of the antenna to a desirable frequency.

Figure 52A:
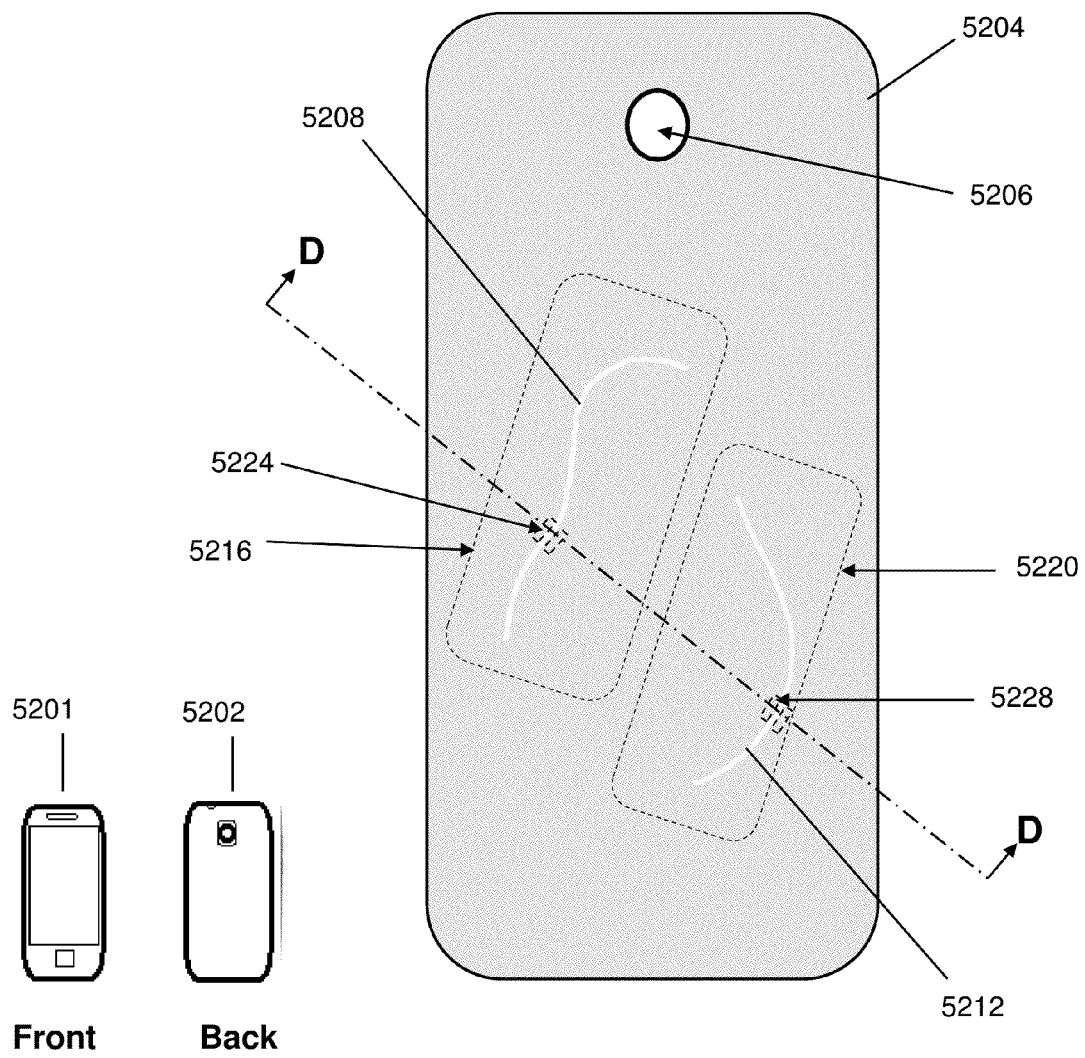
FIGS. 52A to 52H depict illustrative embodiments of slot antenna devices forming part of a trade dress design in a conductive cover of a communication device.
Figure 52B:
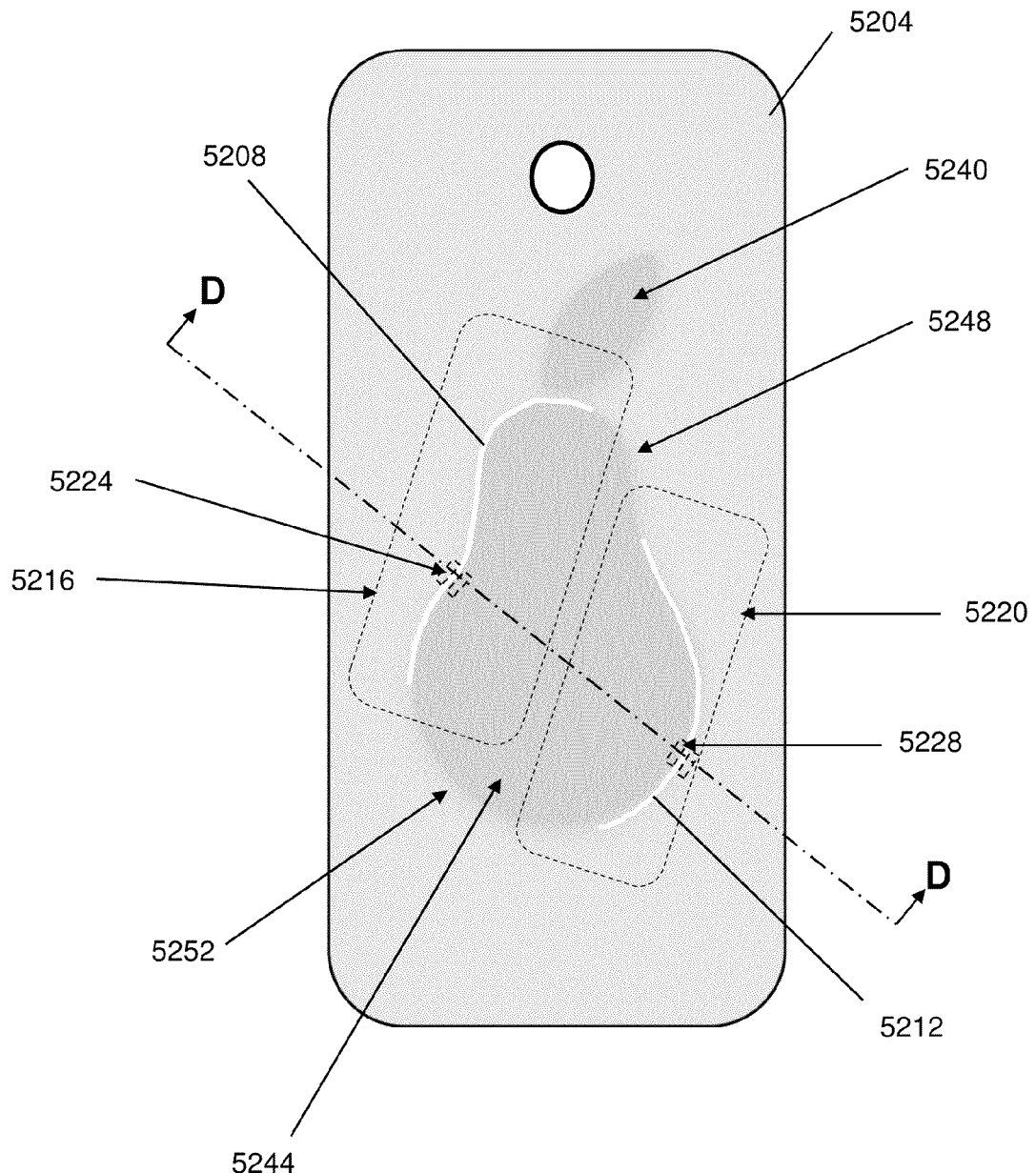

FIGS. 52A through 52F depict illustrative embodiments of slot antenna devices forming part of a trade dress design in a conductive cover of a communication device. FIG. 52A depicts outside views of a conductive cover 5204 of a communication device 5200 with slot antennas 5208 and 5212 formed therein. The communication device 5200 can comprise any device capable of performing wireless transmission and/or reception of signals via an antenna. For example, the communication device 5200 can be a mobile phone, a pad device, a mobile computing device, a cellular phone, a radio-frequency communicator, or any other device capable of remote communication via electromagnetic signals. The communication device 5200 can include a front 5201 and a back 5202, as shown. The front 5201 can include a user interface, which can include a touchscreen, one or more buttons, a display, a keypad, and other interface elements that allow a user to select functions for controlling the operation of the communication device 5200. The communication device 5200 can also include a microphone, camera, and other interfaces that facilitate audio and/or visual communications using the communication device 5200. The back 5202 of the communication device 5200 can also include user interface elements. For example, the back 5202 of the communication device 5200 can include an opening to allow light to pass into a camera device that can be included in the communication device 5200.

In one embodiment, the communication device 5200 can include a back that is formed substantially of a cover 5204. This cover 5204 can provide mechanical strength to the communication device 5200 while protecting components of the communication device. The cover 5204 can also provide a mechanical structure for holding the communication device 5200 and/or hermetically sealing the device to prevent liquid intrusion. In one embodiment, the cover 5204 can be formed of a conductive material. For example, cover 5204 can be formed from a metal, such as aluminum. In another example, the cover 5204 can be formed from a nonconductive material, such as a resin, that is made intrinsically conductive or that is made to exhibit conductivity through the inclusion of conductive materials. In yet another example, the cover 5204 can be a laminate of conductive and nonconductive materials. Where the cover 5204 is conductive, the cover 5204 can serve as a conductive plane for grounding and/or isolation functions for the communication device 5200.

In one embodiment, the cover 5204 can substantially encompass the entire back 5202 of the communication device 5200. Alternatively, the cover 5204 can encompass a portion of the back 5202 of the communication device 5200 and/or can encompass both the back 5202 and/or a portion of the front 5201 of the communication device 5200. While the cover 5204 is shown as a single piece of material, such as a continuous piece of metal, the cover 5204 can be formed of multiple pieces of material. In one embodiment, cover 5204 comprises a single piece of sheet aluminum that is formed using one or more steps of pressing, stamping, rolling, bending, and/or embossing. In one embodiment, cover 5204 can be formed by molding material into the cover shape using, for example, injection molding and/or extrusion processes, which can be further combined with other material-working processes.

In one or more embodiments, communication device 5200 can be capable of engaging in wireless radio communications. For example, the communication device 5200 can transmit and/or receive radio frequency electromagnetic waves using one or more antennas 5208 and 5212 that are communicatively coupled to electronic circuits inside of the device. The radio frequency electromagnetic signals can be used in a cellular communications system for transmitting and/or receiving various types of communications at the device, such as voice, data, video, audio, digital information, and/or text information. One or more antenna devices 5208 and 5212 can be used by the communications device 5200 for the transmission and or reception of communications.

In one or more embodiments, slot antennas 5208 and 5212 can be formed into the cover 5204 of the communications device 5200. Each slot antenna 5208 can be defined by an opening in the cover 5204. For example, a first slot antenna 5208 can be defined by a first slotted opening through the cover 5204. A second slot antenna 5216 can be defined by a second slotted opening through the cover 5204. Where the cover 5204 is constructed from a conductive material, application of a voltage source to the cover 5204 can cause current to flow in the cover 5204. Where current is induced into a conductive material, this current flow can cause electromagnetic energy to radiate from the conductive material. Alternatively, if a conductive material is exposed to electromagnetic energy, then this electronic energy can cause current flow to be induced into the conductive material.

In one or embodiments, the slot antennas 5208 and 5212 can have relatively narrow widths and relatively long lengths. In one embodiment, a high ratio of length to width for a slot opening can create a slotted antenna 5208, where the length of the slot opening can be dominant in the determination of a frequency response for the antenna. For example, a narrow slot antenna, where length L is much greater than width w, can demonstrate electromagnetic frequency resonance at a center frequency of wavelength $\lambda$, where L is approximately equal to $\lambda/2$. If a voltage signal is coupled across two points at opposite edges of the slotted opening of the slot antenna 5208, then this voltage signal can induce current to flow along the edges of the slotted opening in the conductive material of the cover 5204. If the voltage signal is an oscillating source, then the induced current can oscillate and can generate electromagnetic energy at the frequency of oscillation. The slot antenna 5208 can most efficiently transfer energy at a resonance frequency $f_c$, which corresponds to a first resonance wavelength $\lambda_c$ that is approximately twice the slot length or 2L.

In one or more embodiments, the cover 5204 can include two slot antennas 5208 and 5212. In one embodiment, a first slot antenna 5208 can be used for transmitting first electromagnetic signals from the communication device 5200, while a second slot antenna 5212 can be used for receiving second electromagnetic signals at the communication device 5200. In another embodiment the first and second slot antennas 5208 and 5212 can be used to transmit and/or receive radio frequency signals of differing frequencies. In one embodiment, the first slot antenna 5208 is coupled to the communication device 5200 at a port 5224, or feed point. In one embodiment, the port 5224 can be offset from a longitudinal center of the slot opening for the slot antenna 5208. The specific location of the port 5224, with respect to the endpoints and the center point of the slot opening, can be selected to adjust and input impedance of the first slot antenna 5208. For example, the first slot antenna 5208 that is formed in the cover 5204 can be modeled as a set of transmission lines coupled to a voltage source at the port 5224 and this model can include a line inductance in parallel with a line capacitance and further in parallel with a line resistance. By selecting a particular location of the port 5224 along the slot opening, the line capacitance and the line inductance can cancel one another leaving only the line resistance in the model. Therefore, according to various embodiments, a slot opening length L and a placement of a first port 5224 can be used to design a first slot antenna 5208 that exhibits desired center frequency response and desired input impedance. In one embodiment, first and second ports 5224 and 5228 can be designed to provide electrical conductivity from the communication device 5220 with in the cover 5204 to first and second slot antennas 5208 and 5212 that are formed in the cover 5204.

In one or more embodiments, first and second slot antennas 5208 and 5212 can be formed in the cover 5204 in first and second portions 5216 and 5220 of the cover 5204. While the cover 5204 can be a continuous single piece of conductive material, currents flowing in the first and second slot antennas 5208 and 5212 can be substantially concentrated along the edges of the slot openings that defined the locations of the first and second slot antennas 5208 and 5212. Where the first and second slot antennas 5208 and 5212 are spaced sufficiently, there can be relatively small cross coupling or cross talk between the two slot antennas 5208 and 5212, first and second electrical signals, and first and second electromagnetic radiofrequency signals generated by the slot antennas 5208 and 5212.

In one or more embodiments, a slot opening for a slot antenna 5208 can be formed in the cover 5204 such that an aesthetically useful shape is defined by the traversal of the slot opening across the surface of the cover 5204. In one embodiment, a shape defined by the slot opening for the slot antenna 5208 can correspond to all or any portion of a design that is useful as "trade dress" for the communication device 5200. Trade dress can include a design, symbol, likeness, facsimile, word and or letter that can be used for commercial purposes in the marketing and/or sale of the communication device 5200. In one embodiment, the trade dress can correspond to a trademark symbol that has been registered and/or used commercially for marketing the communication device 5200. In one or more embodiments, the slot antennas 5208 and 5212 can be any shape. In the illustrative embodiment, the slot antennas 5208 and 5212 are curved to correspond to a portion of a fruit shape. In one embodiment, the slot antennas 5208 and 5212 can be the same shape. In another embodiment, the slot antennas 5208 and 5212 can different in shape from each other, as shown in the illustrative embodiment.

Referring again to FIG. 52B, one embodiment is illustrated of a trade dress design formed on the cover 5204 of the communication device 5200. In this example, the trade dress consists of an outline of a pear that is formed by a combination of features of the cover 5204. For example, first and second slot antennas 5208 and 5212 formed through the cover 5204 can create side shapes for the pear. Additional side shapes 5248 and 5252 of the pear are formed by embossing and/or painting shapes into and/or onto the surface of the cover 5204. An additional feature of the pear is a leaf shape 5240 that can likewise be formed by embossing and/or painting. The resulting pear shape can be used to identify the maker and/or seller of the communication device 5200. In one or more embodiments, first and second slot antennas 5208 and 5212 can combine useful purposes of providing antenna functionality and providing shade definition for a trade dress design.

Figure 52C:
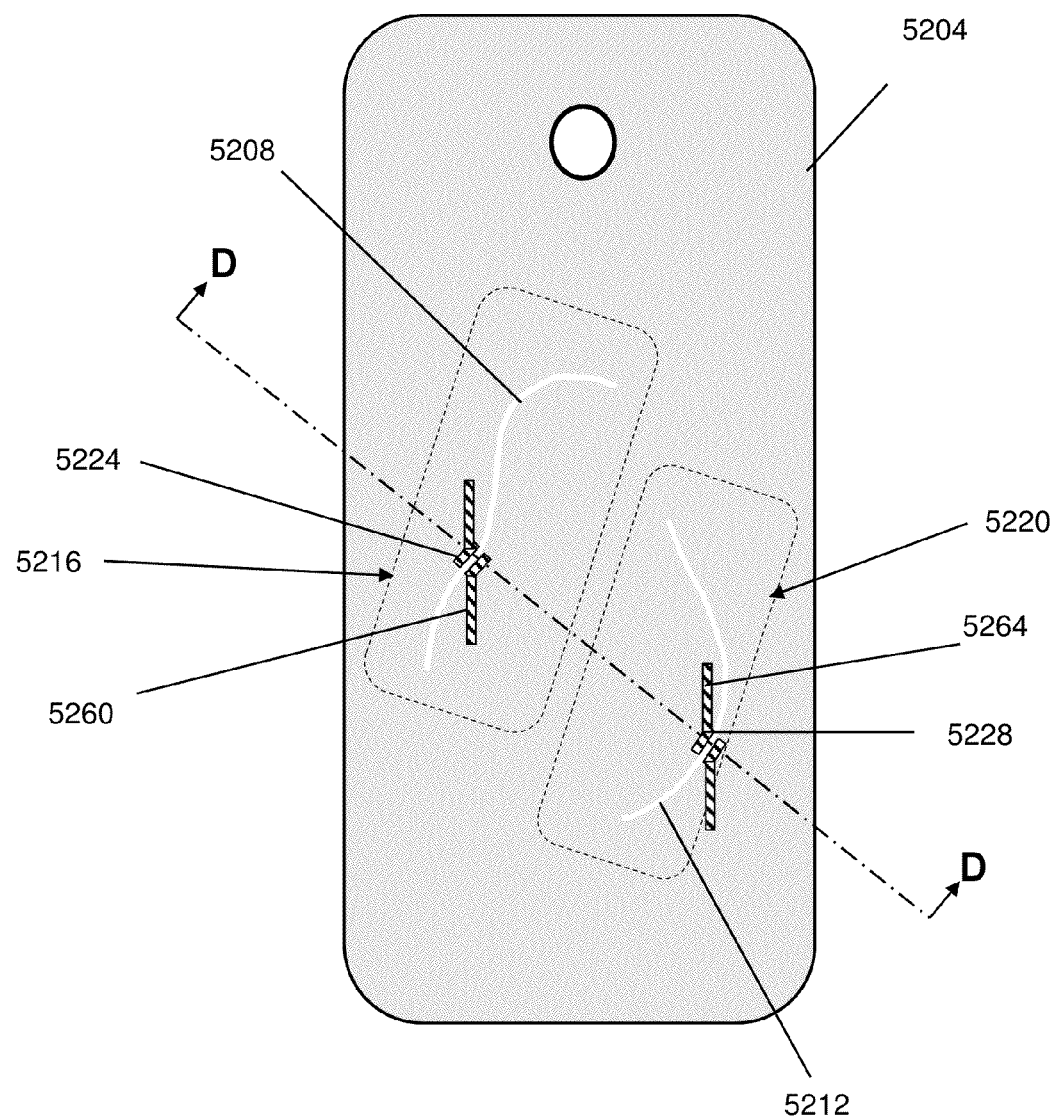

FIG. 52C depicts one or more embodiments of an inside view of the cover 5204. The first and second slot antennas 5208 and 5212 can be defined through the cover 5204 by the slot openings. The first and second ports 5224 and 5228 can be formed on the inside surface of the cover 5204 and can provide conductive connections from internal circuits, not shown, and edges of the first and second slot antennas 5208 and 5212. In one embodiment, the inside surface of the cover 5204 can be coated with an insulating material such that conductive lines 5260 for the ports 5224 and 5228 can be routed along the inner surface of the cover 5204. Openings can be formed in the insulating material at the specific locations of the ports 5224 and 5228 to complete conductive connections to the first and second slot antennas 5208 and 5212.

Figure 52D:
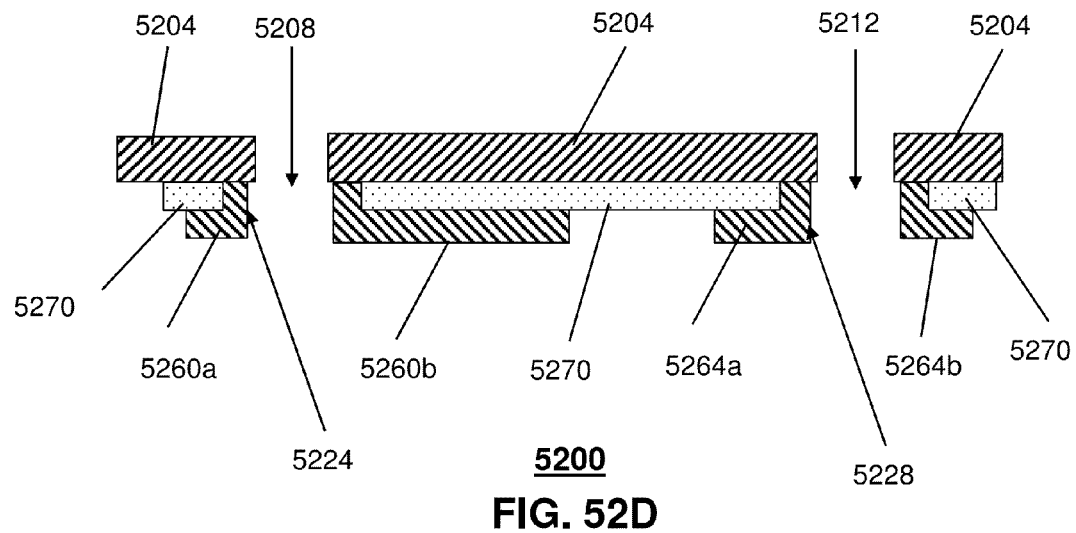

FIG. 52D depicts one or more embodiments of the cover 5204 and the slot antennas 5208 and 5212 in cross-sectional illustration. The cover 5204 can be formed from a conductive material, such as a sheet of metal. The slot antennas 5208 and 5212 can be formed as openings in the cover 5204. In one embodiment, an insulating material 5270 can be used to provide an insulator barrier on the inside surface of the cover 5204. The presence of this insulating material 5270 can allow conductive lines 5260a, 5260b, 5264a, and 5264b to independently connect circuits of the communication device 5200 to the first slot antenna 5208 and the second slot antenna 5212 via a first port 5224 and a second port 5228. In one embodiment, openings can be formed in the insulating material 5270 to facilitate the connections to the ports 5224 and 5228.

Figure 52E:
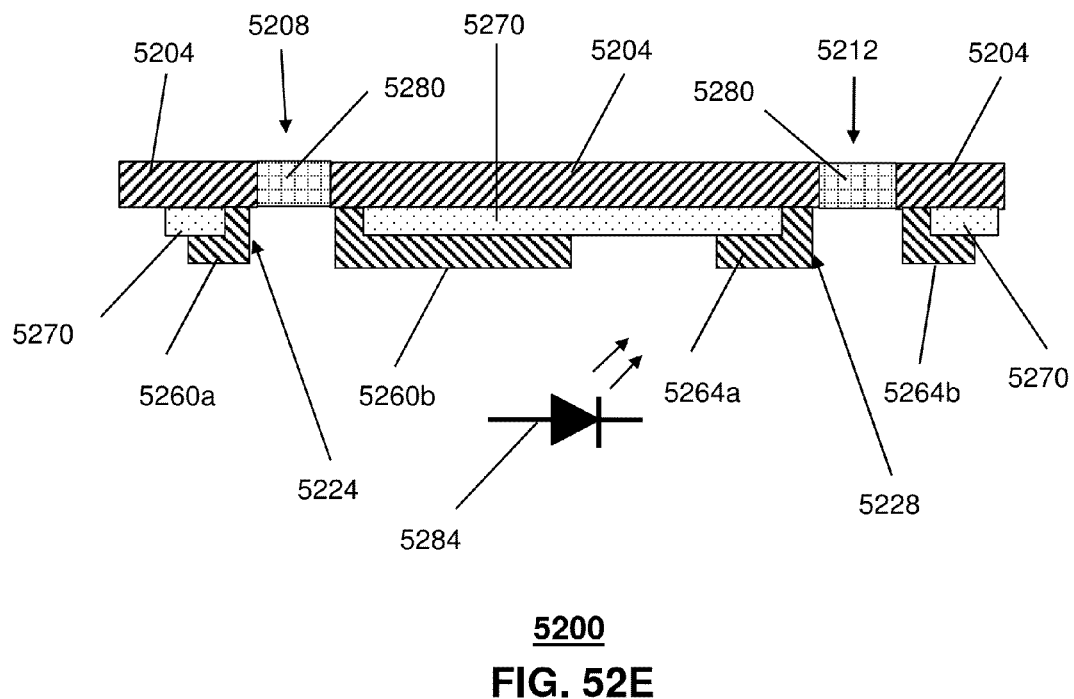

FIG. 52E depicts one or more embodiments of the cover 5204 and the slot antennas 5208 and 5212 in cross-sectional illustration and, further, shows filling the openings that make up the slot antennas 5208 and 5212 with a nonconductive material 5280. For example, a nonconductive material can be selected that is impervious to moisture such that the slot openings in the cover 5204 do not permit the entry of moisture or other foreign materials into an assembled case for the communication device 5200. In one embodiment, the nonconductive material 5280 can be translucent. The communication device 5200 can include a light source 5284, such as a light emitting diode (LED) that can emit light within the closed case of the communication device 5200. By using a translucent material for the nonconductive material 5280, light that is emitted within the case can be transmitted through the slot openings of the slot antennas 5208 and 5212. This emitted light can enhance visual aspects of the slot antennas 5208 and 5212 in the cover 5204 and, thereby, enhance the trade dress design. In another embodiment, the nonconductive material 5280 can be non translucent and not permit the passage of light. The nonconductive material 5280 can be colored to fit the aesthetic scheme of the trade dress design. Alternatively, the nonconductive material 5280 can be colored to blend into the color scheme of to the portions of the cover 5204 that are not part of the trade dress design.

Figure 52F:
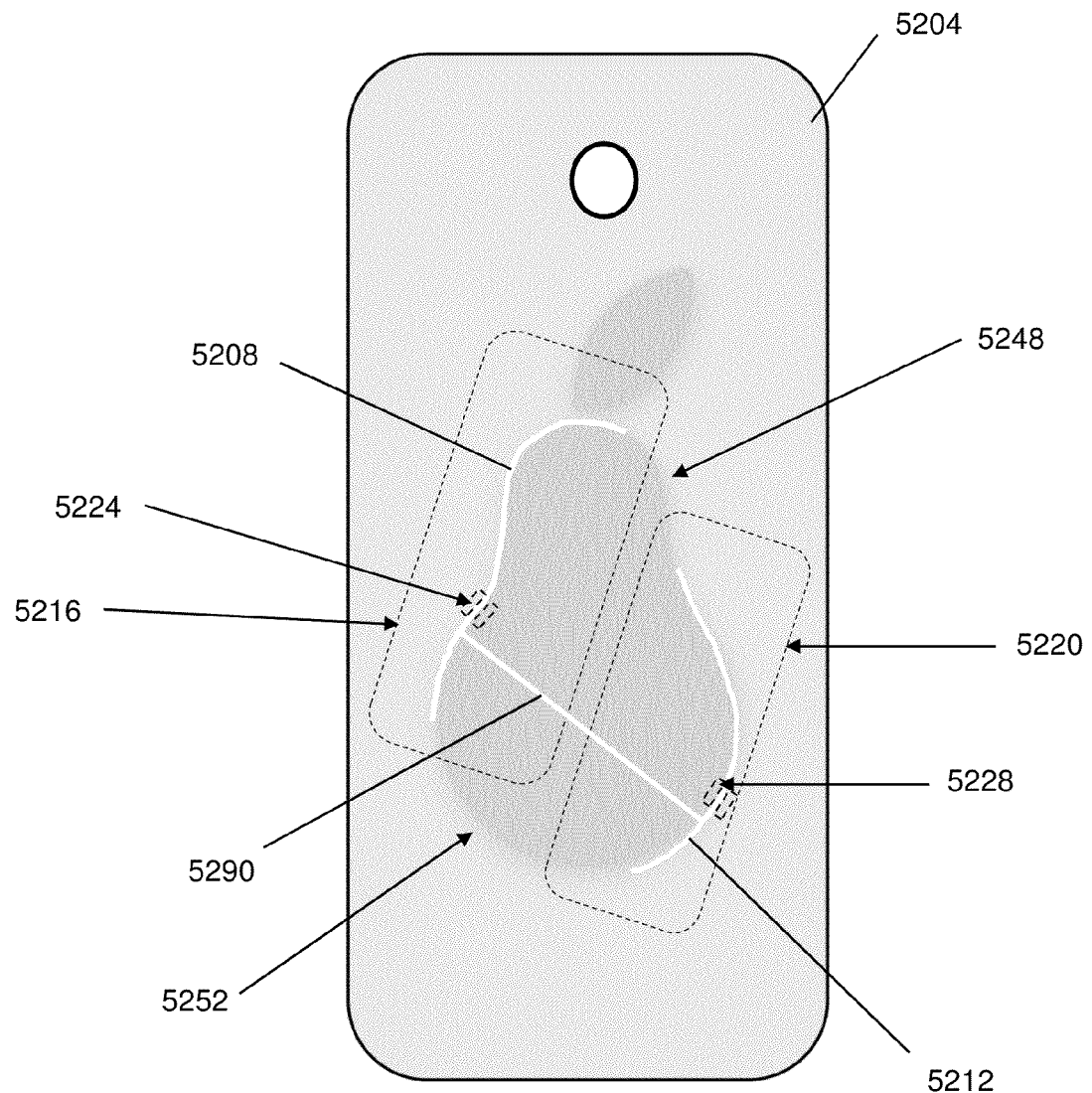

FIG. 52F depicts one or more embodiments of the cover 5204, where a coupling element can be used for increasing signal isolation between the slot antennas 5208 and 5212. If the first slot antenna 5208 and the second slot antenna 5212 are spaced far apart on the cover 5204, then coupling of signals between the antennas can be negligible. However, if the distance between the first slot antenna 5208 and the second slot antenna 5212 is small, then this coupling can be large enough to cause crosstalk between two antennas. In this case, the antennas 5208 and 5212 no longer act independently and can be considered an antenna system, where each antenna distorts the gain pattern of the other. In the example featuring the first slot antenna 5208 and the second slot antenna 5212 formed in the cover 5204 of the communication device 5200, the antennas 5208 and 5212 can be in closest proximity at areas 5248 and 5252 at the ends of the antennas.

In one or more embodiments, a coupling element 5290 can be used to improve signal isolation between the two slot antennas 5208 and 5212. The coupling element 5290 can create a combined, two-port resonant antenna structure made up of the first slot antenna 5208, accessible via a first port 5224, and a second slot antenna 5212, accessible via a second port 5228. When either of the ports 5224 and 5228 is excited via a voltage signal, the combined structure can exhibits a resonance similar to that of the unattached slot antennas 5208 and 5212, but with a significant reduction in coupling between the antennas 5208 and 5212. Further, pattern diversity between the antennas 5208 and 5212 can be increased via the coupling element 5290. In one embodiment, the coupling element 5290 can be formed as another slot opening that connects between the first slot antenna 5208 and the second slot antenna 5212. In one embodiment, the coupling element 5290 can connect from the first slot antenna 5208 to the second slot antenna 5212 below the first and second ports 5224 and 5228 so that the coupling element can be across a short end of the slot antennas 5208 and 5212.

Figure 52G:
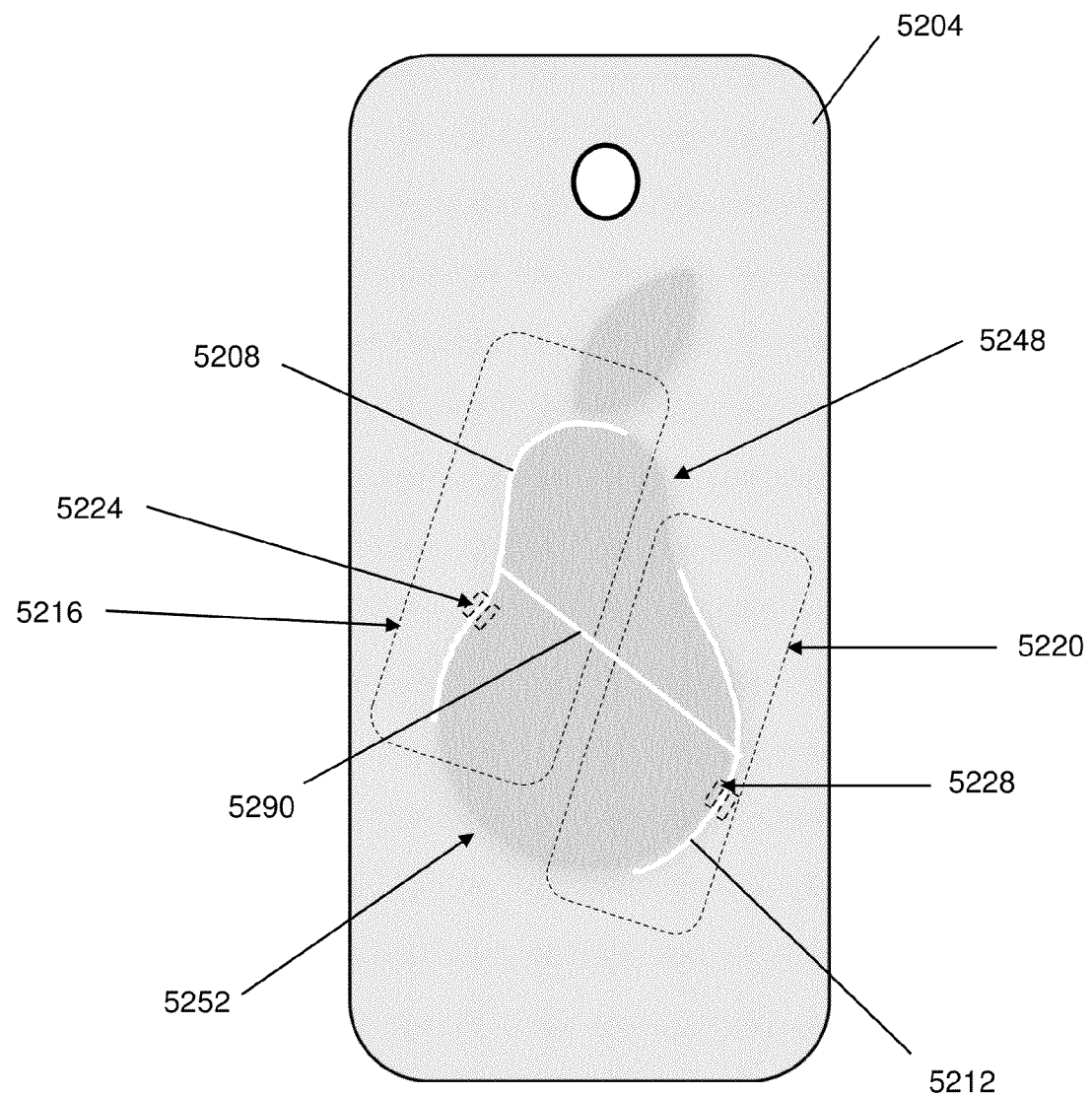

In another embodiment, shown in FIG. 52G, the coupling element 5290 can connect from the first slot antenna 5208 to the second slot antenna 5212 above the first and second ports 5224 and 5228, so that the coupling element can be across a long end of the slot antennas 5208 and 5212. In one embodiment, a coupling element 5290 can further include a nonconductive material that is formed in the opening of the coupling element 5290. This nonconductive material can be a translucent material for passing light out of the cover 5204 or can be a non translucent material. The nonconductive material can be colored to fit the aesthetic scheme of the trade dress design. Alternatively, the nonconductive material can be colored to blend into the color scheme of to the portions of the cover 5204 that are not part of the trade dress design.

Figure 52H:
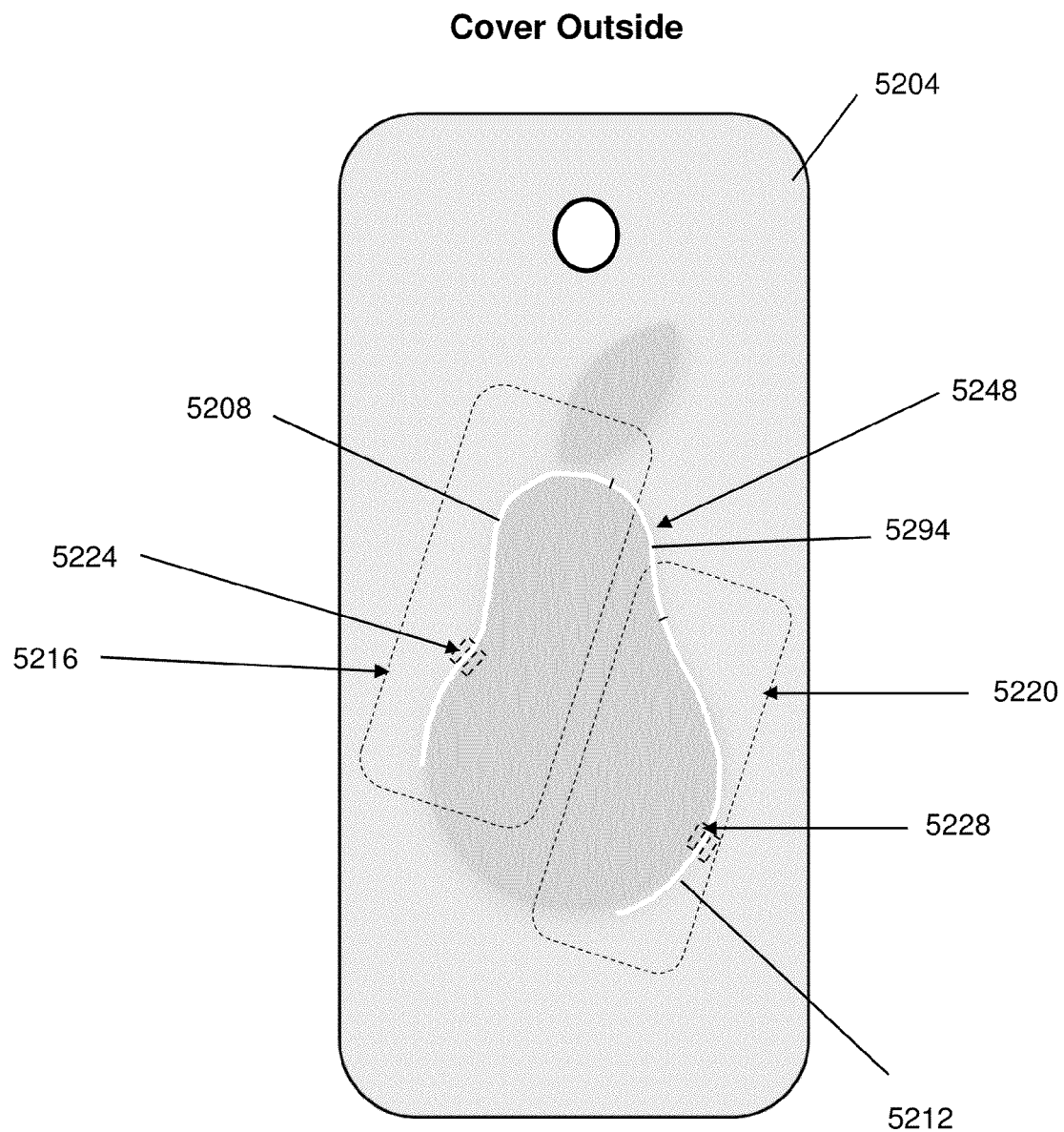

FIG. 52H depicts an illustrative embodiment wherein the coupling element 5248 can be part of the trade dress design. In one embodiment, coupling element 5294 can connect a first slot antenna by 5208 two a second slot antenna 5212 at an end point of each antenna. For example, the coupling element 5248 can connect endpoints of the antennas 5208 and 5212 and continue the shape of the pear that makes up the trade dress for the communication device 5200. In one embodiment, the coupling element 5294 can make up part of the trade dress design while connecting the first and second slot antennas 5208 and 5212 at locations away from the endpoints of the antennas.

Figure 53:
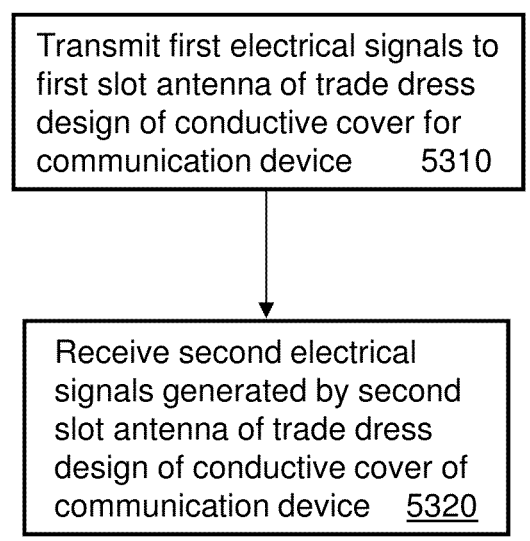
FIG. 53 depicts an illustrative embodiment of a method that can be applied to the communication device of FIGS. 52A-H.

FIG. 53 depicts an illustrative embodiment of a method that can be applied to the communication device of FIGS. 52A-G. At step 5310, a communication device 5200 can transmit first electrical signals to a first slot antenna 5208 of a trade dress design of a conductive cover 5204. In one embodiment, the first electrical signals can represent first carrier and data information of a first wireless communication signal, such as a cellular communication signal. In one embodiment, first slot antenna 5208 can form a shape that corresponds to all or a portion of the trade dress design that is used for commercial activities associated with the communication device 5200. In one embodiment, the communication device 5200 can use a processor to control a transmitter circuit, where the processor and the transmitter circuit can be contained within a case made up in part by the conductive cover 5204.

At step 5320, the communication device 5200 can receive second electrical signals from a second slot antenna 5212 that can make up part the trade dress design of the conductive cover 5204. In one embodiment, only one of the slot antennas 5208 and 5212 can form all or part of the trade dress design. In one embodiment, the second electrical signals can represent second carrier and data information of a second wireless communication signal. In one embodiment, the first carrier and data information can correspond to outgoing voice, data, audio/video information that is being transmitted from the communication device 5200, while the second carrier and data information can correspond to incoming voice, data, audio/video information that is being received at the communication device. In one embodiment, the first electrical signals can cause the first slot antenna 5208 to generate first electromagnetic signals that are propagated away from the communication device 5200, while the second electrical signals can be generated by the second slot antenna 5212 responsive to the second slot antenna 5212 receiving second electromagnetic signals that have been propagated to communication device 5200. In one embodiment, a coupling element 5290 can substantially decouple the first electrical signals from the second electrical signals at the first and second slot antennas 5208 and 5212.

In one or more embodiments, the slot antennas 5208 and 5212 can further incorporate the various structural and tuning techniques described herein with respect to dipole antenna structures. The communication device 5200 can further include additional elements including, but not limited to, inductors, capacitors, resistors, switches, antennas, and/or gain elements to modify the performance of the slot antennas 5208 at 5212.

Figure 54:
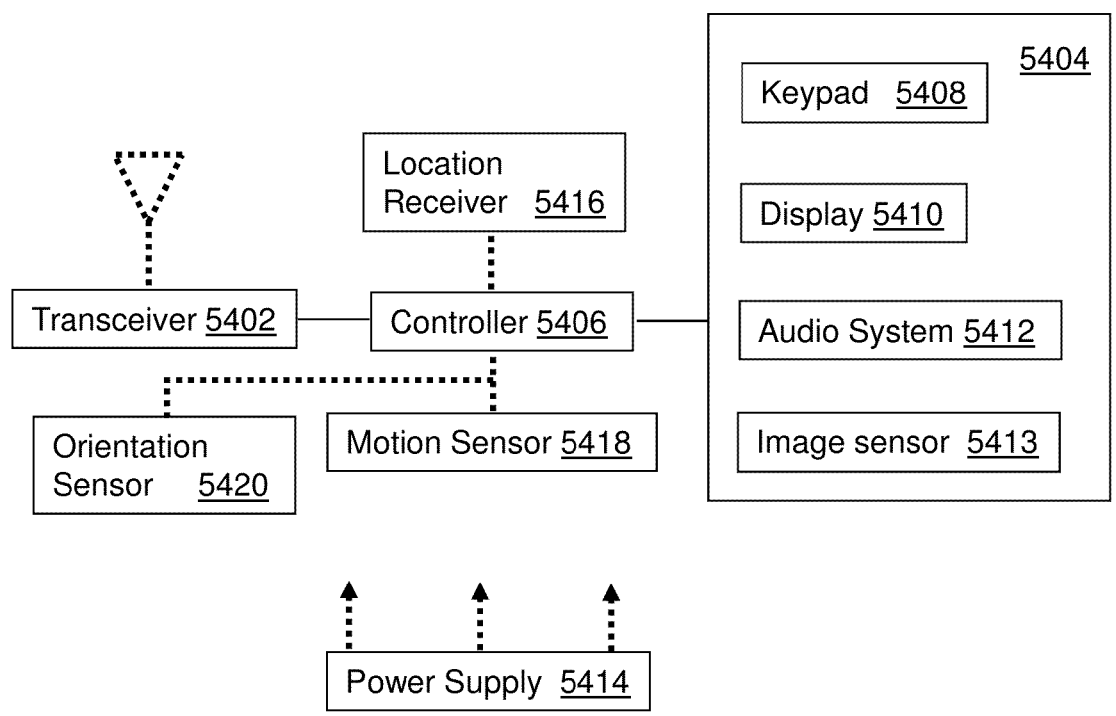
FIG. 54 depicts an illustrative embodiment of a communication device.

FIG. 54 depicts an illustrative embodiment of a communication device 5400. The communication device 5400 can comprise a wireline and/or wireless transceiver 5402 (herein transceiver 5402), a user interface (UI) 5404, a power supply 5414, a location receiver 5416, a motion sensor 5418, an orientation sensor 5420, and a controller 5406 for managing operations thereof. The transceiver 5402 can support short-range or long-range wireless access technologies such as Bluetooth, ZigBee, WiFi, DECT, or cellular communication technologies, just to mention a few. Cellular technologies can include, for example, CDMA-1x, UMTS/HSDPA, GSM/GPRS, TDMA/EDGE, EV/DO, WiMAX, SDR, LTE, as well as other next generation wireless communication technologies as they arise. The transceiver 5402 can also be adapted to support circuit-switched wireline access technologies (such as PSTN), packet-switched wireline access technologies (such as TCP/IP, VoIP, etc.), and combinations thereof. The transceiver 5402 can be adapted to utilize any of the aforementioned adaptive antenna embodiments described above singly or in any combination.

The UI 5404 can include a depressible or touch-sensitive keypad 5408 with a navigation mechanism such as a roller ball, a joystick, a mouse, or a navigation disk for manipulating operations of the communication device 5400. The keypad 5408 can be an integral part of a housing assembly of the communication device 5400 or an independent device operably coupled thereto by a tethered wireline interface (such as a USB cable) or a wireless interface supporting for example Bluetooth. The keypad 5408 can represent a numeric keypad commonly used by phones, and/or a QWERTY keypad with alphanumeric keys. The UI 5404 can further include a display 5410 such as monochrome or color LCD (Liquid Crystal Display), OLED (Organic Light Emitting Diode) or other suitable display technology for conveying images to an end user of the communication device 5400. In an embodiment where the display 5410 is touch-sensitive, a portion or all of the keypad 5408 can be presented by way of the display 5410 with navigation features.

The display 5410 can use touch screen technology to also serve as a user interface for detecting user input. As a touch screen display, the communication device 5400 can be adapted to present a user interface with graphical user interface (GUI) elements that can be selected by a user with a touch of a finger. The touch screen display 5410 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 5410 can be an integral part of the housing assembly of the communication device 5400 or an independent device communicatively coupled thereto by a tethered wireline interface (such as a cable) or a wireless interface.

The UI 5404 can also include an audio system 5412 that utilizes audio technology for conveying low volume audio (such as audio heard in proximity of a human ear) and high volume audio (such as speakerphone for hands free operation). The audio system 5412 can further include a microphone for receiving audible signals of an end user. The audio system 5412 can also be used for voice recognition applications. The UI 5404 can further include an image sensor 5413 such as a charged coupled device (CCD) camera for capturing still or moving images.

The power supply 5414 can utilize common power management technologies such as replaceable and rechargeable batteries, supply regulation technologies, and/or charging system technologies for supplying energy to the components of the communication device 5400 to facilitate long-range or short-range portable applications. Alternatively, or in combination, the charging system can utilize external power sources such as DC power supplied over a physical interface such as a USB port or other suitable tethering technologies.

The location receiver 5416 can utilize location technology such as a global positioning system (GPS) receiver capable of assisted GPS for identifying a location of the communication device 5400 based on signals generated by a constellation of GPS satellites, which can be used for facilitating location services such as navigation. The motion sensor 5418 can utilize motion sensing technology such as an accelerometer, a gyroscope, or other suitable motion sensing technology to detect motion of the communication device 5400 in three-dimensional space. The orientation sensor 5420 can utilize orientation sensing technology such as a magnetometer to detect the orientation of the communication device 5400 (north, south, west, and east, as well as combined orientations in degrees, minutes, or other suitable orientation metrics).

The communication device 5400 can use the transceiver 5402 to also determine a proximity to a cellular, WiFi, Bluetooth, or other wireless access points by sensing techniques such as utilizing a received signal strength indicator (RSSI) and/or signal time of arrival (TOA) or time of flight (TOF) measurements. The controller 5406 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 400.

Other components not shown in FIG. 54 can be used in one or more embodiments of the subject disclosure. For instance, the communication device 5400 can include a reset button (not shown). The reset button can be used to reset the controller 5406 of the communication device 5400. In yet another embodiment, the communication device 5400 can also include a factory default setting button positioned, for example, below a small hole in a housing assembly of the communication device 5400 to force the communication device 5400 to re-establish factory settings. In this embodiment, a user can use a protruding object such as a pen or paper clip tip to reach into the hole and depress the default setting button. The communication device 400 can also include a slot for adding or removing an identity module such as a Subscriber Identity Module (SIM) card. SIM cards can be used for identifying subscriber services, executing programs, storing subscriber data, and so forth.

The communication device 5400 as described herein can operate with more or less of the circuit components shown in FIG. 54. These variant embodiments can be used in one or more embodiments of the subject disclosure.

It should be understood that devices described in the exemplary embodiments can be in communication with each other via various wireless and/or wired methodologies. The methodologies can be links that are described as coupled, connected and so forth, which can include unidirectional and/or bidirectional communication over wireless paths and/or wired paths that utilize one or more of various protocols or methodologies, where the coupling and/or connection can be direct (e.g., no intervening processing device) and/or indirect (e.g., an intermediary processing device such as a router).

Figure 55:
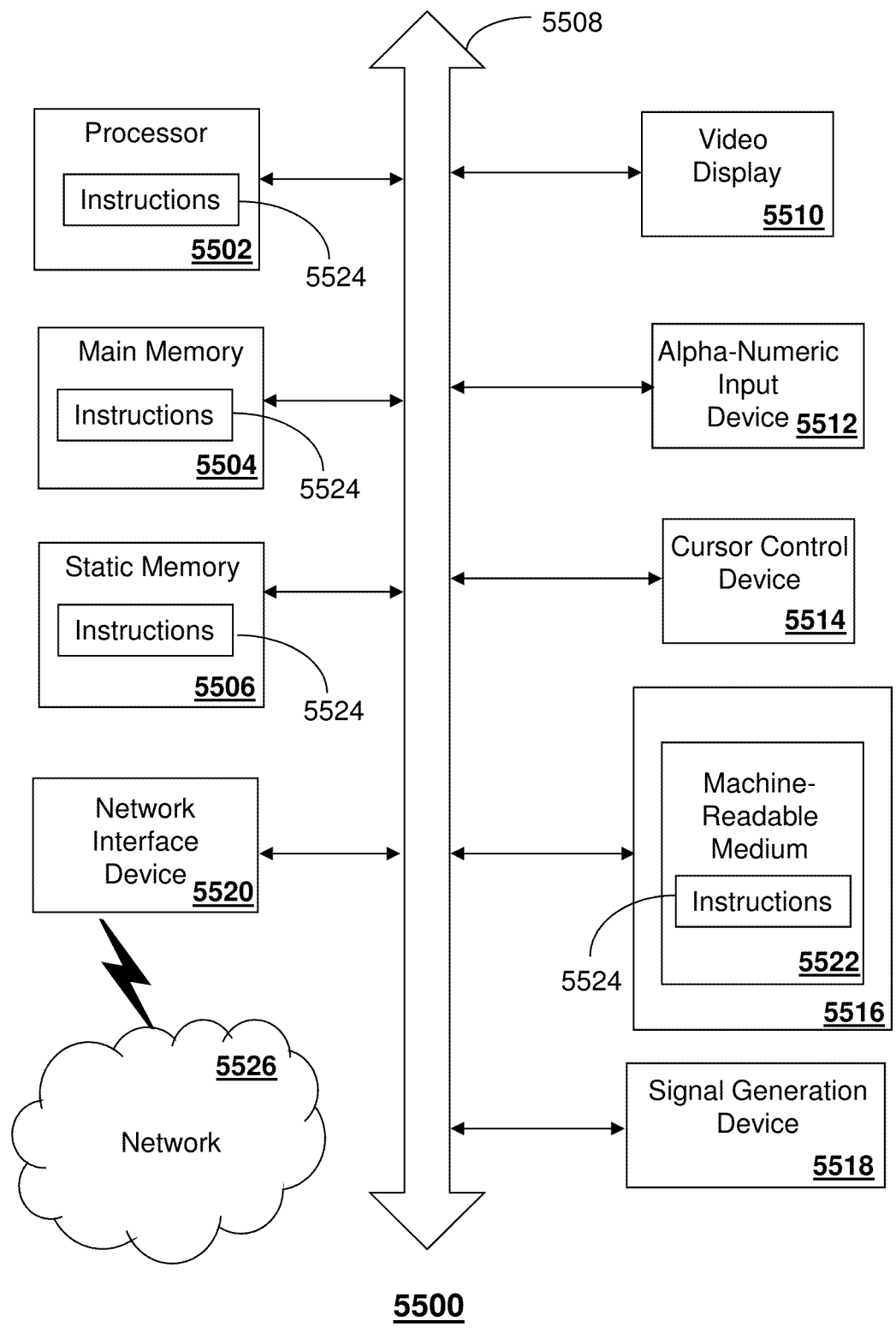
FIG. 55 is a diagrammatic representation of a machine in the form of a computer system within which a set of instructions, when executed, may cause the machine to perform any one or more of the methods described herein.

FIG. 55 depicts an exemplary diagrammatic representation of a machine in the form of a computer system 5500 within which a set of instructions, when executed, may cause the machine to perform any one or more of the embodiments described above. One or more instances of the machine can utilize the aforementioned adaptive antenna embodiments singly or in any combination. In some embodiments, the machine may be connected (e.g., using a network 5526) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a smart phone, a laptop computer, a desktop computer, a control system, a network router, switch or bridge, or any machine capable of executing a set of instructions (sequential or otherwise) that specify actions to be taken by that machine. It will be understood that a communication device of the subject disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

The computer system 5500 may include a processor (or controller) 5502 (e.g., a central processing unit (CPU), a graphics processing unit (GPU, or both), a main memory 5504 and a static memory 5506, which communicate with each other via a bus 5508. The computer system 5500 may further include a display unit 5510 (e.g., a liquid crystal display (LCD), a flat panel, or a solid state display. The computer system 5500 may include an input device 5512 (e.g., a keyboard), a cursor control device 5514 (e.g., a mouse), a disk drive unit 5516, a signal generation device 5518 (e.g., a speaker or remote control) and a network interface device 5520. In distributed environments, the embodiments described in the subject disclosure can be adapted to utilize multiple display units 5510 controlled by two or more computer systems 5500. In this configuration, presentations described by the subject disclosure may in part be shown in a first of the display units 5510, while the remaining portion is presented in a second of the display units 5510.

The disk drive unit 5516 may include a tangible computer-readable storage medium 5522 on which is stored one or more sets of instructions (e.g., software 5524) embodying any one or more of the methods or functions described herein, including those methods illustrated above. The instructions 5524 may also reside, completely or at least partially, within the main memory 5504, the static memory 5506, and/or within the processor 5502 during execution thereof by the computer system 5500. The main memory 5504 and the processor 5502 also may constitute tangible computer-readable storage media.

Dedicated hardware implementations including, but not limited to, application specific integrated circuits, programmable logic arrays and other hardware devices that can likewise be constructed to implement the methods described herein. Application specific integrated circuits and programmable logic array can use downloadable instructions for executing state machines and/or circuit configurations to implement embodiments of the subject disclosure. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the subject disclosure, the operations or methods described herein are intended for operation as software programs or instructions running on or executed by a computer processor or other computing device, and which may include other forms of instructions manifested as a state machine implemented with logic components in an application specific integrated circuit or field programmable gate array. Furthermore, software implementations (e.g., software programs, instructions, etc.) including, but not limited to, distributed processing or component/object distributed processing, parallel processing, or virtual machine processing can also be constructed to implement the methods described herein. It is further noted that a computing device such as a processor, a controller, a state machine or other suitable device for executing instructions to perform operations or methods may perform such operations directly or indirectly by way of one or more intermediate devices directed by the computing device.

While the tangible computer-readable storage medium 5522 is shown in an example embodiment to be a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium that is capable of storing or encoding a set of instructions for execution by the machine and that cause the machine to perform any one or more of the methods of the subject disclosure.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are from time-to-time superseded by faster or more efficient equivalents having essentially the same functions. Wireless standards for device detection (e.g., RFID), short-range communications (e.g., Bluetooth, WiFi, Zigbee), and long-range communications (e.g., WiMAX, GSM, CDMA, LTE) can be used by computer system 5500.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. The exemplary embodiments can include combinations of features and/or steps from multiple embodiments. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, can be used in the subject disclosure.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

It is to be understood that although the disclosure has been described above in terms of particular embodiments, the foregoing embodiments are provided as illustrative only, and do not limit or define the scope of the disclosure.

Various other embodiments, including but not limited to the following, are also within the scope of the claims. For example, the elements or components of the various multi-mode antenna structures described herein may be further divided into additional components or joined together to form fewer components for performing the same functions. For example, the antenna elements and the connecting element or elements that are part of a multimode antenna structure may be combined to form a single radiating structure having multiple feed points operatively coupled to a plurality of antenna ports or feed points.

It is further noted that the low band and high band antennae structures described in the subject disclosure may be different or dissimilar antenna types, such as, for example, monopole, PIFA, loop, dielectric or other structures known in the art. It is also noted that the embodiments described herein may represent other sub-frequency ranges such as, for example, low band, mid band, and high band. Accordingly, the antenna structures described herein may have differing antenna types, and differing frequency ranges.

Having described embodiments of the present disclosure, it should be apparent that modifications can be made without departing from the spirit and scope of the disclosure.

What is claimed is:

1. An antenna structure, comprising:
   a conductive cover of an electronic device;
   a first antenna element for converting between first electromagnetic signals and first electrical signals, wherein the first antenna element comprises a first slotted opening formed in a first portion of the conductive cover, wherein first locations on first edges of the first slotted opening of the first antenna element define first antenna ports;
   first conductive lines coupling the first antenna ports to a circuit of the electronic device;
   a second antenna element for converting between second electromagnetic signals and second electrical signals, wherein the second antenna element comprises a second slotted opening formed in a second portion of the conductive cover, wherein second locations on second edges of the second slotted opening of the second antenna element define second antenna ports;
   second conductive lines coupling the second antenna ports to the circuit of the electronic device; and
   a trade dress design in the conductive cover, wherein a shape of the trade dress design is defined by the first slotted opening comprising the first antenna element and the second slotted opening comprising the second antenna element.

2. The antenna structure of claim 1, wherein the first slotted opening and the second slotted opening comprise slots formed through the conductive cover.

3. The antenna structure of claim 1, further comprising a coupling element comprising a third portion of the conductive cover having a third slotted opening formed therein, wherein the third slotted opening connects the first slotted opening to the second slotted opening, wherein the coupling element causes differential currents and common mode currents flowing through the first antenna element and the second antenna element to combine in a manner that increases signal isolation between the first antenna ports of the first antenna element and the second antenna ports of the second antenna element.

4. The antenna structure of claim 3, further comprising a non-conductive material filling one of the first slotted opening, the second slotted opening, the third slotted opening, or a combination thereof.

5. The antenna structure of claim 4, wherein the non-conductive material filling the third slotted opening comprises a color scheme of a portion of the conductive cover and does not allow light to pass.

6. The antenna structure of claim 4, wherein the non-conductive material comprises a translucent material.

7. The antenna structure of claim 5, further comprising a lighting source attached inside of the conductive cover, wherein light from the lighting source is visible through one of the first slotted opening, the second slotted opening, the third slotted opening, or any combination thereof.

8. The antenna structure of claim 1, wherein the trade dress design comprises one of a trademark, a likeness of a person, a rendition of an object, or any combination thereof.

9. The antenna structure of claim 1, wherein the conductive cover is one of a front cover, a back cover, or a combination thereof, for the electronic device.

10. The antenna structure of claim 1, wherein the electronic device transmits the first electromagnetic signals via the first antenna element and receives the second electromagnetic signals via the second antenna element.

11. A communication device, comprising:
    a conductive cover;
    an antenna structure comprising a first portion of the conductive cover having a first slotted opening formed therein, wherein the first portion forms a first antenna element for converting between first electromagnetic signals and first electrical signals, and wherein the first slotted opening defines a shape of a trade dress design in the conductive cover, wherein first locations on first edges of the first slotted opening of the first antenna element define first antenna ports; and
    a circuit communicatively coupled to first antenna ports of the first antenna element via first conductive lines, wherein the circuit performs operations comprising:
        transmitting the first electronic signals into the first antenna element; and
        receiving second electronic signals from the first antenna element.

12. The communication device of claim 11, wherein the antenna structure further comprises a second portion of the conductive cover having a second slotted opening formed therein, wherein the second portion forms a second antenna element for converting between second electromagnetic signals and second electrical signals, and wherein the second slotted opening further defines the shape of the trade dress design in the conductive cover, wherein second locations on second edges of the second slotted opening of the second antenna element define second antenna ports, and wherein the circuit is further communicatively coupled to second antenna ports of the second antenna element via second conductive lines.

13. The communication device of claim 12, wherein the antenna structure further comprises a coupling slotted opening in the conductive cover, wherein the coupling slotted opening connects the first slotted opening to the second slotted opening, and wherein the coupling slotted opening causes differential currents and common mode currents flowing through the first antenna element and the second antenna element to combine in a manner that increases signal isolation between the first antenna ports of the first antenna element and the second antenna ports of the second antenna element.

14. The communication device of claim 13, wherein the coupling slotted opening further defines the shape of the trade dress design in the conductive cover.

15. The communication device of claim 13, further comprising a non-conductive material filling one of the first slotted opening, the second slotted opening, the coupling slotted opening, or a combination thereof.

16. The communication device of claim 12, wherein the circuit further receives the second electromagnetic signals via the second antenna element.

17. A method, comprising:
    transmitting or receiving, by a device comprising a processor, first electronic signals to a first slot antenna element, wherein the first electronic signals generate first electromagnetic signals via the first slot antenna element and wherein the first slot antenna comprises a first portion of a conductive cover of the device having a first slotted opening formed therein, wherein first conductive lines couple a circuit of the device to first locations on first edges of the first slotted opening; and receiving or transmitting, by the device, second electrical signals from a second slot antenna element, wherein the second electrical signals are generated via second electromagnetic signals received by the second slot antenna element, wherein the second slot antenna comprises a second portion of the conductive cover having a second slotted opening formed therein, wherein second conductive lines couple the circuit of the device to second locations on second edges of the second slotted opening, and wherein a shape of a trade dress design in the conductive cover is defined by one of the first slotted opening, the second slotted opening, or a combination thereof.

18. The method of claim 17, wherein the device further comprises a third portion of the conductive cover having a coupling slotted opening formed therein, wherein the coupling opening connects from the first slotted opening to the second slotted opening, wherein the coupling slotted opening causes differential currents and common mode currents flowing through the first slot antenna element and the second slot antenna element to combine in a manner that increases signal isolation between a first port at the first locations on the first edges of the first slotted opening of the first slot antenna element and a second port at the second locations on the second edges of the second slotted opening of the slot second antenna element.

19. The method of claim 17, further comprising:

receiving third electronic signals from the first slot antenna element; and transmitting fourth electronic signals to the second slot antenna element.

20. The method of claim 17, wherein the trade dress design comprises one of a trademark, a likeness of a person, a rendition of an object, or any combination thereof.

* * * * *